United States Patent [19]
Yamagata et al.

[11] Patent Number: 5,959,927
[45] Date of Patent: *Sep. 28, 1999

[54] SEMICONDUCTOR INTEGRATED CIRCUIT DEVICE HAVING HIERARCHICAL POWER SOURCE ARRANGEMENT

[75] Inventors: Tadato Yamagata; Kazutami Arimoto; Masaki Tsukude, all of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/953,728

[22] Filed: Oct. 17, 1997

Related U.S. Application Data

[62] Division of application No. 08/820,545, Mar. 19, 1997, Pat. No. 5,726,946, which is a continuation of application No. 08/458,583, Jun. 2, 1995, abandoned.

[30] Foreign Application Priority Data

| Jun. 2, 1994 | [JP] | Japan | 6-121299 |
| Dec. 22, 1994 | [JP] | Japan | 6-320102 |
| Feb. 13, 1995 | [JP] | Japan | 7-023590 |

[51] Int. Cl.$^6$ ..................................................... G11C 7/00
[52] U.S. Cl. ............................. 365/229; 365/226; 365/63
[58] Field of Search ..................................... 365/226, 227, 365/228, 229, 189.09, 189.11, 63

[56] References Cited

U.S. PATENT DOCUMENTS

| 5,270,581 | 12/1993 | Nakamura | 325/530 |
| 5,347,492 | 9/1994 | Horiguchi et al. | 365/226 |
| 5,541,885 | 7/1996 | Takashima | 365/227 |
| 5,583,457 | 12/1996 | Horiguchi et al. | 326/121 |
| 5,710,741 | 1/1998 | McLaury | 365/226 |

OTHER PUBLICATIONS

"Switched–Source–Impedance CMOS Circuit for Low Standby Subthreshold Current Giga–Scale LSI'S", Masashi Horiguchi et al., 1993 Symposium on VLSI Circuit, Digest of Technical Papers, pp. 47–48.

"Stand–By/Active Mode Logic for Sub–1 VIG/4Gb DRAMS", Takashima et al., 1993 Symposium on VLSI Circuit, Digest of Technical Papers, pp. 83–84.

"A Testing Technique for ULSI Memory with On–Chip Voltage Down Converter", Masaki Tsukude et al., International Test Conference 1992, pp. 615–622.

"1V High–Speed Digital Circuit Technology with 0.5 UM Multi–Threshold CMOS", Mutoh et al., 1993, IEEE pp. 186–189.

*Primary Examiner*—Vu A. Le
*Attorney, Agent, or Firm*—McDermott, Will & Emery

[57] ABSTRACT

A variable impedance power supply line and a variable impedance ground line supplying voltages VCL1 and VSL1, respectively, are set to a low impedance state in a stand-by cycle and in a row related signal set period, and to a high impedance state in a column circuitry valid time period. Variable impedance power supply line and variable impedance ground line supplying voltages VCL2 and VSL2, respectively, are set to a high impedance state in the stand-by cycle, and low impedance state in the active cycle and in the row related signal reset time period. Inverters operate as operating power supply voltage of voltages VCL1 and VSL2 or voltages VCL2 and VSL1, in accordance with a logic level of an output signal in the stand-by cycle and in the active cycle. Thus a semiconductor memory device is provided in which subthreshold current in the stand-by cycle and active DC current in the active cycle can be reduced.

18 Claims, 52 Drawing Sheets

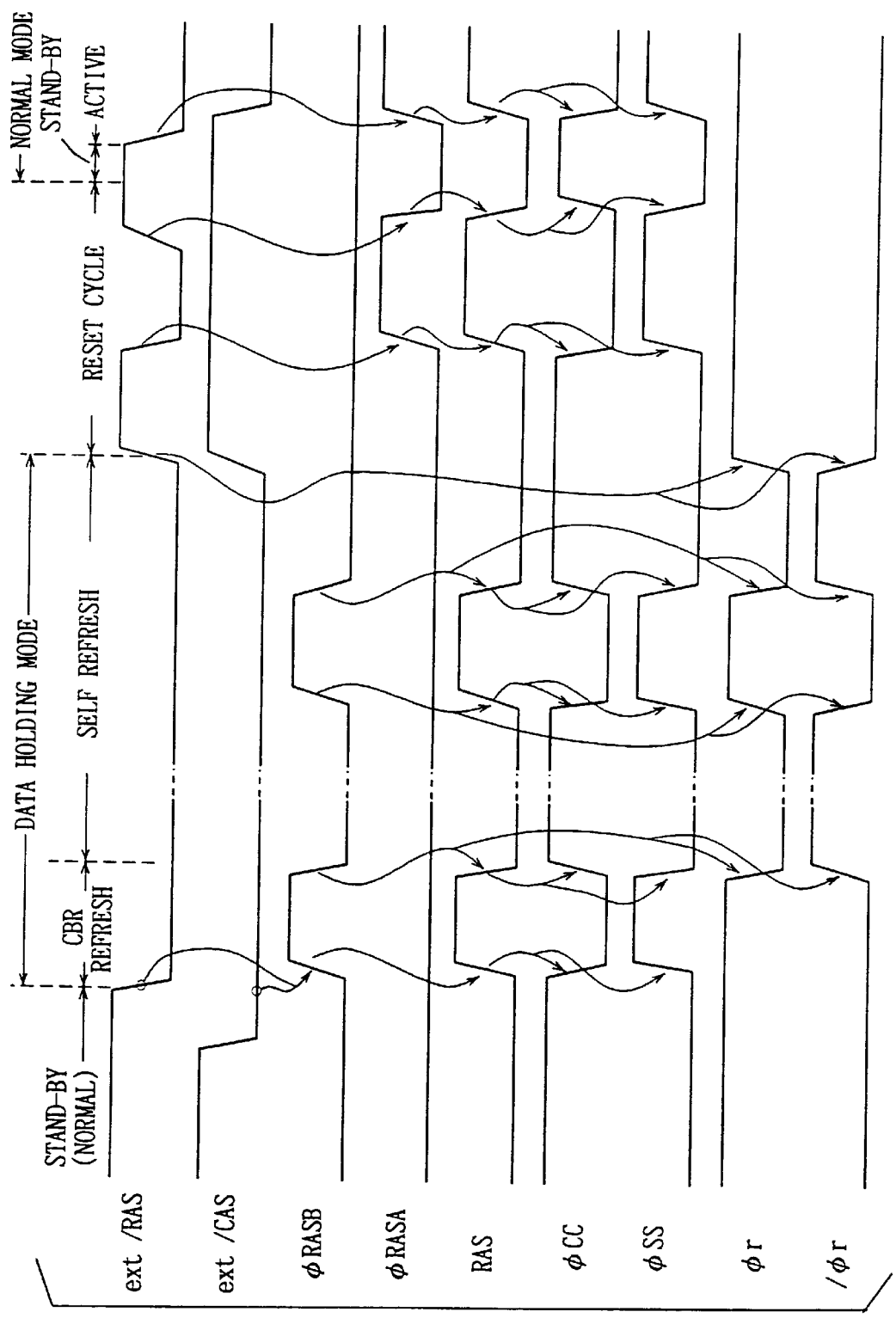
F I G. 30

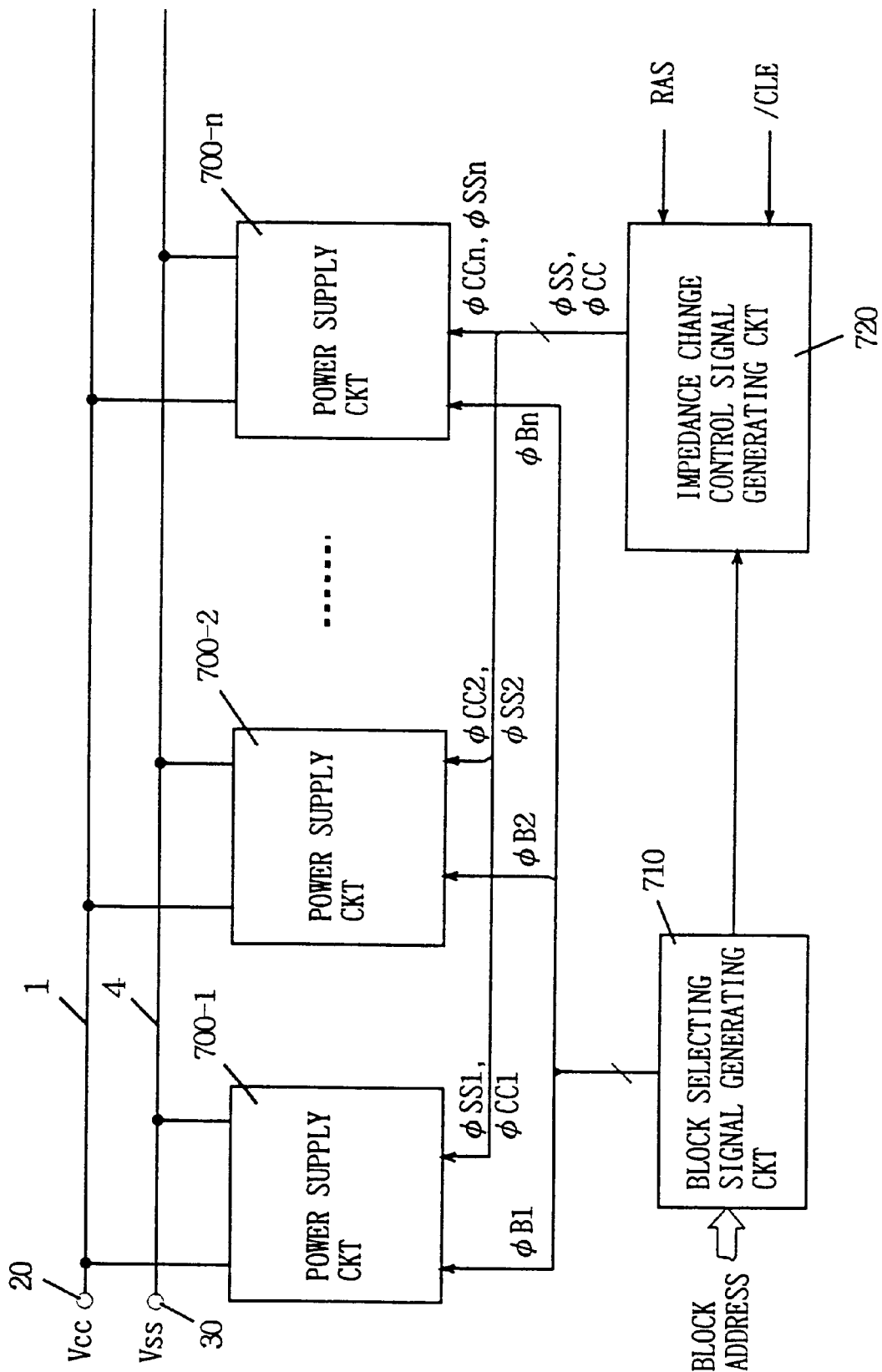
F I G. 3 2

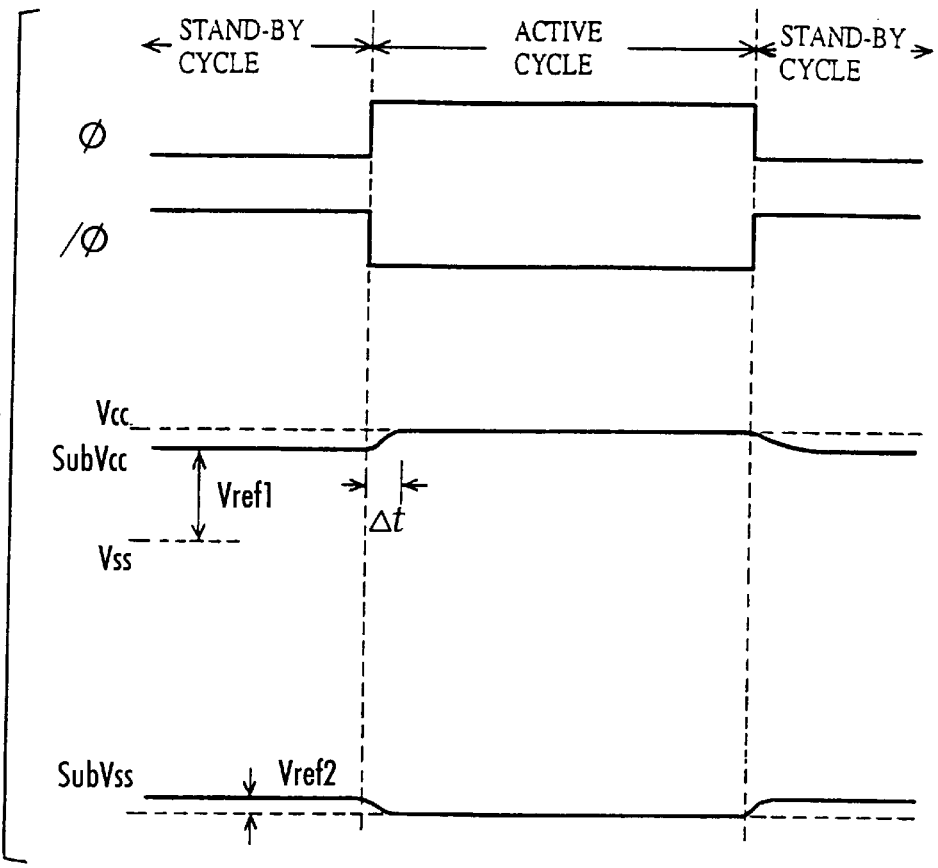
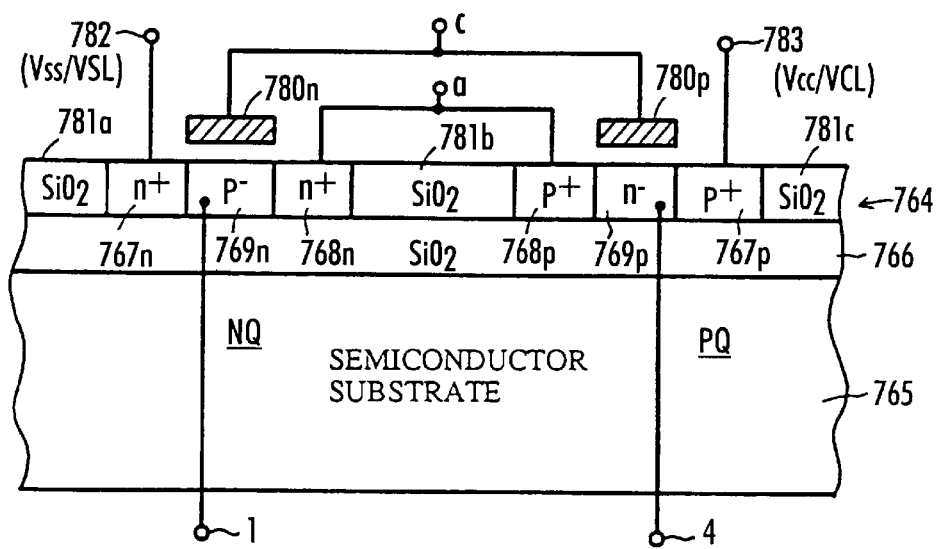

FIG. 56 ic Random Access Memory).

SEMICONDUCTOR INTEGRATED CIRCUIT DEVICE HAVING HIERARCHICAL POWER SOURCE ARRANGEMENT

This application is a division of application Ser. No. 08/820,545 filed Mar. 19, 1997 U.S. Pat. No. 5,726,946, which is a continuation of application Ser. No. 08/458,583, filed Jun. 2, 1995, abandoned.

BACKGROUND OF THE INVENTION

1. Field of the Invention

The present invention relates to a semiconductor device, and, specifically to a structure for reducing current consumption in a semiconductor device including a logic gate consisting of CMOS transistors (complementary insulated gate type field effect transistors) without affecting operating characteristics thereof. More specifically, the present invention relates to a structure for reducing subthreshold current of a semiconductor memory device such as a DRAM (Dynamic Random Access Memory).

2. Description of the Background Art

A CMOS circuit has been well known as a semiconductor circuit of which power consumption is extremely small.

FIG. 60 shows a structure of a general CMOS inverter. Referring to FIG. 60, the CMOS inverter includes a p channel MOS transistor (insulated gate type field effect transistor) PT provided between a power supply node 1900 receiving one operating power supply voltage Vcc and an output node 1901 and receiving at its gate an input signal IN; and an n channel MOS transistor NT provided between the other power supply node 1902 receiving the other operating power supply voltage Vss (generally, ground potential) and output node 1901 and receiving at its gate the input signal IN. There is a load capacitance C at output node 1901. When input signal IN is at a low level, p channel MOS transistor PT turns on, n channel MOS transistor NT turns off, load capacitance C is charged through p channel MOS transistor PT, and an output signal OUT attains to the power supply voltage level Vcc. When charging of the load capacitance C is completed, source and drain of p channel MOS transistor PT come to have the same potential, and thus the transistor PT turns off. Therefore, at this time, current does not flow, and power consumption is negligible.

When input signal IN is at a high level, p channel MOS transistor PT turns off, n channel MOS transistor NT turns on, and load capacitance C is discharged to the level of the other power supply potential Vss through n channel MOS transistor NT. When the discharge is completed, the source and drain of n channel MOS transistor NT come to have the same potential, and thus the transistor NT turns off. Therefore, in this state also, power consumption is negligible.

A drain current IL flowing through a MOS transistor can be represented by a function of a gate-source voltage of the MOS transistor. When the absolute value of the gate-source voltage becomes larger than the absolute value of the threshold voltage of an MOS transistor, a large drain current flows. Even when the absolute value of the gate-source voltage becomes not higher than that of absolute value of the threshold voltage, the drain current is not completely reduced to 0. This drain current flowing under such a voltage is referred to as subthreshold current which is exponentially proportional to the gate-source voltage.

FIG. 61 shows subthreshold current characteristic of an n channel MOS transistor. Referring to FIG. 61, the abscissa represents gate-source voltage VGS, and the ordinate represents logarithmic value of drain current IL. In FIG. 61, linear regions of lines I and II each represent the subthreshold current. The threshold voltage is defined as the gate-source voltage providing a prescribed current in this subthreshold current region. For example, in MOS transistor having the gate width (channel width) of 10 $\mu$m, the gate-source voltage causing a drain current flow of 10 mA is defined as the threshold voltage. FIG. 61 represents the prescribed current I0 and the threshold voltages VT0 and VT1.

As the MOS transistor has been made smaller and smaller, the power supply voltage Vcc decreases in accordance with the scaling rule. Therefore, the absolute value Vth of the threshold voltage of the MOS transistor must be decreased similarly in accordance with the scaling rule in order to improve performance of the MOS transistor. In the CMOS inverter shown in FIG. 60, for example, assume that the power supply voltage Vcc is 5 V and the threshold voltage Vth of n channel MOS transistor NT is 1 V. When input signal IN changes from 0 V to a value larger than 1 V, a large drain current flow is generated, starting discharging of load capacitance C. On the other hand, when the power supply voltage Vcc is lowered to 3 V, for example, while maintaining the threshold voltage Vth at the same value, the load capacitance C can be discharged with large current only when the input signal IN exceeds 1 V to turn on the n channel MOS transistor NT. More specifically, when the power supply voltage Vcc is 5 V, discharge of capacitive load starts at ⅕ of the amplitude of the input signal IN. Meanwhile, when the power supply voltage Vcc is 3 V, discharge of capacitive load C starts at ⅓ of the amplitude of input signal IN. Namely, input/output response characteristic is degraded, and hence high speed operation cannot be ensured. Therefore, the absolute value Vth of the threshold voltage needs to be scaled similarly down as the power supply voltage. However, as shown in FIG. 61, when the threshold voltage VT1 is lowered to the threshold voltage VT0, the subthreshold current characteristic changes from that represented by the line I to that of the line II. Accordingly, the subthreshold current when the gate voltage is 0 V (Vss level) rises from IL1 to IL0, increasing current consumption. Thus, difficulty is encountered in scaling down the absolute value Vth of the threshold voltage in the similar manner as the power supply voltage and in realizing superior operating characteristics, especially high speed operation.

Structures for suppressing subthreshold current without degrading high speed operation characteristic have been disclosed in pages 47 and 48, and in pages 83 and 84 of 1993 *Symposium on VLSI Circuit, Digest of Technical Papers,* by Horiguchi et al. and Takashima et al., respectively.

FIG. 62 shows a structure of a power supply line disclosed by Horiguchi et al. in the above described article. FIG. 62 shows, as an example of a CMOS circuit, n cascade connected CMOS inverters f1 to fn. Each of inverters f1 to f4 has the same structure as that shown in FIG. 60.

In a path for supplying one operating power supply voltage, a first power supply line 1911 is connected to the first power supply node 1910 receiving power supply voltage Vcc, and a second power supply line 1912 is arranged parallel to the first power supply line 1911. First power supply line 1911 is connected to second power supply line 1912 by means of a high resistance Ra. Parallel to the resistance Ra, a p channel MOS transistor Q1 for selectively connecting first power supply line 1911 and second power supply line 1912 in response to a control signal $\phi$c is provided. Between the first and second power supply lines 1911 and 1912, a capacitor Ca having a relatively large capacitance for stabilizing the potential of second power supply line 1912 is provided.

A transmission path of the other power supply voltage Vss (ground potential: 0 V) includes a third power supply line 1921 connected to a second power supply node 1920 receiving the other power supply voltage (hereinafter simply referred to as the ground voltage) Vss, and a fourth power supply line 1922 arranged parallel to the third power supply line 1921. Between the third and fourth power supply lines 1921 and 1922, a high resistance Rb is provided, and parallel to the resistance Rb, there is provided an n channel MOS transistor Q2 for selectively connecting the third power supply line 1921 and the fourth power supply line 1922 in response to a control signal φs. Between the third and fourth power supply lines 1921 and 1922, a capacitor Cb having large capacitance for stabilizing the potential of the fourth power supply line 1922 is provided.

Inverters f1, f3, . . . of odd-numbered stages have one operating power supply node (power supply node receiving a high potential) connected to first power supply line 1911 and the other power supply node (power supply node receiving a low potential) connected to fourth power supply line 1922. Inverters f2, . . . of even-numbered stages have one operating power supply node connected to second power supply line 1912 and the other power supply node connected to third power supply line 1921. The operation will be described.

In a DRAM, a signal state at a stand-by state can be predicted in advance. The state of an output signal is also predictable. In the structure shown in FIG. 62, input signal IN attains to the low level at the stand-by state and attains to the high level in an active cycle. In a stand-by cycle, control signal φc is set to the high level, control signal φs is set to the low level and MOS transistors Q1 and Q2 are both turned off. At this state, power supply lines 1911 and 1912 are connected through high resistance Ra, while power supply lines 1921 and 1922 are connected through high resistance Rb. The potential VCL of power supply line 1912 is $$VCL=Vcc-Ia \cdot Ra$$

while the voltage VSL of power supply line 1922 is $$VSL=Vss+Ib \cdot Rb$$

where Ia and Ib represent currents flowing through resistances Ra and Rb, respectively. It is assumed that input signal IN is at the ground potential level Vss. In inverter f1, p channel MOS transistor PT is on, charging the output node to the power supply potential Vcc level on power supply line 1911. Meanwhile, source potential (potential of power supply node 1920) of n channel MOS transistor NT is the intermediate potential VSL, and set at a potential level higher than the ground potential Vss. Therefore, the gate-source voltage of n channel MOS transistor NT becomes negative, the subthreshold current corresponds to the subthreshold current IL2 when the gate-source voltage is −VSL, and is smaller than the subthreshold current IL1 flowing when the potential at power supply node 1902 is at the ground potential Vss, as shown in FIG. 61.

The operating characteristics of the MOS transistor will be described in accordance with the line I shown in FIG. 61. As for the on/off state of n channel MOS transistor, the state where the gate-source voltage is higher than the threshold voltage is referred to as the on state, and the state where the gate-source voltage is smaller than the threshold voltage is referred to as the off state. The relation is reversed in a p channel MOS transistor.

In inverter f2, the input signal/IN (output signal from inverter f1) is at the high level of the power supply potential Vcc. Therefore, in inverter f2, p channel MOS transistor is off and n channel MOS transistor is on. The p channel MOS transistor has its source connected to power supply line 1912 receiving the voltage VCL. Therefore, in inverter f2, the gate potential of p channel MOS transistor is higher than the source potential, and as in the n channel MOS transistor, the subthreshold current is also suppressed. This also applies to inverters f3 to fn of the succeeding stages. Therefore, in the stand-by state, subthreshold current in inverters f1 to fn is suppressed, and the stand-by current can be reduced.

When an active cycle starts, control signal φc is set to the low level and control signal φs is set to the high level. MOS transistors Q1 and Q2 are both turned on. MOS transistors Q1 and Q2 have large channel width W, and are capable of supplying sufficient charging/discharging current to inverters f1 to fn. At this state, potentials of power supply lines 1912 and 1922 are at the levels of the power supply potential Vcc and the ground potential Vss, respectively. Therefore, in the active cycle, the output signal OUT is set to the established state in accordance with the input signal IN.

FIG. 63 shows signal waveforms of the circuit shown in FIG. 62 and current flowing through the power supply lines. Referring to FIG. 63, in the stand-by cycle, MOS transistors Q1 and Q2 are both off in response to signals φs and φc, and the voltage VCL on power supply line 1912 and the voltage VSL of power supply line 1922 are at intermediate potentials between power supply voltage Vcc and ground potential Vcc (0 V), respectively. At this stage, MOS transistors in the subthreshold region (MOS transistors which are off) of inverters f1 to f4 are set more strongly off, thus reducing subthreshold current.

However, in the active cycle, control signals φs and φc are set to the high level and low level, respectively, MOS transistors Q1 and Q2 are turned on, the voltage VCL on power supply line 1912 becomes equal to the power supply potential Vcc and voltage VSL on power supply line 1922 becomes equal to the ground potential Vss. At the start of an active cycle, the power supply current Icc (VCL charging current) flows for charging power supply line 1912 and when input signal IN changes subsequently, inverters f1 to fn operate in response, charging/discharging current is generated for changing the respective signal levels, and thus a relatively large operating current flows.

In the active cycle, the voltage VCL is set to be equal to power supply potential Vcc, while the power supply voltage VSL is set equal to the ground potential Vss. Therefore, in inverters f1 to f4, the gate potential and the source potential of a transistor which is off are equal to each other. Therefore, when an MOS transistor having small absolute value Vth of the threshold voltage is used, considerably large subthreshold current flows. Namely, in the active cycle, before and after the change of the input signal IN, a large subthreshold current (active DC current) flows, causing a problem of a large current consumption in the active cycle. Especially in a semiconductor memory device having large storage capacity such as a 1 giga bit DRAM, when the number of MOS transistors which are the components of the device is increased, total sum of the active DC current is too large to be negligible.

In transistors Q1 and Q2 (see FIG. 62) which are turned off in the standby cycle, subthreshold current flows in the stand-by cycle. When the absolute values of the threshold voltages of transistors Q1 and Q2 are increased so as to reduce the subthreshold current flowing through transistors Q1 and Q2 in the stand-by cycle, the time necessary for recovering the potentials of power supply lines 1912 and 1922 at the transition into the active cycle becomes longer from the reason which will be described in the following, causing the problem that the access time of the semiconductor memory device becomes longer.

More specifically, at the transition from the stand-by cycle to the active cycle, it takes long period of time for the transistors Q1 and Q2 to operate in the saturated region as the absolute value of the threshold voltage of the transistors Q1 and Q2 is high. Thus, the transistors operate in the nonsaturated region for a long period of time. Therefore, as compared with an example in which the threshold value of the MOS transistor is small, current drivability of transistors Q1 and Q2 at the transition from the stand-by cycle to the active cycle becomes smaller, retarding recovery of potentials on power supply lines 1921 and 1922. It is necessary that internal circuitry is activated after the potentials on power supply lines 1921 and 1922 becomes stable. This means that the start of operation of the internal circuitry is delayed, and in the case of a semiconductor memory device, the access time becomes longer.

SUMMARY OF THE INVENTION

An object of the present invention is to provide an integrated semiconductor device which operates at high speed with low current consumption.

Another object of the present invention is to provide a semiconductor device in which current consumption in an active cycle can be reduced.

A further object of the present invention is to provide a semiconductor memory device which operates at high speed with low current consumption.

Briefly stated, in the semiconductor device in accordance with the present invention, impedance of a subpower supply line to which current is supplied from the main power supply line is minimized only when the current on the subpower supply line is consumed, in accordance with the operation mode of the semiconductor device. When any component does not consume the current on the subpower supply line, voltage level of the subpower line is maintained at a prescribed value.

Since the impedance of the subpower supply line is changed as needed, unnecessary consumption of current can be prevented. Further, when the configuration for maintaining the voltage level of the subpower supply line at a prescribed value is utilized, transition from a high impedance state to a low impedance state of the subpower line can be performed at higher speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 is a diagram of signal waveforms showing the operation of the circuit shown in FIG. 29.

FIG. 32 shows a structure of a power supply circuit in accordance with a fourth embodiment of the present invention.

FIG. 35 is a diagram of signal waveforms showing the operation of the semiconductor circuit shown in FIG. 34.

FIG. 36 shows a schematic cross sectional structure of an inverter circuit shown in FIG. 34.

FIG. 56 shows a structure of a second modification of the twelfth embodiment of the present invention.

DESCRIPTION OF THE PREFERRED EMBODIMENTS

[Embodiment 1]

Figure 1:
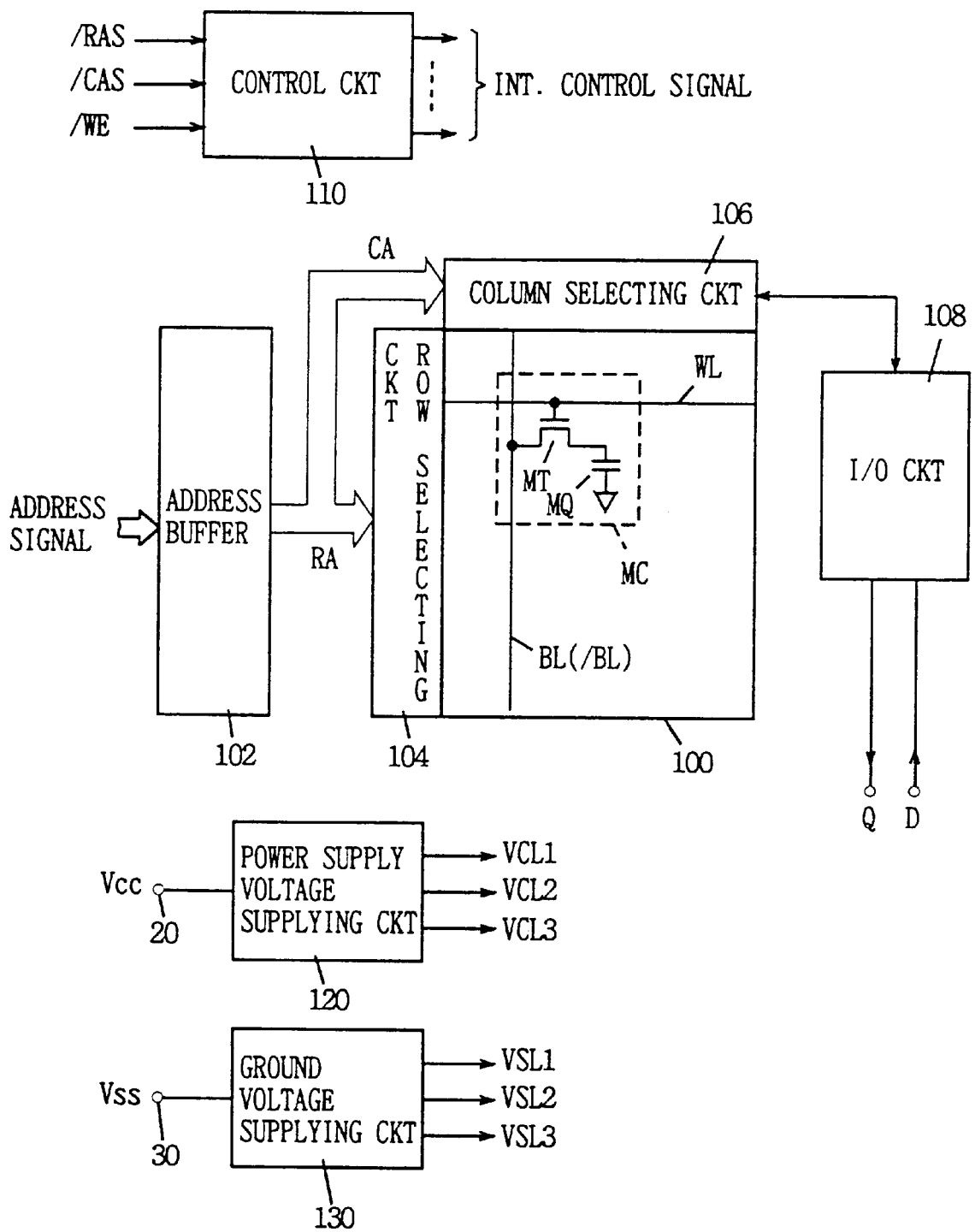
FIG. 1 schematically shows a whole structure of a semiconductor memory device in accordance with one embodiment of the present invention.

FIG. 1 schematically shows a whole structure of a semiconductor memory device (DRAM) in accordance with a first embodiment of the present invention. Referring to FIG. 1, the DRAM includes a memory cell array 100 including memory cells MC arranged in a matrix of rows and columns; a row selecting circuit 104 for decoding an internal row address signal (X address) RA from an address buffer 102 for selecting a corresponding row (word line) in memory cell array 100; a column selecting circuit 106 for decoding an internal column address signal (Y address) CA from address buffer 102 for selecting a column (bit lines BL and /BL) in memory cell array 100; and an input/output circuit 108 for writing or reading data to and from a memory cell arranged corresponding to a crossing of the row and the column selected by row selecting circuit 104 and column selecting circuit 106.

FIG. 1 shows a memory cell MC arranged corresponding to a crossing of one word line WL and one bit line BL (or /BL) as a representative. When "folded bit line structure" is employed, in memory cell array 100, a column line consists of a pair of bit lines BL and /BL transmitting signals complementary to each other, and memory cells arranged in one column each are connected to one bit line BL (or /BL) of the corresponding bit line pair. Memory cells MC arranged in a row are connected to the word line WL. The memory cell MC includes a memory capacitor MQ storing information, and a memory transistor MT for connecting, in response to a signal potential on a corresponding word line WL, the memory capacitor MQ to the corresponding bit line BL (or /BL).

The DRAM further includes a control circuit 110 for generating various internal control signals in accordance with externally applied control signals, that is, a row address strobe signal /RAS, a column address strobe signals /CAS and a write enable signal /WE; a power supply voltage supplying circuit 120 for generating high level power supply voltages VCL1, VCL2 and VCL3 from one power supply voltage Vcc applied to one power supply node 20 and for supplying the voltages to various circuits; and a ground voltage supplying circuit 130 for generating low level power supply voltages VSL1, VSL2 and VSL3 from the other power supply voltage (ground voltage) Vss applied to the other power supply node (ground node) 30 and for supplying the voltages to various circuits.

Control circuit 110 includes a circuit for generating control signals related to row selecting operation, and a circuit for generating control signals related to column selecting operation, the details of which will be described later. The row address strobe signal /RAS determines operation cycles of the DRAM, that is, the stand-by cycle in which the device is in the stand-by state waiting for an external access and the active cycle in which external access takes place. Further, this signal starts operations related to row selection in the DRAM. Circuits of which activation/inactivation determined by the row address strobe signals /RAS will be hereinafter referred to as row circuits or row circuitry.

The column address strobe signal /CAS starts operations related to column selection of the DRAM (including the operation of data input/output) when the signal /RAS is active (at the L level). The write enable signal /WE indicates whether data writing is to be performed or not. When it is at the low level, it designates writing of data, and when it is at the high level, it designates reading of data. The timing for reading data is determined by activation of the column address strobe signals /CAS, and the timing for writing data is determined by activation of the signal /WE or /CAS whichever is later. Circuits of which activation/inactivation is determined by the signal /CAS will be referred to as column circuits or column circuitry. A structure in which an output enable signal /OE is additionally applied may be used.

Power supply voltage supplying circuit 120 and ground voltage supplying circuit 130, details of which structure will be described later, are provided separately for the row circuits and column circuits and these circuits suppress subthreshold current by changing impedances (resistances) of power supply lines transmitting voltages VCL1, VCL2, VCL3, VSL1, VSL2 and VLS3, in accordance with the state of operation (operation cycle and operation period) of the DRAM.

Figure 2:
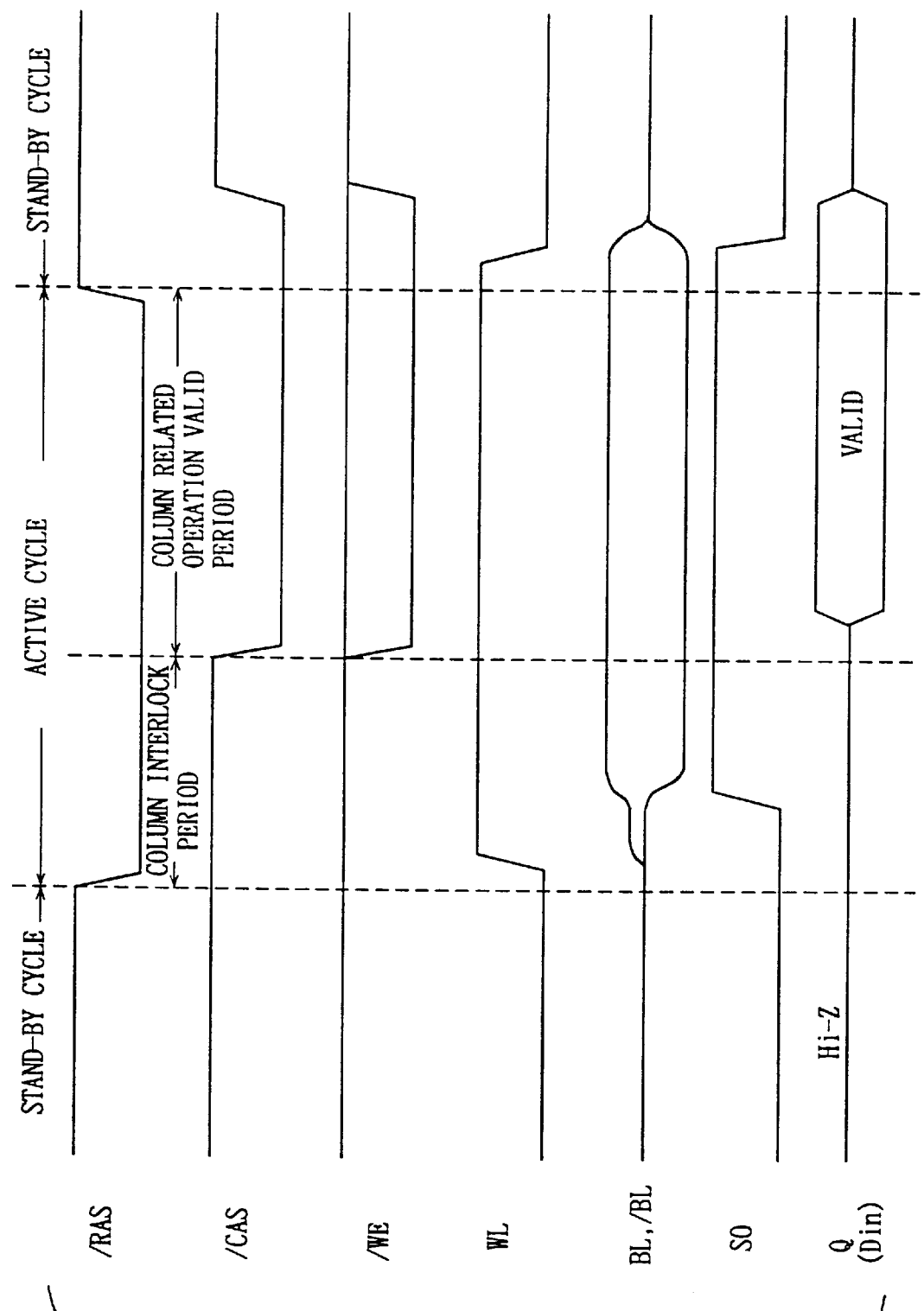
FIG. 2 is a diagram of waveforms showing a memory cell selecting operation of the semiconductor memory device shown in FIG. 1.

The data input/output operation of the DRAM shown in FIG. 1 will be described briefly, referring to the diagram of signal waveforms of FIG. 2. When the external row address strobe signals /RAS is at the high level and inactive, the DRAM is in the stand-by cycle. At this state, in memory cell array 100, the word line WL is at the non-selected state of low level, and bit lines BL and /BL are precharged to an intermediate potential level (Vcc/2). Sense amplifier activating signal SO is also at the inactive state of low level.

Though not shown in FIG. 1, a sense amplifier is provided for each bit line pair BL, /BL, and when activated, the sense amplifier differentially amplifies the potential of each bit line of the corresponding bit line pair. Input/output data Din (and Q) is at an invalid state. In FIG. 2, it is denoted as high impedance (electrically floating) state, Hi-Z.

When the signal /RAS falls to the low level, an active cycle starts, and the DRAM is externally accessed. First, the bit lines BL and /BL which have been held at the intermediate potential are set to the floating state at the precharge potential. Address buffer 102 latches an applied address signal and generates an internal row address signal RA under the control of control circuit 110. Row selecting circuit 104 decodes the internal row address signal RA, and raises the potential of the word line provided corresponding to the row designated by the address RA to the high level. The data (potential of one electrode (storage node) of memory capacitor MQ) held by the memory cell connected to the selected word line WL is transmitted to the corresponding bit line BL or /BL (through memory transistor MT). Consequently, the potential of the bit line BL or /BL changes in accordance with the transmitted data held in the memory cell. The other one of the pair of bit lines /BL or BL maintains the precharge potential (Vcc/2).

Thereafter, sense amplifier activating signal SO is activated, a sense amplifier, not shown, operates and differentially amplifies the potential of the bit line pair BL and /BL, thus the data held in the memory cell is sensed and amplified. In FIG. 2, an example is shown in which the selected memory cell holds a high level data. When the potential on bit lines BL and /BL are established at the high level (the level of the power supply voltage Vcc) and the low level (the level of the ground voltage Vss), a column interlock period terminates, and operation of the column circuits is permitted.

In this period in which the output signal from the column circuit is made valid, the external column address strobe signal /CAS is made valid, and it is activated and attains to the low level. In response to the column address strobe signal /CAS which is at the low level, address buffer 102 takes an address signal and generates an internal column address signal CA. Column selecting circuit 106 decodes the internal column address signal CA, and selects a corresponding column (bit line pair) in memory cell array 100. At the time of data reading, input/output circuit 108 provides a valid data Q in response to the fall of the column address strobe signal /CAS. At the time of data writing, when the write enable signal /WE and a column address strobe signal /CAS both attain to the low level, a valid internal write data is generated from an external write data D, and it is written to the selected memory cell (a memory cell located at a crossing of the selected row and the selected column).

When writing/reading of necessary data of the memory cell is completed, the row address strobe signal /RAS rises to the high level, that is, inactive state, and thus the active cycle terminates. Consequently, the period in which column operation is valid is completed, the word line WL which has been selected is set to the non-selected state, and sense amplifier activating signal SO is inactivated. Bit lines BL and /BL are equalized and precharged at the intermediate potential. Thereafter, column address strobe signal /CAS is inactivated and write enable signal /WE attains to the high level, whereby one memory cycle is completed.

As described above, in the DRAM, logic level of an internal node (input signal or output signal of each circuit) in the stand-by cycle can be determined previously. Logic levels of input and output signals of the row circuits can also be determined previously in the period in which column circuitry operation is valid. Further, the start and end points of the stand-by cycle, the start and end of the period in which column circuitry operation is valid can be determined by the signal /RAS (the sense amplifier activating signal SO is generated in accordance with the signal /RAS). By utilizing such features, in this embodiment, the potential levels of output voltages VCL1, VCL2, VCL3 and VSL1, VSL2, VSL3 of power supply voltage supplying circuit 120 and ground voltage supplying circuit 130 are changed by changing the impedances (resistances) of power supply lines (including the ground line) transmitting these voltages, so that MOS transistor operating in the subthreshold region is turned more strongly off, and hence subthreshold current is reduced.

Figure 3:
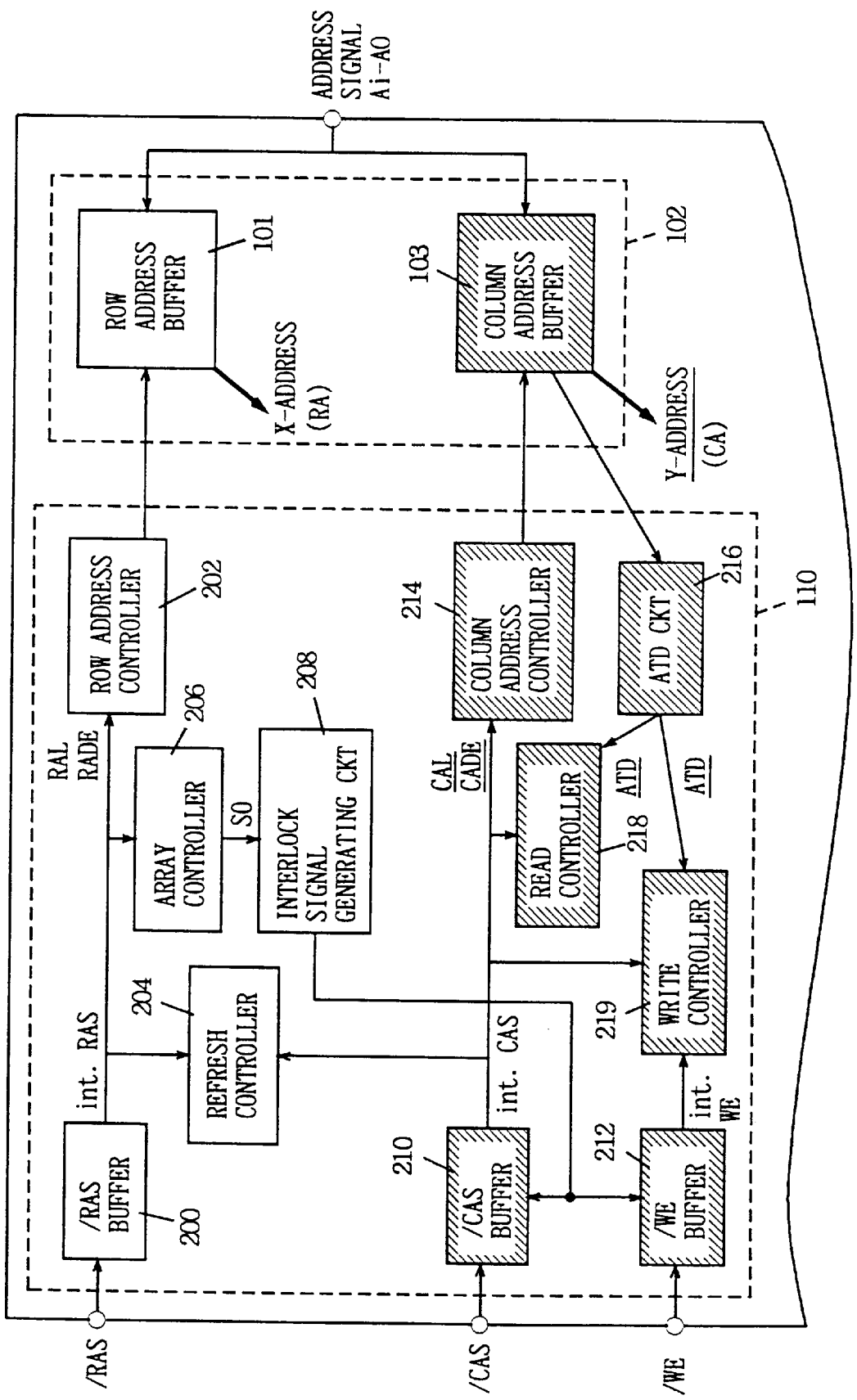
FIG. 3 is a block diagram schematically showing structures of a buffer and a control circuit of the semiconductor memory device shown in FIG. 1.

FIG. 3 is a block diagram showing detailed structure of the address buffer and the control circuit shown in FIG. 1. Referring to FIG. 3, address buffer 102 includes a row address buffer 101 for generating an X address (internal row address signal RA) from externally applied address signals Ai–A0, and a column address buffer 103 for generating a Y address (internal column address signal CA) from the address signals Ai–A0. The row address signal and the column address signal are multiplexed and applied as address signals Ai–A0. The timings of generation of X address and Y address by row address buffer 101 and column address buffer 103 are determined by an internal control signal from control circuit 110.

Control circuit 110 includes a /RAS buffer 200 receiving the external row address strobe signal /RAS for generating an internal RAS signal, a row address latch signal RAL and a row address enable signal RADE; a row address controller 202 responsive to the signals RAL and RADE from /RAS buffer 200 for activating row address buffer 101; an array controller 206 responsive to the internal RAS signal from /RAS buffer 200 for generating a word line driving signal RX (which will be described later) and sense amplifier activating signal SO; and an interlock signal generating circuit 208 responsive to a signal (sense amplifier activating signal) from array controller 206 for generating an interlock signal. The interlock signal from interlock signal generating circuit 208 determines the interlock period shown in FIG. 2 in which the column operation is valid and enables operations related to column selection.

Control circuit 110 further include a /CAS buffer 210 responsive to the external column address strobe signal /CAS for generating an internal CAS signal, a column address latch signal CAL and a column address enable signal CADE; a WE buffer 212 responsive to the external write enable signal /WE for generating an internal WE signal; a column address controller 214 responsive to the signals CAL and CADE from /CAS buffer 210 for controlling the operation of column address buffer 103; an ATD circuit 216 for detecting the time of change (transition) of Y address from column address buffer 103; a read controller 218 responsive to the internal CAS signal from /CAS buffer 210 and address transition detection signal ATD from ATD circuit 216 for generating a signal for activating data reading circuitry of the input/output circuit shown in FIG. 1; and a write controller 219 for generating a signal for activating data writing circuitry of the input/output circuit shown in FIG. 1 in accordance with the internal CAS signal from /CAS buffer 210, internal WE signal from /WE buffer 212 and the address transition detecting signal ATD from ATD circuit 216.

In the DRAM, an address access time from the application of a column address signal to the output of the valid data is defined by specification. Therefore, ATD circuit 216 is provided for detecting the transition in the column address signal. In accordance with the address transition detecting signal ATD from ATD circuit 216, timings of operations of the column circuits such as the column decoder and a preamplifier (which will be described later) are determined. Read controller 216 generates a preamplifier enabling signal PAE in accordance with the address transition detecting signal ATD from ATD circuit 216, and provides an output enable signal OEM (which will be described later) in accordance with the signals /CAS. Write controller 219 generates a signal WDE for activating a write driver, which will be described later, in accordance with the internal WE signal from /WE buffer 212 and address transition detecting signal ATD, and provides a data latch signal DIL for the input buffer, which will be described later, in accordance with the internal CAS signal from /CAS buffer 210 and address transition detecting signal ATD from ATD circuit 216.

Row address controller 202 has row address buffer 101 latch the row address in accordance with the row address latch signal RAL, and in response to the row address enable signal RADE, renders internal row address signal (X address) valid. When column address latch signal CAL is rendered active, column address controller 214 has column address buffer 103 execute address latch operation, and when column address enable signal CADE is activated subsequently, renders internal column address signal CA (Y address) valid.

The interlock signal from interlock signal generating circuit 208 is applied to /CAS buffer 210 and /WE buffer 212. When the output from interlock signal generating circuit 208 is inactive, designating a column interlock period, internal signal generating operations of /CAS buffer 210 and /WE buffer 212 are set to the stand-by state. Similarly, in ATD circuit 216, generation of the address transition detection signal ATD is set to the stand-by state in accordance with the column interlock period designating signal (inactive interlock signal) from interlock signal generating circuit 218.

When refreshing operation is designated (CBR mode) in accordance with the internal RAS signal from /RAS buffer 200 and internal CAS signal from /CAS buffer 210, refresh controller 204 generates an internal RAS signal having a prescribed time width internally, and executes necessary operations for refreshing. Refresh controller 202 determines that the refresh mode is designated when the column address strobe signal /CAS falls prior to the fall of the row address strobe signal /RAS. When the refresh mode is designated, generally, column selecting operation is inhibited (that is, generation of internal CAS signal and internal WE signal is inhibited).

In the structure shown in FIG. 3, the circuits operating related to the signal /RAS, that is, row circuits, include /RAS buffer 200, row address controller 202, refresh controller 204, array controller 206, interlock signal generating circuit 208 and row address buffer 101. The column circuits related to column selection include /CAS buffer 210, /WE buffer 212, column address controller 214, ATD circuit 216, read controller 218, write controller 219 and column address buffer 103.

Figure 4:
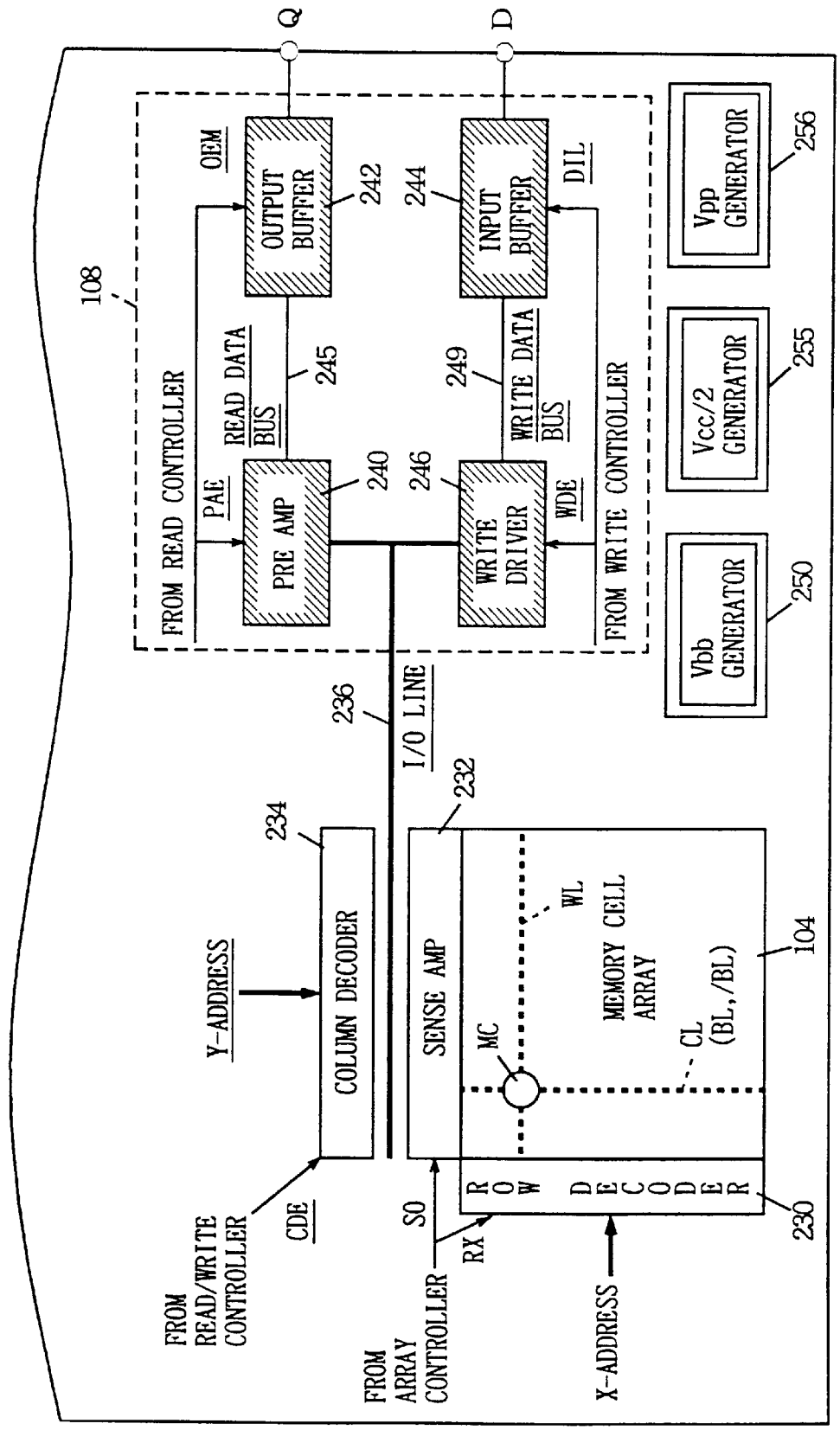
FIG. 4 shows a memory array and an input/output circuit shown in FIG. 1.

FIG. 4 is a block diagram showing detailed structure of the memory cell array portion and the input/output circuit shown in FIG. 1. Referring to FIG. 4, row address selecting circuit 104 is constituted by a row decoder 230 which decodes the X address (internal row address signal RA) applied from row address buffer 101 shown in FIG. 3, selects a corresponding word line in memory cell array 104 and transmits a word line driving signal RX applied from array controller 206 to the selected word line WL. For memory cell array 104, a sense amplifier 232 which is activated by a sense amplifier activating signal SO applied from array controller 206 (see FIG. 3) for differentially amplifying signal potential of each column CL (bit line pair Bl and /BL) is provided.

Column selecting circuit 106 shown in FIG. 1 includes a column decoder 234 which is activated in response to a column address enable signal CADE applied from read controller 218 or write controller 219 shown in FIG. 3 and when activated, decodes the Y address (internal column address CA) applied from column address buffer 103 shown in FIG. 3, and generates a signal for selecting a corresponding column in memory cell array 104. Column selecting circuit 106 shown in FIG. 1 further includes IO gate responsive to the selecting signal from column decoder 234 for connecting the corresponding column in memory cell array 104 to I/O line 236. The IO gate is not shown in FIG. 4.

Input/output circuit 108 shown in FIG. 1 includes a preamplifier 240 activated in response to a preamplifier enable signal PAE applied from read controller 218 shown in FIG. 3, amplifying internal read data on I/O line 23 and transmitting the amplified data to read data bus 245; an output buffer 242 activated in response to a main amplifier output enable signal OEM from read controller 218 (see FIG. 3), amplifying a signal on read data bus 245 for generating and outputting external read data Q; an input buffer 244 responsive to an input data latch signal DL from write controller 219 shown in FIG. 3 for latching external write data D and providing the data onto write data bus 249; and a write driver 246 activated in response to a write driver enable signal WDE from write controller 219 shown in FIG. 3 for outputting internal write data onto the I/O line 236 in accordance with the internal write data on the write data bus 249.

FIG. 4 further shows a Vbb generator 250, a Vcc/2 generator 255 and a Vpp generator 256 for generating reference voltages of the DRAM. Vbb generator 250 generates a negative voltage Vbb by charge pump operation and applies the voltage to a substrate (or well) region. Application of the negative voltage Vbb to the substrate region attains the following effects.

(1) Negative voltage Vbb is applied to a p type substrate region (well region) in which an n channel MOS transistor (insulated gate type field effect transistor) is formed. Even when there occurs an undershoot in the signal applied to external signal input terminal, entrance of electrons from the input terminal to p type substrate region can be prevented, and thus destruction of the memory cell data by the entrance of electrons can be prevented.

(2) PN junction capacitance formed between highly doped N+ region and the p substrate region of the n channel MOS transistor can be reduced, whereby speed of internal operation can be increased.

(3) Substrate effect on the threshold voltage of the n channel MOS transistor can be reduced, and the circuit operation can be stabilized.

(4) Generation of a parasitic MOS transistor formed between signal lines and substrate region can be suppressed.

Vcc/2 generator 255 generates a potential of one half that of power supply voltage Vcc. The intermediate potential Vcc/2 from Vcc/2 generator 255 is applied to the other electrode (cell plate) of the memory cell capacitor, and it is also utilized for precharging the bit lines to the intermediate potential Vcc/2 at the stand-by state.

Vpp generator 256 generates a voltage Vpp which is higher than the power supply voltage Vcc. This high voltage Vpp is used for boosting the selected word line to a high voltage level.

In the structure shown in FIG. 4, the row circuits include row decoder 230 and sense amplifier 232. Column circuits include column decoder 234, preamplifier 240, output buffer 242, input buffer 244 and write driver 246. Vbb generator 250 and Vcc/2 generator 255 constantly generate prescribed voltages, independently of the row and column related signals.

Figure 5:
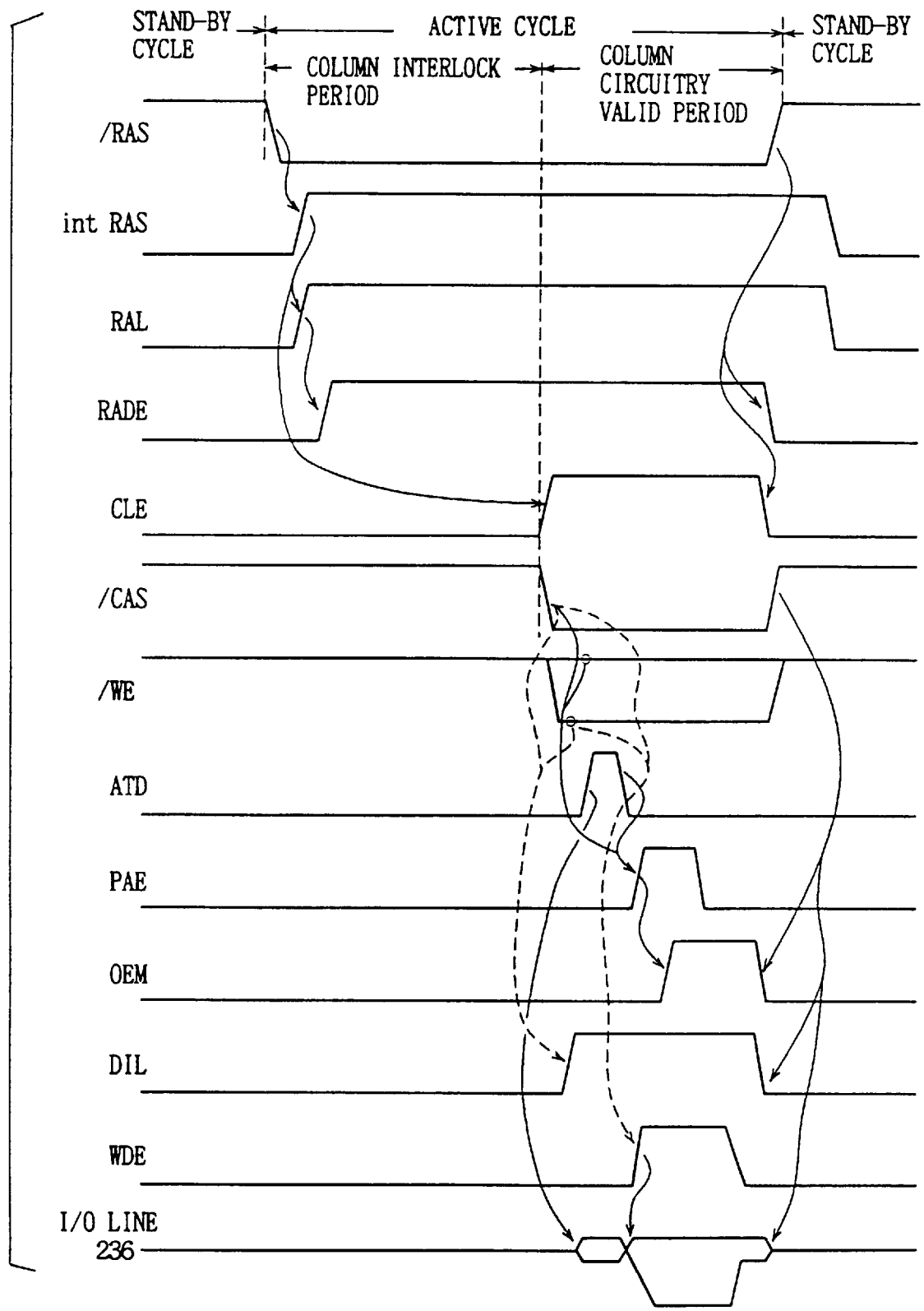
FIG. 5 is a diagram of waveforms showing the operation of the circuits shown in FIGS. 3 and 4.

FIG. 5 shows a sequence of generation of the control signals shown in FIGS. 3 and 4. Operations of various circuits will be described with reference to FIGS. 3 to 5.

In the stand-by cycle, external row address strobe signal /RAS is at a high level. In this state, internal RAS signal, row address latch signal RAL and row address enable signal RADE are all at the low level of inactive state. The column enable signal (interlock signal) CLE for activating column selecting operation is also at the inactive state of low level. Column address strobe signal /CAS and write enable signal /WE are at a high level. Control signals ATD, PAE, OEM, DIL and WDE of the column related signals are all at the inactive state of low level. The I/O line is precharged at a prescribed potential level (Vcc-Vth).

When row address strobe signal /RAS falls to the low level, an active cycle starts. In response to the fall of the row address strobe signal /RAS, internal RAS signal rises to the high level of active state, and in response to the rise of the internal RAS signal, row address latch signal RAL rises to the high level. In response to the rise of the row address latch signal RAL, row address buffer 101 shown in FIG. 3 latches the applied address signal Ai–A0. Then, row address enable signal RADE attains to the high level and activated, and from row address buffer 101, an X address (internal row address signal RA) corresponding to the latched address signal is generated. Until completion of selection of a word line in the memory cell array 104 in accordance with the X address, rise of the selected word line potential to the high level and sensing operation by sense amplifier 232, column enable signal CLE is kept at the inactive state of low level.

After all the operations of the row circuits are completed and the data of the memory cell connected to the selected word line is detected, amplified and latched by sense amplifier 232, column enable signal CLE rises to the high level, that is, to the active state. By the rise of column enable signal CLE to the high level, column interlock period terminates, and column circuitry valid period starts.

In the column circuitry valid period, column address strobe signal /CAS falls, column address latch signal CAL and column address enable signal CADE are successively set to the high level, and the Y address (internal column address signal CA) is generated from column address buffer 103. In accordance with the Y address from column address buffer 103, an address transition detecting signal ATD is generated from ATD circuit 216, and in accordance with the address transition detecting signal ATD, a column decoder enable signal CDE is generated from read controller 218 or write controller 219. For simplicity of drawing, column address latch signal CAL, column address enable signal CADE and column decoder enable signal CDE are not shown in FIG. 5. Column address latch signal CAL and column address enable signal CADE are generated in response to the internal CAS signal which is generated in accordance with column address strobe signal /CAS, and column decoder enable signal CDE is generated in response to the rise of the address transition detecting signal ATD.

In response to the column decoder enable signal CDE, column decoder 234 decodes the Y address, and selects a column in the memory cell array 104 corresponding to the Y address. Consequently, memory cell data which has been transmitted to the selected column is transmitted to the I/O line 236, resulting in a change in the potential of the I/O line 236. In response to the column decoder enable signal CDE, I/O line 236 is released from the precharged state, and set to an electrically floating state.

In response to the fall of address transition detecting signal ATD, preamplifier enable signal PAE rises to the high level, preamplifier 240 is activated, and it amplifies the signal appearing on I/O signal 236, and transmits the signal to read data bus 245. Main amplifier output enable signal OEM from read controller 218 rises to the high level, output buffer 242 is activated, amplifies the data on read data bus 245, and generates and outputs an external data Q.

Meanwhile, in data writing, in response to signals /CAS and /WE, input data latch signal DIL rises to the high level, input buffer 244 latches external write data D and transmits the data to write data bus 249. Then, in response to signals /WE and /CAS, write driver enable signal WDE rises to and is kept at the high level for a prescribed time period, and write driver 246 is activated, generates internal write data from the data on write data bus 249 and transmits the data to I/O line 236.

When column address strobe signal /CAS rises to the high level, data write/read cycle for one memory cell completes, signals OEM and DIL fall to the low level, and I/O line 236 returns to the precharge potential.

When external row address strobe signal /RAS rises to the high level, an active cycle is completed, and in response to the rise of external row address strobe signal /RAS, both the row address enable signal RADE and the column enable signal CADE attain to the low level, that is, inactive state. Then, internal RAS signal and row address latch signal RAL fall to the low level. In the period from the rise of the external row address strobe signal /RAS to the high level until the fall of the internal RAS signal to the low level, control signals of the row circuitry are all returned to the initial state. In the column circuitry valid period, row circuitry control signals are all maintained at prescribed states. Column related control signals are maintained at the initial state in the column interlock period, and changes in the column circuitry valid period. Namely, in the DRAM, logic levels of both the row related control signals and column related control signals are predictable in certain operation periods. The present embodiment utilizes this fact.

Figure 6:
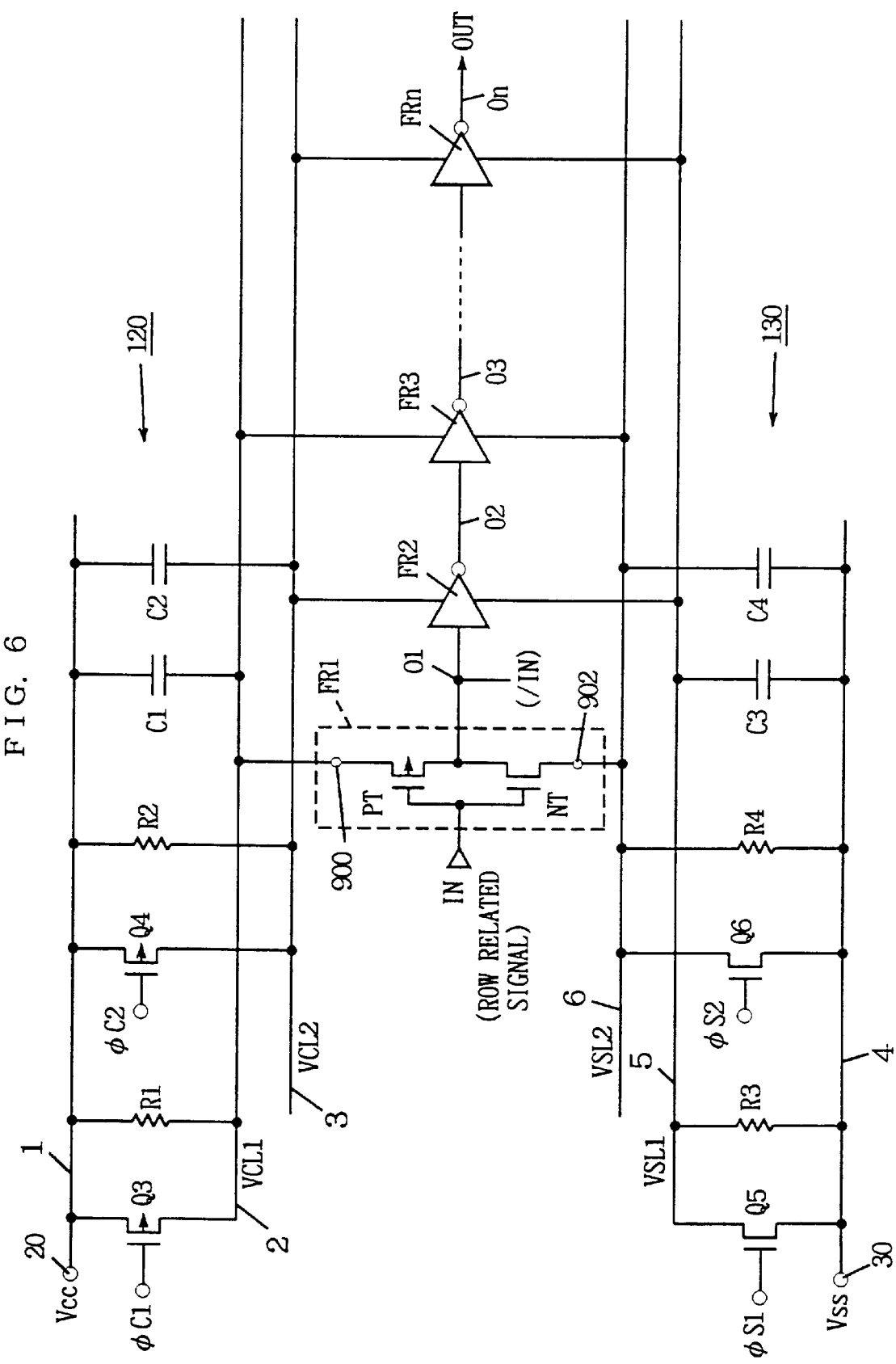
FIG. 6 shows a structure of a power supply circuit in accordance with the first embodiment of the present invention.

FIG. 6 shows structures of the power supply voltage supplying circuit and the ground voltage supplying circuit shown in FIG. 1. FIG. 6 shows a structure of the voltage supplying circuits related to the row related circuits. Referring to FIG. 6, the row circuits are represented by n stages of cascade connected inverters FR1 to FRn. An input signal IN is a row related control signal which attains to the low level in the stand-by cycle, changes to the high level in the active cycle and maintained at the high level in the column circuitry valid period. The number of inverters may be one and the inverters may be replaced by other multi-input logic gates (which will be described later).

The inverters FR1 to FRn have a structure of a CMOS inverter. More specifically, in each of the inverters FR1 to FRn includes a p channel MOS transistor PT which is rendered conductive when a signal applied at its input node is at the low level and transmits a voltage applied to one power supply node 900 to an output node (O1–On; and an n channel MOS transistor NT which is rendered conductive when a signal applied to each input node is at the high level and discharges the output node (O1–On) to a voltage level applied to the other power supply node 902.

Power supply voltage supplying circuit 120 includes a first main power supply line 1 for transmitting the power supply voltage Vcc which has been supplied to a first power supply node 20, and variable impedance power supply lines 2 and 3 arranged parallel to the first main power supply line 1. Though power supply lines 1 and 2 may be referred to as main and subpower supply lines for first to third power supply lines in claims of the present application, these power lines will be referred to as main power supply lines and variable impedance power supply lines in the following description.

The first variable impedance power supply line 2 is connected to the first main power supply line 1 by means of resistance R1, and the second variable impedance power supply line 3 is connected to the first main power supply line 1 through resistance R2. A p channel MOS transistor Q3 which is rendered conductive in response to control signal φc1 for connecting the first main power supply line 1 and the first variable impedance power supply line 2 is provided parallel to resistance R1. A p channel MOS transistor Q4 which is rendered conductive in response to control signal φc2 for connecting the first main power supply line 1 and the second variable impedance power supply line 3 is provided parallel to resistance R2. A stabilizing capacitor C1 having relatively large capacitance for maintaining stably the potential of the second variable impedance power supply line 2 is provided between the first main power supply line 1 and the first variable impedance power supply line 2. A stabilizing capacitor C2 having relatively large capacitance for maintaining stably potential of the second variable impedance power supply line is provided between the first main power supply line 1 and the second variable impedance power supply line 3.

Resistances R1 and R2 have sufficient resistances to generate voltage drop to the second and third variable impedance power supply lines 2 and 3 by the current flowing therethrough. However, in order to reduce current consumption, they are set to relatively high resistance values (in the order of 1 KΩ to 1 MΩ, for example). MOS transistors Q3 and Q4 each have current supplying capability large enough to supply current to the p channel MOS transistor of each of inverters FR1 to FRn, and the channel width W is set to a sufficiently large value. On-resistances of MOS transistors Q3 and Q4 are set sufficiently smaller than the resistances R1 and R2, at such values that cause negligible voltage drop by the on-resistances. As resistances R1 and R2, an MOS transistor having high on-resistance or an MOS transistor having so long a channel length L as to serve as a resistance may be used.

Ground voltage supplying circuit 130 includes a second main power supply line (hereinafter referred to as the main ground line) 4 for transmitting the other power supply voltage (ground voltage) Vss applied to a second power supplied node 30, and first and second variable impedance ground lines 5 and 6 arranged parallel to the main ground line 4. Though ground lines 4 to 6 may be often referred to as the second main power supply line and third and fourth subpower supply lines in the claims, they will be referred to as the main ground line and first and second variable impedance ground lines in the following description.

The first variable impedance ground line 5 is connected to main ground line 4 through a resistance R3, and second variable impedance ground line 6 is connected to main ground line 4 through a resistance R4. An n channel MOS transistor Q5 which is rendered conductive in response to a control signal φs1 for connecting first variable impedance ground line 5 to main ground line 4 is provided parallel to resistance R3. An n channel MOS transistor Q6 which is rendered conductive in response to a control signal φs2 for connecting second variable impedance ground line 6 to main ground line 4 is provided parallel to resistance R4. A capacitor C3 having large capacitance for stabilizing the potential of first variable impedance ground line 5 is provided between main ground line 4 and first variable impedance ground line 5. A capacitor C4 having large capacitance for stabilizing the potential of second variable impedance ground line 6 is provided between main ground line 4 and second variable impedance ground line 6. Resistances R3 and R4 have high resistance values. More specifically, resistances R3 and R4 have resistance values high enough to maintain the potentials of variable impedance ground lines 5 and 6 at a voltage level higher than the ground voltage Vss. The resistance values of resistances R3 and R4 are in the order of 1 KΩ to 1 MΩ, as the resistances R1 and R2. MOS transistors Q5 and Q6 have current drivability sufficient to absorb all the discharge currents of inverters FR1 to FRn and they have sufficiently large channel width W. On resistances of MOS transistors Q5 and Q6 are sufficiently small, and set at negligible values as compared with the resistance values of resistances R3 and R4. Resistances R3 and R4 may be implemented by using MOS transistors as resistance elements.

Of the inverters FR1 to FRn, inverters of the odd-numbered stages, that is, FR1, FR3, . . . have one power supply node 900 connected to the first variable impedance power supply line 2 and the other power supply node 902 connected to the second variable impedance ground line 6. Inverters of the even-numbered stages, that is, FR2, FRn (n is assumed to be an even number) have one power supply node 900 connected to the second variable impedance power supply line 3 and the other power supply node 902 connected to the first variable impedance ground line 5.

Figure 7:
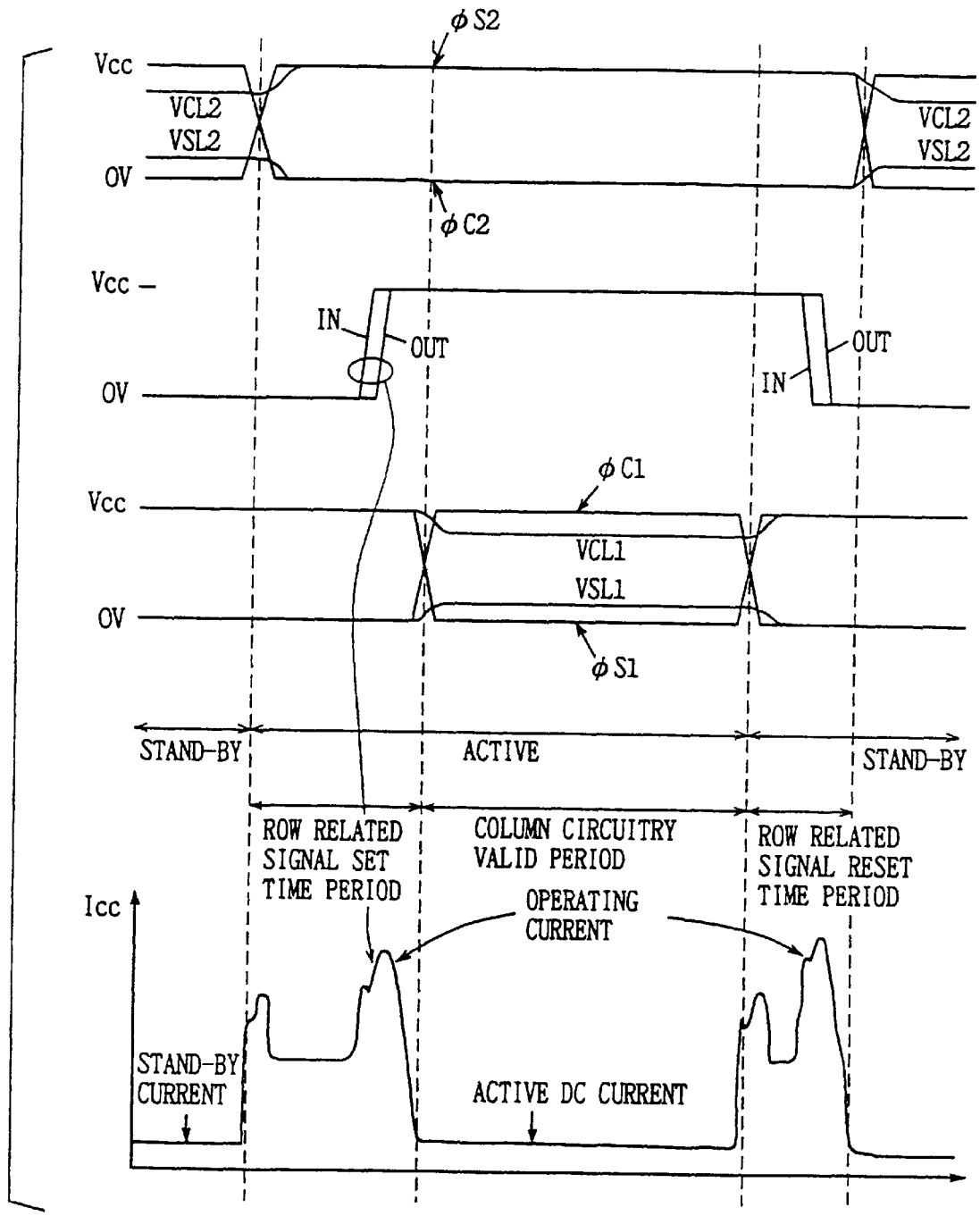
FIG. 7 is a diagram of signal waveforms showing the operation of the power supply circuit shown in FIG. 6.

FIG. 7 is a diagram of signal waveforms showing the operation of the circuit shown in FIG. 6. The operation will be described with reference to FIGS. 6 and 7.

In the stand-by cycle, input signal IN is at the low level which is at the level of the ground voltage Vss. Control signal φc1 is at the level of the ground voltage Vss, control signal φs1 is at the level of the power supply voltage Vcc, and MOS transistors Q3 and Q5 are both on. Accordingly, the voltage VCL1 on the first variable impedance power supply line 2 is at the level of the power supply voltage Vcc, while the voltage VSL1 on the first variable impedance ground line 5 is at the level of the ground voltage Vss. Meanwhile, control signal φs2 is at the level of the ground voltage Vss (0 V), and control signal φc2 is at the level of the power supply voltage Vcc. At this state, MOS transistors Q4 and Q6 are both off, the power supply voltage Vcc is supplied through resistance R2 from main power supply line 1 to the second variable impedance power supply line 3, and the voltage VCL2 on the second variable impedance power supply line 3 attains to a voltage level lower than the power supply voltage Vcc. The voltage VCL2 is represented as Vcc−Ia·R2. Ia represents current flowing through resistance R2. Meanwhile, the second variable impedance ground line 6 is connected to the main ground line 4 through resistance R4. Therefore, the voltage on the second variable impedance ground line 6 becomes higher than the ground voltage Vss. Namely, VSL2=Vss+Ib·R4, where Ib represents current flowing through resistance R4.

Figure 61:
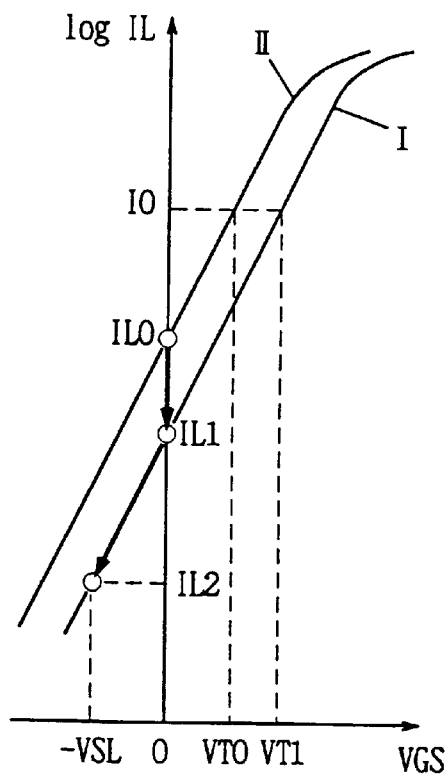
FIG. 61 shows a subthreshold current characteristic of an MOS transistor.
Figure 62:
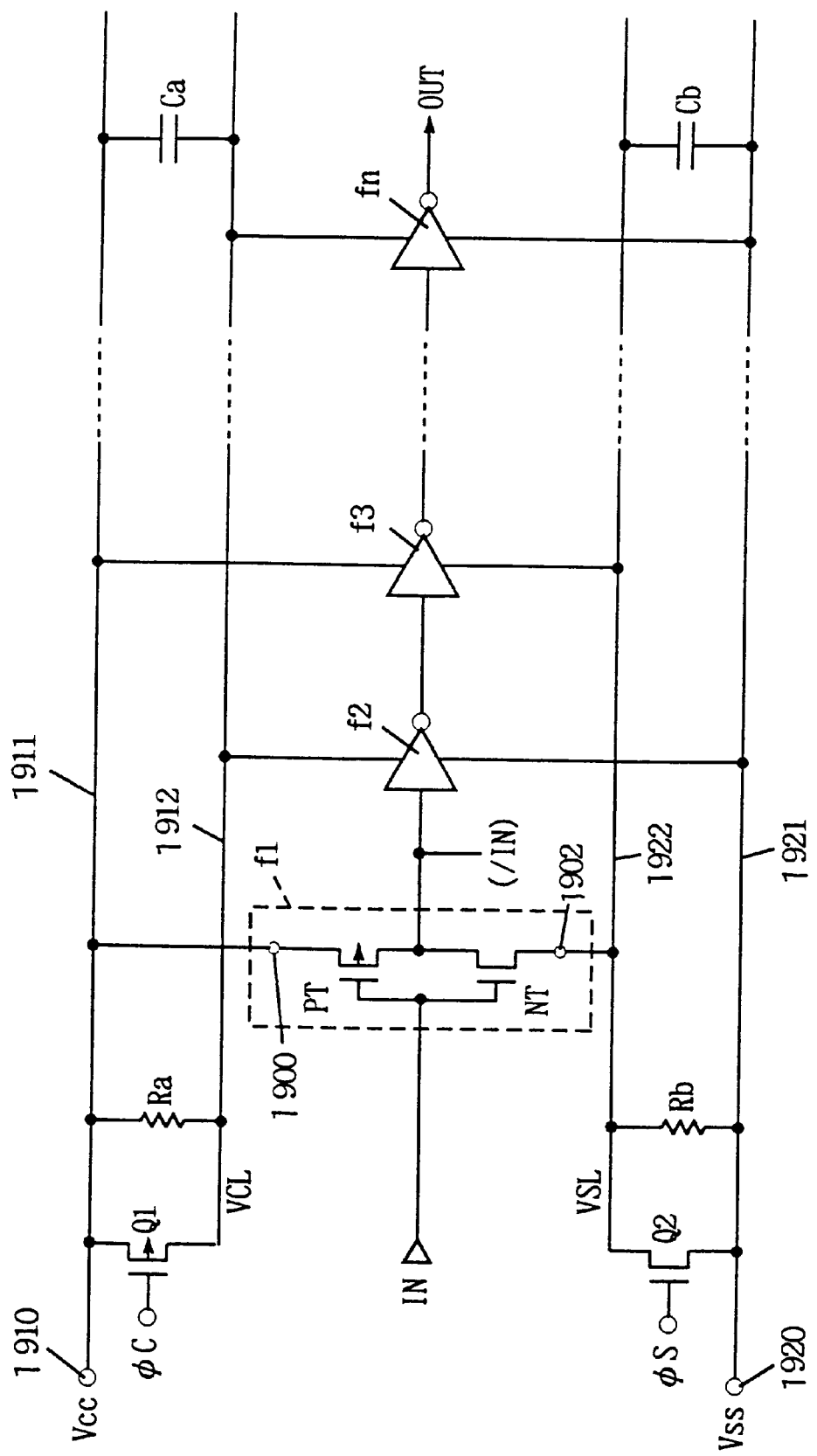
FIG. 62 shows a structure of a conventional variable impedance power supply line.
Figure 63:
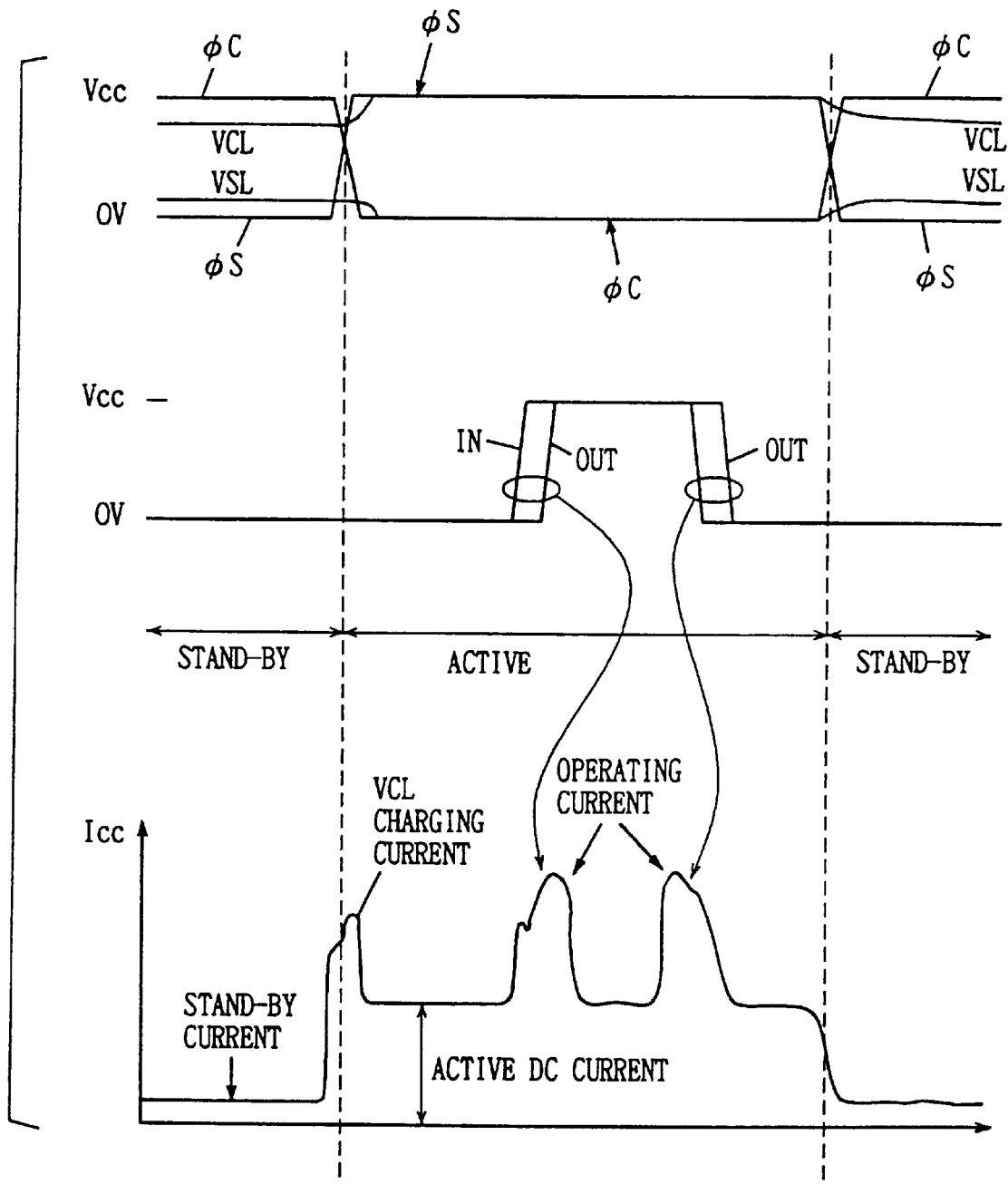
FIG. 63 is a diagram of signal waveforms showing the operation of the power supply circuit shown in FIG. 62.

In inverter FR1, p channel MOS transistor PT turns on in accordance with the input signal IN which is at the level of the ground voltage Vss, and output node O1 is charged to the level of the power supply voltage VCL1. The voltage VCL1 is at the level of the power supply voltage Vcc, and therefore output node O1 attains to the power supply voltage Vcc level. Meanwhile, n channel MOS transistor NT is off as the input signal IN is at the level of the ground voltage Vss, and thus the transistor NT operates in the subthreshold region. At this time, the voltage VSL2 on the second variable impedance ground line 6 is at a voltage level higher than the ground voltage Vss level. Therefore, the source voltage of the n channel MOS transistor NT becomes higher than the gate voltage, n channel MOS transistor NT is turned more strongly off, and thus subthreshold current is suppressed (see FIG. 61; VGS attains negative).

In inverter FR2, the voltage level at node O1 is at the level of the power supply voltage Vcc. Therefore, p channel MOS transistor PT turns off and operates in the subthreshold region. The voltage VCL2 on the second variable impedance power supply line 3 is at a voltage level lower than the power supply voltage Vcc. Therefore, p channel MOS transistor PT (in inverter FR2) is more strongly turned off, and subthreshold current in the p channel MOS transistor PT can be suppressed. The n channel MOS transistor of inverter FR2 receives at its gate a voltage at the level of the power supply voltage Vcc, and discharges the output node O2 to the level of the voltage VSL1 on the first variable impedance ground line 5. The voltage VSL1 on the first variable impedance ground line 5 is at the level of the ground voltage Vss. Therefore, the output node O2 attains to the level of the ground voltage Vss. Similar operation takes place in the inverters FR3 to FRn of the succeeding stages, MOS transistors operating in the subthreshold region are strongly turned off to suppress subthreshold current, and by the MOS transistors which are on, the potentials at output nodes O3 to On are set to the level of the power supply voltage Vcc or the level of the ground voltage Vss. Therefore, output signal OUT is maintained at the level of the power supply voltage Vcc (where n is an even number). More specifically, the p channel MOS transistor receiving at its gate a signal at the level of the power supply voltage Vcc has its source potential smaller than the level of the power supply voltage Vcc, hence it turns more strongly off, whereby the subthreshold current is reduced. Meanwhile, the n channel MOS transistor receiving at its gate a signal at the level of the ground voltage Vss has its source voltage set higher than the level of the ground voltage Vss. Therefore, it is turned more strongly off, reducing subthreshold current.

An active cycle is divided into two periods. More specifically, row related signal set time period or column interlock period, and the column circuitry valid period in which logic levels of all row related signals are maintained. In the active cycle period, control signal φs2 is set to the high level which is the level of the power supply voltage Vcc, and control signal φc2 is set to the low level which is at the level of the ground voltage Vss. Meanwhile, in the row related signal set time period, control signals φc1 and φs1 are maintained at the level of the ground voltage Vss and of the power supply voltage Vcc, respectively. At this state, MOS transistors Q3 to Q6 are all on, and voltages VCL1 and VCL2 on variable impedance power supply lines 2 and 3 both attain to the level of the power supply voltage Vcc. Voltages VSL1 and VSL2 on variable impedance ground lines 5 and 6 both attain to the level of the ground voltage Vss. In this row circuitry set time period, input signal IN rises from the ground voltage Vss level to the power supply voltage Vcc level, and in response, potentials of output nodes O1 to On change. As the input signal IN changes, operating current flows through MOS transistors which are turned on. In the period prior to the change in the input signal IN, relatively large current flows because of charging of power supply line VCL2, and thereafter MOS transistors Q3 to Q6 are all turned on, so that a relatively large DC current (active DC current) flows.

When input signal IN rises to the high level and the voltage level is stabilized, row related signal set period terminates and the column circuitry valid period starts. In other words, the column interlock period terminates and column related circuits start operation. In the column circuitry valid time period, control signal φs1 is again set to the ground voltage Vss level, and control signal φc1 is set to the power supply voltage Vcc level. Control signals φc2 and φs2 are maintained at the level of the ground voltage Vss and of the power supply voltage Vcc, respectively. At this state, MOS transistors Q3 and Q5 are turned off, while MOS transistors Q4 and Q6 are kept on. Therefore, in the column circuitry valid period, power supply voltage Vcc is transmitted to the variable impedance power supply line 2 through resistance R1, so that voltage VCL1 becomes lower than the level of the power supply voltage Vcc, while the voltage VCL on the second variable impedance power supply line 3 is maintained at the level of the power supply voltage Vcc, because of the MOS transistor Q4.

Because of resistance R3, voltage VSL1 on the first variable impedance ground line 5 becomes higher than the level of the ground voltage Vss. The voltage VSL2 on the second variable impedance ground line 6 is maintained at the level of the ground voltage Vss. In inverter FR1, the input signal IN is at a high level of the power supply voltage Vcc, p channel MOS transistor PT has its source potential lower than the gate potential and thus turns more strongly off, whereby subthreshold current is reduced. Meanwhile, n channel MOS transistor NT turns on, maintaining the output node O1 at the level of the ground voltage Vss (=VSL2). In inverter FR2, because of the voltage at the level of the ground voltage Vss at node O1, p channel MOS transistor is on, maintaining the output node O2 at the level of the power supply voltage Vcc (=VCL2). In inverter FR2, source potential of the n channel MOS transistor is VSL1 (>Vss) which is higher than the voltage applied to the gate, and thus it is more strongly turned off, suppressing subthreshold current. The same applies to the inverters FR3 to FRn of the succeeding stages. The subthreshold current in the column circuitry valid time period is suppressed, and the active DC current consumed by the row related circuits can be reduced to the current level approximately the same as that in the stand-by cycle.

When an active cycle completes, a stand-by cycle starts. At the start of the stand-by cycle, the row related signals which have been set at the high level return to the original low level. In the row related signal reset time period, control signal φc1 is set to the level of the ground voltage Vss, and control signal φs1 is set to the level of the power supply voltage Vcc. Control signal φs2 maintains the power supply voltage Vcc level, and control signal φc2 maintains the ground voltage Vss level. At this stage, MOS transistors Q3 to Q6 are again all turned on. At this state, voltages VCL1 and VCL2 are at the level of the power supply voltage Vcc, and voltages VSL1 and VSL2 are at the level of the ground voltage Vss. Consequently, in response to the fall of the input signal IN from the high level to the low level, inverters FR1 to FRn have the potential levels of output nodes O1 to On changed at high speed, to the initial state.

When row related signal reset time period completes, control signal φs2 is set to the level of the ground voltage Vss and control signal φc2 is set to the level of the power supply voltage Vcc. MOS transistors Q4 and Q6 are turned off, and MOS transistors Q3 and Q5 are turned on. Voltage VCL2 becomes lower than the level of the power supply voltage Vcc, while the voltage VSL2 becomes higher than the level of the ground voltage Vss. The voltage VCL1 is at the level of the power supply voltage Vcc, and the voltage VSL2 is at the level of the ground voltage Vss. The device waits for the start of the next active cycle at this state.

As described above, by appropriately turning on or off the MOS transistors Q3 to Q6 in accordance with the operation periods, the impedances of power supply lines 2 and 3 and ground lines 5 and 6 can be changed, whereby operating power supply voltage level of inverters FR1 to FRn can be changed. Therefore, subthreshold current can be surely suppressed.

In the description of the operation above, the input signal IN is at the low level in the stand-by cycle, and it changes to the high level in the active cycle. As for a signal which attains to the high level in the stand-by cycle and changes to the low level in the active cycle, an input signal /IN may be used in FIG. 6, and manner of generation of control signals φc1, φc2, φs1 and φs2 need not be changed. An operation when the input signal is at the high level in the stand-by cycle and changes to the low level in the active cycle will be briefly described.

Figure 8A:
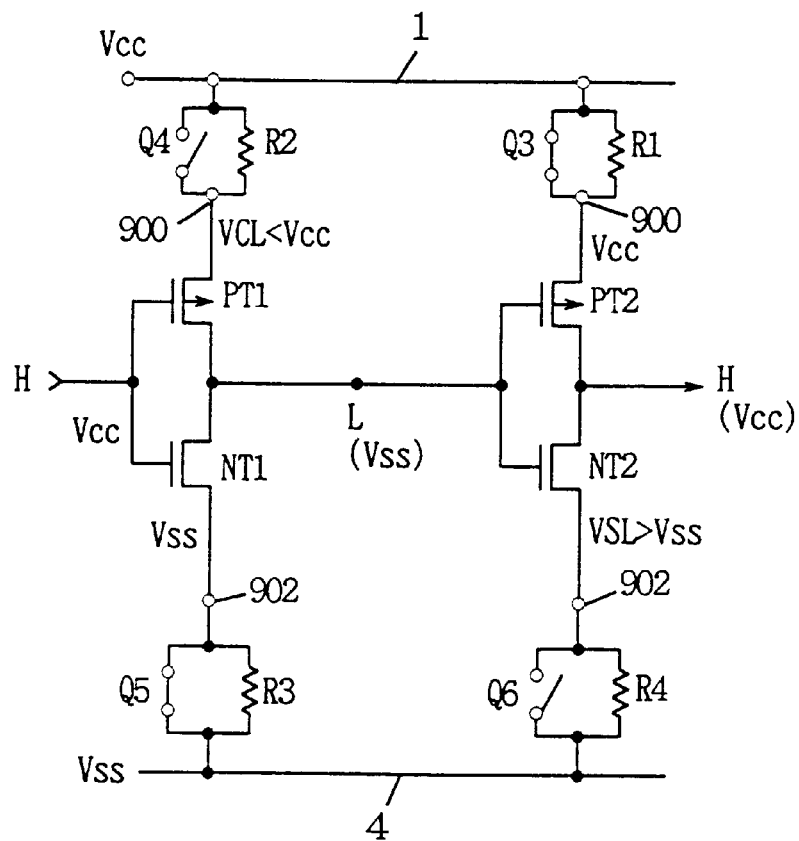
FIGS. 8A and 8B are illustrations facilitating understanding of the operation of the power supply circuit shown in FIG. 6.
Figure 8B:
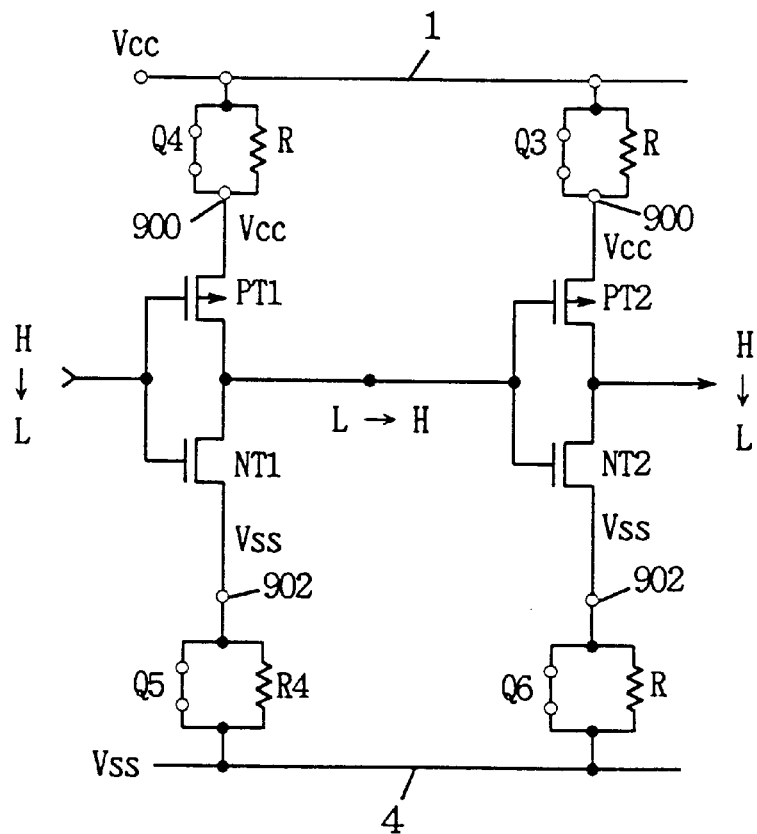

FIGS. 8A and 8B show voltage levels at various nodes when row circuitry is formed by CMOS inverters. The inverter of the first stage consists of a p channel MOS transistor PT1 and an n channel MOS transistor NT1, and the inverter of the second stage consists of a p channel MOS transistor PT2 and an n channel MOS transistor NT2. The p channel MOS transistor PT1 receives the power supply voltage Vcc from the main power supply line 1 through resistance R2 and MOS transistor Q4, while the n channel MOS transistor NT1 receives the ground voltage Vss from the main ground line 4 through resistance R3 and MOS transistor Q5. MOS transistor PT2 receives the power supply voltage Vcc from the main power supply line 1 through resistance R1 and MOS transistor Q3, while n channel MOS transistor NT2 receives the ground voltage Vss from the main ground line 4 through resistance R4 and MOS transistor Q6.

As shown in FIG. 8A, in the stand-by cycle, the input signal is at the high level, MOS transistors Q4 and Q6 are off, and MOS transistors Q3 and Q5 are on. The source potential of p channel MOS transistor PT1 is at VCL (<Vcc), and the source voltage of the n channel MOS transistor NT1 is at the ground voltage Vss. The source potential of p channel MOS transistor PT2 is at the level of the power supply voltage Vcc, and the source potential of the n channel MOS transistor NT2 is at VSL (>Vss). The input signal is at a high level which is at the level of the power supply voltage Vcc, n channel MOS transistor NT1 turns on, and the output node attains to the low level, which is at the level of the ground voltage Vss. At this time, since the gate potential of p channel MOS transistor PT1 is higher than the source potential, it is more strongly turned off, suppressing the subthreshold current. The p channel MOS transistor PT2 receives at its gate a low level potential, and provides a high level signal at the level of the power supply voltage Vcc. Since the gate potential of n channel MOS transistor NT2 is lower than the source potential, it is turned more strongly off, suppressing subthreshold current.

Referring to FIG. 8B, in the row related signal set time period, MOS transistors Q3 to Q6 are all turned on. The source potential of p channel MOS transistors PT1 and PT2 is at the level of the power supply voltage Vcc, and the source potential of n channel MOS transistors NT1 and NT2 is at the level of the ground voltage Vss. At this state, the input signal changes from the high level to the low level, and in response to the change in the input signal, the output signal from the inverter changes.

Figure 9A:
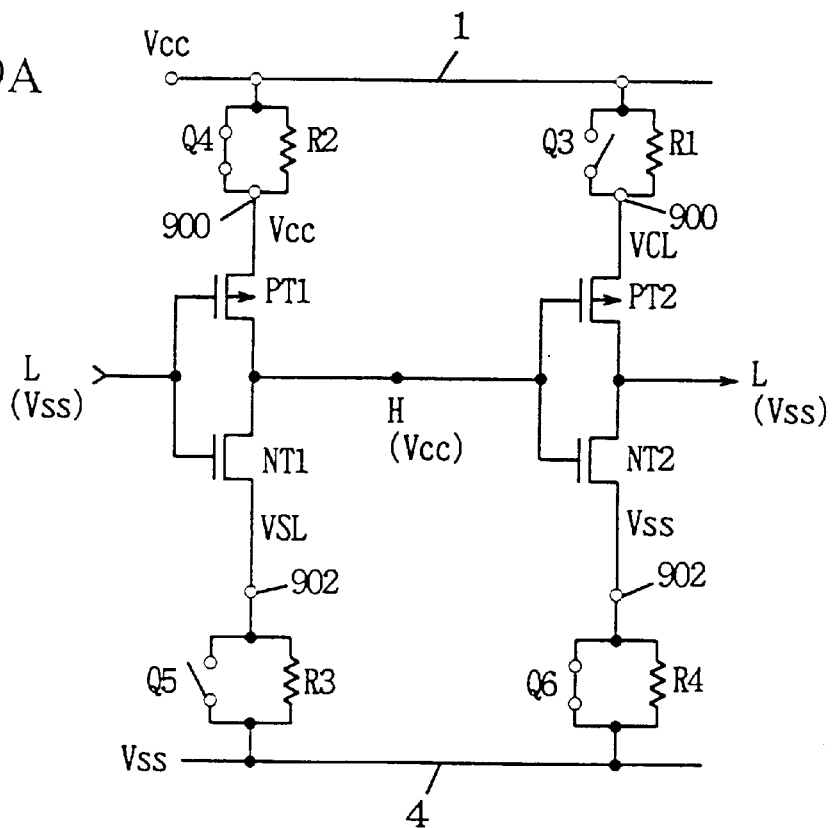
FIGS. 9A and 9B are illustrations facilitating understanding of the operation of the power supply circuit shown in FIG. 6.

Referring to FIG. 9A, in the column circuitry valid period, the input signal is at a low level of the ground voltage Vss level, and in this period, the logic level of the input signal does not change. At this state, MOS transistors Q3 and Q5 are off and MOS transistors Q4 and Q6 are on. The source potential of the n channel MOS transistor NT1 attains to the level of the voltage VSL (>Vss), and the source potential of p channel MOS transistor PT2 attains to the level of the voltage VCL (<Vcc). The source potential of p channel MOS transistor PT1 is at the level of the power supply voltage Vcc, and the source potential of n channel MOS transistor NT2 is at the level of the ground voltage Vss. In this state, n channel MOS transistor NT1 and p channel MOS transistor PT2 are turned more strongly off, suppressing subthreshold current. The voltage levels of the output signals from respective inverters are maintained at the power supply voltage Vcc level or the ground voltage Vss level through MOS transistors (PT1 and NT2) which are on.

Figure 9B:
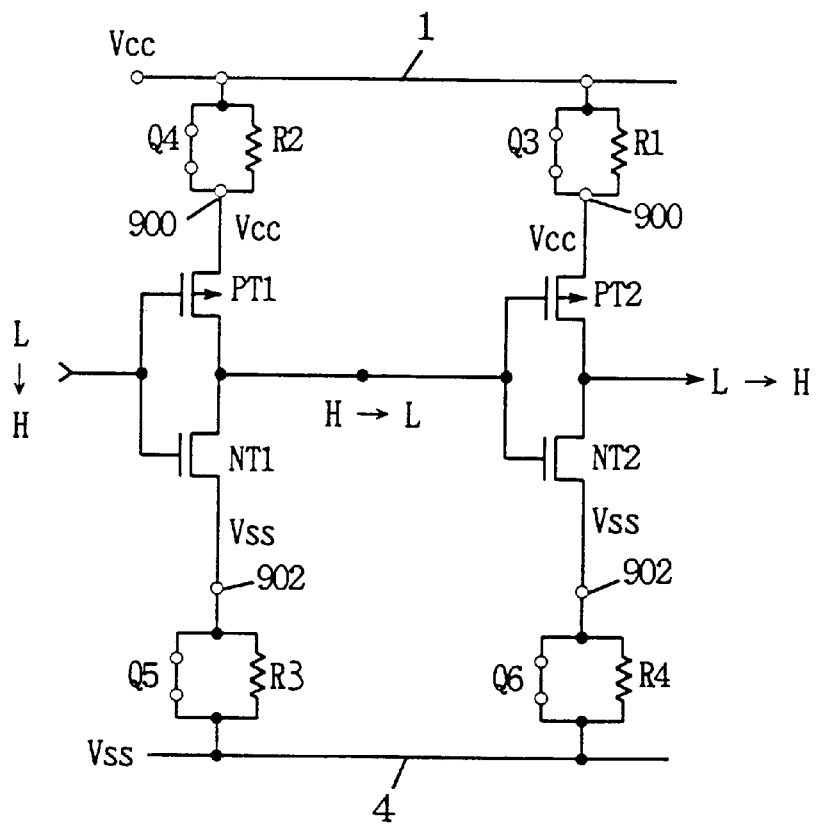

Referring to FIG. 9B, in the row related signal reset time period, MOS transistors Q3 to Q6 are all turned on, and in response to the change of the logic level of the input signal, the inverter changes the logic level of the low level output signal. When this state completes, the operation changes to the stand-by cycle shown in FIG. 8A.

As described above, even when the input signal is at a high level in the stand-by cycle and low level in the active cycle, the subthreshold current can be suppressed by turning more strongly off the MOS transistor which operates in the subthreshold region.

Figure 10:
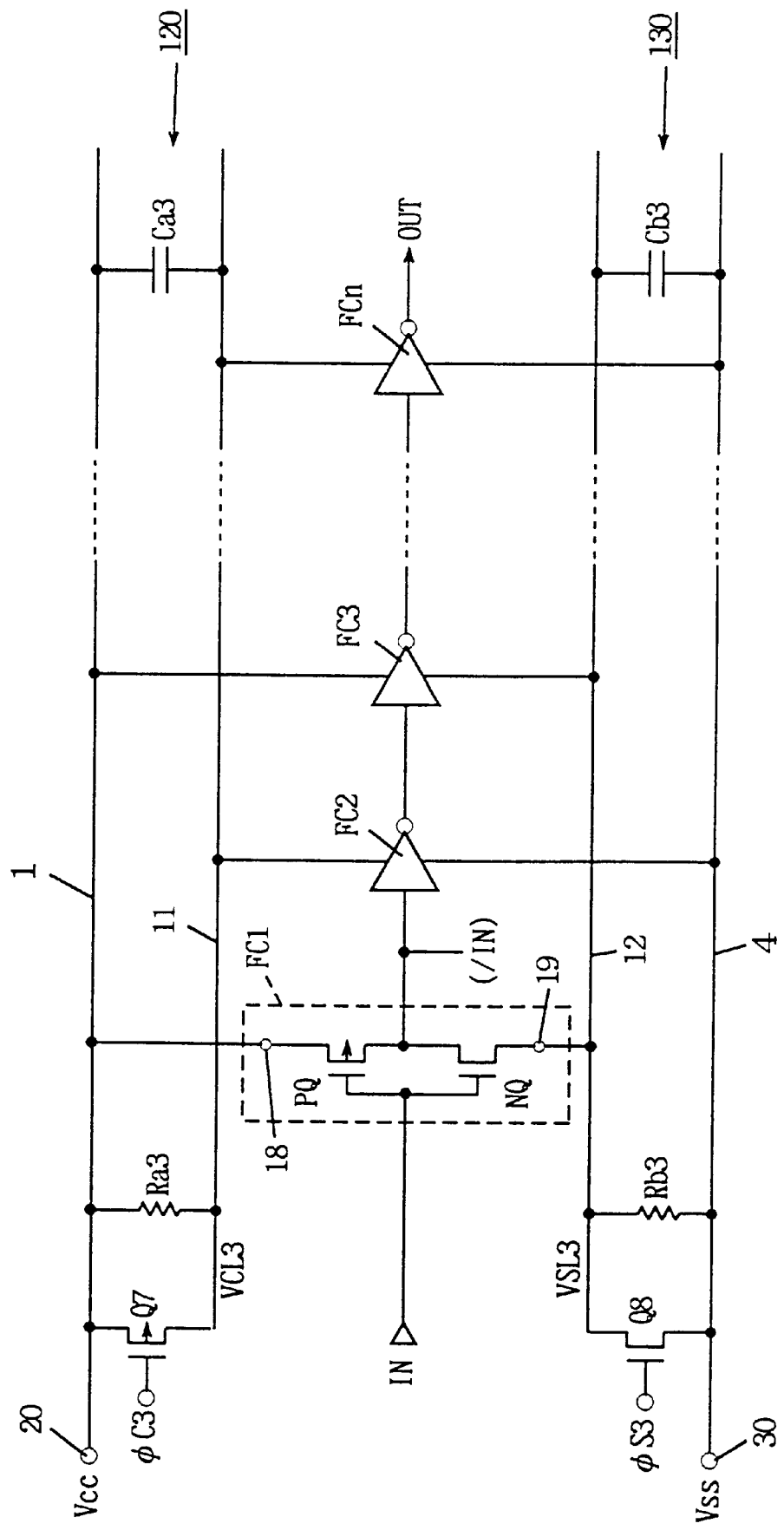
FIG. 10 shows a structure of a power supply circuit for a column related circuit in accordance with one embodiment of the present invention.

FIG. 10 shows structures of a power supply voltage and ground voltage supplying circuit for the column circuits. Referring to FIG. 10, n stages of cascade connected CMOS inverters are shown as the column circuits. Each of the CMOS inverters FC1 to FCn (n is an even number) includes a p channel MOS transistor PQ and an n channel MOS transistor NQ.

A power supply voltage supplying circuit 120 includes a main power supply line 1 connected to a first power supply node 20; a variable impedance power supply line 11 arranged parallel to the main power supply line 1; a resistance Ra3 connecting main power supply line 1 and variable impedance power supply line 11; and a p channel MOS transistor Q7 provided parallel to resistance Ra3, which is rendered conductive in response to a control signal $\phi c3$ for connecting main power supply line 1 to variable impedance power supply line 11. Between main power supply line 1 and variable impedance power supply line 11, a capacitor Ca3 having a large capacitance for stabilizing the potential of variable impedance power supply line 11 is provided. Resistance value of resistance Ra3 is set relatively large, on-resistance of p channel MOS transistor Q7 is set sufficiently small, and current supplying capability of the transistor Q7 is set sufficiently large. Resistive connection of an MOS transistor may be used as the resistance Ra3.

A ground voltage supplying circuit 130 includes a main ground line 4 connected to a second power supply node 30, a variable impedance ground line 12 arranged parallel to the main ground line 4, a resistance Rb3 connecting variable impedance ground line 12 to main ground line 4, and an n channel MOS transistor Q8 arranged parallel to resistance Rb3, which is rendered conductive in response to control signal $\phi s3$ for connecting main ground line 4 to variable impedance ground line 12. Between variable impedance ground line 12 and main ground line 4, a capacitance Cb3 for stabilizing the potential of variable impedance ground line 12 is provided. Resistance value of resistance Rb3 is set sufficiently large, and MOS transistor Q8 has its on-resistance set sufficiently small and its current supplying capability set sufficiently large.

Figure 11:
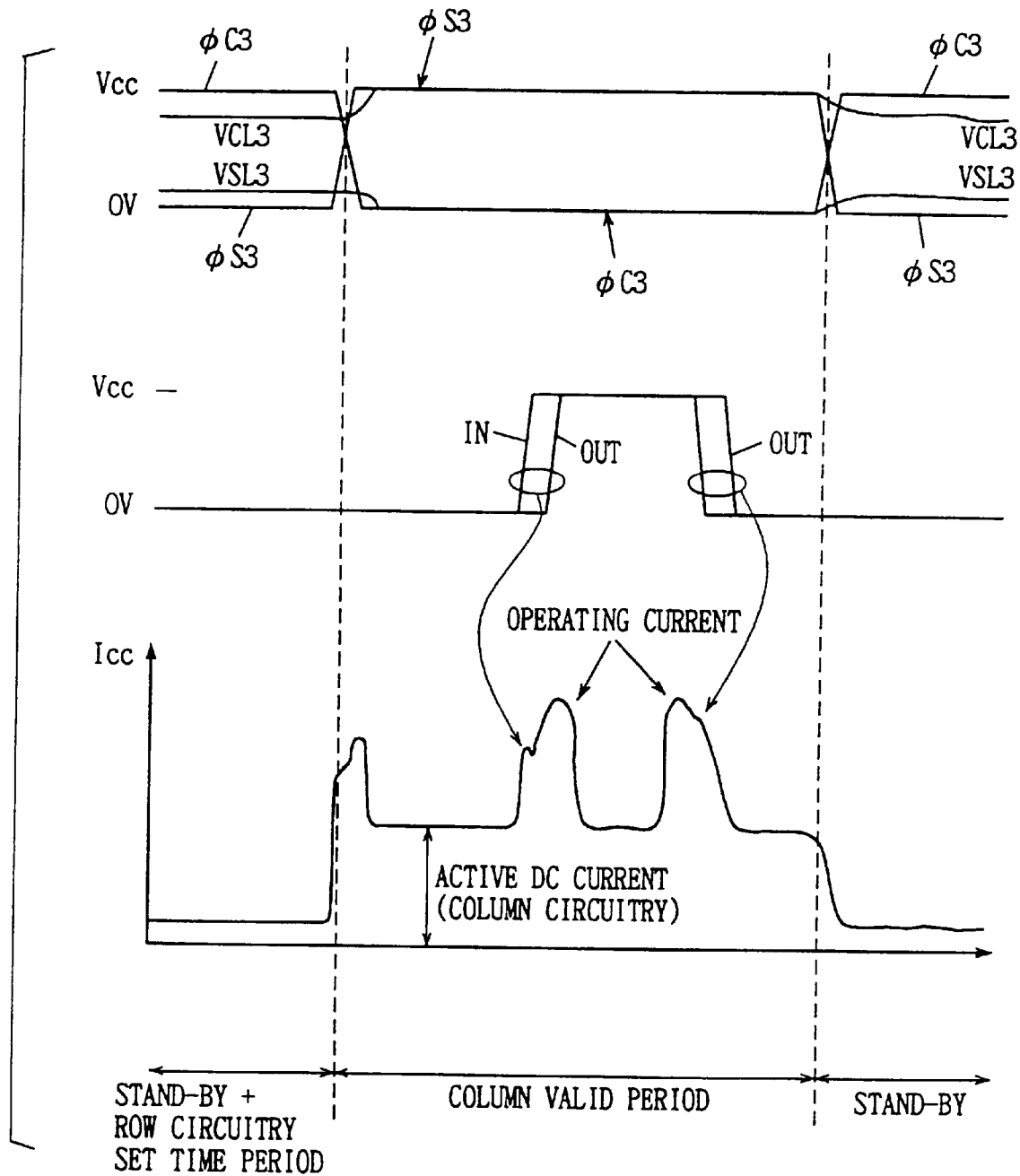
FIG. 11 is a diagram of signal waveforms showing the operation of the power supply circuit shown in FIG. 10.

In the stand-by cycle, the input signal IN is set to the low level, and it changes to the high level in the active cycle (in the column circuitry valid period). Inverters FC1, FC3 . . . of odd-numbered stages have one power supply node 18 connected to main power supply line 1 and the other power supply node 19 connected to variable impedance ground line 12. Inverters FC2 . . . , FCn of even-numbered stages have one power supply node (18) connected to variable impedance power supply line 11, and the other power supply node (19) connected to main ground line 4. The operation of the circuit shown in FIG. 11 will be described with reference to the diagram of waveforms of FIG. 11.

In the stand-by cycle and in the row circuitry set time period, control signal $\phi c3$ is at a high level of the power supply voltage level, and control signal $\phi s3$ is set to a low level of the ground voltage level. MOS transistors Q7 and Q8 are both turned off. The voltage VCL3 on variable impedance power supply line 11 becomes lower than the power supply voltage Vcc by a voltage drop across resistance Ra3 (Ia·Ra3), since the power supply voltage Vcc is supplied thereto through resistance Ra3. Meanwhile, variable impedance ground line 12 is connected to the ground line 4 through resistance Rb3, and because of the current Ib flowing through resistance Rb3, the voltage VSL3 becomes higher than the ground voltage Vss by the voltage Ib·Rb3.

Now, input signal IN is at a low level of the ground voltage Vss level, and in inverter FC1, p channel MOS transistor PQ is on and n channel MOS transistor NQ is off. The output of inverter FC1 is charged to the level of the power supply voltage Vcc by p channel MOS transistor PQ. Since the potential at the other power supply node 19 is the voltage VSL3 higher than the ground voltage Vss, n channel MOS transistor NQ has its source potential higher than the gate potential, and thus it is turned more strongly off, whereby subthreshold current is suppressed.

In inverter FC2, n channel MOS transistor (NQ) is on, discharging its output to the level of the ground voltage Vss. Since the source potential of p channel MOS transistor (PQ) of inverter FC2 is the voltage VCL3 on variable impedance power supply line 11 and lower than the gate potential, the p channel MOS transistor is also strongly turned off, suppressing the subthreshold current.

When the row circuitry set time period, that is, column interlock period terminates, a column valid time period (column circuitry valid period) starts. In this column valid time period, control signal $\phi c3$ attains to the level of the ground voltage Vss and control signal $\phi s$ attains to the level of the power supply voltage Vcc. MOS transistors Q7 and Q8 both turn on, and voltages VCL2 and VSL3 attain to the level of the power supply voltage Vcc and of the ground voltage Vss, respectively. In the column valid time period, input signal IN rises from the low level to the high level, and falls from the high level to the low level. In response to the rise and fall of the input signal IN, output nodes of inverters FC1 to FCn are charged/discharged, and operating current Icc flows.

When column valid time period completes, again, control signal $\phi c3$ is set to the level of the power supply voltage Vcc and control signal $\phi s3$ is set to the level of the ground voltage Vss, MOS transistors Q7 and Q8 are turned off, variable impedance power supply line 11 is connected to main power supply line 1 through high resistance Ra3, while variable impedance ground line 12 is connected to main ground line 4 through high resistance Rb3. In the stand-by cycle and row circuitry reset time period, the input signal IN has already been reset to the low level, and as in the operation of the stand-by cycle and row circuitry set time period described above, the MOS transistor which is off and operating in the subthreshold region is more strongly turned off, thus suppressing the subthreshold current.

As described above, in the column circuits, only in the column valid time period in which column circuits operate, variable impedance power supply line 11 and variable impedance ground line 12 are set to low impedance state and connected to the power supply node 20 and the ground voltage node 30, respectively. Therefore, the device operates at high speed in accordance with the change in the input signal. In the stand-by cycle and in the row circuitry set time period (column interlock period), variable impedance power supply line 11 and variable impedance ground line 12 are connected to power supply node 20 and ground voltage node 30 through high resistances Ra3 and Rb3, so that subthreshold current can be suppressed.

Figure 12:
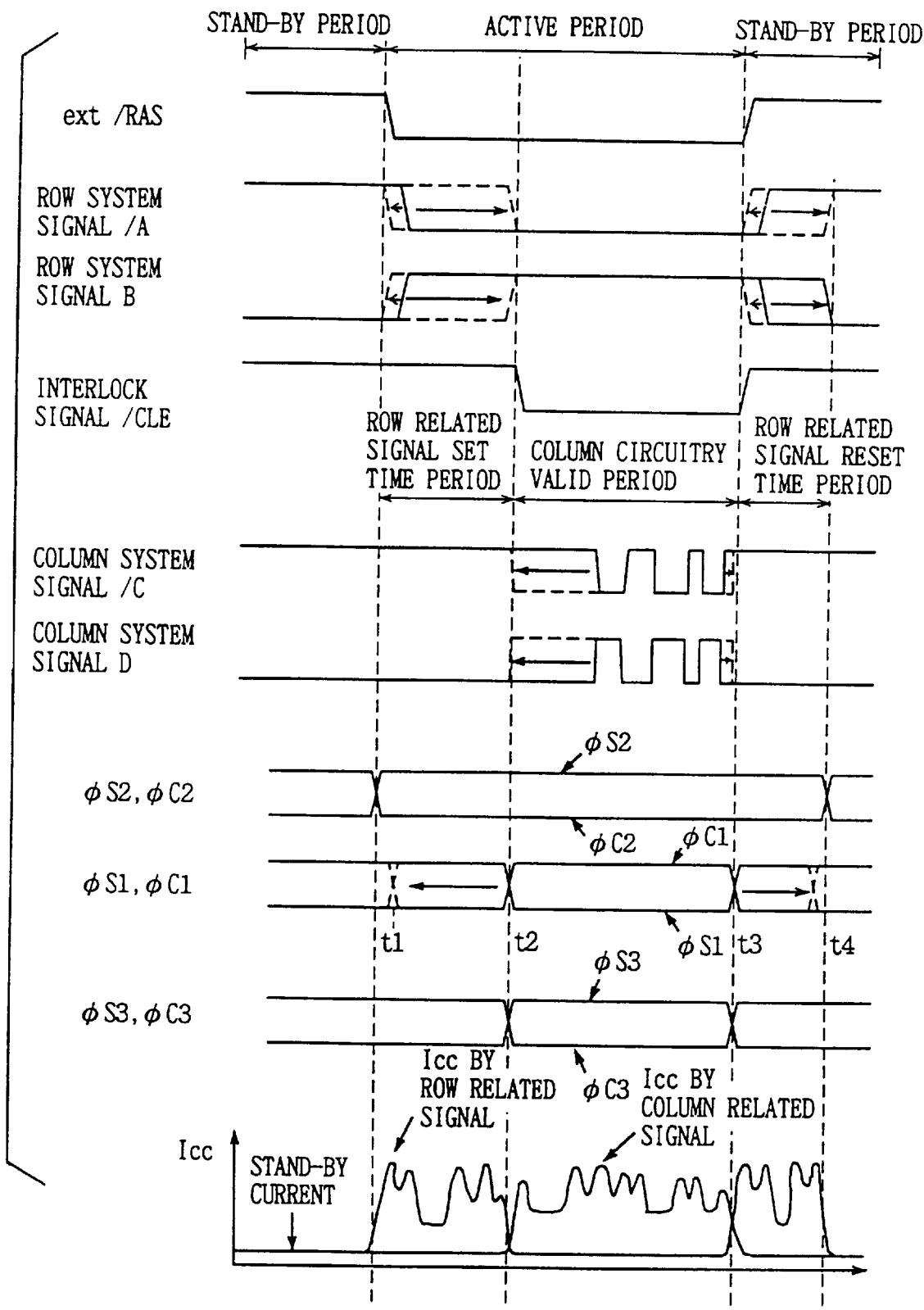
FIG. 12 is a diagram of signal waveforms showing operations of the power supply circuits shown in FIGS. 6 and 10.

FIG. 12 is a diagram of signal waveforms showing both the row related signals and column related signals. Referring to FIG. 12, overall operation including both the row related and column related signals will be described.

The row related signals include row related signal /A which is at a high level in the stand-by cycle and changes to the low level in the active cycle, and a row related signal B which is at the low level in the stand-by cycle and changes to the high level in the active cycle. Similarly, the column related signals include a column related signal /C which is at the high level in the stand-by cycle and changes to the low level in the column circuitry valid time period, and a column related signal D which is at the low level in the stand-by cycle and changes to the high level in the column circuitry valid time period.

In the stand-by cycle, external row address strobe signal /RAS (ext/RAS) is at a high level, row related signal /A and column related signal /C are both at the high level, and row related signal B and column related signal B are both at the low level. Interlock signal (column enable signal) /CLE is at the high level. In this state, control signals $\phi$c2 and $\phi$s1 are both at the high level, while control signals $\phi$s2 and $\phi$c1 are both at the low level. Control signal $\phi$c3 is at a high level, and control signal $\phi$s3 is at the low level. When external row address strobe signal /RAS falls to the low level, an active cycle starts.

In response to the fall of the external row address strobe signal /RAS, control signal $\phi$s2 attains to the high level, and control signal $\phi$c2 changes to the low level.

In the active cycle, row related signals /A and B change 10 respectively. The timings of change of respective signals are at prescribed time instants within the time period of the dotted waveform. When row related signals /A and B change and the states thereof are established at the low level and the high level, respectively, control signals $\phi$s1 and $\phi$c1 for the voltage supplying circuits provided corresponding to the circuits generating row related signals /A and B change. The states of the row related signals /A and B are established at the latest when the interlock signal /CLE attains to the low level of active state. Before this latest time of the row related signal set time period (which is determined by the interlock signal /CLE), control signal $\phi$c1 changes to the high level and control signal $\phi$s1 changes to the low level. The timings of change of the control signals $\phi$c1 and $\phi$s1 are set within the period from time t1 to time t2, as denoted by the dotted line in the figure (in accordance with the timings of establishment of the outputs from corresponding row related circuits). By the time t2, at the latest, the control signals $\phi$c1 and $\phi$s1 are set to the high level and low level, respectively.

When the row related signal set time period terminates, interlock signal /CLE attains to the low level, that is active state, and in response, control signal $\phi$s3 attains to the high level and control signal $\phi$c3 attains to the low level. In the column circuitry valid time period, row related signals /A and B are fixed at the low level and high level, respectively, subthreshold current is suppressed, and the power supply current Icc related to the row related signals has approximately the same value as the stand-by current flowing in the stand-by cycle. In the column circuitry valid time period, column related signals /C and D change. In the DRAM, an operation in which column related signals /C and D change several times, such as page mode operation, is known. In this period, control signal $\phi$s3 is at the high level, control signal $\phi$c3 is at the low level and the column related signal changes plural times in accordance with the contents of the access under execution. During this period, power supply current Icc is consumed by the column related signals.

When the active cycle terminates, external row address strobe signal /RAS rises to the high level, and interlock signal /CLE rises to the high level. In response to the rise of the interlock signal /CLE, control signal $\phi$s3 changes to the low level, control signal $\phi$c3 rises to the high level, and the subthreshold current at column related signals /C and D generating portions is suppressed. At the completion of the active cycle, column related signal /C and D have already returned to the initial state. Meanwhile, row related signals /A and D return to the initial state after the completion of the active cycle. Return to the initial state of the row related signals /A and B takes place at prescribed timings between time t3 and t4. When output signals of respective circuits return to the initial states, control signal $\phi$c1 changes to the low level and control signal $\phi$s1 changes to the high level. At the time t2 at which row related signal reset time period terminates, control signal $\phi$s2 is set to the low level and control signal $\phi$c2 is set to the high level. Thus consumption of the subthreshold current at portions generating row related signals /A and B can be suppressed.

By utilizing the structure shown in FIG. 6 as the power supply source for the row related signal generating circuit and utilizing the variable impedance power supply source shown in FIG. 10 for the column related signal generating circuit, the subthreshold current flowing through the inverter array (row and column related circuits) can be minimized, and current consumption can be significantly reduced. More specifically, even when an MOS transistor having a threshold voltage of the small absolute value is used, subthreshold current can be suppressed, enabling use of such MOS transistor having a threshold voltage of the small absolute value as component of the semiconductor memory device. Therefore, a semiconductor memory device having large storage capacity operating at high speed can be implemented.

Figure 13:
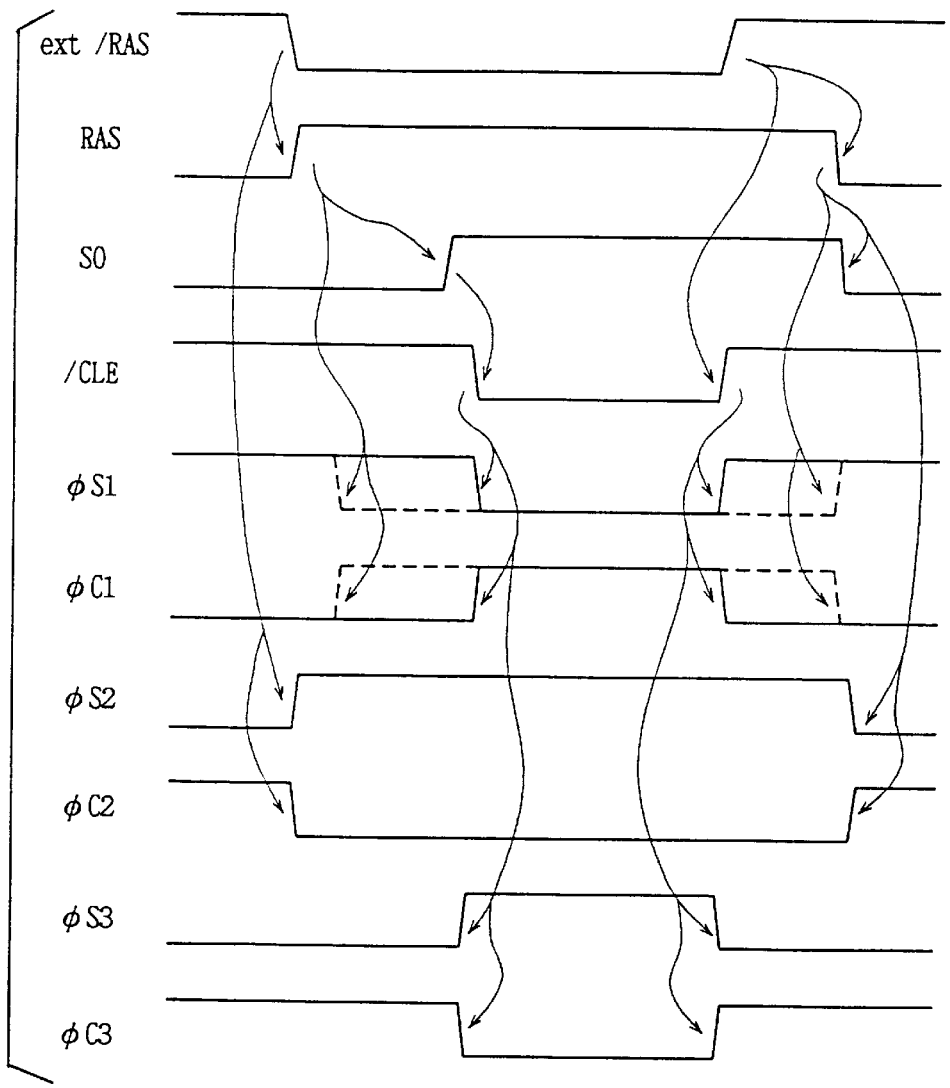
FIG. 13 shows a sequence for generating an impedance control signal shown in FIGS. 6 and 10.

FIG. 13 shows signal generation sequence for controlling on/off of MOS transistors as switching elements provided at the power supply line and the ground line. Referring to FIG. 13, in the stand-cycle in which external row address strobe signal /RAS (ext/RAS) is at the high level, control signals $\phi$s1, $\phi$c2, and $\phi$c3 are at the high level, while control signals $\phi$c1, $\phi$s2 and $\phi$s3 are at the low level. Sense amplifier activating signal SO is at the low level, and interlock signal (column enable signal) /CLE is at the high level.

When external row address strobe signal /RAS falls to the low level, internal RAS signal RAS rises to the high level, and thus an active cycle starts. In response to the fall of the external row address strobe signal /RAS (ext/RAS), control signal φs2 rises to the high level, and control signal φc2 falls to the low level. Control signals φs1 and φc1 which change at the earliest timing change to the low level and high level, respectively, in response to the rise of internal row address strobe signal RAS. In response to the rise of internal row address strobe signal RAS, after a prescribed time period, sense amplifier activating signal SO attains to the high level, which is the active state. In response to activation (high level) of sense amplifier activating signal SO, interlock signal /CLE attains to the low level, enabling operation of the column related circuits. In response to the fall of the interlock signal /CLE, control signals φs1 and φc1 which change at a latest timing change to the low level and to the high level, respectively. Control signals φs1 and φc1 changed in a row related signal set period (time period) represented by the dotted lines.

In response to the fall of the interlock signal /CLE, control signal φs3 attains to the high level, and control signal φc3 changes to the low level. While the interlock signal /CLE is at the low level, a column related signal changes permitting execution of prescribed operations.

When the active cycle terminates, external row address strobe signal /RAS (ext/RAS) rises to the high level, and in response, interlock signal /CLE rises to the high level. Control signals φs1 and φc1 which change at the earliest timing change to the high level and to the low level, respectively, in response to the rise of the interlock signal /CLE. In response to the rise of the interlock signal /CLE, control signals φs3 and φc3 change to the low level and high level, respectively.

In response to the rise of external row address strobe signal /RAS (ext/RAS), after a prescribed time period, internal row address strobe signal RAS falls to the low level, and in response, sense amplifier activating signal SO changes to the low level. In response to the fall of the internal row address strobe signal RAS, control signals φs1 and φc1, which change at the latest timing change to the high level and low level, respectively. Thereafter, in response to the fall of external row address strobe signal RAS, control signals φs2 and φc2 change to the low level and high level, respectively.

Figure 14:
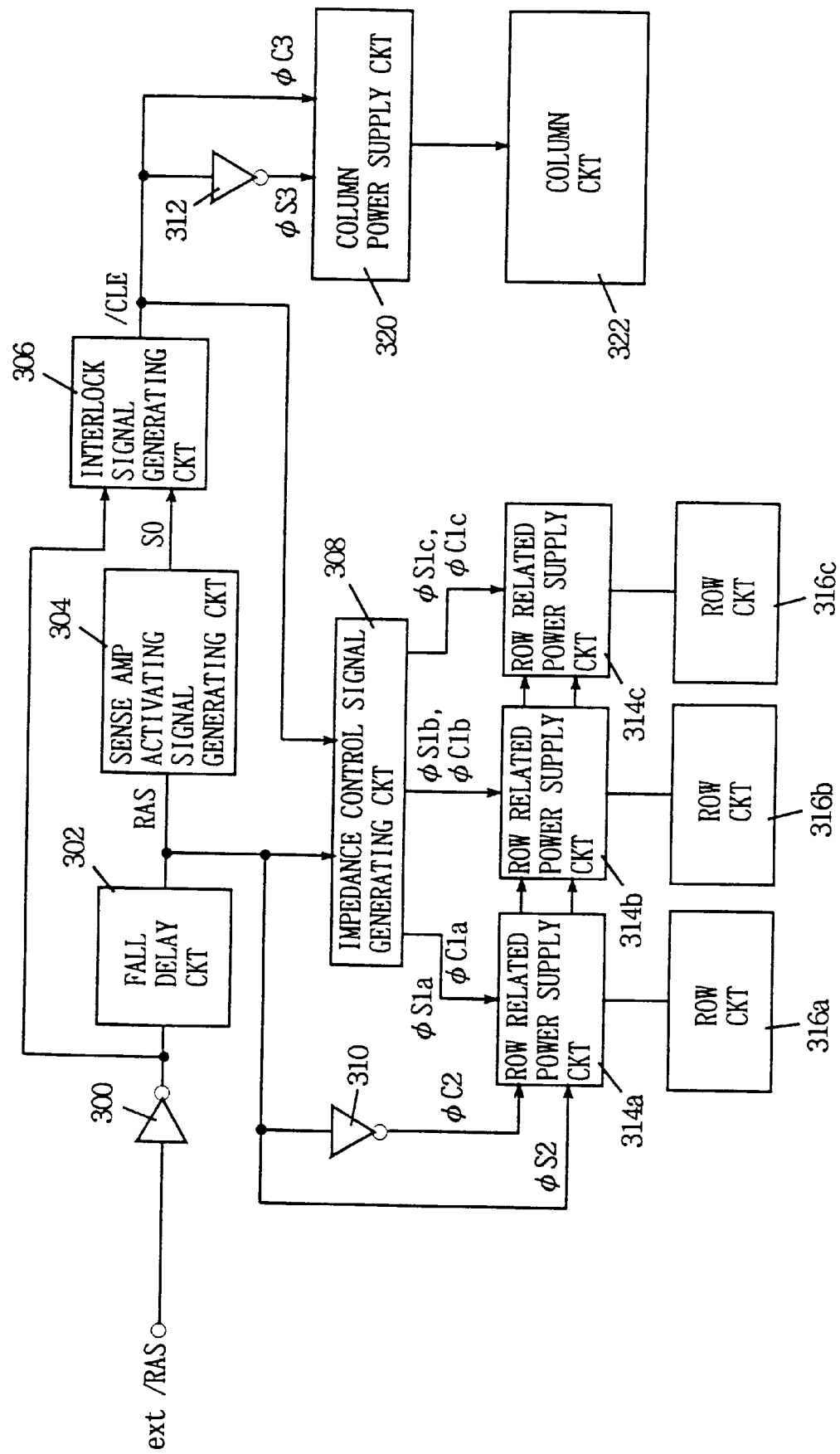
FIG. 14 shows a structure of control signal generating circuitry for implementing the control signal generating sequence shown in FIG. 13.

FIG. 14 shows an example of a structure for generating control signals shown in FIG. 13. Referring to FIG. 14, the control signal generating circuitry includes an inverter 300 receiving the external row address strobe signal /RAS (Ext/RAS); a fall delay circuit 302 for delaying the fall of an output of inverter 300 and generating internal row address strobe signal RAS; a sense amplifier activating signal generating circuit 304 responsive to an output signal RAS from fall delay circuit 302 for generating the sense amplifier activating signal SO; an interlock signal generating circuit 306 responsive to the output signal from inverter 300 and to sense amplifier activating signal SO for generating the interlock signal /CLE; and an impedance control signal generating circuit 308 responsive to the internal row address strobe signal RAS from fall delay circuit 302 and to interlock signal /CLE from interlock signal generating circuit 306 for generating a row related power supply impedance control signal.

The row circuits can be classified into groups in accordance with the timings of change in the output signals therefrom. FIG. 14 shows three row circuits 316a, 316b and 316c. Impedance control signal generating circuit 308 generates power supply impedance control signals φs1a, φc1a, φs1b, φc1b and φs1c and φc1c for the row circuits 316a to 316c, respectively. Row power supply circuits 314a, 314b and 314c are provided for row circuits 316a to 316c, respectively. Control signals φs1a and φc1a are applied to row power supply circuit 314a, control signals φs1b and φc1b are applied to row power supply circuit 314b, and control signals φs1c and φc1c are applied to row power supply circuit 314c.

Control signal φs2 is generated from internal row address strobe signal RAS, and control signal φc2 is generated from internal row address strobe signal RAS through inverter 310. Control signals φc2 and φs2 are commonly applied to row power supply circuits 314a to 314c. Row power supply circuits 314a to 314c change impedances of their own power supply lines (operating power supply voltage Vcc transmitting line and ground voltage Vss transmitting line) in accordance with the applied control signals respectively, and transmit power supply voltages (operating power supply voltage Vcc and ground voltage Vss) to the corresponding row circuits 316a to 316c.

A control signal φc3 is generated from interlock signal /CLE, and a control signal φs3 is generated from interlock signal /CLE through inverter 312. These control signals φc3 and φs3 are applied to a column power supply circuit 320. Column power supply circuit 320 supplies necessary voltage to column circuit 323 in accordance with the applied control signals φc3 and φs3.

Inverter 300 and fall delay circuit 302 are included in /RAS buffer 200 shown in FIG. 3, and sense amplifier activating signal generating circuit 304 is included in array controller 206 shown in FIG. 3. Interlock signal generating circuit 306 is the same as interlock signal generating circuit 208 shown in FIG. 3.

In response to the rise of the output signal from inverter 300, fall delay circuit 302 raises the internal row address strobe signal RAS to the high level, and after a prescribed time period from the fall of the output signal from inverter 300, the circuit 302 lowers the internal row address strobe signal RAS to the low level. Sense amplifier activating signal generating circuit 304 delays the rise of internal row address strobe signal RAS by a prescribed time period to raise the sense amplifier activating signal SO to the active state of high level, and in response to the fall of internal row address strobe signal RAS, it lowers the sense amplifier activating signal SO to the inactive state of low level.

Interlock signal generating circuit 306 lowers the interlock signal /CLE to the active state of low level in response to the rise of sense amplifier activating signal SO to the high level, and raises the interlock signal /CLE to the inactive state of high level in response to the fall of the output signal from inverter 300. Impedance control signal generating circuit 308 generates control signals φs1 (φs1a–φs1c) and φc1 (φc1a–φc1c) which change in the dotted line regions of FIG. 13, in response to internal row address strobe signal RAS and interlock signal /CLE.

In the structure shown in FIG. 14, fall delay circuit 302, sense amplifier activating signal generating circuit 304 and interlock signal generating circuit 306 are included in the row circuits and impedances of power supply lines (operating power supply voltage Vcc transmitting line and ground voltage Vss transmitting line) of these circuits are changed in accordance with the change of the logic levels of the output signals from respective circuits. As for the power supply of impedance control signal generating circuits 308, impedances of power supply lines of control signal generating circuits are adjusted in accordance with the changes in the control signals φs1 (φs1a to φs1c) and φc1 (φc1a–φc1c). The impedance of the power supply line of inverter 310 may be adjusted in accordance with external row address strobe signal RAS, and impedance of the power supply line of inverter 312 may be adjusted in accordance with the interlock signal /CLE.

The inverter 300 of external row address strobe signal /RAS (ext/RAS) may be adapted to operate receiving only the power supply voltage Vcc and the ground voltage Vss.

[First Modification]

The row related signals and column related signals are generated successively in accordance with certain operating sequences. In this case, the row related signals and column related signals can be generated by utilizing delay in the signals by using an inverter array. In the DRAM, multiple input logic gates are also utilized. In the following, a method adjusting impedances of power supply lines when a multiple input logic gate is used will be described.

Figure 15:
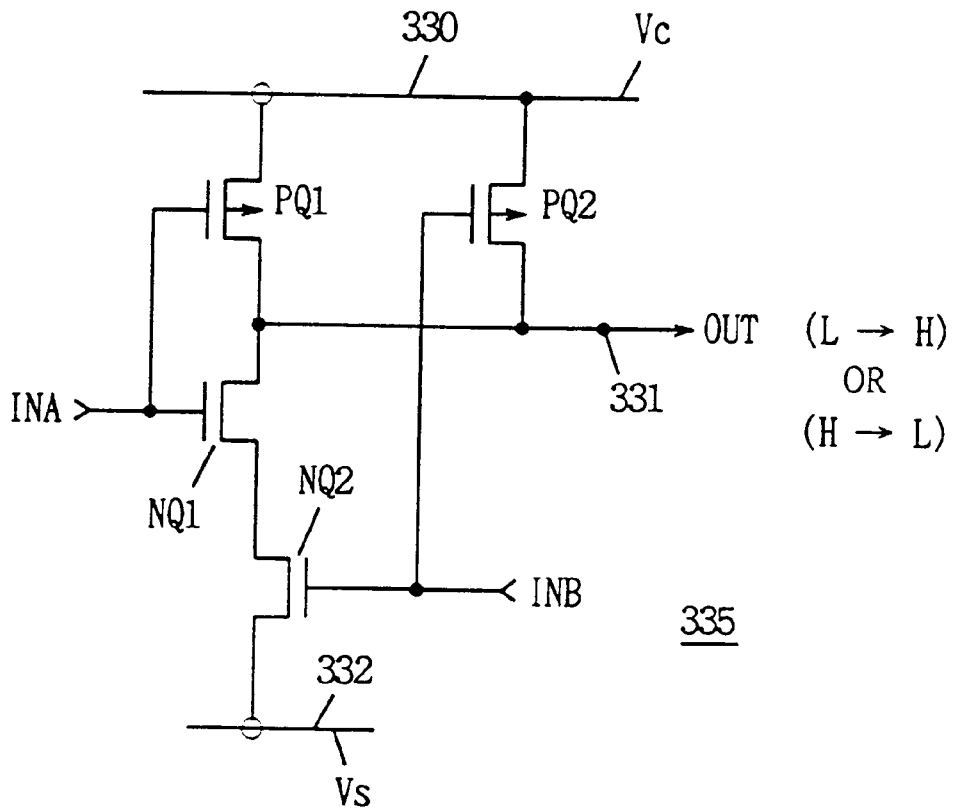
FIG. 15 shows an example of a structure of a multi-input NAND circuit used in a first modification of the first embodiment of the present invention.

FIG. 15 shows an example of a structure of a 2-input NAND circuit. Referring to FIG. 15, the 2-input NAND circuit includes p channel MOS transistors PQ1 and PQ2 connected in parallel between one power supply line 330 and output node 331, and n channel MOS transistors NQ1 and NQ2 connected in series between output node 331 and the other power supply line 332. An input signal INA is applied to the gates of MOS transistors PQ1 and NQ1, and an input signal INB is applied to the gates of MOS transistors PQ2 and NQ2.

Assume that the output OUT of the 2-input NAND circuit is at the low level (L) in the stand-by cycle and changes to the high level (H) in the active cycle. In the stand-by cycle, since output signal OUT is at the low level, MOS transistors NQ1 and NQ2 are on and MOS transistors PQ1 and PQ2 are off. In the stand-by cycle, the subthreshold current flows through MOS transistors PQ1 and PQ2. Therefore, in this case, the voltage Vc on one power supply line 330 must be set at a voltage VCL (VCL1 or VCL2) which is lower than the power supply voltage Vcc in the stand-by cycle. When output signal OUT attains to the high level in the active cycle, at least one of the MOS transistors NQ1 and NQ2 turns off. At this state, subthreshold current flows through MOS transistors NQ1 and NQ2. Therefore, at this state, the voltage Vs of the other power supply line 332 is set at a voltage higher than the ground voltage Vss so as to increase the source potential of the MOS transistor operating in the subthreshold region.

Figure 16:
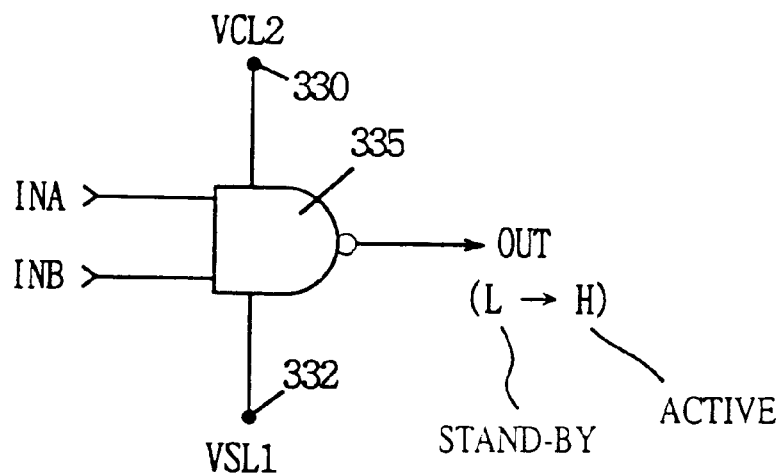
FIG. 16 shows connection between variable impedance power supply line and variable impedance ground line with respect to a 2-input NAND circuit shown in FIG. 15.

Such changes of the power supply voltages as described above are applied by the voltages VCL2 and VSL1 in accordance with the waveform shown in FIG. 7. Therefore, referring to FIG. 16, power supply voltage VCL2 is applied to one power supply line 330 of NAND circuit 335, and voltage VSL1 is applied to the power supply line 332. By this structure, the subthreshold current can be suppressed.

By contrast, let us assume that the output signal OUT of NAND circuit 335 shown in FIG. 15 is at the high level (H) in the stand-by cycle and at the low level (L) in the active cycle. The subthreshold current may possibly flow in the stand-by cycle in MOS transistors NQ1 and NQ2. Even when a p channel MOS transistor PQ (PQ1 or PQ2) receives at its gate a high level signal, the subthreshold current is not generated, since the output signal OUT is at the level of the power supply voltage Vcc at that time.

Therefore, in this stand-by cycle, the power supply voltage Vcc is transmitted to the power supply line 300, and a voltage higher than the ground voltage Vss is transmitted to the other power supply line 332. When the output signal OUT falls to the low level in the active cycle, the subthreshold current flows in p channel MOS transistor PQ1 or PQ2. Therefore, in this case, the voltage of one power supply line 330 is set to a voltage level lower than the power supply voltage Vcc, and the voltage on the other power supply line 332 is set to the ground voltage Vss.

Figure 17:
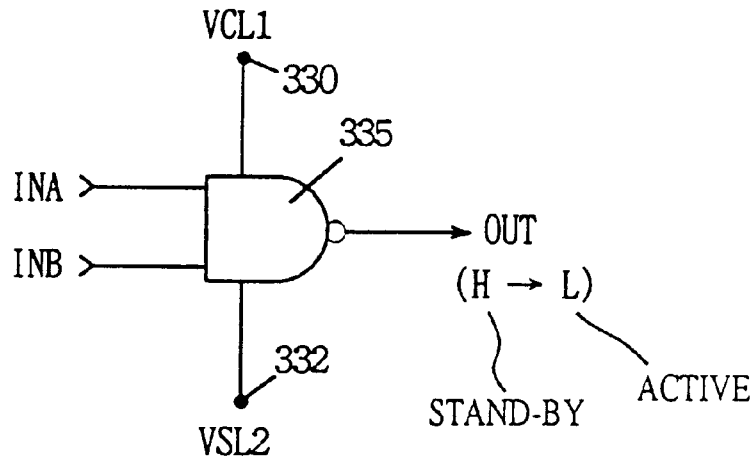
FIG. 17 shows a connection of power supply with respect to a 2-input NAND circuit used as a modification in the first embodiment of the present invention.

From the waveform diagram of FIG. 7, such power supply voltage sequence is provided by the voltages VCL1 and VSL2. Therefore, as shown in FIG. 17, the voltage VCL1 is supplied to one power supply line 330 and the voltage VSL2 is supplied to the other power supply line 332, in the NAND circuit. Consequently, the subthreshold current can be suppressed in the NAND circuit 335 which provides a high level signal in the stand-by cycle and provides a low level signal in the active cycle.

Figure 18:
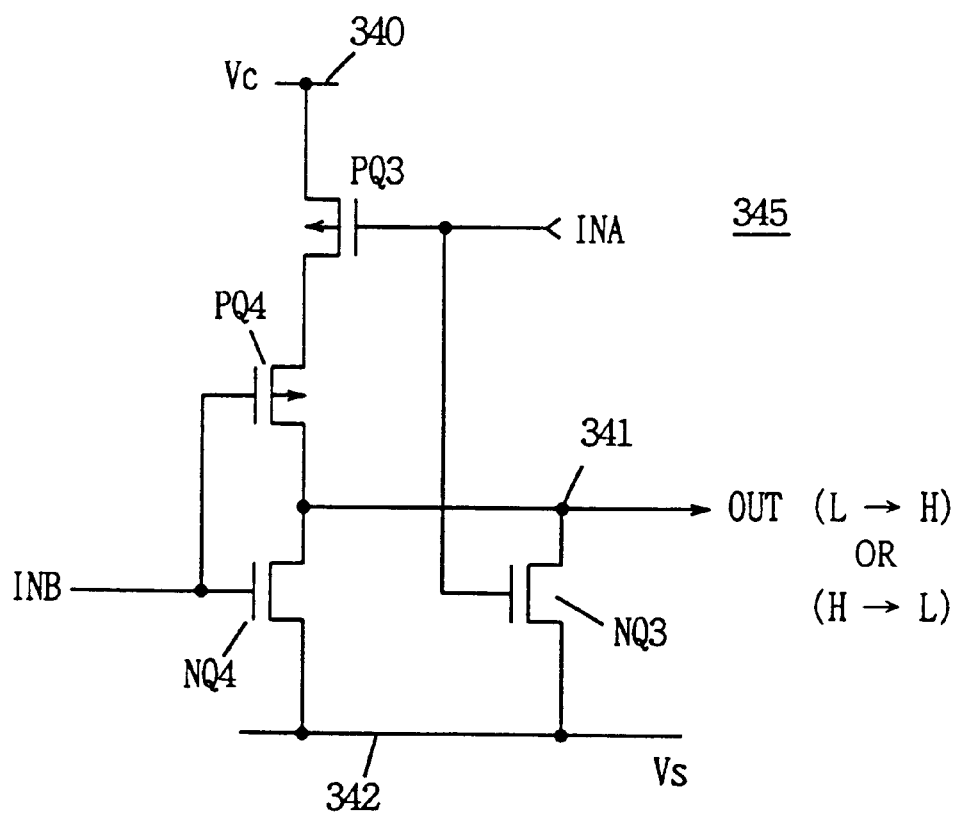
FIG. 18 shows a structure of 2-input NOR circuit and change in a logic level of an output signal, in one modification of the first embodiment of the present invention.

FIG. 18 shows a structure of a 2-input NOR circuit. Referring to FIG. 18, the 2-input NOR circuit 340 includes p channel MOS transistors PQ3 and PQ4 connected in series between one power supply line 340 and an output node 341, and n channel MOS transistors NQ3 and NQ4 provided in parallel between output node 341 and the other power supply line 342. An input signal INA is applied to the gates of MOS transistors PQ3 and NQ3, and an input signal INB is applied to the gates of MOS transistors PQ4 and NQ4.

Assume that the output signal OUT changes to the low level in the stand-by cycle and to the high level in the active cycle. In the stand-by cycle, when the output signal OUT is at the low level, at least one of the input signals INA and INB is at the high level. The subthreshold current may possibly flow in p channel MOS transistors PQ3 and PQ4. Therefore, the voltage Vc on one power supply line 340 is set to a voltage level lower than the power supply voltage Vcc, and the voltage Vs on the other power supply line 342 is set to the ground voltage level Vss.

Figure 19:
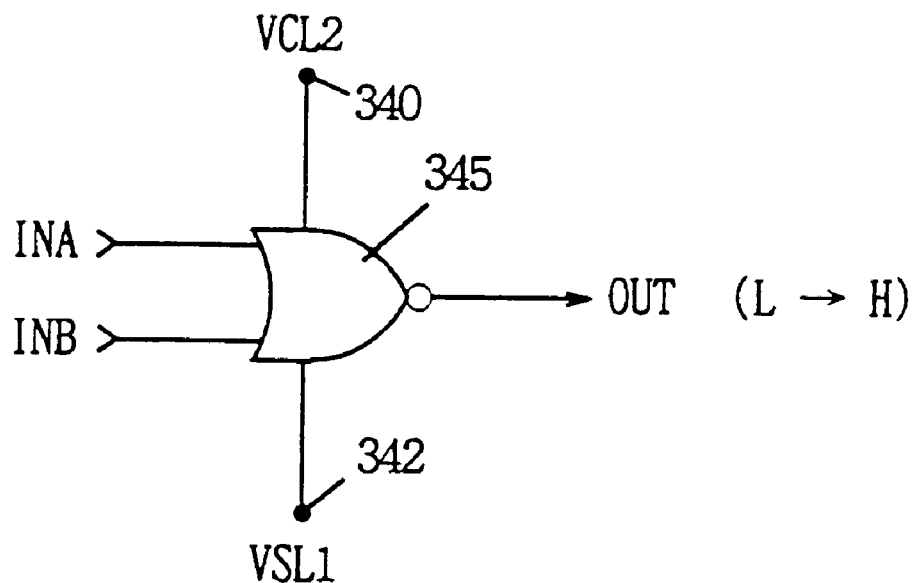
FIG. 19 shows a manner of connection of power supply of the 2-input NOR circuit shown in FIG. 18.

When output signal OUT rises to the high level in the active cycle, MOS transistors PQ3 and PQ5 are both on (input signals INA and INB are at the low level). At this time, subthreshold current flows through MOS transistors NQ3 and NQ4. Therefore, the voltage Vs on the other power supply line 342 is set to a voltage level higher than the ground voltage Vss, and the voltage Vc on one power supply line 340 is set to the level of the power supply voltage Vcc. Such voltage changes are provided by voltages VCL2 and VSL1. Therefore, referring to FIG. 19, the voltage VCL2 is applied to one power supply line 340 and the voltage VSL1 is applied to the other power supply line 342 of NOR circuit 345 which provides a signal OUT which attains to the low level in the stand-by cycle and to the high level in the active cycle.

Figure 20:
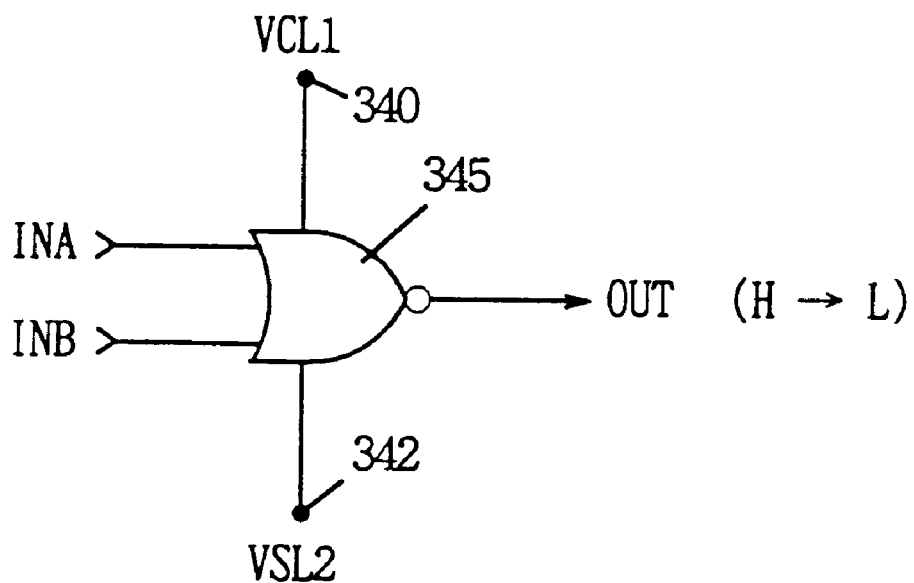
FIG. 20 shows a manner of connection of a power supply in accordance with a logic level of the output signal from 2-input NOR circuit shown in FIG. 18.

Meanwhile, the operation is reversed when the output signal OUT attains to the high level in the stand-by cycle and to the low level in the active cycle. More specifically, in the stand-by cycle, subthreshold current flows through MOS transistors NQ3 and NQ4, and therefore the voltage Vs on the other power supply line 342 is set higher than the ground voltage Vss level. In the active cycle, the subthreshold current flows through the path of p channel MOS transistors PQ3 and PQ4. Therefore, in this case, the voltage Vc of one power supply line 340 is set lower than the power supply voltage Vcc. Such voltage changes are provided by voltages VCL1 and VSL2. Therefore, referring to FIG. 20, the voltage VCL1 is applied to one power supply line 340 and the voltage VSL2 is applied to the other power supply line 342 of the NOR circuit 345 which provides a high level signal in the stand-by cycle and a low level signal in the active cycle.

As described above, in a multi-input logic circuit also, the subthreshold current can be surely suppressed when the logic levels of the output signal in the stand-by cycle and active cycle are known and the logic level thereof changes between the stand-by cycle and the active cycle. The NAND circuit and the NOR circuit have been described as row circuits. As for the column circuit, provided that the logic level of the output signal OUT in the stand-by cycle is known, a structure may be used which adjusts the level of the power supply voltage which is of the logic complementary to the output logic level, to the intermediate potential level (intermediate between Vcc and Vss). This is because the power supply lines of the column circuit have both the power supply voltage Vcc and the ground voltage Vss set to the low impedance state in the column circuitry valid time period.

As described above, when the logic levels of input/output signals in the active cycle and stand-by cycle are predictable, the subthreshold current can be effectively suppressed even in a multi-input logic gate.

[Second Modification]

As disclosed by Horiguchi et al. in the aforementioned prior art article (*IEEE* 1993 *Symposium on VLSI Circuits, Direst of Technical Papers,* pp. 47–48), the potentials at internal nodes of the DRAM in the stand-by cycle can all be predicted. However, logic levels of output signals from some circuits such as an address buffer, a decoder circuit and a clocked inverter are not predictable in the active cycle. Further, in a sense amplifier, there is a possibility that the subthreshold current flows in the stand-by cycle regardless of the high level and low level of the activation signal (subthreshold current may possibly flow through a transistor which is rendered conductive in response to the sense amplifier activating signal SO for transmitting the power supply voltage Vcc and the ground voltage Vss to the sense amplifier). In such a case, the subthreshold current may not be effectively suppressed by utilizing the aforementioned sequence of changing the power supply line impedances. The sequence for changing the power supply line impedances for such a circuit in that logic level of the output signal is unpredictable, will be described.

Figure 21:
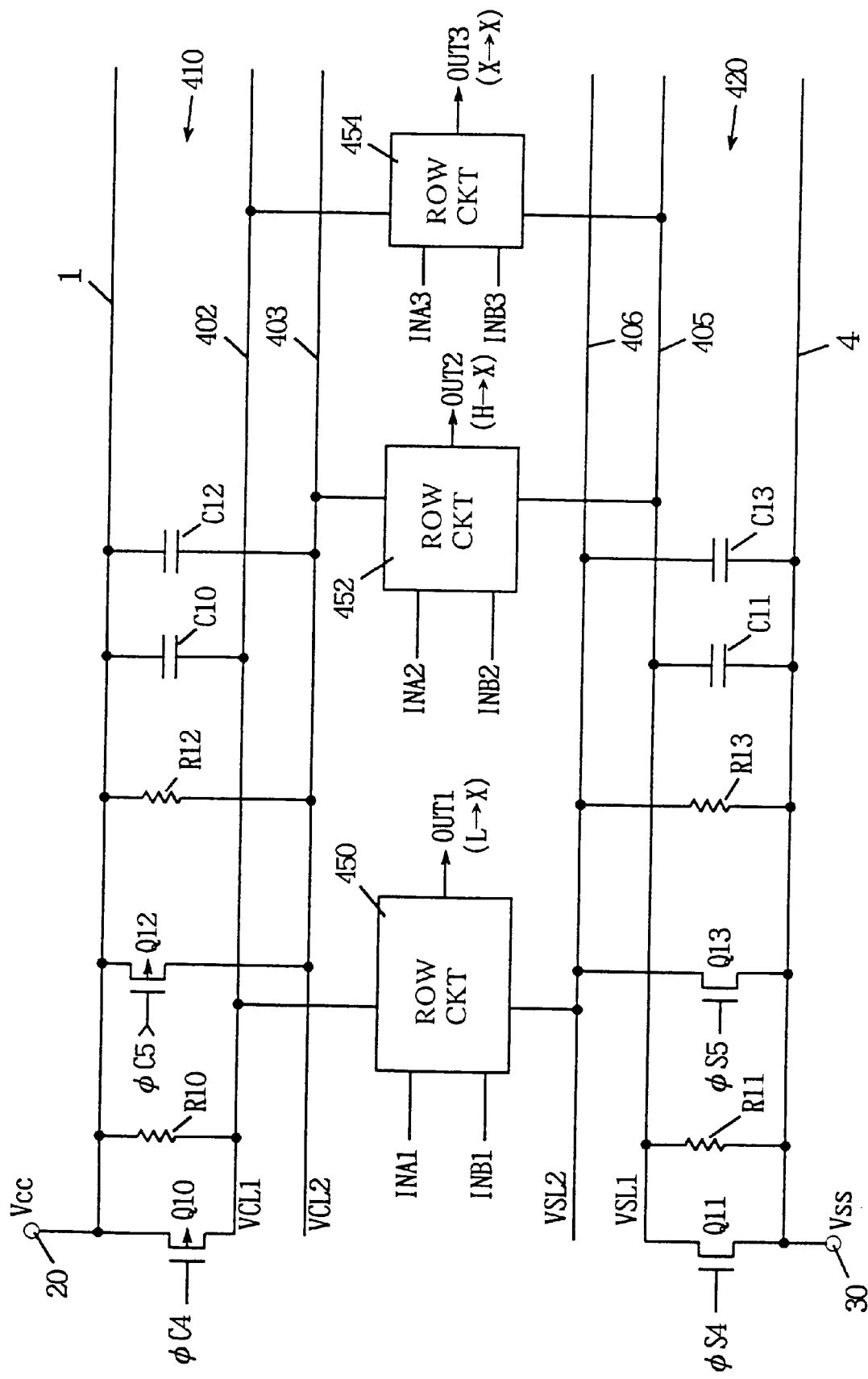
FIG. 21 shows a structure of a power supply circuit for a row related circuit in a second modification of the first embodiment of the present invention.

FIG. 21 shows a structure of a power supply circuit of a semiconductor device in accordance with a second modification of the first embodiment of the present invention. FIG. 21 shows three 2-input row circuits 450, 452 and 454 as representatives. Row circuit 450 receives inputs INA1 and INB1, and generates an output OUT1. Output signal OUT1 of row circuit 450 is at the low level (L) in the stand-by cycle and the logic level of the output signal attains to the high level or kept at the low level in the active cycle (in the figure, represented as X). Row circuit 452 receives input signals INA2 and INB2, and generates an output signal OUT2. Output signal OUT2 of row circuit 452 is at the high level in the stand-by cycle, and at the high level or the low level in the active cycle. Row circuit 454 receives input signals INA3 and INB3, and generates an output signal OUT3. Output signal OUT3 of row circuit 454 is at the high level or the low level in the stand-by cycle and high level or low level in the active cycle. An example of row circuit 454 is a clocked inverter which is set to the output high impedance state in the stand-by cycle, and the output signal thereof attains to the high level or low level during its operation. A sense amplifier provided for each bit line pair is another example of the row circuit 454.

Referring to FIG. 21, a power supply voltage supplying circuit 410 supplying a high level power supply voltage includes a main power supply line 1 coupled to a first power supply node 20; a subpower supply line (variable impedance power supply line) 402 connected to main power supply line 1 through resistance R10; and a variable impedance power supply line 403 connected to main power supply 1 through a resistance R12. Parallel to resistance R10, a p channel MOS transistor Q10 which is rendered conductive in response to a control signal $\phi c4$ for connecting the main power supply line 1 to variable impedance power supply line 402 is provided. Parallel to resistance R10, a p channel MOS transistor Q12 which is rendered conductive in response to a control signal $\phi c5$ for connecting main power supply line 1 to variable impedance power supply line 403 is provided. Between main power supply line and variable impedance power supply 402, a capacitor C10 having relatively large capacitance for stabilizing the voltage VCL1 on variable impedance power supply line 402 is provided. Between main power supply line 1 and variable impedance power supply 403, a capacitor C12 having relatively large capacitance for stabilizing the voltage VCL2 on variable impedance power supply line 403 is provided. Resistances R10 and R12 have relatively large capacitance values, and MOS transistors Q10 and Q12 have on-resistances which are negligible as compared with the resistance values of resistances R10 and R12. MOS transistors Q10 and Q12 have current supplying capability large enough to supply sufficient charging current to the row circuits (the channel widths W are made greater). Resistances R10 and R12 may be implemented by resistance connected MOS transistors.

A ground voltage supplying circuit 420 supplying a low level power supply voltage includes a main ground line 4 coupled to the other power supply node 30 for transmitting the ground voltage Vss; a variable impedance ground line 405 connected to main ground line 4 through a resistance R11; and a variable impedance ground line 406 connected to main ground line 4 through a resistance R13. Parallel to resistance R11, an n channel MOS transistor Q11 which is rendered conductive in response to a control signal $\phi s4$ for connecting main ground line 4 to variable impedance ground line 405 is provided. Parallel to resistance R13, an n channel MOS transistor Q13 which is rendered conductive in response to a control signal $\phi s5$ for connecting main ground line 4 to variable impedance ground line 406 is provided. Further, between main ground line 4 and variable impedance ground line 405, a capacitor C11 having large capacitance for stabilizing the voltage VSL1 on variable impedance ground line 405 is provided. Between main ground line 4 and variable impedance ground line 406, a capacitor C13 having large capacitance for stabilizing the voltage VSL2 on variable impedance ground line 406 is further provided. Resistances R11 and R13 have relatively large resistance values. MOS transistors Q11 and Q13 have large current supplying capability (large channel width) sufficient to absorb discharging currents from row circuits 450, 452 and 454. on-resistances of MOS transistors Q11 and Q13 are set to negligible values as compared with resistances R11 and R13.

Row circuit 450 has one power supply node (receiving high level power supply voltage) connected to variable impedance power supply line 402, and the other power supply node (receiving a low level power supply voltage) connected to variable impedance ground line 406. Row circuit 452 has one power supply node connected to variable impedance power supply line 403 and the other power supply node connected to variable impedance ground line 405. Row circuit 424 has one power supply node connected to variable impedance power supply line 402, and the other power supply node connected to variable impedance ground line 405. The operation of the structure shown in FIG. 21 will be described with reference to the waveform diagram of FIG. 22.

In the stand-by cycle, external row address strobe signal ext/RAS is at the high level and internal row address strobe signal RAS is at the low level. The output signal OUT1 of row circuit 450 is at the low level, the output signal OUT2 of row circuit 452 is at the high level, and the output signal OUT3 of row circuit 454 is at the high level or the low level. At this state, control signals φc4 and φs5 are set to the high level, and control signals φs4 and φc5 are set to the low level. MOS transistors Q10 and Q11 are both turned off, and MOS transistors Q12 and Q13 are turned on.

The power supply voltage Vcc is supplied from main power supply line 1 through resistance R10 to variable impedance power supply line 402. Therefore, the voltage VCL1 becomes lower than the power supply voltage level Vcc because of the voltage drop across resistance RIO. Since variable impedance ground line 405 receives the ground voltage Vss through resistance R11, the voltage VSL1 becomes higher than the ground voltage Vss (0 V). Variable impedance power supply line 403 receives the power supply voltage Vcc through MOS transistor Q12, and the voltage VCL2 attains to the level of the power supply voltage Vcc. Since variable impedance ground line 406 receives the ground voltage Vss through MOS transistor Q13, the voltage VSL2 attains to the ground voltage Vss.

Row circuit 450 receives the voltage VCL1 which is lower than the power supply voltage Vcc, and the output signal OUT1 is also at the low level. Therefore, the subthreshold current flowing from one power supply node to the output node of the circuit 450 is suppressed. Row circuit 452 has high level output signal OUT2, and receives the voltage VSL1 at the other power supply node. Therefore, subthreshold current flowing from the output node to the other power supply node can be suppressed. Row circuit 454 receives the voltage VCL1 at one power supply node, and the voltage VSL1 at the other power supply node. Namely, row circuit 454 receives voltages Vcc and Vss through high resistances, and therefore the subthreshold current flowing from one power supply node to the output node and the subthreshold current flowing from the output node to the other power supply node can be suppressed, regardless of the logic level of the output signal. Therefore, subthreshold current in the stand-by cycle can be sufficiently suppressed.

Figure 22:
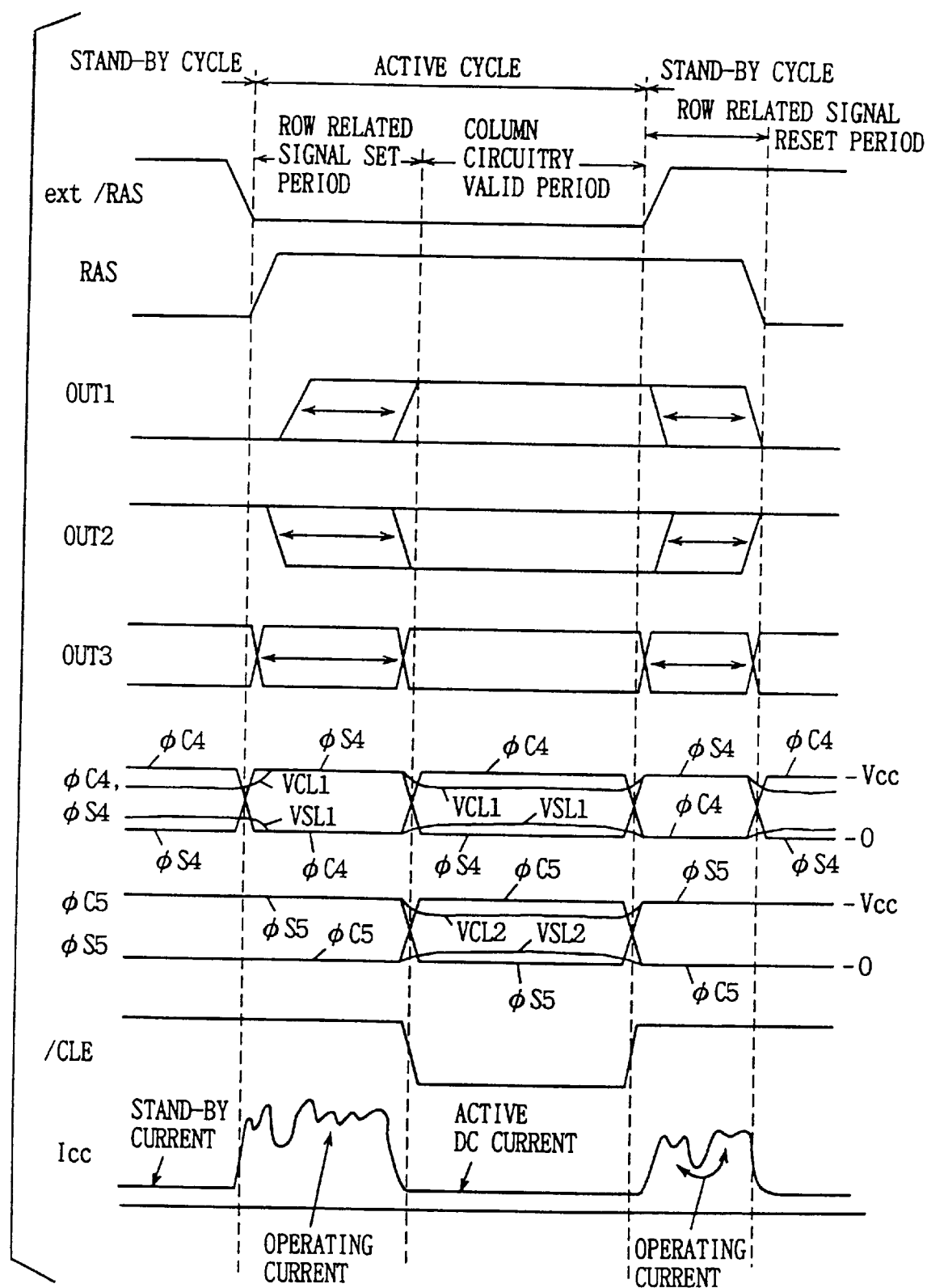
FIG. 22 is a diagram of signal waveforms showing the operation of the power supply circuit shown in FIG. 21.

When external row address strobe signal ext/RAS falls to the low level, an active cycle starts. In this active cycle, output signals OUT1, OUT2 and OUT3 of row circuits 450, 452 and 454 change. In FIG. 22, the timings of change of output signals OUT1 to OUT3 are set in a prescribed time in the period denoted by bidirectional arrows. More specifically, output signals OUT1 to OUT3 change at prescribed timings in the row related signals set period.

In the row related signal set period, in accordance with the internal row address strobe signal RAS which has risen to the high level in response to the fall of external row address strobe signal ext/RAS, control signal φc4 attains to the low level and control signal φs4 attains to the high level. Control signal φc5 is kept at the low level, and control signal φs5 is kept at the high level. At this state, MOS transistors Q10 to Q13 are all turned on, voltages VCL1 and VCL2 both attain to the level of the power supply voltage Vcc, and voltages VSL1 and VSL2 both attain to the level of the ground voltage Vss. In accordance with the operations of row circuits 450, 452 and 454, operating current Icc flows.

When the row related signal set period completes, the interlock signal, that is, column enable signal /CLE falls to the low level, and column circuitry valid period starts. In the column circuitry valid period, control signals φc4 and φc5 are both set to the high level and control signals φs4 and φs5 are both set to the low level. MOS transistors Q10 to Q13 are all turned off, voltages VCL1 and VCL2 are set to the voltage level lower than the level of the power supply voltage Vcc, and voltages VSL1 and VSL3 are set to the level higher than the level of the ground voltage Vss. In this period, the states of row related signals do not change. Regardless of the logic levels of output signals OUT1, OUT2 and OUT3 of row circuits 450, 452 and 454, the subthreshold current can be suppressed. In this example, the voltage levels of output signals OUT1 to OUT3 change from the levels of the power supply voltage Vcc and the ground voltage Vss to the voltage levels intermediate between these two voltages. However, there is not a malfunction in the row circuits, since operations of the row circuits have already been completed. In the row circuits, it is possible that the voltages at the gate and the source of a MOS transistor, which is a component of the circuit, may attain the same voltage level. However, since power supply lines 402 and 403 and the ground lines 405 and 406 are at highly resistive state (that is, connected to power supply node 20 or ground voltage node 30 through high resistance), and therefore the active DC current flowing at this time can be set to a sufficiently small value.

When the column circuitry valid period terminates and memory access ends, external row address strobe signal ext/RAS rises to the high level, and the active cycle terminates. In response to the rise of the external row address strobe signal ext/RAS, column enable signal /CLE rises to the high level. In the initial state of the stand-by cycle, output signals OUT1 to OUT3 of row circuits 450, 452 and 454 return to the initial state. In the row related signal reset period in which the row related signals return to the initial state, control signals φs4 and φs5 are set to the high level, control signals φc4 and φc5 are set to the low level, and MOS transistors Q10 and Q13 are all turned on. Consequently, voltages VCL1 and VCL2 attain to the level of the power supply voltage Vcc, voltages VSL1 and VSL2 attain to the level of the ground voltage Vss, row related signals are reset at high speed, and operating current is generated.

Output signals OUT1 to OUT3 return to the initial state at prescribed timings in the row related signal reset period. In FIG. 22, the period in which the signal return is denoted by a bidirectional arrow.

When the row related signal reset period completes, internal row address strobe signal RAS falls to the low level. In response to the fall of internal row address strobe signal RAS, control signal φc4 is set to the high level, and control signal φs4 is set to the low level. Control signals φs5 and φc5 are maintained at the high level and low level, respectively. Consequently, MOS transistors Q10 and Q11 turn off, and MOS transistors Q12 and Q13 turn off. Consequently, row circuits 450, 452 and 454 receive one power supply voltage (high level side power supply voltage) and the other power supply voltage (low level side power supply voltage) in accordance with the logic levels of respective output signals OUT1 to OUT3, and thus the subthreshold current can be suppressed.

In the column circuits, when the logic level of the output signal is fixed at the high level or the low level in the stand-by cycle, one power supply voltage and the other power supply voltage of which voltage levels determined in accordance with the fixed logic level may be applied. When a column circuit is set to the output high impedance state such as in the case of a clocked inverter, it may be connected to the power supply line and the ground line which are set to the highly resistive state in the stand-by cycle. For example, in the structure shown in FIG. 10, even a circuit such as a clocked inverter which is set to the output high impedance state, the subthreshold current can be sufficiently suppressed provided that it is connected to receive the voltages on power supply line 11 and ground line 12.

Figure 23A:
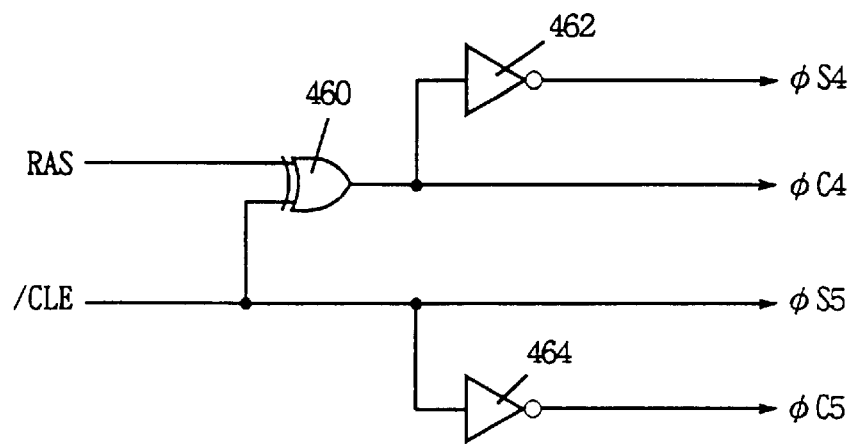
FIG. 23A shows a structure for generating control signals shown in FIG. 21.
Figure 23B:
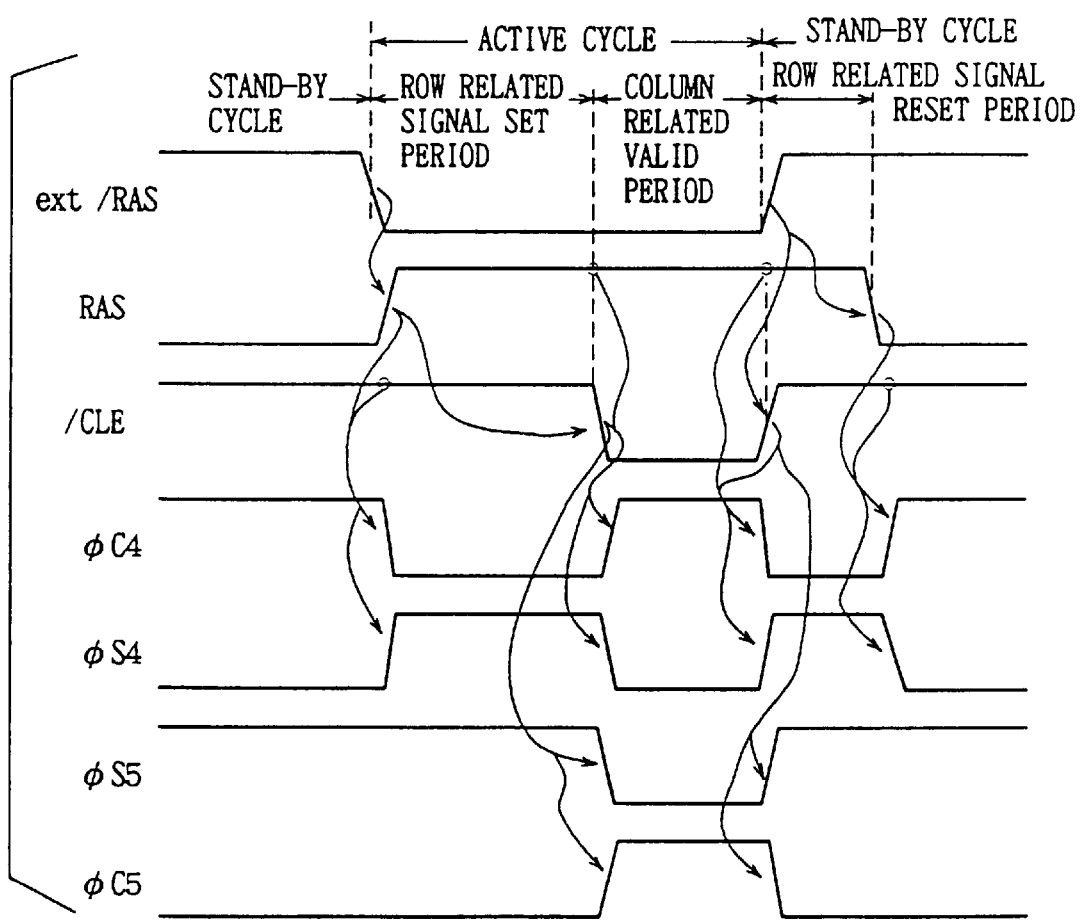
FIG. 23B is a diagram of signal waveform showing the operation of the circuit shown in FIG. 23A.

FIGS. 23A and 23B show the circuit of a structure generating control signals for changing impedances of power supply lines shown in FIG. 22, and signal waveforms thereof.

Referring to FIG. 23A, the control signal generating circuitry includes EXOR circuit 460 receiving internal row address strobe signal RAS and column enable signal (interlock signal) /CLE, an inverter 462 inverting an output from EXOR circuit 460, and an inverter 464 inverting column enable signal /CLE. EXOR circuit 460 operates as a non-coincidence detecting circuit, and when the logic levels of signals RAS and /CLE do not coincide with each other, it provides a high level signal. Control signal $\phi c4$ is provided from EXOR circuit 460. Control signal $\phi s4$ is output from inverter 462. Column enable signal /CLE is utilized as control signal $\phi s5$, and control signal $\phi c5$ is output from inverter 464. The operation of the circuit shown in FIG. 23A will be described with reference to the waveforms of FIG. 23B.

In the stand-by cycle, internal row address strobe signal RAS is at the low level, and the column enable signal /CLE is at the high level. As for the output of EXOR circuit 460, control signal $\phi c4$ attains to the high level. In response, control signal $\phi s4$ attains to the low level. As the column enable signal /CLE is high, control signal $\phi s5$ is high, and control signal $\phi c5$ is at the low level.

When an active cycle starts, internal row address strobe signal RAS rises to the high level. At this time, column enable signal /CLE is still at the high level. Consequently, control signal $\phi c4$ output from EXOR circuit 460 attains to the low level, and control signal $\phi s4$ attains to the high level. Control signals $\phi s5$ and $\phi c5$ are high level and low level, respectively, as in the stand-by cycle.

When the row related signal set period completes, column enable signal /CLE falls to the low level. Therefore, the control signal $\phi c4$ output from EXOR circuit 460 attains to the high level, and control signal $\phi s4$ attains to the low level. In response to the fall of column enable signal /CLE, control signal $\phi s5$ attains to the low level and control signal $\phi c5$ attains to the high level.

When the active cycle terminates, external row address strobe signal ext/RAS rises to the high level, and in response, column enable signal /CLE rises to the high level. Control signal $\phi s5$ attains to the high level and control signal $\phi c5$ attains to the low level. At the rise of column enable signal /CLE, internal row address strobe signal RAS is still at the high level, control signal $\phi c4$ output from EXOR circuit 460 attains to the low level and control signal $\phi s4$ attains to the high level. When internal row address strobe signal RAS falls to the low level, control signal $\phi c4$ from EXOR circuit 460 rises to the high level, and control signal $\phi s4$ attains to the low level. Consequently, control signal $\phi c4$ can be set to the high level and control signal $\phi s4$ can be set to the low level after the completion of row related signal reset period.

In the structure of the control signal generating circuitry shown in FIG. 23A, the row related signal set period and the row related signal reset period are set as a period common to various row circuits. However, this structure is proposed only for facilitating control, and therefore other structure in which timings of changes of control signals are adjusted in accordance with the timings of establishment of various output signals from row circuits may be utilized.

As described above, according to the first embodiment of the present invention, since the impedances of power supply lines and ground lines are adjusted in accordance with the operating periods or operation cycles, subthreshold currents in various circuits can be reduced effectively, circuits can be formed by using MOS transistors having low threshold voltages, and thus a semiconductor memory device operating at a high speed with low current consumption can be obtained. Though a semiconductor memory device such as a DRAM has been described in the embodiment above, the structure of the present invention can be similarly applied to a general semiconductor integrated circuit device provided that the operation has a stand-by cycle and active cycle, that the active cycle has an output signal hold time, and that the hold time can be identified.

[Embodiment 2]

Figure 24A:
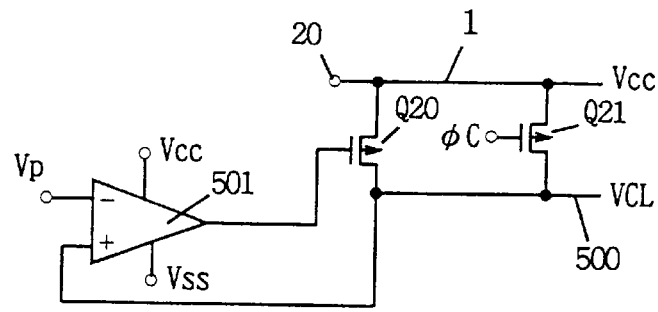
FIG. 24A shows a structure of a power supply circuit in accordance with a second embodiment of the present invention.
Figure 24B:
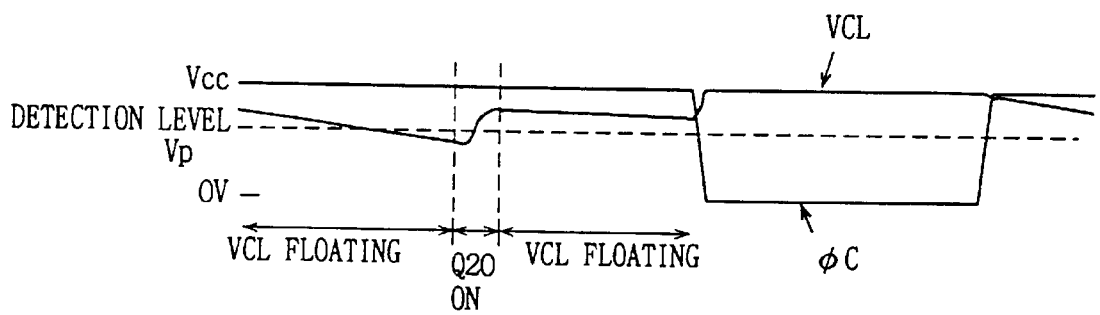
FIG. 24B is a diagram of waveforms showing the operation thereof.

FIGS. 24A and 24B show the structure and operation of a power supply circuit in accordance with a second embodiment of the present invention. FIG. 24A shows the structure of the power supply voltage supplying circuit, and FIG. 24B shows the operating waveforms thereof. Referring to FIG. 24A, the power supply voltage supplying circuit includes a main power supply line 1 connected to a first power supply node 20, a variable impedance power supply line 500, a p channel MOS transistor Q21 which is rendered conductive in response to a control signal $\phi c$ for connecting the main power supply line 1 to variable impedance power supply line 500, a differential amplifier (OP amplifier) 501 for comparing the voltage VCL on variable impedance power supply line 500 with a prescribed reference voltage VP, and a p channel MOS transistor Q20 which is rendered conductive in response to an output from differential amplifier 501 for connecting, when conducted, the main power supply line 1 to variable impedance power supply line 500.

Variable impedance power supply line 500 is one of the first and second variable impedance power supply lines described in the first embodiment above (it may be a row circuit or a column circuit). Differential amplifier 501 operates using power supply voltage Vcc and ground voltage Vss as operating power supply voltages, and receives at its positive input (+) the voltage VCL on variable impedance power supply line 500 and at its negative input (−) the reference voltage VP. When the voltage VCL is higher than the reference voltage VP, differential amplifier 501 provides a high level signal. In the structure shown in FIG. 24A, there is not a high resistance provided for connecting main power supply line 1 and variable impedance power supply line 500. The operation will be described with reference to the waveforms shown in FIG. 24B.

When control signal $\phi c$ is at the high level, p channel MOS transistor Q21 is off. When voltage VCL is higher than the reference voltage VP, the output from differential amplifier 501 is at the high level, and MOS transistor Q21 is off. The MOS transistor which is off is set to a state of high impedance which is higher than that provided by a resistance element, and the power supply line 500 is set to electrically floating state. When the potential of the variable impedance power supply line 500 which is at the electrically floating state lowers because of the leak current and becomes lower than the reference voltage VP, the output from differential amplifier 501 attains to the low level, and MOS transistor Q20 turns on, electrically connecting variable impedance power supply line 500 and main power supply line 1.

Consequently, current is supplied to variable impedance power supply line 500 from power supply node 20, and voltage VCL rises. When the voltage VCL becomes higher than the level of the reference voltage VP, the output of differential amplifier 501 attains to the high level, MOS transistor Q20 turns off, and variable impedance power supply line 500 is again set to the electrically floating state.

When control signal φc attains to the low level, p channel MOS transistor Q21 turns on, and the voltage VCL on variable impedance power supply line 500 attains to the level of the power supply voltage Vcc applied to the power supply node 20 (main power supply line 1). At this state, the output of differential amplifier 501 is at the high level and MOS transistor Q20 is off.

Because of the feedback circuit provided by differential amplifier 501 and MOS transistor Q20, while control signal φc is at the high level and voltage VCL is higher than reference voltage VP, variable impedance power supply line 500 can be maintained at the electrically floating state, and thus the voltage VCL can be generated stably with lower power consumption as compared with the structure employing a resistance element. Further, by appropriately adjusting the response characteristic of the feedback circuit of differential amplifier 501 and MOS transistor Q20, the voltage VCL can be maintained approximately at the level of reference voltage VP under the high impedance state of the variable impedance power supply line 500. When a resistance element is used, it may be difficult to set the voltage VCL at a desired voltage level when the variable impedance power supply line 500 is at the high impedance state, because of fluctuation of resistance values caused by change in operating temperature and variation in the resistance value derived from variation in manufacturing parameters. However, when differential amplifier 501 is used, the voltage VCL can be maintained at the level of the reference voltage VP stably while the power supply line 500 is at the high impedance state.

Figure 25A:
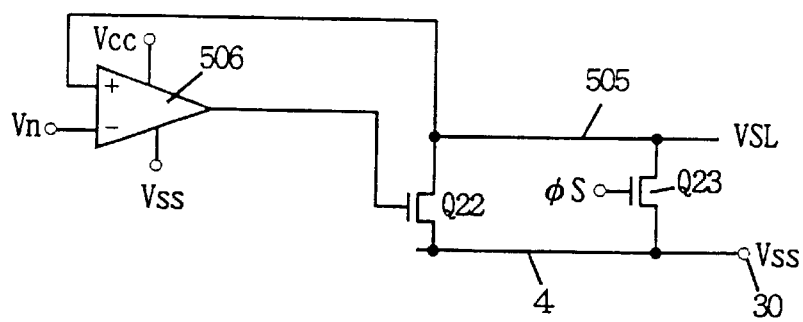
FIGS. 25A and 25B show a structure and operation waveforms of a power supply circuit in accordance with the second embodiment of the present invention.
Figure 25B:
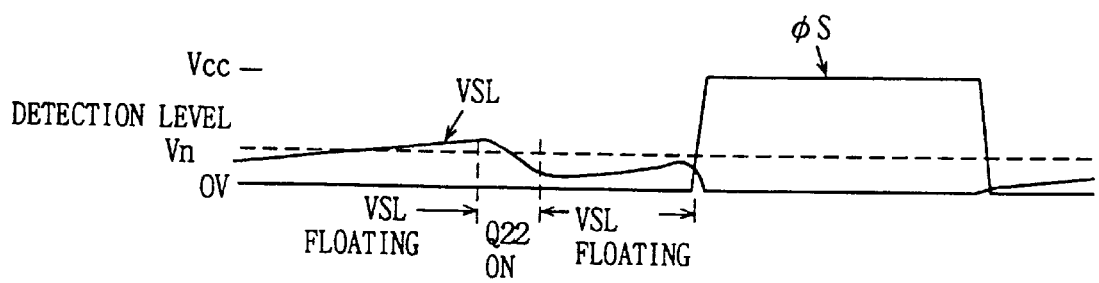

FIGS. 25A and 25B show the structure and operation of the power supply circuit generating the other power supply voltage (low level voltage, FIG. 25A) showing the structure of the power supply circuit (ground voltage supplying circuit) and FIG. 25B shows waveforms of operation.

Referring to FIG. 25A, the power supply circuit includes a main ground line 4 connected to the other power supply node (ground node) 30, a variable impedance ground line 505, an n channel MOS transistor Q23 which is rendered conductive in response to a control signal φs for connecting, when rendered conductive, main ground line 4 to variable impedance ground line 505, a differential amplifier (OP amplifier) 506 for comparing reference voltage Vn and voltage VSL, and an n channel MOS transistor Q22 responsive to an output from differential amplifier 506 for electrically connecting main ground line 4 to variable impedance ground line 505. Differential amplifier 506 receives at its positive input (+) the reference voltage Vn, and at its negative input, the voltage VSL. When the voltage VSL is lower than the reference voltage Vn, the output from differential amplifier 506 attains to the high level, and when the voltage VSL is higher than the reference voltage Vn, the output from differential amplifier 506 attains to the low level. Differential amplifier 506 operates using power supply voltage Vcc and ground voltage Vss as operating power supply voltages. The operation of the power supply circuit shown in FIG. 25A will be described with reference to the waveforms of FIG. 25B. The power supply circuit is used both for the row circuits and column circuits.

When control signal φs is at the low level, MOS transistor Q23 turns off. When the voltage VSL on variable impedance ground line 505 is lower than reference voltage Vn, the output of differential amplifier 506 attains to the low level, and MOS transistor Q22 turns off. Consequently, variable impedance ground line 505 is set to an electrically floating state. When the voltage VSL on variable impedance ground line 505 increases because of the subthreshold current in MOS transistors Q22 and Q23 or by the subthreshold current from any circuit connected to variable impedance ground line 505 and the voltage becomes higher than the reference voltage Vn, the output from differential amplifier 506 attains to the high level, and MOS transistor Q22 turns on, connecting variable impedance ground line 505 to the main ground line 4. Consequently, the voltage VSL lowers.

When the voltage VSL becomes lower than the reference voltage Vn, the output from differential amplifier 506 attains to the low level, the MOS transistor Q22 turns off, and variable impedance ground line 505 is again set to the electrically floating state. The electrically floating state is a state of high impedance which is higher than that provided by the electrical connection by the resistance element, and therefore current is hardly generated. Since variable impedance ground line 505 is isolated from ground node 30, current consumption can further be reduced.

When control signal φc is at the low level, current flows from variable impedance ground line 505 to ground node 30 only if MOS transistor Q22 is on. Therefore, when the variable impedance ground line 505 is at the high impedance state, current consumption can be further reduced as compared with a structure employing a resistance element. By appropriately setting response characteristics of differential amplifier 506 and MOS transistor Q22, the voltage VSL on the variable impedance ground line 505 set at the high impedance state can be set approximately at the level of the reference voltage Vn.

When control signal φs rises to the high level, MOS transistor Q23 turns on, variable impedance ground line 505 is set to a low impedance state and connected to ground node 30, and voltage VSL attains to the level of the ground voltage Vss. The output from differential amplifier 506 attains to the low level, and MOS transistor Q22 turns off.

Figure 26:
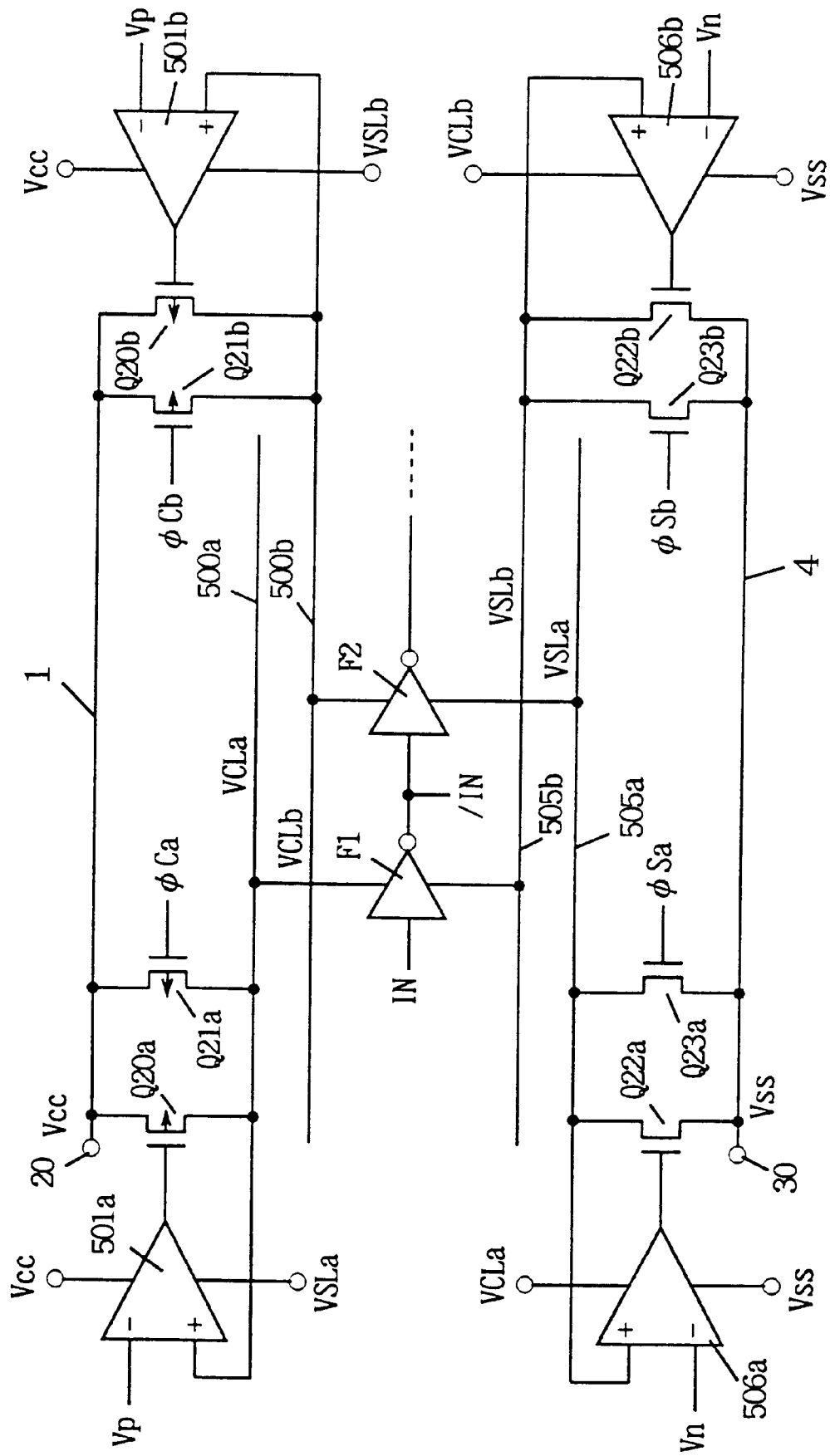
FIG. 26 shows a whole structure of a power supply circuit in accordance with the second embodiment of the present invention.

FIG. 26 shows the whole structure of the power supply circuit. Referring to FIG. 26, variable impedance power supply lines 500a and 500b are provided corresponding to the main power supply line 1. For variable impedance power supply line 500a, a differential amplifier 501a for comparing voltage VCLa on variable impedance power supply line 500a with a reference voltage VP, a p channel MOS transistor Q20a which is rendered conductive in response to an output from differential amplifier 501a for connecting main power supply line 1 to variable impedance power supply line 500a, and a p channel MOS transistor Q21a which is rendered conductive in response to control signal φca for connecting main power supply line 1 to variable impedance power supply line 500a are provided.

For variable impedance power supply line 500b, a differential amplifier 501b for comparing voltage VSLb on variable impedance power supply line 500b with reference voltage VP, a p channel MOS transistor Q20b which is rendered conductive in response to an output from differential amplifier 501b for connecting main power supply line 1 to variable impedance power supply line 500b, and a p channel MOS transistor Q21b which is rendered conductive in response to control signal φcb for connecting main power supply line 1 to variable impedance power supply line 500b are provided.

For the main ground line 4, variable impedance ground lines 505a and 505b are provided. For variable impedance ground line 505a, a differential amplifier 506a for comparing voltage VSLa on variable impedance ground line 505a with reference voltage Vn, an n channel MOS transistor Q22a which is rendered conductive in response to an output from differential amplifier 506a for connecting the main ground line 4 to variable impedance ground line 505a, and an n channel MOS transistor Q23a which is rendered conductive in response to control signal φsa for connecting variable impedance ground line 505b to main ground line 4 are provided.

For variable impedance ground line 505b, a differential amplifier 506b for comparing voltage VSLb on variable impedance ground line 505b and reference voltage Vn, an n channel MOS transistor Q22b which is rendered conductive in response to an output from differential amplifier 506b for connecting main ground line 4 to variable impedance ground line 505b, and an n channel MOS transistor Q23b which is rendered conductive in response to control signal φsb for connecting main ground line 4 to variable impedance ground line 505b are provided. Differential amplifiers 506a and 506b receive voltages VSLa and VSLb at positive inputs respectively, and receive reference voltage Vn at respective negative inputs.

Differential amplifier 501a receive at one power supply node, the power supply voltage Vcc, and at the other power supply node, the voltage VSLa. Differential amplifier 501a receives, at power supply node, the power supply voltage Vcc, and at the other power supply node, the voltage VSLb. Differential amplifier 506a receives, at one power supply node, the voltage VCLa, and at the other power supply node, the ground voltage Vss. Differential amplifier 506 receives, at one power supply node, the voltage VCLb, and at the other power supply node, the ground voltage Vss.

In operation, on and off of MOS transistors Q21a and Q23a are controlled at the same timings. Similarly, on and off of MOS transistors Q21b and Q23b are controlled at the same timings. The outputs from differential amplifiers 501a, 501b, 506a and 506b are valid when corresponding variable impedance power supply line or variable impedance ground line is set to the high impedance state. In order to turn off corresponding p channel MOS transistors Q20a and Q20b, differential amplifiers 501a and 501b must provide a high level signal, at the level of the power supply voltage Vcc. In order to turn on MOS transistors Q20a and Q20b, it is not always necessary to provide a signal at the level of the ground voltage Vss. Even when the voltage level is higher than the ground voltage Vss, MOS transistors Q20a and Q20b turn on provided that the gate potential is lower than the source potential. Accordingly, voltages of variable impedance ground lines which are set to the high impedance state at the same timing are supplied to the other power supply node of differential amplifiers 501a and 501b. Thus current in the differential amplifiers 501a and 501b can be suppressed.

Similarly, in order to turn off corresponding MOS transistors Q22a and Q22b, differential amplifiers 506a and 506b must provide a low level signal at the level of the ground voltage Vss. However, in order to turn on these transistors, it is not necessary to provide a signal at the level of the power supply voltage Vcc. MOS transistors Q22a and Q22b turn on provided that the gate potential is higher than the source potential. Therefore, voltages VCLa and VCLb are applied to one power supply node of differential amplifiers 506a and 506b, so as to suppress current consumption in the differential amplifiers 506a and 506b.

Though inverters F1 and F2 are shown as examples, these may be row or column circuits. The power supply circuit shown in FIG. 26 can be applied to each of the row circuits and column circuits. Further, the circuit may be applied to the first embodiment and to modifications of the first embodiment.

As described above, according to the second embodiment of the present invention, a power supply line (including the ground line) which is set to a high impedance state is set to an electrically floating state by means of a feedback circuit and the line is set to a high impedance state higher than the high resistance state provided by connection of a resistance element, supply voltage can be generated stably even when the corresponding variable impedance power supply line (or ground line) is at the high impedance state, and current consumption can be reduced.

[Embodiment 3]

Figure 27:
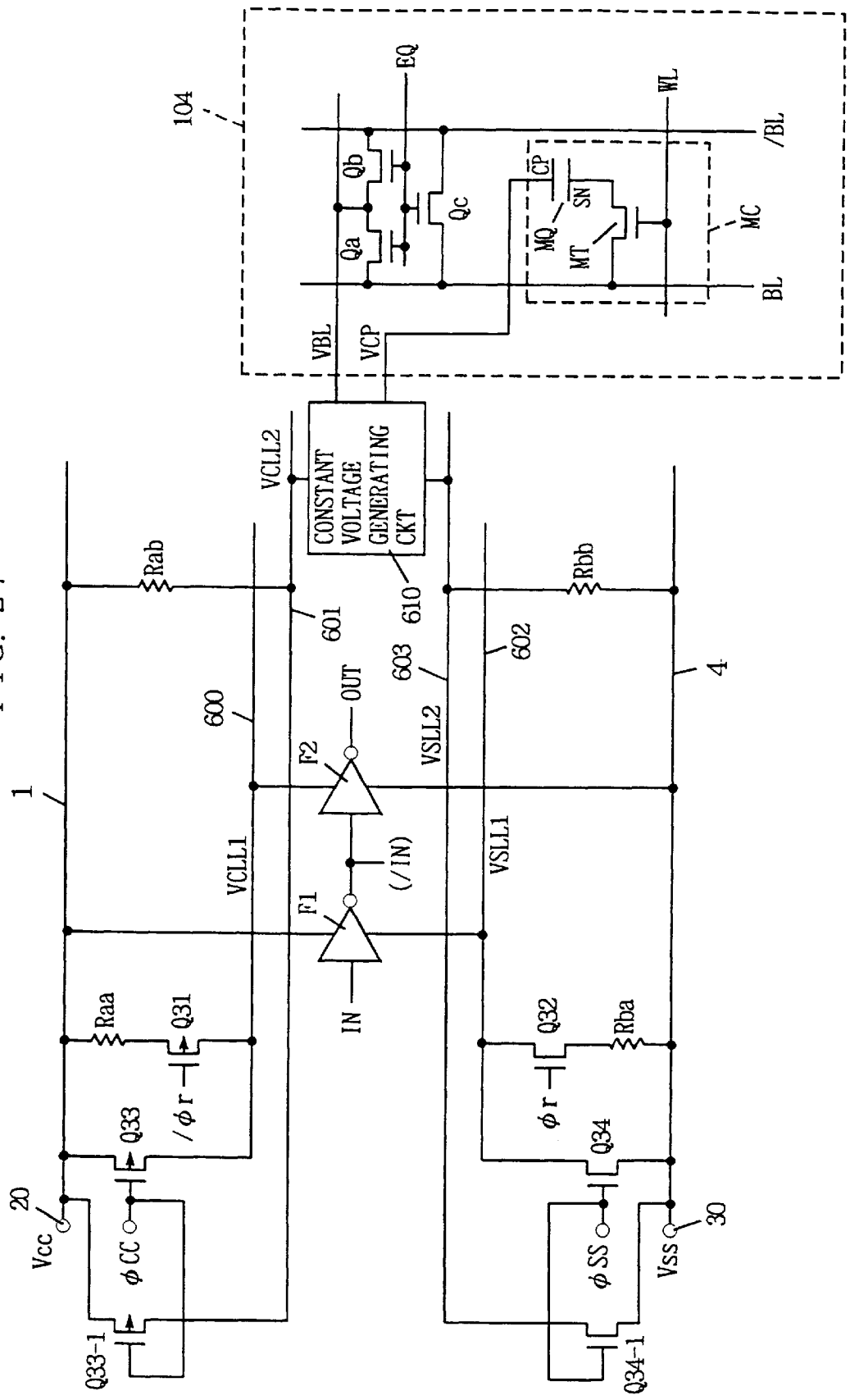
FIG. 27 shows a structure of a power supply circuit in accordance with a third embodiment of the present invention.

FIG. 27 shows a structure of a power supply circuit in accordance with a third embodiment of the present invention. Referring to FIG. 27, the power supply voltage supplying circuit includes main power supply line 1 connected to power supply node 20, variable impedance power supply lines 600 and 601 provided corresponding to main power supply line 1, main ground line 4 connected to the other power supply node (ground node) 30, and variable impedance ground lines 602 and 603 provided corresponding to main ground line 4. Variable impedance power supply line 600 is connected to main power supply line 1 through a p channel MOS transistor Q33 which is rendered conductive in response to control signal φcc. Between main power supply line 1 and variable impedance power supply line 600, a p channel MOS transistor Q31 which is rendered conductive in response to control signal /φr, and resistance Raa are provided, parallel to p channel MOS transistor Q33. Resistance Raa and MOS transistor Q31 are connected in series. Variable impedance power supply line 601 is connected to main power supply line 1 through a resistance Rab, and to main power supply line 1 through an MOS transistor Q33-1 which is rendered conductive in response to control signal φcc. Resistances Raa and Rab have large resistance values. MOS transistor Q31 has current supplying capability enough to provide a current flowing through resistance Raa. The on-resistance of MOS transistor Q31 is set sufficiently lower than resistance Raa. MOS transistor Q33 has sufficiently smaller on resistance than resistance Raa, and has sufficiently large current supplying capability. MOS transistor Q33-1 has on-resistance sufficiently smaller than the resistance value of resistance Rab.

Between variable impedance ground line 602 and main ground line 4, n channel MOS transistor Q32 and resistance Rba are connected in series. MOS transistor Q32 is rendered conductive in response to a control signal φr. Parallel to MOS transistor Q32 and resistance Rba, an n channel MOS transistor Q34 is provided, which is rendered conductive in response to control signal φss. When conducted, MOS transistor Q34 connects main ground line 4 to variable impedance ground line 602. Variable impedance ground line 603 is connected to main ground line 4 through an n channel MOS transistor Q34-1 which is rendered conductive in response to control signal φss, and connected to main ground line 4 through resistance Rbb. On-resistance of MOS transistor Q32 is set sufficiently smaller than the resistance value of resistance Rba. On-resistances of MOS transistors Q34 and Q34-1 are set at sufficiently smaller values than resistance values of resistances Rba and Rbb, respectively. MOS transistor Q34 has sufficiently large current supplying capability, and MOS transistor Q32 has current supplying capability sufficient to pass the current flowing through resistance Rba.

Inverters F1 and F2 are shown as representing an example of a circuit to which the power supply voltage (including power supply voltages for high level and low level) is supplied by the power supply circuit. A constant voltage generating circuit 610 for generating a bit line precharge voltage VBL and a cell plate voltage VCP is shown. Inverter F1 has one power supply node connected to main power supply line 1, and the other power supply node connected to variable impedance ground line 602. Inverter F2 has one power supply node connected to variable impedance power supply line 600 and the other power supply node connected to main ground line 4. An input signal IN attains to the low level in the stand-by cycle. The bit line precharge voltage VBL and the cell plate voltage VCP from constant voltage generating circuit 610 are applied to memory cell array 104.

In memory cell array 104, structures of a bit line precharge/equalize circuit corresponding to a pair of bit lines BL and /BL and of one memory cell MC are shown as a representative.

The equalize/precharge circuit includes n channel MOS transistors Qa and Qb which are rendered conductive in response to an equalizing signal EQ for transmitting the bit line precharge voltage VBL to the bit lines BL and /BL, and an n channel MOS transistor Qc which is rendered conductive in response to the equalizing signal EQ for electrically connecting the bit lines BL and /BL. The cell plate voltage VCP is connected to a cell plate CP of a memory capacitor MQ contained in memory cell MC. Generally, the bit line precharge voltage VBL and the cell plate voltage VCP are at a voltage level intermediate (½) between power supply voltage Vcc and ground voltage Vss (½). For the constant voltage generating circuit 610 to generate accurate intermediate potential, the amounts of voltage drop across resistances Rab and Rbb are set to equal values. An intermediate voltage can be generated stably even when variable impedance power supply lines 601 and 603 are set to the high impedance state. The operation of the circuit shown in FIG. 27 will be described with reference to the diagram of waveforms of FIG. 28.

In a DRAM, there is a data holding mode such as a power down mode (in which voltage level of power supply voltage Vcc is lowered) or a CAS before RAS refresh mode. The CAS before RAS refresh mode is a refresh mode designated by the fall of external column address strobe signal /CAS prior to the fall of external row address strobe signal /RAS. In the CAS before RAS refresh mode which is generally referred to as CBR refresh mode, refresh is executed internally in the cycle satisfying the CAS before RAS condition, and in the data holding period, refresh is executed internally at every prescribed time period (self-refresh mode). In the power down mode, power supply voltage Vcc is lowered, and the period of refresh is made longer.

At a stand-by state in the normal operation mode, control signal φcc is set at the high level, and control signal φss is set at the low level. At this state, MOS transistors Q33, Q33-1, Q34 and Q34-1 are turned off. Power supply lines 600 and 601 as well as ground lines 602 and 603 are set to the high impedance state. At this time, control signal φr is at the high level, control signal φr is at the low level and MOS transistors Q31 and Q32 are both on. Therefore, power supply voltage Vcc is supplied to variable impedance power supply line 600 through resistance Raa and MOS transistor Q31, and the voltage VCLL1 is set to a level lower than the power supply voltage Vcc. Meanwhile, since power supply voltage Vcc is applied to variable impedance power supply line 601 through resistance Rab, the voltage VCLL2 becomes lower than the power supply voltage Vcc. Since variable impedance ground line 602 is connected to main ground line 4 through MOS transistor Q32 which is on and resistance Rba, the voltage VSLL1 becomes higher than the level of the ground voltage Vss. Since variable impedance ground line 603 is connected to main ground line 4 through resistance Rbb, the voltage VSLL2 thereof is also set to a voltage level higher than the ground voltage Vss. At this time, if (VCLL2+VSLL2)/2 is equal to Vcc/2, it is possible to stably generate constant voltages VBBL and VCP.

As will be described later, when the power down mode or the CBR refresh mode is designated, internal row address strobe signal is generated and refreshing operation takes place. In the CBR active cycle in which refresh is performed, control signal φss is set to the high level, control signal φcc is set to the low level, MOS transistors Q33, Q33-1, Q34 and Q34-1 are all turned on, and voltages VCLL1 and VCLL2 on variable impedance power supply lines 600 and 601 are set to the level of the power supply voltage Vcc. The voltages VSLL1 and VSLL2 on variable impedance ground lines 602 and 603 are set to the level of the ground voltage Vss. When the CBR active cycle terminates, internal row address strobe signal RAS falls to the low level. In response to the fall of internal row address strobe signal RAS, control signal φr is set to the low level, control signals φr is set to the high level, and MOS transistors Q31 and Q32 are turned off. Control signal φss is also set to the low level, control signal φcc is set to the high level, and MOS transistors Q33, Q33-1, Q34 and Q34-1 are all turned off. Variable impedance power supply line 601 is connected to main power supply line 1 through resistance Rab, and voltage VCLL2 becomes lower than the level of the power supply voltage Vcc. Similarly, variable impedance ground line 603 is connected to main ground line 4 through resistance Rbb, and voltage VSLL2 thereof becomes higher than the level of the ground voltage Vss. Since power supply voltage Vcc and ground voltage Vss are coupled to the voltages VCLL2 and VSLL2 through resistances Rab and Rbb, the levels of these voltages are stable in the data holding period.

Meanwhile, MOS transistors Q31 and Q32 are turned off, and hence variable impedance power supply line 600 and variable impedance ground line 602 are set to an electrically floating state, more specifically, electrically floating state with higher resistance than the resistance values of resistances Raa and Rbb. In this period, since voltages VCLL1 and VSLL1 are set to the electrically floating state, voltage levels thereof change because of discharging.

In the stand-by cycle and in the data holding state (except the refresh period), equalizing signal EQ is at a high level, and bit lines BL and /BL are held at the bit line precharge potential VBBL. At this time also, voltages VCLL2 and VSLL2 are maintained at constant voltage levels, and therefore the bit lines BL and /BL can be maintained stably at the intermediate potential.

Similarly, the cell plate voltage VCP maintains a constant voltage level. Consequently, data can be accurately held in the memory cell MC. In the data holding state, since variable impedance power supply line 600 and variable impedance ground line 602 are set to the electrically floating state, current is not consumed in this path, enabling extremely low power consumption.

Figure 28:
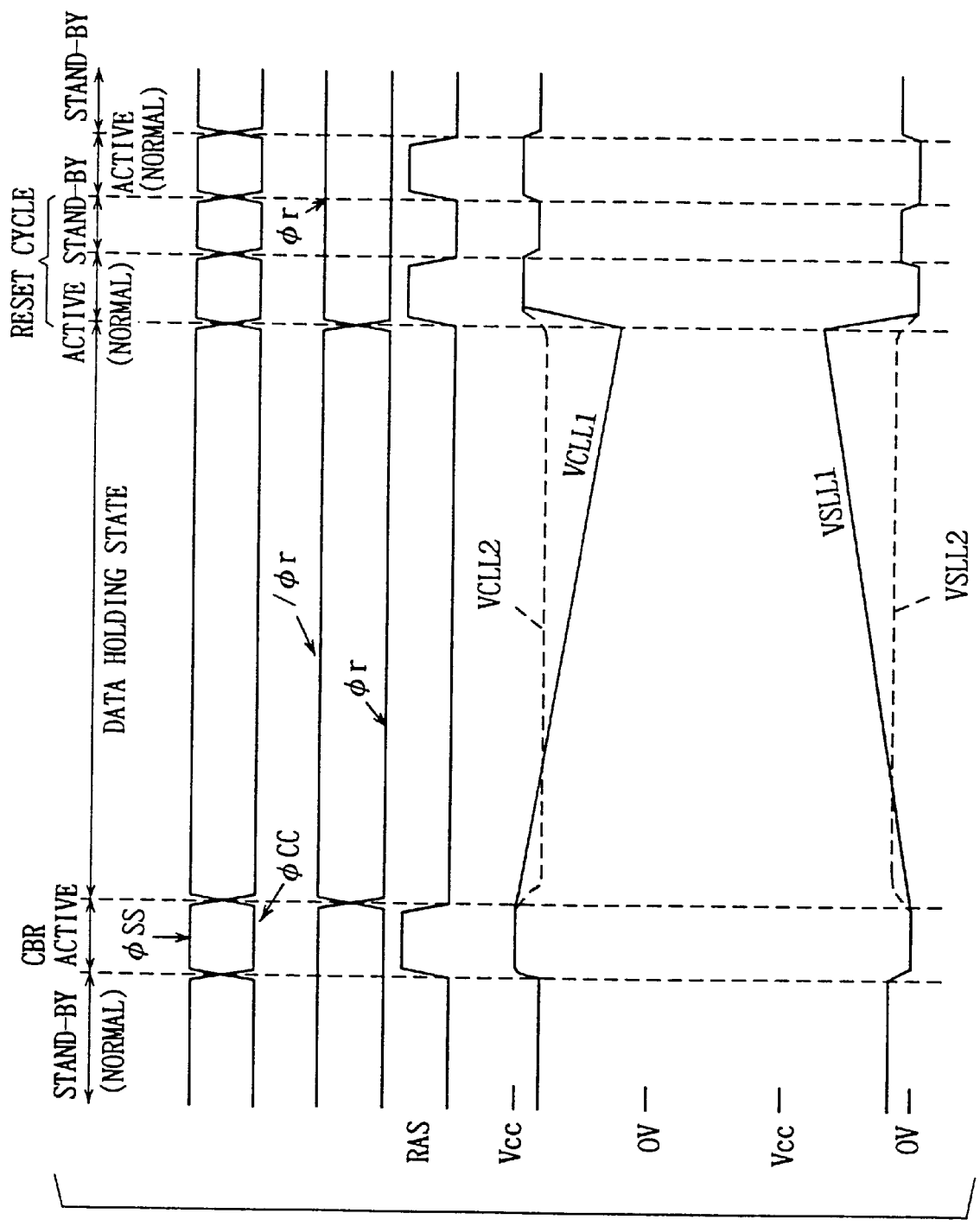
FIG. 28 is a diagram of signal waveforms showing the operation of the power supply circuit shown in FIG. 27.

When the data holding mode terminates, control signal φr attains to the high level, control signal φr attains to the low level and MOS transistors Q31 and Q32 turn on. Since voltage levels of voltages VCLL1 and VSLL1 have been changed because of the leak during the data holding made, reset cycle is again executed after the completion of data holding made. In the reset cycle, the active cycle and the stand-by cycle are executed prescribed number of times (only one for each is shown in FIG. 28). As the active cycle occurs in the reset cycle, internal row address strobe signal RAS rises to the high level, while control signal φss is set to the high level and control signal φcc is set to the low level, variable impedance power supply lines 600 and 601 as well as variable impedance ground lines 602 and 603 are set to the low impedance state, voltages VCLL1 and VCLL2 are set to the level of the power supply voltage Vcc and voltages VSLL1 and VSLL2 are set to the level of the ground voltage Vss. The reset cycle is implemented by toggling prescribed number of times the external row address strobe signal ext/RAS after the end of the data holding mode. By executing the reset cycle, voltages VCLL1 and VSLL1 return to the prescribed voltage levels.

When the reset cycle terminates, a normal operation cycle (active cycle and stand-by cycle) is executed.

In the above described structure, since power is supplied to constant voltage generating circuit 610 through resistances Rab and Rbb, voltages VBBL and VCP from constant voltage generating circuit 610 can be maintained at constant voltage levels, bit line precharge voltage VBBL and cell plate voltage VCP are maintained at the intermediate potential in the reset cycle, and thus memory cell data can be refreshed accurately.

In FIG. 28, internal RAS signal is shown maintaining the low level in the data holding state. In the data holding state, self-refresh may take place in which row address strobe signal RAS rises to the high level at a prescribed time interval, executing refresh. In that case, control signals φss and φcc are set to the high level and low level, respectively, in each self-refresh cycle.

Figure 29:
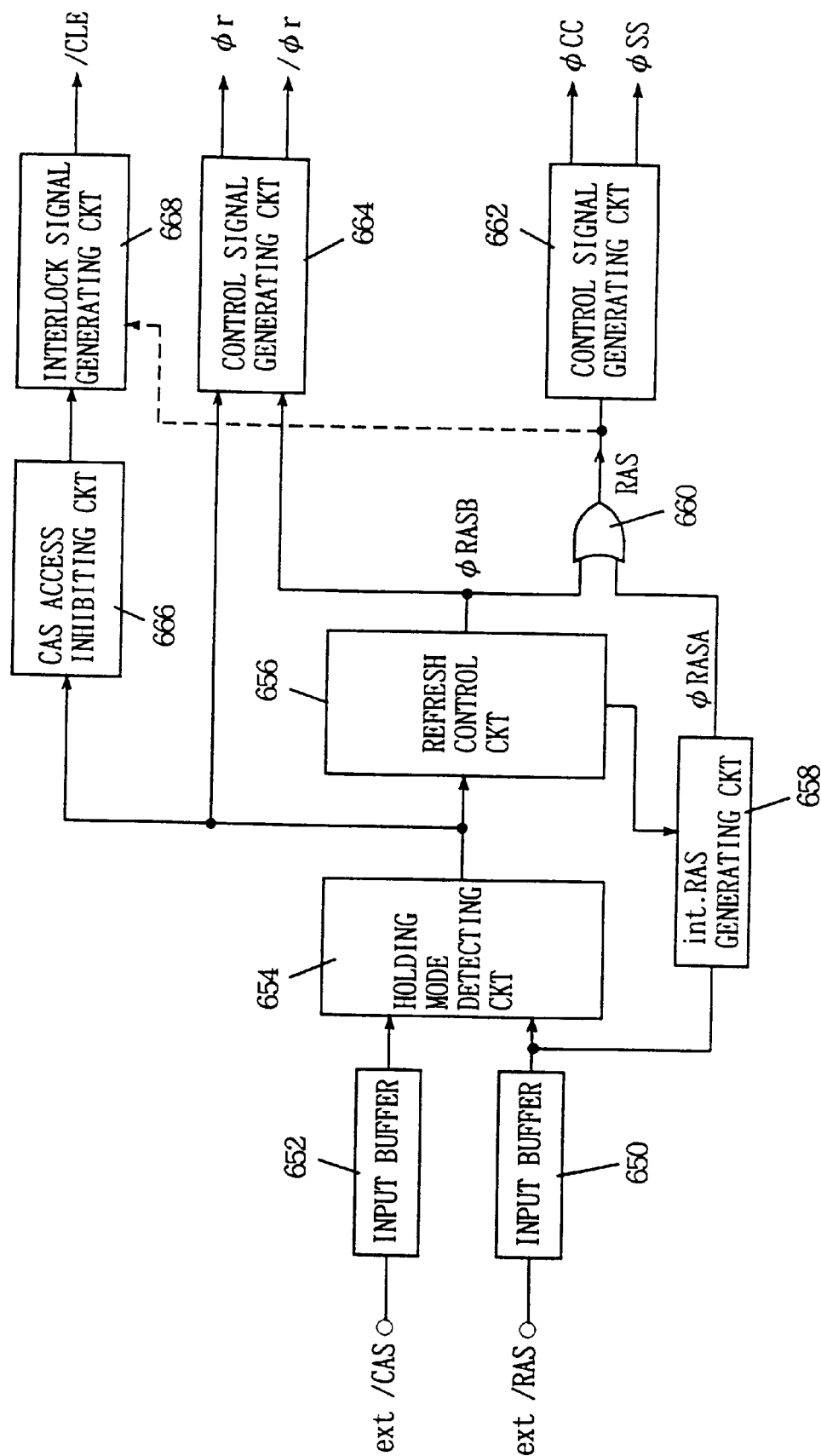
FIG. 29 shows a structure for generating control signals shown in FIG. 27.

FIG. 29 shows a circuit structure for generating control signals shown in FIG. 27. Referring to FIG. 29, the control signal generating circuitry includes an input buffer 650 for buffering the external row address strobe signal ext/RAS; an input buffer 652 for buffering external column address strobe signal ext/CAS; a holding mode detecting circuit 654 responsive to output signals from input buffers 650 and 652 for detecting designation of a data holding mode such as a power down mode or the CBR refresh mode; a refresh control circuit 656 responsive to a data holding mode designating signal from holding mode detecting circuit 654 for performing control operation necessary for refreshing; an internal RAS generating circuit 658 responsive to an output signal from input buffer 650 for generating internal RAS signal φRASA; a gate circuit 600 receiving internal RAS signal φRASB from refresh control circuit 656 and internal RAS signal φRASA from internal RAS generating circuit 658 for generating an internal row address strobe signal RAS; a control signal generating circuit 662 responsive to the internal row address strobe signal RAS from gate circuit 660 for generating control signals φcc and φss; a control signal generating circuit 664 for generating control signals φr and /φr in response to the data holding mode designating signal from holding mode detecting circuit 654; a CAS access inhibiting circuit 666 responsive to the data holding mode designating signal from holding mode detecting circuit 654 for inhibiting operations related to column selection; and an interlock signal generating circuit 668 responsive to an output signal from CAS access inhibiting circuit 666 for maintaining the interlock signal /CLE at an inactive state. Interlock signal generating circuit 668 generates, in the normal operation mode other than the data holding mode, the interlock signal /CLE in accordance with the internal row address strobe signal RAS from gate circuit 660.

Comparing to the structure of FIG. 13, input buffer 650 and internal RAS generating circuit 658 correspond to /RAS buffer 200, and holding mode detecting circuit 654 and refresh control circuit 656 correspond to refresh controller 204. Input buffer 652 is included in /CAS buffer 210. Refresh control circuit 656 includes a timer and an address counter, and when the data holding mode is designated, it applies the output from address counter to row address buffer or row decoder, generates an internal RAS signal φRASB having a prescribed time width, and performs refreshing operation using the count value of the address counter as the row address. When refreshing operation completes (CBR refresh), refresh control circuit 656 activates the timer as will be described later, and generates internal RAS signal φRASB at a prescribed interval (self-refresh mode). When data holding mode is designated, refresh control circuit 656 maintains internal RAS generating circuit 658 inactive, inhibiting generation of the internal RAS signal φRASA. Gate circuit 660 generates internal row address strobe signal RAS in accordance with internal RAS signals φRASB and φRASA. The row circuits operate in accordance with the internal row address strobe signal RAS.

When internal row address strobe signal RAS is activated (high level), control signal generating circuit 662 set control signal φcc to the low level and control signal φss to the high level, and when internal row address strobe signal RAS is inactive (low level), it sets the control signal φcc to the high level and control signal φss to the low level. When the output from holding mode detecting circuit 654 is active, designating data holding mode, control signal generating circuit 664 sets the control signal φr to the low level and control signal /φr to the high level, when the internal RAS signal φRASB from refresh control circuit 656 changes from active state to inactive state.

FIG. 30 is a diagram of signal waveform showing the operation of the circuit shown in FIG. 29. The operation of the circuit shown in FIG. 29 will be described with reference to the waveforms of FIG. 30.

When external column address strobe signal ext/CAS is at the low level at the rise of external row address strobe signal /RAS, data holding mode is designated. In response to the designation of data holding mode, internal RAS signal φRASB is generated from refresh control circuit 656, and in response, internal row address strobe signal RAS rises to the high level. During this period, CBR refresh is executed. In the CBR refresh period, signal φcc is set to the low level, and control signal φss is set to the high level. When CBR refresh cycle is completed, control signal generating circuit 664 sets control signal φr to low level and control signal /φr to the high level.

When CBR refresh period terminates, self-refresh period starts. In the self-refresh period, external row address strobe signal ext/RAS and external column address strobe signal ext/CAS are both set to the low level state. A structure in which only one of external row address strobe signal ext/RAS and column address strobe signal ext/CAS is set to the low level may be utilized. During this period, refresh control circuit 656 generates internal RAS signal φRASB at a prescribed time interval, and in response, internal row address strobe signal RAS is generated. In response to activation (high level) of internal row address strobe signal RAS, control signal generating circuit 662 sets control signal φcc to the low level and control signal φss to the high level.

In response to the internal RAS signal φRASB from refresh control circuit 656, control signal generating circuit 666 sets control signal φr to the high level and control signal /φr to the low level. Therefore, refreshing is executed at prescribed time intervals. During this period, interlock signal generating circuit 668 sets interlock signal /CLE to the high level state by the output signal from CAS access inhibiting circuits 666, inhibiting operation of the column circuits.

When external row address strobe signal ext/RAS and external column address strobe signal ext/CAS both rise to the high level, data holding mode completes. In response to the completion of data holding mode, control signal generating circuit 664 sets control signal $\phi r$ to the high level, and control signal $/\phi r$ to the low level. When data holding mode is completed, reset cycle is executed. In the reset cycle, external row address strobe signal ext/RAS is set to the low level a prescribed number of times. In response to activation (low level) of external row address strobe signal ext/RAS, internal RAS generating circuit 658 generates internal RAS signal $\phi$RASA, and in response, internal row address strobe signal RAS is activated. In response to activation of internal row address strobe signal RAS, control signal $\phi cc$ is set to the low level, control signal $\phi ss$ is set to the high level, and potentials on the power supply lines and the ground lines are recovered. When the reset cycle is completed, and accessing operation is executed in accordance with external row address strobe signal ext/RAS and column address strobe signal ext/CAS.

In the foregoing description, control signals $\phi cc$ and $\phi ss$ set variable impedance power supply line 600 and variable impedance ground line 602 to the low impedance state/high impedance state, in response to activation/inactivation of internal row address strobe signal RAS. Therefore, control signals $\phi r$ and $/\phi r$ may be fixedly set at the low level and the high level respectively, in the data holding mode.

This structure can similarly be applied to the first embodiment. More specifically, when internal row address strobe signal RAS from gate circuit 660 is used as the internal row address strobe signal RAS shown in FIG. 14, a structure can be implemented in which impedances of the variable impedance power supply line and variable impedance ground line are changed in accordance with the operation cycle and operation period. In other words, when control signal generating circuit 662 is replaced by the impedance control signal generating circuit 308 shown in FIG. 14, a structure can be provided in which the active DC current can be significantly reduced and the stand-by current can further be reduced. In that case, the same manner of generation of control signals or and $/\phi r$ as shown in the third embodiment can be utilized both for the row and column circuits. More specifically, in either of the power supply circuit for the row circuits and the power supply circuit for column circuits, an MOS transistor is provided in series with a resistance element, and the MOS transistor is turned off in the data holding mode. As to the manner of generation of the signals $\phi r$ and $/\phi r$, a gate circuit which operates as a buffer when data holding mode designating signal is activated for passing the signal RAS, and provides a high level signal when the data holding mode designating signal is inactivated, and an inverter inverting the output from the gate circuit may be utilized.

As described above, according to the third embodiment of the present invention, the variable impedance power supply lines and variable impedance ground lines which are set to the high impedance state in the data holding mode are both adapted to be set to the electrically floating state, whereby current consumption in the data holding mode can be significantly reduced.

[Embodiment 4]

Figure 31:
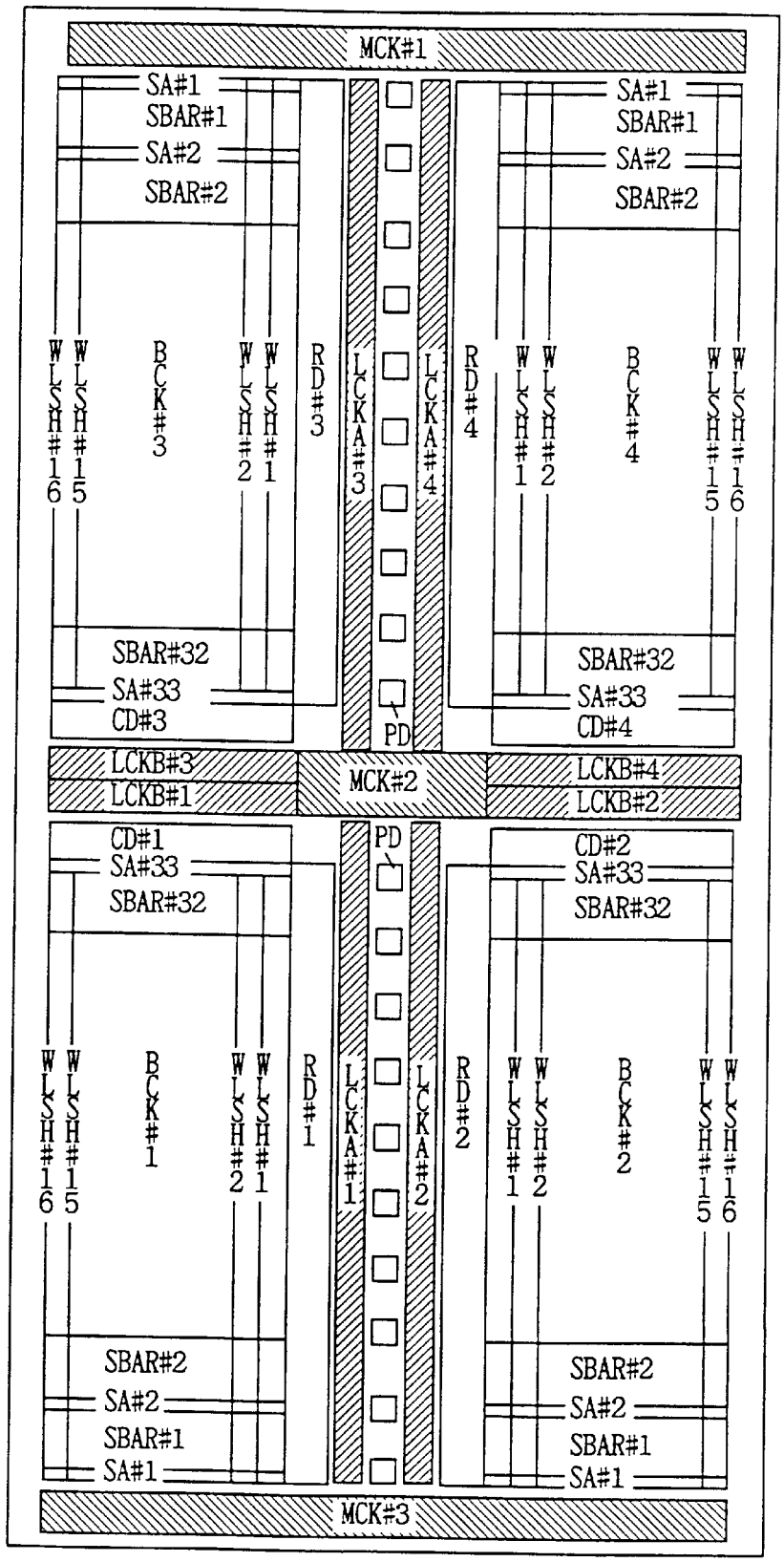
FIG. 31 shows a whole structure of a DRAM to which a fourth embodiment of the present invention is applied.

FIG. 31 shows overall chip layout of the DRAM. Referring to FIG. 31, the DRAM includes four memory blocks BCK#1 to BCK#4. Each of the memory blocks BCK#1 to BCK#4 is divided into 32 subarrays SBAR#1 to SBAR#32. In each of the memory blocks BCK#1 to BCK#4, sense amplifier bands SA#1 to SA#3 are arranged on both sides of a subarray SBAR. The sense amplifiers are arranged in a so called "alternately arranged shared sense amplifier arrangement".

Row local circuits LCKA#1 to LCKA#4 and column local circuits LCKB#1 to LCKB#4 are provided for memory blocks BCK#1 to BCK#4, respectively. Column decoders CD#1 to CD#4 and row decoders RD#1 to RD#4 are provided for memory blocks BCK#1 to BCK#4, respectively. Master circuits MCK#1 and MCK#3 are provided on opposing sides of the chip, and master circuit MCK#2 is provided at the center of the chip. Master circuit MCK#2 generates various control signals for controlling operations of local circuits LCKA#1 to LCKA#4 to LCKB#1 to LCKB#4. Master circuits MCK#1 and MCK#3 include a constant voltage generating circuit, a control signal input buffer and so on. In a region between row local circuits, pads PD for input/output of data, address signals and external control signals are arranged. Namely, the DRAM has a so called "Lead On Chip (LOC) arrangement".

Each of subarrays SBAR#1 to SBAR#32 is divided into 16 subblocks by word line shunt regions WLSH#1 to WLSH#16. In word line shunt regions WLSH#1 to WLSH#16, the word line is electrically connected to a conductor line having low resistance. To the conductor line of low resistance, word line driving signal from row decoder RD (RD#1 to RD#4) is transmitted. Thus the word line driving signal can be transmitted at high speed.

Generally, parallel to sense amplifier bands SA#1 to SA#33, local IO lines for transmitting memory cell data selected in subarrays SBAR#1 to SBAR#32 are provided. These local IO lines are connected to global IO lines for data input/output. Connection between local IO line and global IO lines is provided in accordance with a "block selection (subarray selection)" signal. In other words, the DRAM shown in FIG. 31 has a partially activated operation. For example, in each of the memory blocks BCK#1 to BCK#4, one subarray SBAR is set to the selected state, and row selection and column selection operations are executed in the selected subarray. The remaining non-selected subarrays are maintained at the stand-by state. In the block division or partially activating configuration, a subarray is not necessarily be selected in every memory block BCK#1 to BCK#4. A structure in which a plurality of subarrays are activated in one memory block BCK may be used.

For realizing such block division or partial activation, row decoders RD#1 to RD#4 and column decoders CD#1 to CD#4 are provided, as well as local circuits LCKA#1 to LCKA#4 and LCKB#1 to LCKB#4 for memory blocks BCK#1 to BCK#4, respectively. Column decoders CD#l to CD#4 simultaneously select the same column line (bit line pair) of subarrays SBAR#1 to SBAR#32 in the corresponding memory blocks BCK#1 to BCK#4. Row decoders RD#1 to RD#4 set one word line to the selected state in a memory subarray designated by a block subarray selecting signal, in subarrays SBAR#1 to SBAR#32. In this case, in the non-selected subarrays, the bit line pair is connected to a corresponding local IO line. However, the local IO line provided corresponding to the non-selected subarray is maintained at an intermediate potential (precharge potential), which is the same as the intermediate potential of the bit lines in the non-selected subarray. Therefore, memory cell data is not destroyed in the non-selected subarray. Only the local IO line of the selected subarray is connected to the global IO line.

FIG. 32 shows a structure of a power supply circuit in accordance with a fourth embodiment of the present invention. Referring to FIG. 32, the power supply circuit is provided for each block (memory block or subarray) as a unit which is driven in block division (partial activation) manner of the DRAM shown in FIG. 31. FIG. 32 shows an example in which there are n unit blocks and power supply circuits 700-1 to 700-n. To each of power supply circuits 700-1 to 700-n, power supply voltage Vcc applied to the power supply node 20 is transmitted through main power supply line 1 and ground voltage Vss applied to the ground node 30 is transmitted through main ground line 4.

In order to control impedances of variable impedance power supply lines and variable impedance ground lines of power supply circuits 700-1 to 700-n, a block selection circuit signal generating circuit 710 and an impedance change control signal generating circuit 720 are provided. Block selection signal generating circuit 710 decodes a block address (which is generally included in the X address), generates block selection signals φB1 to φBn designating a block including the selected memory cell, and applies the block selection signals φB1 to φBn to power supply circuits 700-1 to 700-n, respectively. Impedance change control signal generating circuit 720 applies impedance change control signals φss1, φcc1 to φccn, φssn to power supply circuits 700-1 to 700-n, in accordance with the signals RAS and /CLE as well as the block selection signal from block selection signal generating circuit 710.

Impedance change control signal generating circuit 720 changes impedance change control signals φss1 and φcc1 in accordance with the signals RAS and /CLE, only in the power supply circuit provided corresponding to that block which is designated by the block selecting signal from block selecting signal generating circuit 710. Impedance change control signal generating circuit 720 maintains the impedance change control signals φss1 and φcc1 thereof at the stand-by state for the power supply circuits provided corresponding to the non-selected blocks. Impedance change control signal generating circuit may not be provided common to power supply circuits 700-1 to 700-n. Alternatively, a structure in which the impedance change control signal generating circuit is provided corresponding to each of power supply circuits 700-1 to 700-n may be used. As for the structure of the impedance change control signal generating circuit 720 for generating the impedance change control signal in accordance with the block selection signal from block selection signal generating circuit 710, a logic gate which buffers the signals RAS and /CLE and provides a result when the block selection signal is active, and maintains the signals RAS and /CLE at the stand-by state when the block selection signal indicates the non-selected state, may be used. Such logic gate can be readily implemented by an AND circuit and an NAND circuit.

Figure 33:
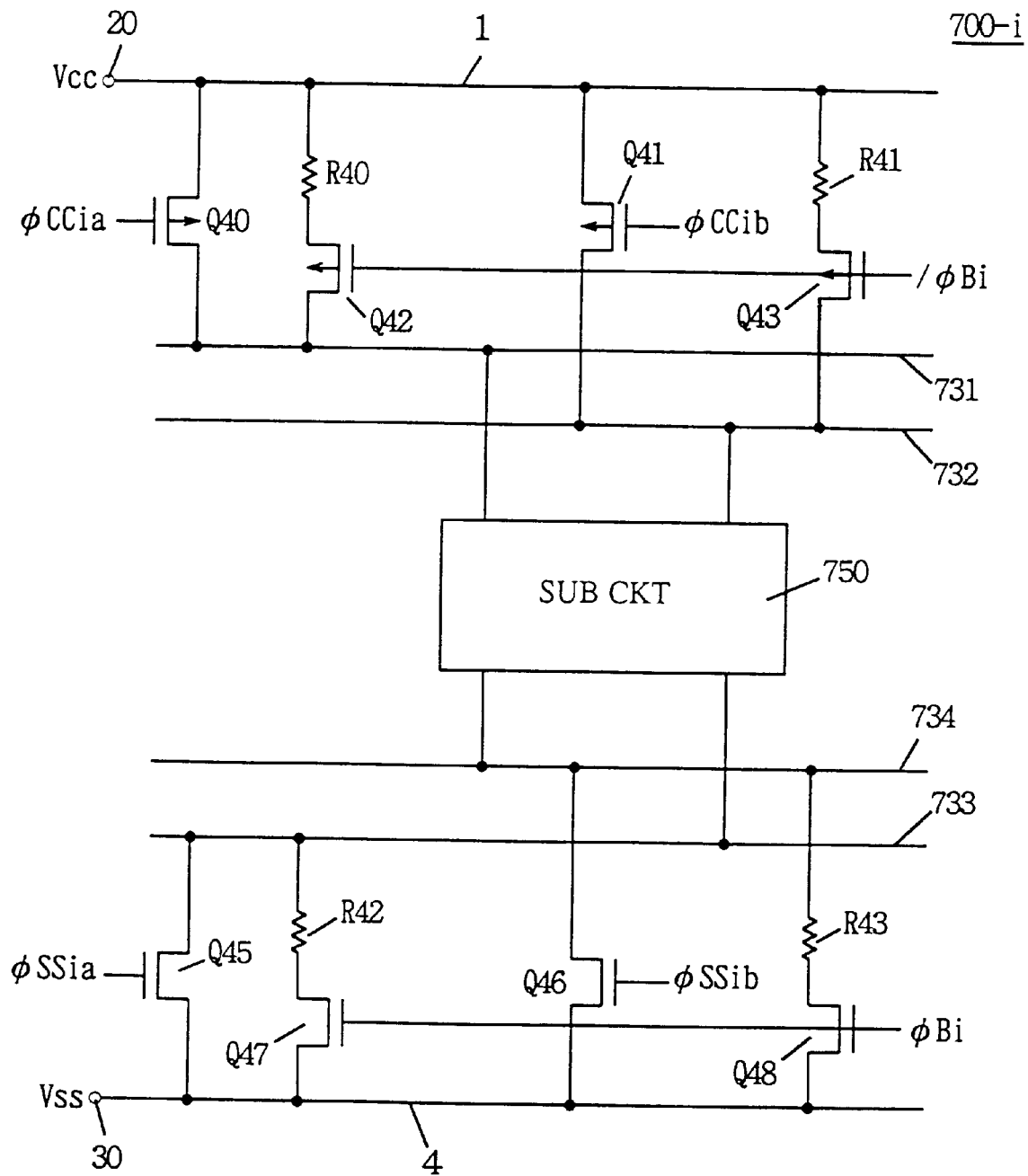
FIG. 33 shows an example of a structure of the power supply circuit shown in FIG. 32.

FIG. 33 shows an example of the structure of power supply circuits 700-1 to 700-n shown in FIG. 32. FIG. 33 shows a structure of only one power supply circuit. Referring to FIG. 33, power supply circuit 700-i (i=1 to n) includes variable impedance power supply lines 731 and 732, variable impedance ground lines 733 and 734, a p channel MOS transistor Q40 which is rendered conductive in response to a control signal φccia for connecting main power supply line 1 to variable impedance power supply line 731, a p channel MOS transistor Q41 which is rendered conductive in response to control signal φccib for connecting main power supply line 1 to variable impedance power supply line 732, a resistance R40 and a p channel MOS transistor Q42 connected in series between main power supply line 1 and variable impedance power supply 731, and a resistance R41 and a p channel MOS transistor Q43 connected in series between main power supply line 1 and variable impedance power supply line 732. A block selection signal /φBi which attains to the low level when the corresponding block is at the selected state, is applied to the gates of p channel MOS transistors Q42 and Q43.

Power supply circuit 700-1 further includes an n channel MOS transistor Q45 which is rendered conductive in response to control signal φssia for connecting main ground line 4 to variable impedance ground line 733, an n channel MOS transistor Q46 which is rendered conductive in response to control signal φssib for connecting main ground line 4 with variable impedance ground line 734, a resistance R42 and an n channel MOS transistor Q47 connected in series between main ground line 4 and variable impedance ground line 733, and a resistance R43 and an n channel MOS transistor Q48 connected in series between main ground line 4 and variable impedance ground line 734. A block selection signal φBi which attains to the high level when the corresponding block is selected, is applied to the gates of n channel MOS transistors Q47 and Q48.

A subcircuit 750 is driven in block division or partial activation manner, which is activated when the block selection signal φBi is at the high level indicative of the selected state, and performs necessary operation. The subcircuit 750 may be a row circuit or a column circuit, and it is included in the local circuit shown in FIG. 31.

Control signals φccia, φccib, φssia and φssib may be generated in any of the manners of Embodiments 1 and to 3. MOS transistors Q40 and Q45 are turned on and off at the same timing, and MOS transistors Q41 and Q46 are turned on and off at the same timing. The operation will be briefly described.

In the stand-by cycle, one of the variable impedance power supply lines 731 and 732 is set to the low impedance state, and the other one is set to the high impedance state. In the stand-by state, block selection signal /φBi is at a high level indicating the non-selected state, and MOS transistors Q42 and Q43 are off. Therefore, the variable impedance power supply line which has been set to the high impedance state is set to the electrically floating state. Consequently, current consumption in the power supply line which is set to the high impedance state can be reduced.

One of the variable impedance ground lines 733 and 734 is set to the low impedance state, and the other to the high impedance state. At the stand-by state, block selection signal φBi is at a low level indicative of the non-selected state, and MOS transistors Q47 and Q48 are off. Therefore, the variable impedance ground line which has been set to the high impedance state is set to the electrically floating state and isolated from ground node 30. Therefore, the subthreshold current of the variable impedance ground line which is at the high impedance state can be suppressed.

In an active cycle, when a corresponding block is designated, block selecting signal /φBi attains to the low level, block selection signal φBi attains to the high level, and MOS transistors Q42, Q43, Q47 and Q48 are turned on. Consequently, variable impedance power supply lines 731 and 632 are connected to main power supply line 1 through resistances R40 and R41, while variable impedance ground lines 733 and 734 are connected to main ground line 4 through resistances R42 and R43. In the active cycle period, control signals φccia, ccib, φssia and φssib change in the similar manner as described in any of the Embodiments 1 to 3, thus suppressing the subthreshold current. In the power supply circuit provided corresponding to the non-selected block, in the active cycle, block selection signal /φBi is at the high level, block selection signal φBi is at the low level, and MOS transistors Q42, Q43, Q47 and Q48 are off. Control signals φccia, φccib, φssia and φssib are maintained at the same states as in the stand-by cycle. In this manner, in the non-selected memory block, the variable impedance power supply lines and variable impedance ground lines which are at the high impedance state are maintained at the electrically floating state, whereby the current flowing through the resistance can be suppressed and subthreshold current can further be reduced.

Physical parameters of MOS transistors Q40 to Q48 and of resistances R40 to R43 are the same as those described with reference to Embodiments 1 to 3.

In this structure, it is possible that a certain block is maintained at the non-selected state for a long period of time, while the potentials of variable impedance power supply lines and the variable impedance ground lines which are at the high impedance state change only because of leak current. However, refreshing operation is performed periodically in the DRAM and accordingly, block selection signals φBi and /φBi are set to the selected state, and therefore the potentials of the variable impedance power supply lines and variable impedance ground lines set at the high impedance state are returned to the prescribed potential levels.

Alternatively, a structure in which the variable impedance power supply lines and the variable impedance ground lines which are at the high resistance state are set to the electrically floating state only in the non-selected block in the active cycle may be utilized. The start and end of the active cycle can be detected by the internal row address strobe signal /RAS, and therefore, a structure in which signals /φBi and φBi are buffered and passed when internal row address strobe signal RAS is at the high level and signals /φBi and φBi are set to the low level and high level, respectively, when the signal RAS is at the low level, may be utilized. In that case, in the stand-by cycle, variable impedance power supply lines and variable impedance ground lines set at the high impedance state are connected to power supply node 20 and ground node 30 respectively, through resistances.

As described above, according to the fourth embodiment, in the DRAM which is driven in block division manner, a power supply circuit is provided for each unit block and variable impedance power supply lines and variable impedance ground lines which are set at the high impedance state of the power supply circuit provided for non-selected block are set to the electrically floating state, whereby active DC current flowing in the active cycle can be significantly reduced.

[Embodiment 5]

Figure 34:
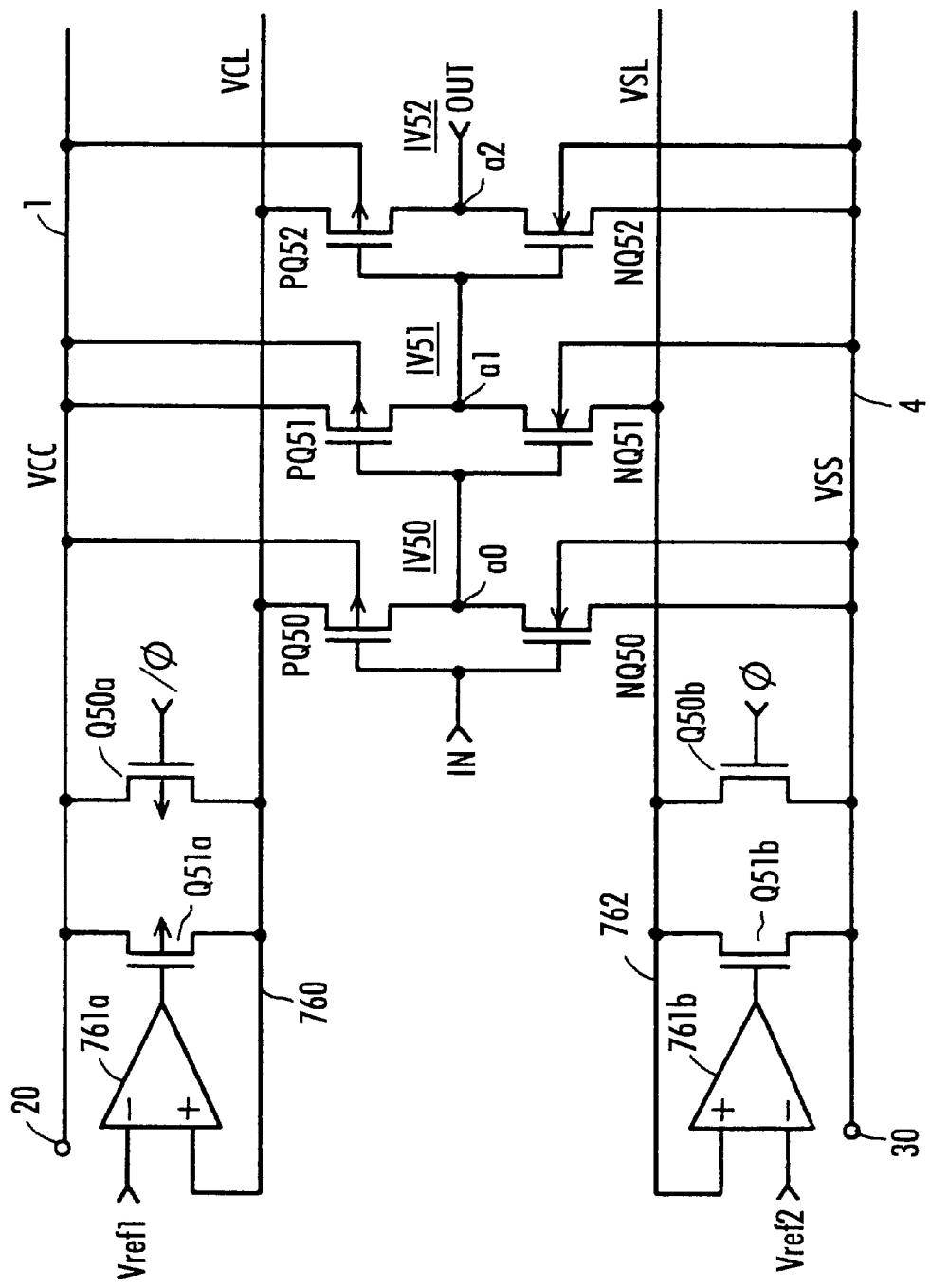
FIG. 34 shows a structure of a main portion of a semiconductor device in accordance with a fifth embodiment of the present invention.

FIG. 34 shows a structure of a main portion of a semiconductor device in accordance with a fifth embodiment of the present invention. Referring to FIG. 34, as a power supply voltage supplying circuit, the semiconductor device includes main power supply line 1 transmitting the voltage Vcc from power supply node 20, a variable impedance power supply line 760 provided corresponding to main power supply line 1, and a switching p channel MOS transistor Q50a for electrically connecting main power supply line 1 and variable impedance power supply line 760 in response to an operation cycle defining signal /φ. Operation cycle defining signals /φ defines the stand-by cycle and the active cycle of the semiconductor device, and it is generated in accordance with the row address strobe signal /RAS shown in FIG. 1, for example. The operation cycle defining signal /φ attains to the high level in the stand-by cycle and attains to the low level in the active cycle.

The power supply voltage supplying circuit further includes a differential amplifier 761a for differentially amplifying the voltage VCL on variable impedance power supply line 760 and reference voltage Vref1, and a driving p channel MOS transistor Q51a responsive to the output signal from differential amplifier 761a for supplying current from main power supply line 1 to variable impedance power supply line 760. Differential amplifier 761a receives at its positive input (+) the voltage VCL of variable impedance power supply line 760, and at its negative input (−) the reference voltage Vref1. When the voltage VCL on variable impedance power supply line 760 is higher than the reference voltage Vref1, the output signal from differential amplifier 761a attains to the high level, and transistor Q51a is turned off. Meanwhile, when the voltage VCL on variable impedance power supply line 760 is lower than the reference voltage Vref1, voltage level of the output signal from differential amplifier 761a lowers, conductance of transistor Q51a is increased, and current is supplied from main power supply line 1 to variable impedance power supply line 760. In other words, the differential amplifier 761a and the transistor Q51a have a function of holding the voltage VCL on variable impedance power supply line 760 at the voltage level of Vref1.

As a ground voltage supplying circuit, the semiconductor device includes main ground line 4 for transmitting voltage Vss from ground node 30, a variable impedance ground line 762 provided corresponding to main ground line 4, a switching n channel MOS transistor Q50b responsive to the operation cycle defining signal for electrically connecting main ground line 4 and variable impedance ground line 762, a differential amplifier 761b for differentially amplifying the voltage VSL on variable impedance ground line 762 and reference voltage Vref2, and an n channel MOS transistor Q51b responsive to an output signal from differential amplifier 761b for discharging current from variable impedance ground line 762 to the main ground line 4. The operation cycle defining signal φ is complementary to the operation cycle defining signal /φ, and it attains to the low level in the stand-by cycle and to the high level in the active cycle.

Differential amplifier 761b receives at its positive input (+), the voltage VSL on variable impedance ground line 762, and at its negative input (−), the reference voltage Vref2. More specifically, when the voltage VSL on variable impedance ground line 762 is higher than the reference voltage Vref2, the output signal of differential amplifier 761b changes to the high level, conductance of transistor Q51b is increased, and current is discharged from variable impedance ground line 762 to main ground line 4. Meanwhile, when the voltage VSL on variable impedance ground line 762 is lower than the reference voltage Vref2, the output signal from differential amplifier 761b attains to the low level, and transistor Q51b is turned off. Namely, differential amplifier 761b and transistor Q51b have a function of holding the voltage VSL on variable impedance ground line 762 at the voltage level of reference voltage Vref2.

The semiconductor device further includes a logic circuit as an internal circuit. In FIG. 34, three stages of cascade connected inverters IV50, IV51 and IV52 are shown as a representative, as an example of the logic circuit. Inverter circuit IV50 includes a p channel MOS transistor PQ50 having a gate receiving an input signal IN, one conduction node (source) connected to variable impedance power supply line 760, another conduction node (drain) connected to an internal output node a0 and a substrate region (body region) connected to main power supply line 1; and an n channel MOS transistor NQ50 having a gate receiving an input signal IN, one conduction node (source) connected to main ground line, another conduction node (drain) connected to output node a0 and a substrate region (body region) connected to main ground line 4.

Inverter circuit IV51 includes a p channel MOS transistor PQ51 having a gate connected to output node a0 of inverter IV50, one conduction node (source) connected to main power supply line 1, another conduction node connected to output node a1 and a substrate region (body region) connected to main power supply line 1; and an n channel MOS transistor NQ51 having a gate connected to output node a0 of inverter IV50, one conduction node connected to variable impedance ground line 762, another conduction node connected to output node a1 and a substrate region (body region) connected to main ground line 4. Inverter circuit IV52 includes a p channel MOS transistor PQ52 having a gate connected to output node a1 of inverter circuit IV51, one conduction node connected to variable impedance power supply line 762, another conduction node connected to output node a2, and a substrate region (body region) connected to main power supply line 1; and an n channel MOS transistor NQ52 having a gate connected to output node a1 of inverter circuit IV51, one conduction node connected to main ground line 4, another conduction node connected to output node a2, and a substrate region (body region) connected to main ground line 4.

More specifically, in inverter circuits IV50 to IV52, substrate regions of p channel MOS transistors PQ50 to PQ52 are connected to the main power supply line 1, and substrate regions (body regions) of n channel MOS transistors NQ50 to NQ52 are connected to main ground line 4. Since the source potential (potential at one conduction node) and the potential of the substrate region (body region) are set different from each other in the stand-by cycle of the MOS transistor, the absolute value of the threshold voltage of the MOS transistor can be increased because of substrate bias effect of the transistor, and hence leak current in the stand-by cycle can be reduced. The operation of the semiconductor device shown in FIG. 34 will be described with reference to FIG. 35, which is a diagram of signal waveforms.

In the stand-by cycle, the signal φ attains to the low level, signal /φ attains to the high level, and transistors Q50a and Q50b are both turned off. At this state, variable impedance power supply line 760 is maintained at the voltage level of reference voltage Vref1, by means of differential amplifier 761a and transistors Q51a. The reference voltage Vref1 has a voltage level slightly lower than the voltage Vcc on main power supply line 1. Meanwhile, variable impedance ground line 762 is maintained at the voltage level of reference voltage Vref2 by means of differential amplifier 761a and Q51b. The reference voltage Vref2 has a voltage level slightly higher than the voltage Vss of main ground line 4.

In the stand-by cycle, input signal IN is at the high level. At this state, by the MOS transistor NQ50, output node a0 is discharged to the level of the voltage Vss on main ground line 4. Meanwhile, transistor PQ50 is turned off by the input signal IN which is at the high level. One conduction node of transistor PQ50 attains to the level of the voltage VCL on variable impedance power supply line 760, that is, the level of the reference voltage Vref1, and the substrate region (body region) thereof is at the level of the voltage Vcc on the main power supply line 1. More specifically, the source potential VCL of p channel MOS transistor PQ50 becomes lower than the voltage Vcc of the substrate region (body region), the threshold voltage of transistor PQ50 is made more negative because of the substrate bias effect (that is, the absolute value of the threshold voltage is increased), whereby transistor PQ50 is more strongly turned off, further reducing the subthreshold current.

In inverter circuit IV51, the line of internal output node a0 is at the level of the voltage Vss of main ground line 4. Therefore, transistor PQ51 is on and transistor NQ51 is off. Accordingly, output node a1 is charged to the level of Vcc on main power supply line 1 by means of transistor PQ51. The source potential of transistor NQ51 is the voltage VSL on variable impedance ground line 762, and the potential of the substrate region (body region) is at the level of Vss on main ground line 4. The voltage VSL equals to reference voltage Vref2, and is at a higher voltage level than the potential Vss on main ground line 4. Therefore, in this case also, the source potential of transistor NQ51 is virtually increased because of substrate bias effect, the gate/source is reversely biased, and transistor NQ51 is more strongly turned off. This is equivalent to increase in the threshold voltage of transistor NQ51. Therefore, subthreshold current of transistor NQ51 can be sufficiently suppressed.

In inverter circuit IV52, similar to inverter circuit IV50, transistor NQ52 is turned on and transistor PQ52 is turned off. In this case also, the source potential and the potential of the substrate region (body region) of transistor PQ52 are different from each other, and because of substrate bias effect, source potential of transistor PQ52 is effectively lowered (or the absolute value of the threshold voltage is increased), and subthreshold current of transistor PQ52 is suppressed.

As substrate regions (body regions) of p channel MOS transistors PQ50 to PQ52 are connected to main power supply line 1 and voltage VCL on variable impedance power supply line 760 is set at a voltage level of reference voltage Vref1 lower than the voltage Vcc in the stand-by cycle, the subthreshold current can be suppressed because of more strongly off state resulting from gate/source reverse biasing voltage provided by reference voltage Vref1, and in addition, as the absolute value of the threshold voltage of MOS transistor is increased by substrate bias effect (in effect, source potentials of p channel MOS transistors PQ50 to PQ52 are lowered), the subthreshold current can further be reduced. Similarly, as substrate regions (body regions) of n channel MOS transistors NQ50 to NQ52 are connected to main ground line 4, the reverse biased state of the gate/ source voltage of the MOS transistor which is turned off in the stand-by cycle due to the voltage VSL of variable impedance ground line 762 is maintained at the voltage level of reference voltage Vref2, can further be enhanced by the substrate effect, whereby subthreshold current can further be reduced.

In the active cycle, signal φ attains to the high level signal /φ attains to the low level, transistors Q50a and Q50b are turned on, the voltage VCL on variable impedance power supply line 760 becomes equal to the level of the voltage Vcc on main power supply line 1, and the voltage VSL on variable impedance ground line 762 becomes equal to the level of voltage Vss on main ground line 4. At this state, the potentials of source and substrate region (body region) of MOS transistors PQ50 to PQ52 and NQ50 to NQ52 are set at the same value. Substrate bias effect is lost, threshold voltages are lowered, and inverter circuits IV50 to IV52 operate at high speed.

MOS transistors PQ50 to PQ52 and NQ50 to NQ52 which are the components of inverter circuits IV50 to IV52 may be formed in a bulk region (semiconductor substrate or well region). However, in order to further reduce the subthreshold current and to realize a high speed operation, the MOS transistors are implemented in an SOI (Semiconductor On Insulator) structure.

FIG. 36 is a schematic cross section of inverter circuits IV50 to IV52. Since inverter circuits IV50 to IV52 have identical cross sectional structure, a cross sectional structure of only one inverter circuit is shown in FIG. 36. Referring to FIG. 36, the SOI structure includes a semiconductor substrate 765, which is a silicon substrate, for example, an insulating layer 766 formed, for example, of a silicon dioxide film ($SiO_2$ film) formed on semiconductor substrate 765, and a semiconductor layer 764 formed on insulating layer 766. A transistor element 764 is formed in semiconductor layer 764. The method of manufacturing an SOI structure is well known, and a prescribed region of semiconductor substrate 765 (single crystal semiconductor substrate) is used as a seed crystal region for forming a semiconductor layer on insulating layer 766. By ion implantation, p and n channel impurity regions are formed, and an insulating film for element isolation is formed, for example, by thermal oxidation. Alternatively, a semiconductor layer 764 may be grown by gas phase epitaxy on insulating layer 756.

A p channel MOS transistor PQ includes a low concentration n type impurity region 769p formed at a prescribed region on insulating layer 766, high concentration p type impurity regions 767p and 768p formed on both sides of n type impurity region 769p, and a gate electrode 780p formed on n type impurity region 769p with a gate insulating film (not shown) interposed. Impurity region 767p serves as a source, and it is connected to a power supply line (main power supply line or variable impedance power supply line) 783. The n type impurity region 769p serves as a body region (substrate region) on the surface of which a channel region is formed when the transistor PQ is rendered conductive, and it is connected to main power supply line 1. Impurity region 768p is connected to an output node a.

An n channel MOS transistor NQ includes high concentration n type impurity regions 767n and 768n, a low concentration p type impurity region 769n formed between impurity regions 767n and 768n and a gate electrode 780n formed on impurity region 769n with a gate insulating film (not shown) interposed. Impurity region 767n serves as a source region, and it is connected to a ground line (main ground line or variable impedance ground line) 782. Impurity region 769n serves as a body region (substrate region) on the surface of which a channel is formed when the transistor NQ is rendered conductive, and it is connected to main ground line 4. Impurity region 768n is connected to output node a. Gate electrodes 780p and 780n are connected to an input node c (or to an output node of an inverter circuit of the preceding stage).

Transistor elements are isolated from each other by insulating films 781a, 781b and 781c.

In the SOI structure, semiconductor layer 764 is separated from semiconductor substrate 765 by insulating layer 766, and therefore there is not a leak current generated from impurity regions of transistors NQ and PQ to the semiconductor substrate 765, so that current consumption can be reduced. Further, impurity regions 769n and 769p serving as the body regions are isolated by semiconductor layer 765 and insulating layer 766, and therefore there is not junction capacitance between the body region and the semiconductor substrate. Therefore, transistors PQ and NQ have only the junction capacitances at the drain and source regions, and there is not a large junction capacitance between the well region and the substrate region existing in a transistor element formed in the normal bulk structure (which will be described later). Therefore, parasitic capacitance of a transistor element is reduced. Accordingly, parasitic capacitance of variable impedance power supply line 760 shown in FIG. 34 is reduced, and current consumption for charging the parasitic capacitance can be reduced. Further, since variable impedance power supply lines 760 and 762 have small parasitic capacitance, the variable impedance power supply lines 760 and variable impedance ground line 762 can be charged and discharged at high speed in response to the change in voltage of these lines in the stand-by cycle, so that the variable impedance power supply line 760 and variable impedance ground line 762 can be maintained at the levels of prescribed voltages Vref1 and Vref2.

At the transition from the stand-by cycle to the active cycle, when transistors Q50a and Q50b are turned on, variable impedance power supply line 760 and variable impedance ground line 762 can be charged/discharged at high speed, since variable impedance power supply line 760 and variable impedance ground line 762 have small parasitic capacitances. Therefore, the voltages VCL and VSL on variable impedance power supply line 760 and variable impedance ground line 762 can be quickly returned to the voltage levels of Vcc on main power supply line 1 and Vss on main ground line 4, respectively. More specifically, the time At for recovery shown in FIG. 35 can be reduced, the timing of starting the operation of the logic circuits can be set earlier, and thus a semiconductor device operating at higher speed can be implemented. Further, since the parasitic capacitance accompanying the output node of each inverter circuit is reduced (thanks to the SOI structure of the transistor element), the output node can be driven at high speed, and thus a logic circuit which operates at high speed in the active cycle can be realized.

In the structure shown in FIG. 34, transistors Q50a, Q50b, Q51a and Q51b as well as differential amplifiers 761a and 761b may have the SOI structure.

[modification]

Figure 37:
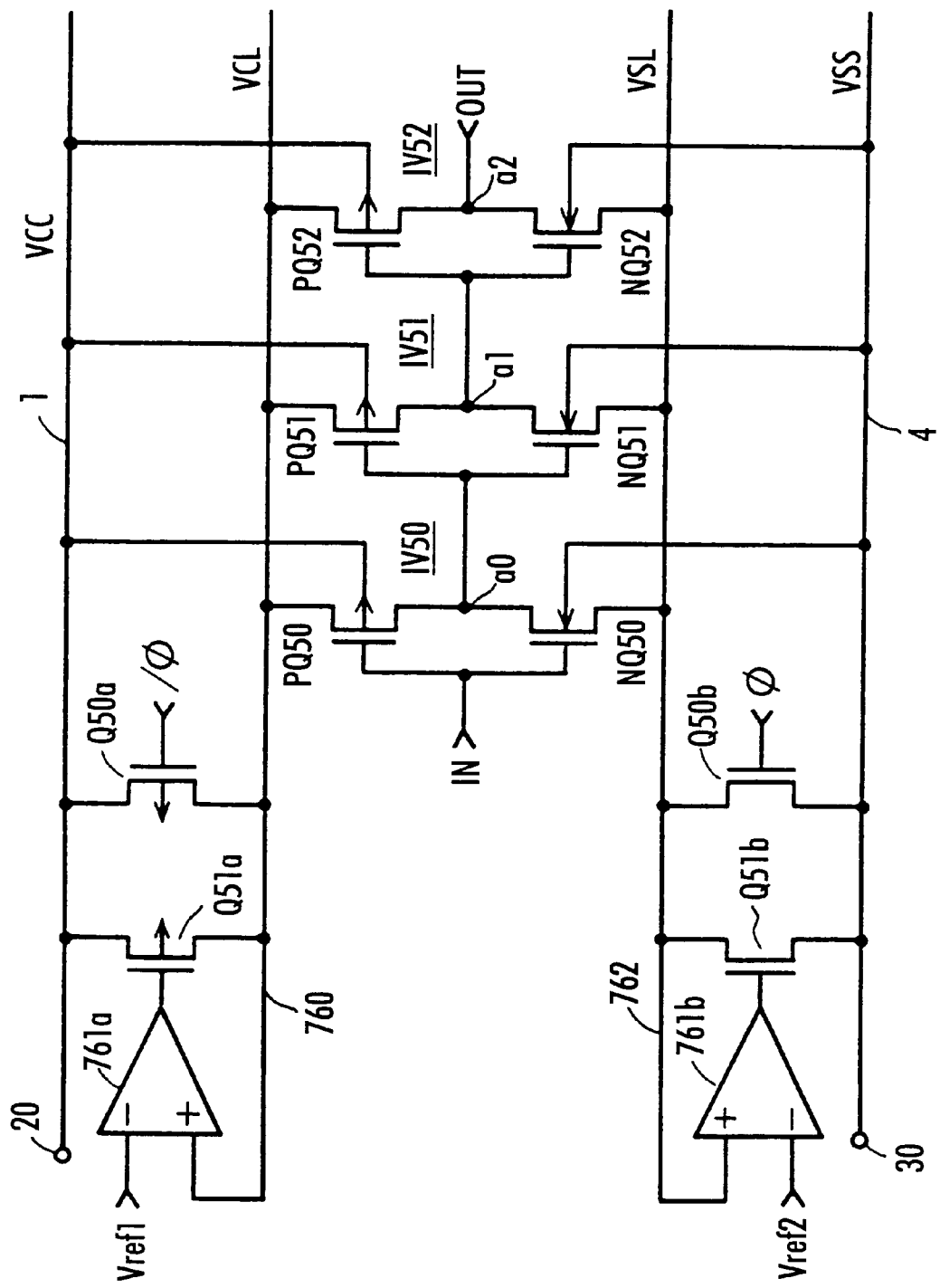
FIG. 37 shows a modification of the fifth embodiment of the present invention.

FIG. 37 shows a structure of a modification of the fifth embodiment of the present invention. In the semiconductor device shown in FIG. 37, each of one conduction node (source) of p channel MOS transistors PQ50 to PQ52 which are the components of inverter circuits IV50 to IV52 each constituting a logic circuit is connected to variable impedance power supply line 760, and each of one conduction node (source) of n channel MOS transistors NQ50 to NQ52 is connected to variable impedance ground line 762. Except these points, the structure is the same as that shown in FIG. 34, and therefore corresponding portions are denoted by the same reference characters and detailed description thereof is not repeated.

In the structure shown in FIG. 37, in the stand-by cycle, sources of p channel MOS transistors PQ50 to PQ52 are separated from main power supply line 1, and similarly sources (one conduction node) of n channel MOS transistors NQ50 to NQ52 are separated from main ground line 4.

When input signal IN is at the high level in the stand-by cycle, transistor NQ50 is turned on and transistor PQ50 is turned off. At this state, in transistor PQ50, the potential of the source is different from the potential of the substrate region (body region), the absolute value of the threshold voltage is increased because of substrate bias effect, and subthreshold current is suppressed. Meanwhile, the voltage level of the output signal from inverter IV50 is the level of the voltage VSL on variable impedance ground line 762. At this time, transistor PQ51 is turned on, and transmits the voltage VCL on variable impedance power supply line 760 to its output node a1. In transistor NQ51, the gate and the source have approximately the same voltage levels. However, to the substrate region (body region), a voltage at the level of the voltage Vss on the main ground line 4 is applied, the threshold voltage is increased by substrate bias effect, and thus subthreshold current can be sufficiently suppressed. Similarly, in the inverter circuit IV52 of the next stage, the potentials of the gate and the source of transistor PQ52 attain the same voltage level. However, the voltage of the substrate region (body region) is at the level of the voltage Vcc on main power supply line 1, and because of the substrate bias effect, the absolute value of the threshold voltage is increased, and subthreshold current can be suppressed.

When the input signal IN is at the low level in the stand-by cycle, the states are reversed. Therefore, no matter whether the input signal IN is at the high level or low level in the stand-by cycle, subthreshold current can be suppressed effectively. Therefore, even in a semiconductor device in which logic level of the input signal IN in the stand-by cycle is not predictable, subthreshold current can be effectively suppressed and accordingly, current consumption can be reduced.

As described above, according to the fifth embodiment of the present invention, transistors constituting the logic circuit are formed by SOI structure, and substrate region (body region) of the transistor is connected to the main power supply line or the main ground line, so that the absolute value of the threshold voltage of the MOS transistors constituting the logic circuit can be increased in the stand-by cycle and the subthreshold current can be surely suppressed. Further, since junction capacitance of the transistor is reduced and parasitic capacitance of variable impedance power supply line and variable impedance ground line are reduced, potentials of variable impedance power supply line and variable impedance ground line can be recovered quickly at the transition from the stand-by cycle to the active cycle.

[Embodiment 6]

Figure 38:
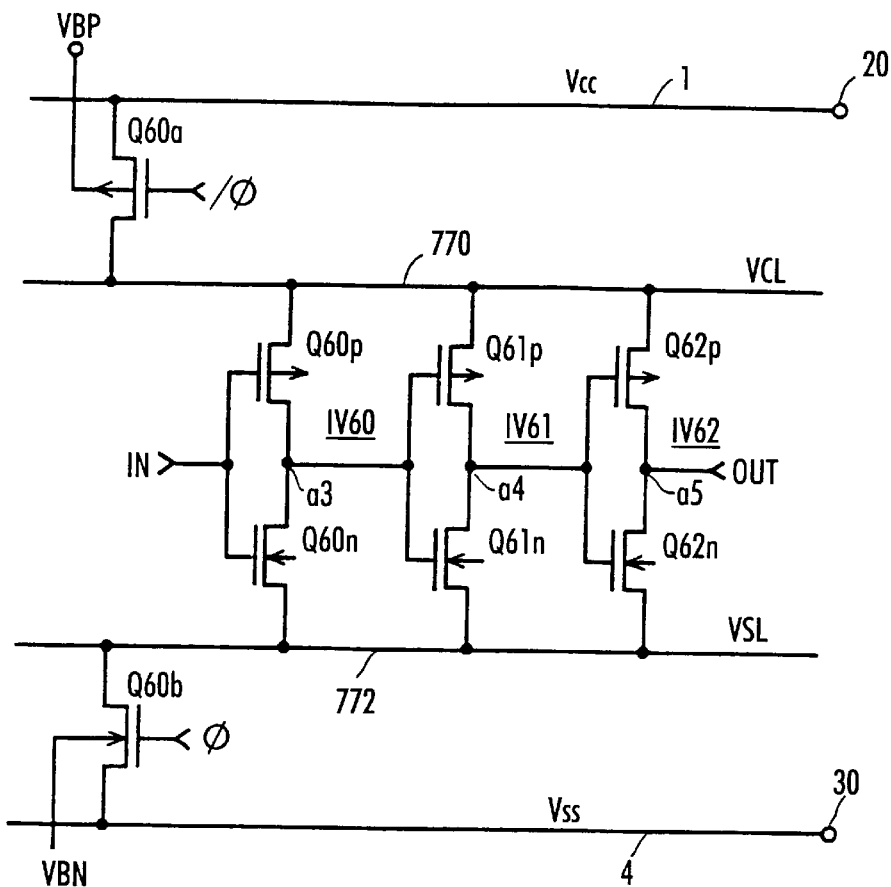
FIG. 38 shows a structure of a main portion of a semiconductor device in accordance with a sixth embodiment of the present invention.

FIG. 38 shows a structure of a main portion of a semiconductor device in accordance with a sixth embodiment of the present invention. In the structure shown in FIG. 38, a switching p channel MOS transistor Q60a which is rendered conductive in response to control signal /φ is provided between main power supply line 1 transmitting power supply voltage Vcc from first power supply node 20 and a variable impedance power supply line 770. To the substrate region (or body region) of MOS transistor Q60a, a bias voltage VBP of which voltage level changes dependent on the operation mode is applied. Control signals /φ attains to the high level in the standby cycle of the semiconductor device and to the low level in the active cycle. The bias voltage VBP is set to the level of the power supply voltage Vcc in the active cycle, and to a level of the voltage Vpp which is higher than the power supply voltage Vcc in the stand-by cycle.

Between main ground line 4 transmitting ground voltage Vss from second power supply node 30 and variable impedance ground line 772, a switching n channel MOS transistor Q60b which is rendered conductive in response to control signal φ is provided. Control signal φ is complementary to control signal /φ, and attains to the low level in the stand-by cycle and to the high level in the active cycle. To the substrate region (or body region) of switching n channel MOS transistor Q60b, a bias voltage VBN of which value changes dependent on the operation cycle, is applied. In the stand-by cycle, the bias voltage VBN is set to a level of a negative voltage Vbb lower than the ground voltage Vss, and in the active cycle, set to the level of the ground voltage Vss.

As an example of a logic circuit, three stages of CMOS inverter circuits IV60, IV61 and IV62 are shown. Inverter circuit IV60 includes a p channel MOS transistor Q60p having one conduction node (source) connected to variable impedance power supply line 770, its gate connected to receive input signal IN and the other conduction node (drain) connected to an internal output node a3; and an n channel MOS transistor Q60n having one conduction node connected to variable impedance ground line 772, the other conduction node connected to internal output node a3 and its gate connected to receive input signal IN.

Inverter circuit IV61 includes a p channel MOS transistor Q61b having its gate connected to internal output node a3, one conduction node connected to variable impedance power supply line 770 and the other conduction node connected to an internal output node a4; and an n channel MOS transistor Q61n having its gate connected to internal output node a3, one conduction node connected to variable impedance ground line 772 and the other conduction node connected to internal output node a4. Inverter circuit IV62 includes a p channel MOS transistor Q62p having its gate connected to internal output node a4, one conduction node connected to variable impedance power supply line 770 and the other conduction node connected to an internal output node a5; and an n channel MOS transistor Q62n having its gate connected to internal output node a4, one conduction node connected to variable impedance ground line 772 and the other conduction node connected to internal output node a5. An output signal OUT is provided from internal output node a5.

In the structure shown in FIG. 38, inverter circuits IV60 to IV62 operate using the voltage VCL on variable impedance power supply line 770 and the voltage VSL on variable impedance ground line 772 as operating power supply voltages.

Figure 39:
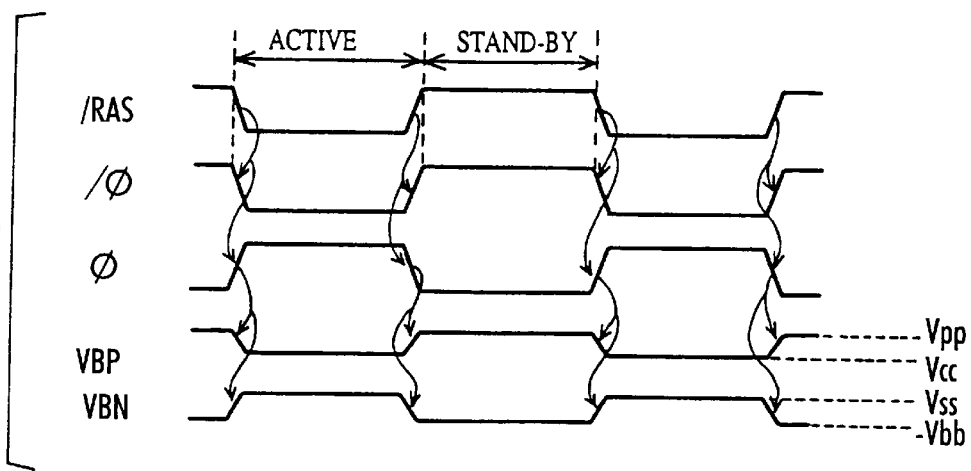
FIG. 39 is a diagram of signal waveforms showing the operation of the semiconductor device shown in FIG. 38.

Transistors Q60p to Q60p have their threshold voltages set sufficiently large (absolute values of threshold voltages set sufficiently small), and n channel MOS transistors Q60n to Q60n have their threshold voltages sufficiently small (the absolute values of threshold voltages made small), in order to realize high speed operation at low power supply voltage and to reduce current consumption. The operation of the semiconductor device shown in FIG. 38 will be described with reference to FIG. 39, which is a diagram of waveforms.

In the stand-by cycle, signal φ is set to the low level, signal /φ is set to the high level and transistors Q60a and Q60b are both turned off. Bias voltage VBP is set to the level of a high voltage Vpp higher than the power supply voltage Vcc, and bias voltage VBN is set to the level of a negative voltage Vbb lower than the ground voltage Vss. Therefore, because of the substrate bias effect, absolute values of threshold voltages of transistors Q60a and Q60b are increased, and thus these transistors are set to more strongly off state. Transistors Q60p to Q62p and Q60n to Q62n which are the components of inverter circuits IV60 to IV62 have low threshold values (absolute value of the threshold voltage is small), and they are set to on or off state in accordance with the voltage level of the input signal IN. At this time, transistors Q60p to Q62p and Q60n to Q62n are transistors of low threshold values, and the subthreshold current flows between variable impedance power supply line 770 and variable impedance ground line 772. However, transistor Q60a between main power supply line 1 and variable impedance power supply line 770 is turned more strongly off, and therefore leak current between main power supply line 1 and variable impedance power supply line 770 can be sufficiently suppressed. Similarly, transistor Q60b is set more strongly off, and therefore leak current between main ground line 4 and variable impedance ground line 772 can be sufficiently suppressed. Therefore, leak current flowing from main power supply line 1 to main ground line 4 can be sufficiently suppressed, and thus current consumption in the stand-by cycle can be reduced.

When the active cycle starts, the signal /RAS falls from the high level to the low level. In response, control signal /φ attains to the low level, signal φ attains to the high level and transistors Q60a and Q60b turn on. At this time, bias voltage VBP is set to the level of the power supply voltage Vcc, and bias voltage VBN is set to the level of the ground voltage Vss. Consequently, in transistors Q64a and Q64b, voltages at the source and substrate region attain to the same voltage level, substrate bias effect is lost, and thus these transistors are set to the low threshold voltage state (in which the absolute value of the threshold voltage is small). Consequently, current is supplied quickly from main power supply line 1 to variable impedance power supply line 770, and therefore the voltage VCL quickly returns to the level of the power supply voltage Vcc. The voltage VSL on variable impedance ground line 772 is discharged to the main ground line 4 through transistor Q60b at high speed and the voltage VSL quickly returns to the level of the ground voltage Vss. Consequently, at a transition from the stand-by cycle to the active cycle, voltages VCL and VSL can be recovered to the levels of the power supply voltage Vcc and ground voltage Vss at high speed, and thus the timing of starting the operation of the logic circuit (inverter circuits IV60 to IV62) can be set earlier.

As transistors Q60p to Q62p and Q60n to Q62n which are components of inverter circuits IV60 to IV62 are low threshold value transistors, the inverter circuits operate at high speed in accordance with the input signal IN applied in the active cycle, and generates an output signal OUT.

As described above, since transistors Q60a and Q60b are set to a state of high resistance (more strongly off state) in the stand-by cycle and the threshold voltages thereof are changed to a state of low resistance (low threshold value state) in the active cycle, leak current (subthreshold current) in the stand-by cycle can be sufficiently suppressed, voltage levels of variable impedance power supply line 770 and variable impedance ground line 772 can be recovered at high speed at the transition from the stand-by cycle to the active cycle, and thus a semiconductor device which operates at high speed with low current consumption can be obtained.

Figure 40:
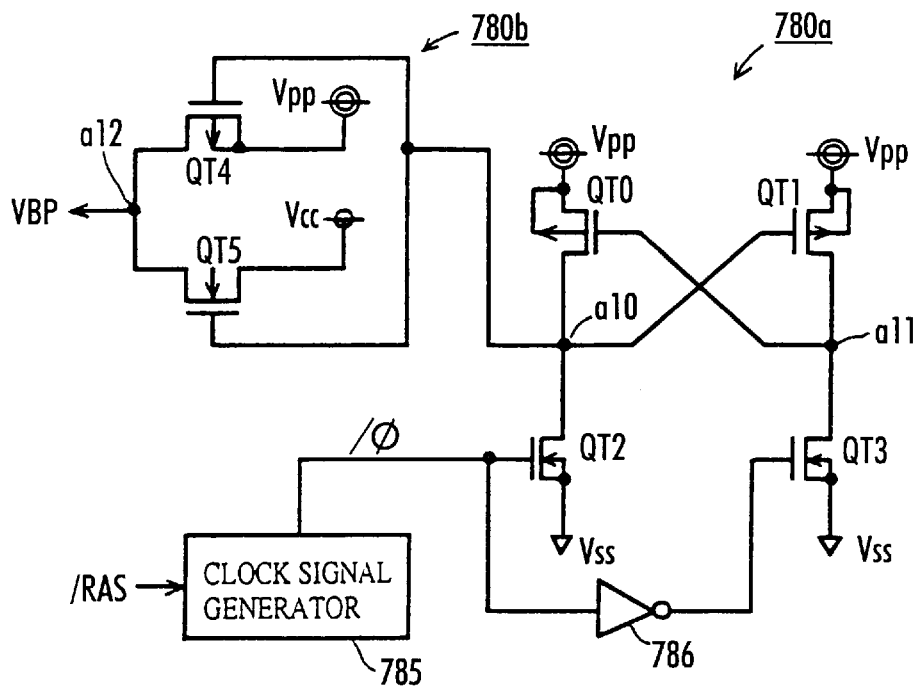
FIG. 40 shows an example of a structure of a substrate bias generating circuit for a transistor connecting a variable impedance power supply line to a main power supply line, shown in FIG. 38.

FIG. 40 shows an example of a structure for generating the bias voltage VBP. Referring to FIG. 40, a bias voltage generating portion includes a clock signal generator 785 responsive to a row address strobe signal /RAS for generating control signal /φ, a level converting portion 780a for inverting control signal /φ output from clock signal generator 785 and converting the high level thereof to the level of the high voltage Vpp, and a selecting portion 780b for outputting either the high voltage Vpp or the power supply voltage Vcc as the bias voltage VBP, in accordance with the output signal from level converting portion 780a. Clock signal generator 785 is included in control circuit 180 shown in FIG. 1. The high voltage Vpp is generated from Vpp generator 256 shown in FIG. 4.

Level converting portion 780a includes an inverter 786 for inverting control signal /φ, a p channel MOS transistor QT0 provided between high voltage Vpp supplying node and a node a10 and rendered conductive in response to the potential at a node a11, a p channel MOS transistor QT1 provided between high voltage Vpp supplying node and node a11 and rendered conductive in response to the poten-
tial at node a10, an n channel MOS transistor QT2 provided between node a10 and ground voltage Vss supplying node and rendered conductive in response to control signal /φ, and an n channel MOS transistor QT3 provided between node a11 and ground voltage Vss supplying node and rendered conductive in response to an output signal from inverter circuit 760.

Selecting portion 780b includes a p channel MOS transistor QT4 provided between high voltage Vpp supplying node and a node a12 and rendered conductive in response to a signal potential on node a10 at level converting portion 780a, and an n channel MOS transistor QT5 provided between power supply voltage Vcc supplying node and node a12 and rendered conductive in response to the potential at node a10 of level converting portion 780a. The bias voltage VBP is output from node a12. The operation will be briefly described.

Clock signal generator 785 generates, in response to row address strobe signal /RAS, the control signal φ which attains to the high level in the standby cycle and to the low level in the active cycle. In the stand-by cycle, transistor QT2 is turned on and transistor QT3 is turned off. Node a10 is discharged to the level of the ground voltage Vss through transistor QT2, transistor QT1 turns on, and the voltage level at node a11 is charged to the level of the high voltage Vpp. By the high voltage Vpp at node a11, transistor QT0 is turned off. Therefore, a signal at the level of the ground voltage Vss is provided from node a10. At this state, in selecting portion 780b, transistor QT4 turns on and transistor QT5 turns off. A high voltage Vpp is output as the bias voltage VBP.

In the active cycle, the signal φ is at the low level, transistor QT2 turns off, transistor QT3 turns on and node a11 is discharged to the level of the ground voltage Vss. Consequently, transistor QT0 turns on and node a10 is charged to the level of the high voltage Vpp. In the selecting portion 780b, transistor QT4 turns off, transistor QT5 turns on, and a bias voltage VBP at the level of the power supply voltage Vcc is provided from node a12.

Here, the signal /φ is shown as a similar signal applied to the gate of transistor Q60a shown in FIG. 38. However, the timing of turning transistor Q60a on/off may be different from the timing of switching of the bias voltage VBP. A structure in which bias voltage VBP changes to the level of the high voltage Vpp and then transistor Q60a is turned off at the transition to the stand-by cycle, and in which bias voltage VBP changes to the level of the power supply voltage Vcc and then transistor Q60a is turned on at the transition to the active cycle, may be used. The voltage level of the bias voltage VBP in the stand-by cycle may be set to a level different from the high voltage Vpp used for driving the word line. Any voltage level may be used provided that the absolute value of the threshold voltage of transistor Q60a can be sufficiently increased in the stand-by cycle.

Figure 41:
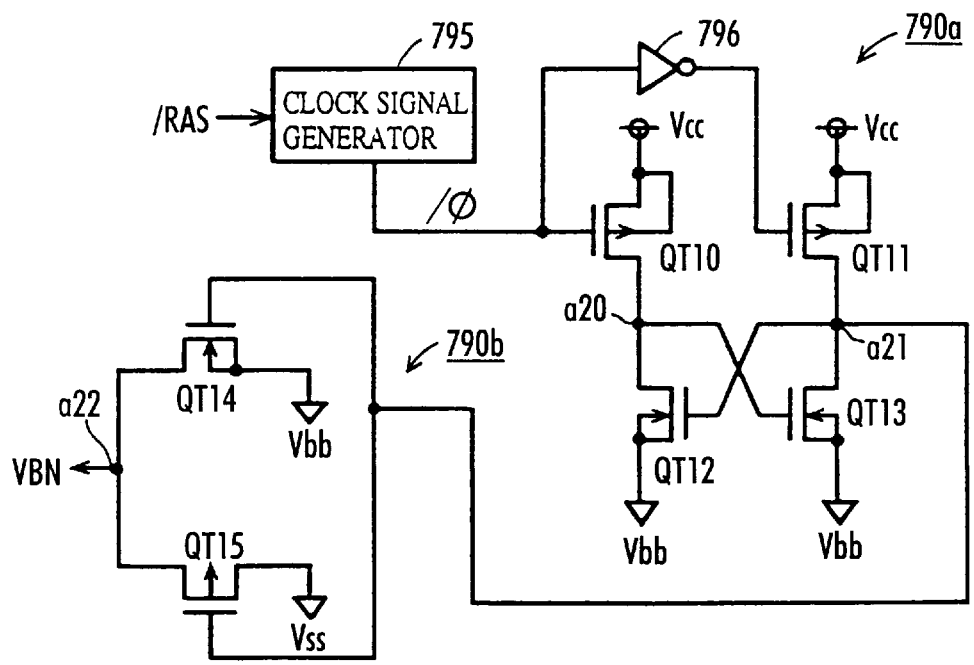
FIG. 41 shows an example of a structure of a substrate bias voltage generating circuit for a transistor connecting a variable impedance ground line and a main ground line shown in FIG. 38.

FIG. 41 shows a structure for generating the bias voltage VBN shown in FIG. 38. Referring to FIG. 41, a bias voltage generating portion includes a clock signal generator 795 for generating control signal φ in response to row address strobe signal /RAS, a level converting portion 790a for converting the level of the ground voltage Vss of control signal φ to a low level of a negative voltage Vbb, and a selecting portion 790b for outputting either the negative voltage Vbb or the ground voltage Vss as bias voltage VBN from output node a22, in accordance with an output signal from level converting portion 790a. Clock signal generator 795 is included in control circuit 110 shown in FIG. 1. Control signal φ is set to the low level in the stand-by cycle and to the high level in the active cycle.

Level converting portion 790*a* includes an inverter circuit 796 inverting the control signal φ, a p channel MOS transistor QT10 connected between a power supply voltage Vcc supplying node and a node a20 and rendered conductive in response to control signal φ for transmitting power supply voltage Vcc to node a20, a p channel MOS transistor QT11 connected between power supply voltage Vcc supplying node and a node a21 and rendered conductive in response to an output signal from inverter circuit 796 for transmitting power supply voltage Vcc to node a21, an n channel MOS transistor QT12 connected between node a20 and a negative voltage Vbb supplying node and rendered conductive in response to a potential at node a21 for discharging node a20 to the level of the negative voltage Vbb, and an n channel MOS transistor QT13 connected between node a21 and negative voltage Vbb supplying node and rendered conductive in response to the potential at node a20 for discharging node a21 to the level of the negative voltage Vbb. Inverter circuit 796 outputs a signal having an amplitude of the levels of power supply voltage Vcc and ground voltage Vss.

Selecting portion 790*b* includes an n channel MOS transistor QT14 connected between negative voltage Vbb supplying node and output node a22 and rendered conductive in response to the potential at node a21 of level converting portion 790*a* for transmitting the negative voltage Vbb to a node a22, and a p channel MOS transistor QT15 connected between ground voltage Vss supplying node and node a22 and rendered conductive in response to the potential at node a21 of level converting portion 790*a* for transmitting the ground voltage Vss to node a22. The bias voltage VBN is output from node a22. The operation will be described in the following.

In the standby cycle, control signal /φ is at the high level, the output signal from inverter circuit 796 attains to the low level, transistor QT10 turns off and transistor QT11 turns on. Node a21 is charged to the level of power supply voltage Vcc by transistor QT11, and transistor QT12 is turned on. Consequently, node a20 is discharged to the level of the negative voltage Vbb, and transistor QT13 is turned off. Consequently, node a21 is maintained at the level of the power supply voltage Vcc by transistor QT11. By the signal at the level of the power supply voltage Vcc from level converting portion 790*a,* transistor QT14 is turned on and transistor QT15 is turned off. Consequently, a negative voltage Vbb is transmitted from node a22 through transistor QT14, and a bias voltage VBN at the level of the negative voltage Vbb is output.

In the active cycle, control signal /φ attains to the low level, transistor QT10 is turned on and transistor QT11 is turned off. At this state, node a20 is charged to the level of the power supply voltage Vcc by transistor QT10, transistor QT13 is turned on and node a21 is discharged to the level of negative voltage Vbb. When the voltage level of node a21 lowers to the level of the negative voltage Vbb, transistor QT12 turns off. By the signal at the level of the negative voltage Vbb from level converting portion 790*a,* transistor QT14 turns off and transistor QT15 turns on at the selecting portion 790*b*. Consequently, ground voltage Vss is transmitted to node a22, and bias voltage VBN at the level of the ground voltage Vss is provided.

As described above, according to the sixth embodiment of the present invention, since the transistor between the main power supply line and the variable impedance power supply line and the transistor between the main ground line and the variable impedance ground line are set to a state of high resistance (in which absolute value of the threshold voltage is large) equivalently in the stand-by cycle, and set to a state of low resistance (in which absolute value of the threshold voltage is small) equivalently in the active cycle, leak current in the stand-by cycle can be suppressed, and recovery of the voltages at the variable impedance power supply line and variable impedance ground line can be realized at high speed at the transition to the active cycle. Therefore, a semiconductor device which operates at high speed with low current consumption can be provided.

[Embodiment 7]

Figure 42:
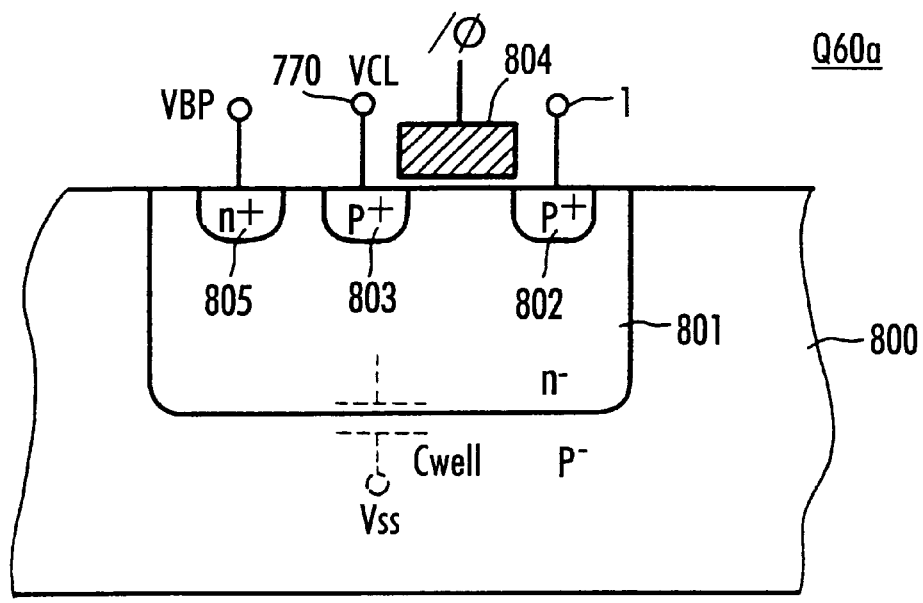
FIG. 42 shows a cross sectional structure of a transistor connecting the main power supply line and the variable impedance power supply line shown in FIG. 38.

FIG. 42 schematically shows a cross sectional structure of a switching p channel MOS transistor Q60*a* shown in FIG. 38. Referring to FIG. 42, transistor Q60*a* has a bulk structure and formed in an n well region 802 formed at a surface of a semiconductor substrate (semiconductor layer or well region) 800. Transistor Q60*a* includes p type high concentration impurity regions 802 and 803 formed spaced apart at the surface of well region 801, a gate electrode layer 804 formed between impurity regions 802 and 803 with a gate insulating film (not shown) interposed, and a high concentration n type impurity region 805 for applying a bias voltage VBP to well region 801. Power supply voltage Vcc is applied to impurity region 802 through main power supply line 1. Impurity region 803 is connected to variable impedance power supply line 770. Control signal /φ is applied to gate electrode 804.

A switching n channel MOS transistor Q60*b* has a similar structure. However, conductivity types of the impurity region and the well region are reversed. As shown in FIG. 42, well region 801 has a size sufficient to accommodate at least impurity regions 802, 803 and 805 for forming transistor element Q60*a*. Therefore, in this example, there is a large junction capacitance Cwell between substrate 800 and well 801. Thus, junction capacitance of transistor Q60*a* increases, and it becomes impossible to change the voltage at well region 801 at high speed by bias voltage VBP. Further, large current must be consumed for maintaining the well region 801 at a prescribed voltage level. However, this example has an advantage that bias voltage VBP is maintained stably.

Figure 43:
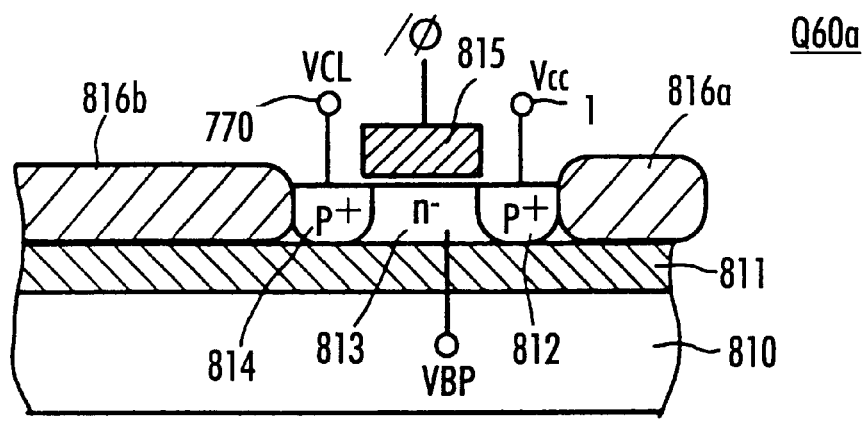
FIG. 43 schematically shows a cross sectional structure of a transistor connecting a variable impedance power supply line and a main power supply line of a seventh embodiment of the present invention.

FIG. 43 shows another structure of the p channel MOS transistor Q60*a* shown in FIG. 38. Referring to FIG. 43, transistor Q60*a* has an SOI structure. More specifically, transistor Q60*a* is formed in a region defined by insulating films 8116*a* and 8116*b* on an insulating layer 811 formed on semiconductor substrate 8110.

Transistor Q40*a* includes high concentration p type impurity regions 812 and 814 formed adjacent to insulating films 816*a* and 816*b,* a low concentration n type impurity region 813 formed between impurity regions 812 and 814, and a gate electrode 815 formed on impurity region 813 with a gate insulating film (not shown) interposed. Impurity region 813 serves as a body region on which channel is formed when transistor Q60*a* is rendered conductive. Bias voltage VBP is applied to impurity region 813. Impurity region 812 is connected to main power supply line 1, and receives power supply voltage Vcc. Impurity region 814 is connected to variable impedance power supply line 770. Control signal /φ is applied to gate electrode layer 815.

In the structure of transistor Q60*a* shown in FIG. 43, insulating layer 811 is formed below impurity region 813, and semiconductor substrate 810 is separated from impurity region 813. Therefore, there is not a large junction capacitance Cwell (see FIG. 42) generated when a well structure is employed, and capacitance at the impurity region 813 is small. Further, impurity region 813 is formed only corresponding to the channel region of transistor Q60*a,* and therefore the size thereof is considerably smaller than the well region 801 shown in FIG. 42. Therefore, when bias voltage VBP is applied to impurity region 813, voltage level of impurity region 813 can be changed at high speed, and voltage level at impurity region 813 can be changed with small power consumption, because of this small capacitance. More specifically, by applying a transistor having SOI structure to switching p channel MOS transistor Q60a, voltage level of the variable impedance power supply line can be changed at high speed, and substrate bias voltage of a transistor element can be changed at high speed with small current consumption.

The n channel MOS transistor Q60b shown in FIG. 38 also has the SOI structure as shown in FIG. 43. Cross sectional structure of transistor Q60b can be obtained simply by reversing the conductivity types of FIG. 43.

As described above, according to the seventh embodiment of the present invention, a transistor having the SOI structure is used as the transistor connecting the main power supply line and the variable impedance power supply line, and as the transistor connecting the variable impedance ground line and the main ground line, so that voltage levels of the variable impedance power supply line and of variable impedance ground line can be changed at high speed, and the bias voltage of the transistor can be changed at high speed with small current consumption.

Therefore, load on the bias voltage generation portion can be mitigated.

[Embodiment 8]

Figure 44:
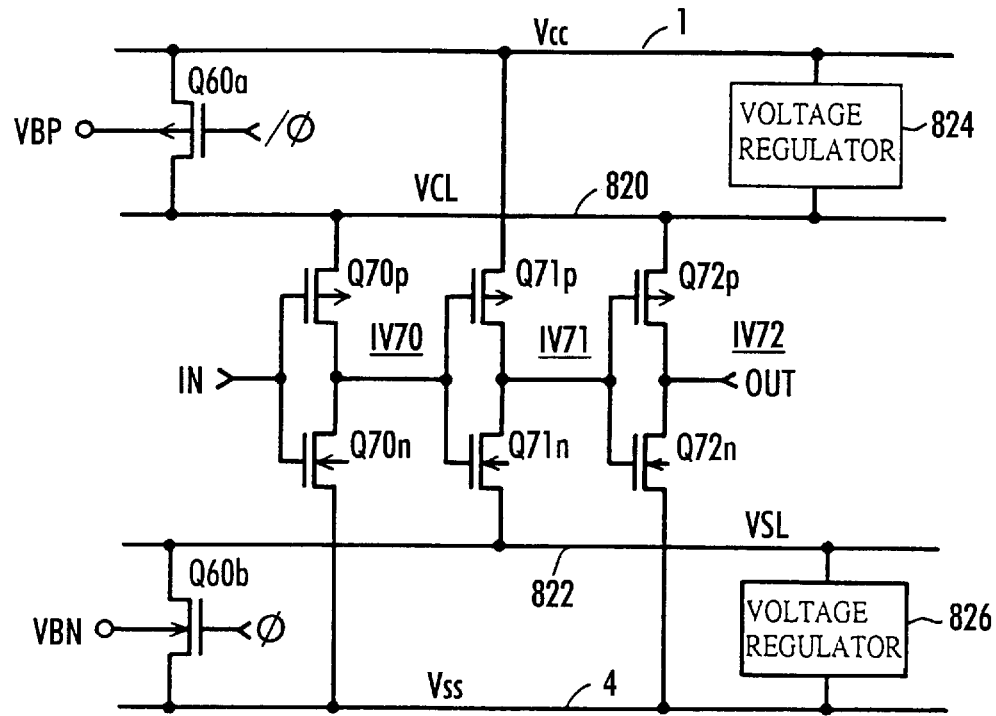
FIG. 44 shows a structure of a main portion of a semiconductor memory device in accordance with an eighth embodiment of the present invention.

FIG. 44 shows a structure of a main portion of a semiconductor substrate in accordance with an eighth embodiment of the present invention. In the structure shown in FIG. 44, between main power supply line 1 and variable impedance power supply line 820, a p channel MOS transistor Q60a which is rendered conductive in response to control signal /φ and electrically connects main power supply line 1 and variable impedance power supply line 820 when conducts, and a voltage regulator 824 for regulating voltage level on variable impedance power supply line 820 in the stand-by cycle are provided. The voltage regulator 824 may be formed by a resistance having high resistance value, or it may be formed by a differential amplifier described with reference to FIG. 34 and a transistor driven by the output signal from the differential amplifier. Other structure may be utilized.

Between main ground line 4 and variable impedance ground line 822, an n channel MOS transistor 60b which is rendered conductive in response to control signal φ and electrically connects variable impedance ground line 822 and main ground line 4, and a voltage regulator 826 for regulating voltage level of variable impedance ground line 822 in the stand-by cycle are provided. Voltage regulator 826 has similar structure as voltage regulator 824.

Bias voltages VBP and VBN are respectively applied to substrate regions (body regions) of transistors Q60a and Q60b. Transistors Q60a and Q60b have similar structures as in the fifth through seventh embodiments above, and perform similar functions.

FIG. 44 shows three stages of CMOS inverter circuits IV70, IV71 and IV72, as an example of a logic circuit. In the stand-by cycle, input signal IN has its logic level set at the high level. In accordance with the logic level of the input signal IN in the stand-by cycle, power supply line/ground line to which MOS transistors constituting inverter circuits IV70 to IV72 are connected, are switched alternately. In inverter circuit IV70, one conduction node (source) of p channel MOS transistor Q70p is connected to variable impedance power supply line 820, and one conduction node (source) of an n channel MOS transistor Q70n is connected to main ground line 4. In inverter circuit IV71, one conduction node of a p channel MOS transistor Q71p is connected to main power supply line 1, and one conduction node of an n channel MOS transistor Q71n is connected to variable impedance ground line 822. In inverter circuit IV72, one conduction node of a p channel MOS transistor Q72p is connected to variable impedance power supply line 820, and one conduction node of an n channel MOS transistor Q72n is connected to main ground line 4.

Also in this structure in which connection of MOS transistors as components to power supply line/ground line is switched alternately in accordance with the logic level of the input signal in the stand-by cycle, by setting transistors Q60a and Q60b to a state of high threshold value (in which absolute value of the threshold voltage is large) in the stand-by cycle and to a state of low threshold voltage (in which absolute value of the threshold voltage is small) in the active cycle, subthreshold current can be sufficiently suppressed, and recovery of potentials of variable impedance power supply line 820 and variable impedance ground line 822 at the transition from the stand-by cycle to the active cycle can be performed at high speed. When the input signal IN is set to the low level in the stand-by cycle, inverter circuit IV71 is used as the first stage circuit.

As described above, according to the eighth embodiment, when the logic level of an input signal in the stand-by cycle is predictable, even in a semiconductor device in which connection between power supply line/ground line and variable impedance power supply line/variable impedance ground line is switched in accordance with the logic level of the input signal in the stand-by cycle, since a transistor provided between main power supply line/main ground line and variable impedance power supply line/variable impedance ground line is set to a state of high threshold value in the stand-by cycle and to a state of low threshold value in the active cycle, a semiconductor device which operates at high speed with low current consumption can be provided.

[Embodiment 9]

Figure 45:
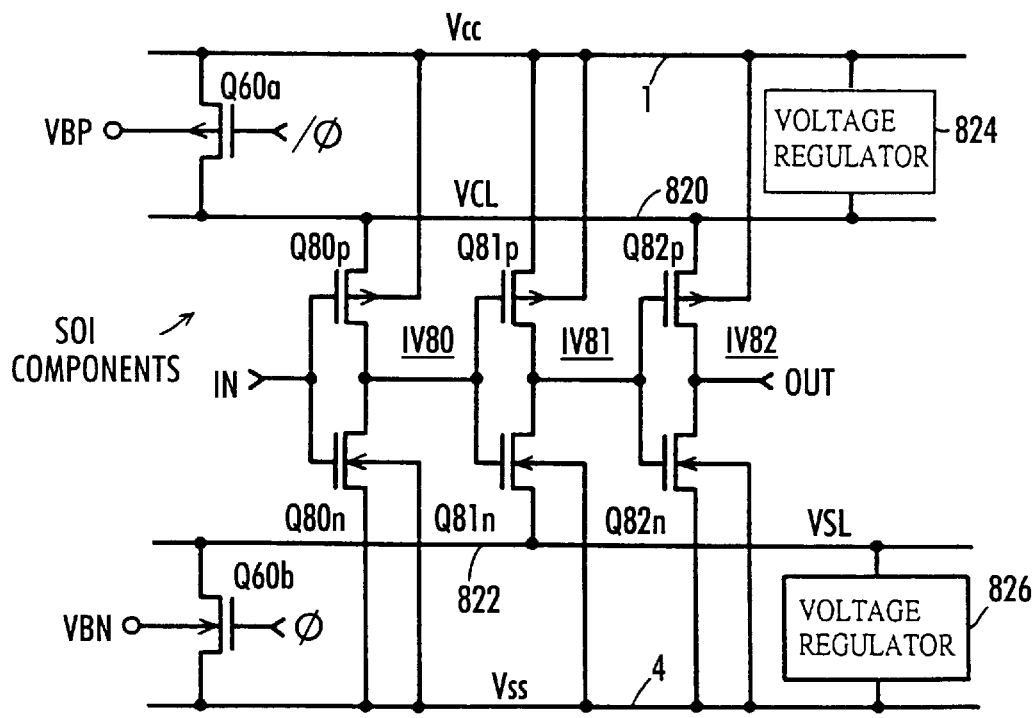
FIG. 45 shows a structure of a main portion of a semiconductor memory device in accordance with a ninth embodiment of the present invention.

FIG. 45 shows a structure of a main portion of a semiconductor device in accordance with a ninth embodiment of the present invention. The semiconductor device shown in FIG. 45 is implemented by combining the semiconductor device shown in FIG. 34 and the semiconductor device shown in FIG. 44. Three stages of CMOS inverter circuits IV80, IV81 and IV82 are shown as a representative of a logic circuit. In these inverter circuits IV80 to IV82, substrate regions (body regions) of p channel MOS transistors Q80p, Q81p and Q82p are connected to main power supply line 1, and substrate regions (body region) of n channel MOS transistors Q80n, Q81n and Q82n are connected to main ground line 4. These transistors Q80p to Q82p as well as Q80n to Q82n are each formed by a transistor having the SOI structure. Other structures are the same as those shown in FIG. 44, and corresponding portions are denoted by the same reference numerals. Since all the components are transistors having the SOI structure, a semiconductor device which operates at high speed with low current consumption can be realized.

In the structure of FIG. 45, when the logic level of the input signal IN in the stand-by cycle is not predictable, one conduction node (source) of p channel MOS transistors Q80p to Q82p of inverter circuits IV80 to IV82 is connected to variable impedance power supply line 820 and one conduction node (source) of n channel MOS transistors Q80n to Q82n is connected to variable impedance ground line 822. In this case also, similar effects can be obtained.

As described above, according to the ninth embodiment, since all the components are formed by transistors having SOI structure, in addition to the effects realized by the fifth to eighth embodiments, power consumption can further be reduced. In addition, since parasitic capacitance at variable impedance power supply line 820 and variable impedance ground line 822 can be reduced, voltages at these lines can be recovered at high speed.

[Embodiment 10]

Figure 46:
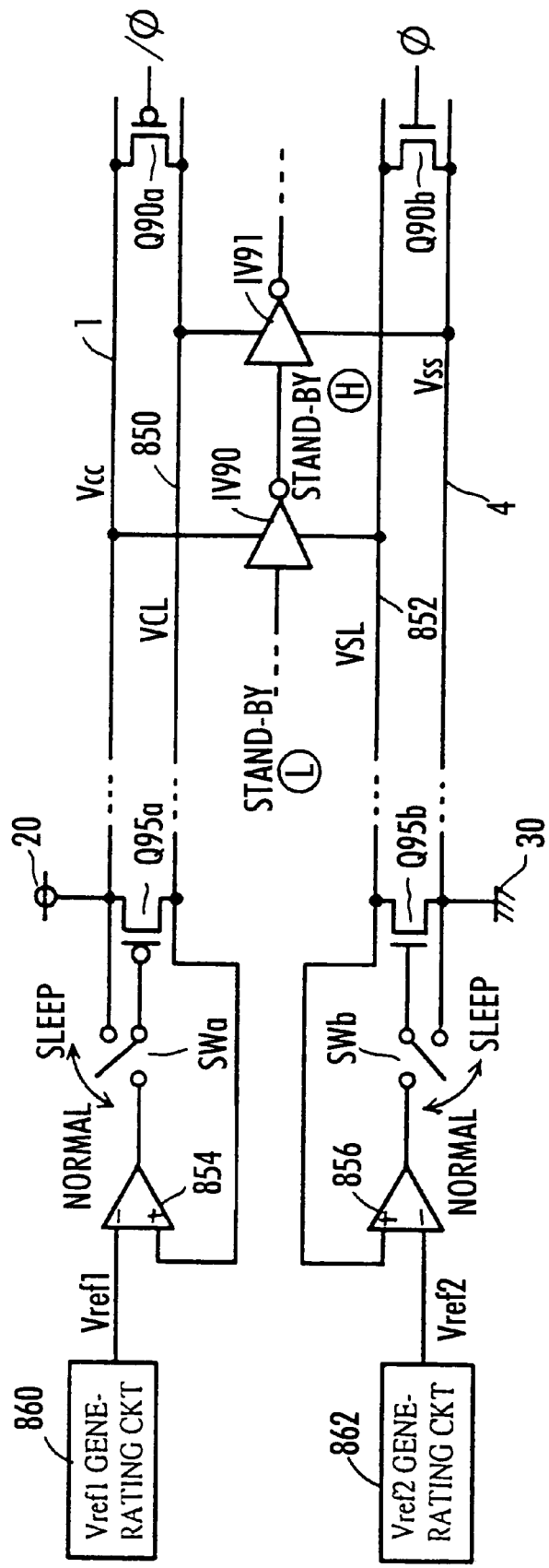
FIG. 46 shows a structure of a main portion of a semiconductor memory device in accordance with a tenth embodiment of the present invention.

FIG. 46 shows a structure of a main portion of a semiconductor memory device in accordance with a tenth embodiment of the present invention. Between main power supply line 1 and variable impedance power supply line 850, a p channel MOS transistor Q90a which is rendered conductive in response to an operation cycle defining signal /φ is arranged, and between main ground line 4 and variable impedance ground line 852, an n channel MOS transistor Q90b which is rendered conductive in response to an operation cycle defining signal φ is arranged. Operation cycle defining signal φ corresponds to the internal row address strobe signal RAS shown in FIG. 30, and it is set to an active state of high level, when memory cell selecting operation is performed (at the time of normal operation or refresh operation). Operation cycle defining signal /φ is complementary to operation cycle defining signal φ.

As an internal circuit, two stages of inverters IV90 and IV91 are shown as examples. Inverter IV90 receives a low level (L) signal in the stand-by cycle, and inverter IV91 receiving an output from inverter IV90, receives a high level (H) signal in the stand-by cycle. Internal structures of inverters IV90 and IV91 will be described later, and these inverters are constituted by MOS transistors of which threshold value in terms of the absolute value is small. Inverter IV90 operates using the power supply voltage Vcc on main power supply line 1 and voltage VSL on variable impedance ground line 852 as both operating power supply voltages. Inverter IV91 operates using the voltage VCL on variable impedance power supply line 850 and the ground voltage Vss on the main ground line 4, as both operating power supply voltages. The source of that MOS transistor which is turned off in the stand-by cycle is connected to variable impedance power supply line 850 or variable impedance ground line 852.

For main power supply line 1 and variable impedance power supply line 850, a Vref1 generating circuit 860 generating a reference voltage Vref1 having a level close to the level of the power supply voltage Vcc, a comparing circuit 854 for comparing the voltage VCL on variable impedance power supply line 850 and reference voltage Vref1 output from Vref1 generating circuit 860, a p channel MOS transistor Q95a connected between main power supply line 1 and variable impedance power supply line 850, and a switch circuit SWa for transmitting an output signal from comparing circuit 854 to the gate (control electrode) of MOS transistor Q95a in the normal mode and for connecting the gate of MOS transistor Q95a to the main power supply line 1 in the data holding mode (sleep mode) are provided. Comparing circuit 854 consists, for example, of a differential amplifier circuit, receives at its positive input the voltage VCL on variable impedance power supply line 850, at its negative input the reference voltage Vref1, and differentially amplifies the voltages VCL and Vref1. The output signal from comparing circuit 854 attains to the high level when the voltage VCL is higher than the reference voltage Vref1, and attains to the low level when the voltage VCL is lower than the reference voltage Vref1. The voltage level of the signal output from comparing circuit 854 is in proportion to the difference between voltage VCL and reference voltage Vref1.

For the main ground line 4 and variable impedance ground line 852, a Vref2 generating circuit 862 for outputting a reference voltage Vref2 which is close to ground voltage Vss, a comparing circuit 856 for comparing the voltage VSL on variable impedance ground line 852 and reference voltage Vref2 output from Vref2 generating circuit 862, an n channel MOS transistor Q95b connected between variable impedance ground line 852 and main ground line 4, and a switch circuit SWLB for transmitting the output signal from comparing circuit 856 to the gate of MOS transistor Q95b in the normal mode and connecting the gate of MOS transistor Q95b to the main ground line 4 in the sleep mode, are provided. Comparing circuit 856 consists of a differential amplifying circuit, and receives at its positive input, the voltage VSL on variable impedance ground line 852, and at its negative input, the reference voltage Vref2. Comparing circuit 856 provides a signal which is proportional to the difference between voltage VSL and reference voltage Vref2.

As shown in FIG. 30, the normal operation cycle includes a stand-by cycle and an active cycle, and the sleep mode (data holding mode) includes a CBR refresh mode in which refreshing only is performed internally, and self-refresh mode in which refreshing is internally performed at predetermined intervals. The operation of the circuit shown in FIG. 46 will be described with reference to FIG. 47, which a diagram of signal waveforms.

The normal operation mode (normal mode) allowing external access includes the stand-by cycle for waiting an external access, and the active cycle in which external access is actually performed and internal operation is carried out (see FIG. 30). In the stand-by cycle, a data holding mode designating signal /Sleep designating data holding operation is set to the inactive state of high level, and the operation cycle defining signal /φ is also at the inactive state of high level. At this state, switch circuit SWa transmits the output signal from comparing circuit 854 to the gate of MOS transistor Q95a, and switch circuit SWb transmits the output signal from comparing circuit 856 to the gate of MOS transistor Q95b. MOS transistors Q90a and Q90b are both off. Therefore, in accordance with the output signal from comparing circuit 854, resistance value of MOS transistor Q95a is adjusted, and similar to the operation described with reference to FIG. 34 above, the voltage VCL on variable impedance power supply line 850 is maintained at the voltage level of reference voltage Vref1. Meanwhile, the voltage VSL on variable impedance ground line 852 is maintained at the voltage level of reference voltage Vref2, by comparing circuit 856 and MOS transistor Q95b.

Inverter IV90 receives a low level signal, the n channel MOS transistor, which is the component of the inverter, is turned off, the gate-source of the transistor is reversely biased, and subthreshold current is suppressed. In inverter IV91, the component, p channel MOS transistor has its gate-source reversely biased, so that the transistor is turned more strongly off, and the subthreshold current is similar suppressed.

When the active cycle starts, the operation cycle defining signal /φ is set to the active state of low level, MOS transistors Q90a and Q90b are both turned on, variable impedance power supply line 890 is electrically connected to main power supply line 1, and variable impedance ground line 852 is electrically connected to main ground line 4. At this state, the voltage VCL attains to the level of the power supply voltage Vcc on main power supply line 1, and the voltage VSL attains to the level of the voltage Vss on main ground line 4. The output signal from comparing circuit 854 attains to the high level, MOS transistor Q95a turns off, the output signal from comparing circuit 856 attains to the low level, and MOS transistor Q95b is turned off. MOS transistors Q90a and Q90b have their gate width W set sufficiently large, the on-resistance is set sufficiently small, so that they have large current drivability. Therefore, at the transition from the stand-by cycle to the active cycle, the voltage VCL on variable impedance power supply line 850 and the voltage VSL on variable impedance ground line 852 return to the power supply voltage Vcc and the ground voltage Vss at high speed. Accordingly, inverters IV90 and IV91 which are the internal circuits operate at high speed following the change of the input signal thereto, and especially because inverters IV90 and IV91 are constituted by transistors having low threshold values, high speed operation is realized.

In the data holding mode (sleep mode), switch circuit SWa couples the main power supply line 1 and the gate of MOS transistor Q95a, and switch circuit SWb couples main ground line 4 and the gate of MOS transistor Q95b. Consequently, MOS transistors Q95a and Q95b each have their gate and source potential set equal to each other, and thus these transistors turn off. The input signals to inverters IV90 and IV91 are set to the same voltage levels as in the stand-by cycle. At this state, the voltage VCL on variable impedance power supply line 850 is maintained at a voltage level at which leak current flowing through MOS transistors Q90a and Q95a is balanced with the leak current flowing through inverters IV90 and IV91. At this time, if, for example, the gate width W of MOS transistor Q95a is set sufficiently smaller than that of MOS transistor Q90a, the leak current flowing through MOS transistor 95a is almost negligible, and in that case, the voltage VCL is maintained at a voltage level at which the leak current flowing through MOS transistor Q90a is balanced with the leak current flowing through inverters IV90 and IV91.

Figure 47:
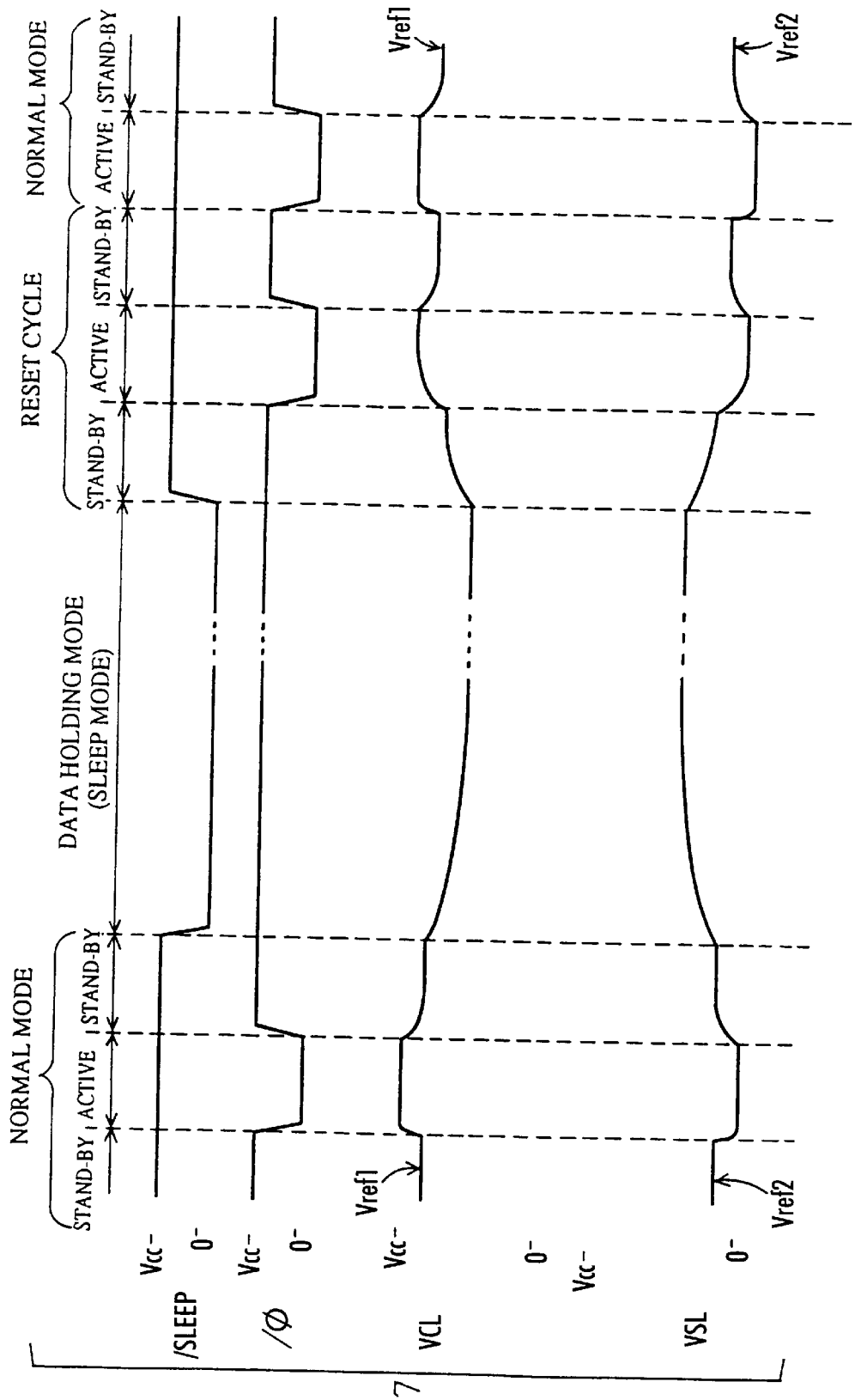
FIG. 47 is a diagram of waveforms showing the operation of the semiconductor device shown in FIG. 46.

Similarly, the voltage VSL on variable impedance ground line 852 rises to a voltage level at which leak current flowing through MOS transistors Q90b and Q95b is balanced with the leak current flowing through inverters IV90 and IV91. At this time, if the gate width of MOS transistor Q95b is set sufficiently smaller than that of MOS transistor Q90b, the leak current flowing through MOS transistor Q95b is almost negligible. In FIG. 47, the operation cycle defining signal /φ is shown maintained at the inactive state of high level in the data holding mode. However, in the data holding mode, refreshing operation is performed at prescribed time intervals as shown in FIG. 30. When refreshing operation is carried out in the data holding mode, operation cycle defining signal /φ is set to the active state of low level, and the voltage VCL on variable impedance power supply line 850 and the voltage VSL on variable impedance ground line 852 are recovered to the levels of power supply voltage Vcc and ground voltage Vss, respectively. When refreshing operation takes place, there is not an external access, and therefore even when recovery of the voltage on variable impedance power supply line 850 and voltage VSL on variable impedance ground line 852 takes much time, it does not affect the access time at all, causing no problem. Memory cells can be surely refreshed by delaying the timing of starting refreshing operation and performing refreshing after the voltages VCL and VSL are recovered to the power supply voltage Vcc and the ground voltage Vss, respectively.

At the transition from the data holding mode to the normal operation mode (normal mode), a reset cycle is carried out in which voltage VCL on variable impedance power supply line 850 and voltage VSL on variable impedance ground line 852 are recovered to the reference voltages Vref1 and Vref2.

In the reset cycle, the stand-by cycle and active cycle are repeated a prescribed number of times. FIG. 47 shows a sequence in which one stand-by cycle, one active cycle and another stand-by cycle are performed, as an example.

When data holding mode terminates, in the stand-by cycle of the reset cycle, switch circuit SWa transmits the output signal from comparing circuit 854 to the gate of MOS transistor Q95a, and switch circuit SWb transmits the output signal from comparing circuit 856 to the gate of MOS transistor Q95b. Consequently, by the control operation implemented by the feedback path of comparing circuit 854 and MOS transistor Q95a, the voltage VCL rises to the voltage level of reference voltage Vref1, and by the adjusting operation of reference circuit 856 and MOS transistors Q95b, the voltage VSL on variable impedance ground line 852 returns to the voltage level of reference voltage Vref2. In the reset cycle, after the execution of the stand-by cycle, the access cycle is carried out. Consequently, MOS transistors Q90a and Q90b are turned on, and voltages VCL and VSL change to the levels of the power supply voltage Vcc and the ground voltage Vss, respectively. After the completion of the active cycle, a stand-by cycle is carried out to be ready for the next normal mode. In this stand-by cycle, voltages VCL and VSL change to reference voltages Vref1 and Vref2, respectively. The active cycle is performed in the reset cycle in order to enable quick recovery of the voltages VCL and VSL, which have changed in the data holding mode, to the prescribed reference voltage levels Vref1 and Vref2. More specifically, voltage recovering operation by the MOS transistors Q95a and Q95b having small current drivability is accelerated by turning on the MOS transistors Q90a and Q90b, so as to reduce time necessary for the reset cycle. In the normal operation mode (normal mode), an active cycle is carried out again in accordance with an external control signal, and access to the memory cell is performed. When the active cycle is completed, a stand-by cycle is carried out.

As described above, by setting MOS transistors Q95a and Q95b to more deeply off state in the data holding mode (sleep mode), the leak current (subthreshold current) flowing through transistors Q95a and Q95a in the data holding mode can be made sufficiently smaller than that in the stand-by cycle, and thus current consumption can further be reduced. Especially when the data holding mode is to be carried out using a battery as a power source in a battery driven personal computer, for example, battery life can be made longer by reducing current consumption in the data holding mode.

Though not explicitly shown in FIG. 46, comparing circuits 854 and 856 operate using power supply voltage Vcc and ground voltage Vss as both operating power supply voltages.

Figure 48:
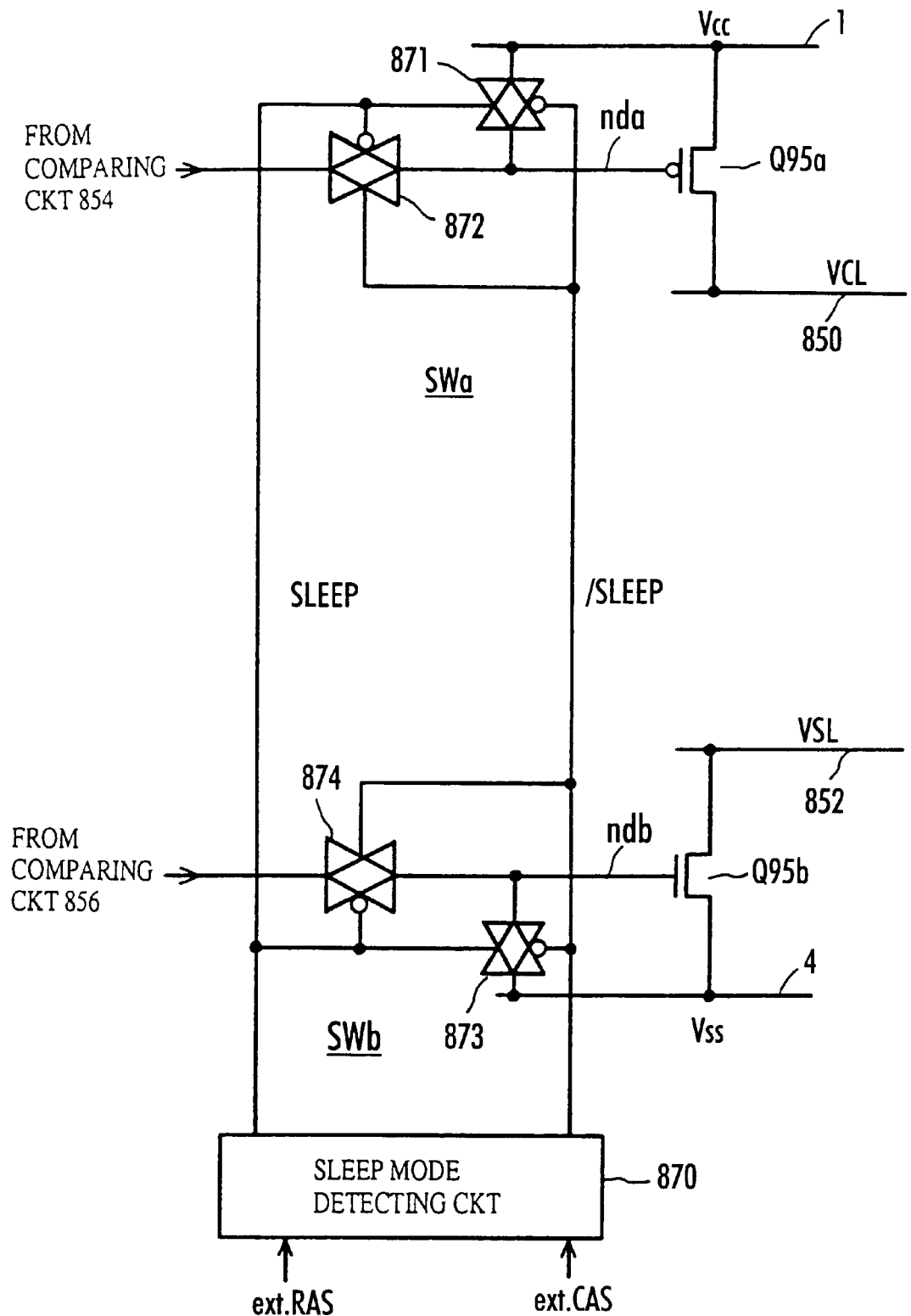
FIG. 48 shows an example of a structure of the switch circuit shown in FIG. 46.

FIG. 48 shows an example of the switch circuits SWa and SWb of FIG. 46. Referring to FIG. 48, switch circuit SWa includes a CMOS transmission gate 871 connected between main power supply line 1 and gate node nda of MOS transistor Q95a, and rendered conductive when the data holding mode designating signal (sleep mode designating signal) /Sleep is activated, and a CMOS transmission gate 871 connected between an output portion of comparing circuit 854 and a gate node nda of MOS transistor Q95a and rendered conductive when data holding mode designating signal Sleep is inactivated.

Data holding mode designating signal /Sleep is set to the active state of low level in the sleep mode (data holding mode), and signal Sleep is set to the active state of high level in the data holding mode (sleep mode). In the normal operation mode, the signal Sleep is at the low level and the signal /Sleep is at the high level. Therefore, in the data holding mode, CMOS transmission gate 871 is rendered conductive, CMOS transmission gate 872 is rendered non-conductive (cut off), and MOS transistor Q95a receives at the gate node nda, the voltage Vcc on main power supply line 1. In the normal operation mode, signal Sleep is set to the low level, the signal /Sleep is set to the high level, CMOS transmission gate 871 is rendered conductive and CMOS transmission gate 871 is rendered non-conductive. At this time, the output signal from comparing circuit 854 is transmitted to the gate node nda of MOS transistor Q95a.

Switch circuit SWb includes a CMOS transmission gate 873 connected between a gate node ndb of MOS transistor Q95b and main ground line 4, and rendered conductive when data holding mode designating signal /Sleep is activated, and a CMOS transmission gate 874 connected between an output portion of comparing circuit 856 and a gate node nda of MOS transistor Q95b and rendered conductive when signals Sleep and /Sleep are inactivated. The operation of CMOS transmission gate 873 is the same as that of CMOS transmission gate 871, and the operation of CMOS transmission gate 874 is the same as that of CMOS transmission gate 872. Therefore, in the data holding mode, the gate node ndb of MOS transistor Q95b is coupled to the main ground line 4 through CMOS transmission gate 873 in the data holding mode. In the normal operation mode, the gate node ndb of MOS transistor Q95b is coupled to the output portion of comparing circuit 856. Data holding mode designating signals Sleep and /Sleep are generated from a sleep mode detecting circuit 870. Sleep mode detecting circuit 870 corresponds to the holding mode detecting circuit 654 shown in FIG. 29. It detects whether or not the data holding mode is designated in accordance with externally applied control signals ext.RAS and ext.CAS, and activates the signals Sleep and /Sleep when the data holding mode is designated.

As described above, since switch circuits SWa and SWb are constituted by CMOS transmission gates, even when the signals Sleep and /Sleep from sleep mode detecting circuit 870 have the amplitude of power supply voltage Vcc and ground voltage Vss, there is not a signal transmission loss, and switch circuits SWa and SWb can transmit applied signals.

As for the sleep mode detecting circuit 870 shown in FIG. 48, it may detect other condition than the CBR condition. For example, a structure may be used in which designation of the sleep mode is detected in accordance with an address signal applied to a specified address signal input terminal in addition to WCBR condition (in which write enable signal /WE and column address strobe signal /CAS are set to the low level prior to the fall of row address strobe signal /RAS).

Sleep mode detecting circuit 870 operates using power supply voltage Vcc and ground voltage Vss as both operating power supply voltages. In a semiconductor memory device, there are a negative voltage Vbb generator and a high voltage Vpp generator, as shown in FIG. 4. When sleep mode detecting circuit 870 has a structure that generates the high voltage Vpp and the negative voltage Vbb, a transfer gate constituted by one MOS transistor may be used in place of the CMOS transmission gate.

A structure in which the high voltage Vpp is applied to gate node nda of MOS transistor Q95a in the data holding mode and the negative voltage Vbb is applied to gate node ndb of MOS transistor Q95b in the data holding mode may be used. MOS transistors Q95a and Q95b can be set more strongly off in the data holding mode, and thus subthreshold current can further be reduced.

As described above, according to the tenth embodiment of the present invention, the MOS transistor for setting the voltage on the subpower supply line (variable impedance power supply line or variable impedance ground line) to the reference voltage (Vref1 or Vref2) in accordance with an output signal from the comparing circuit in the stand-by cycle is set to the off state of high resistance, and the transistor is rendered nonconductive, whereby the leak current of the MOS transistor in the data holding mode can be reduced than in the stand-by cycle, and thus current consumption in the data holding mode can be reduced.

[Embodiment 11]

Figure 49:
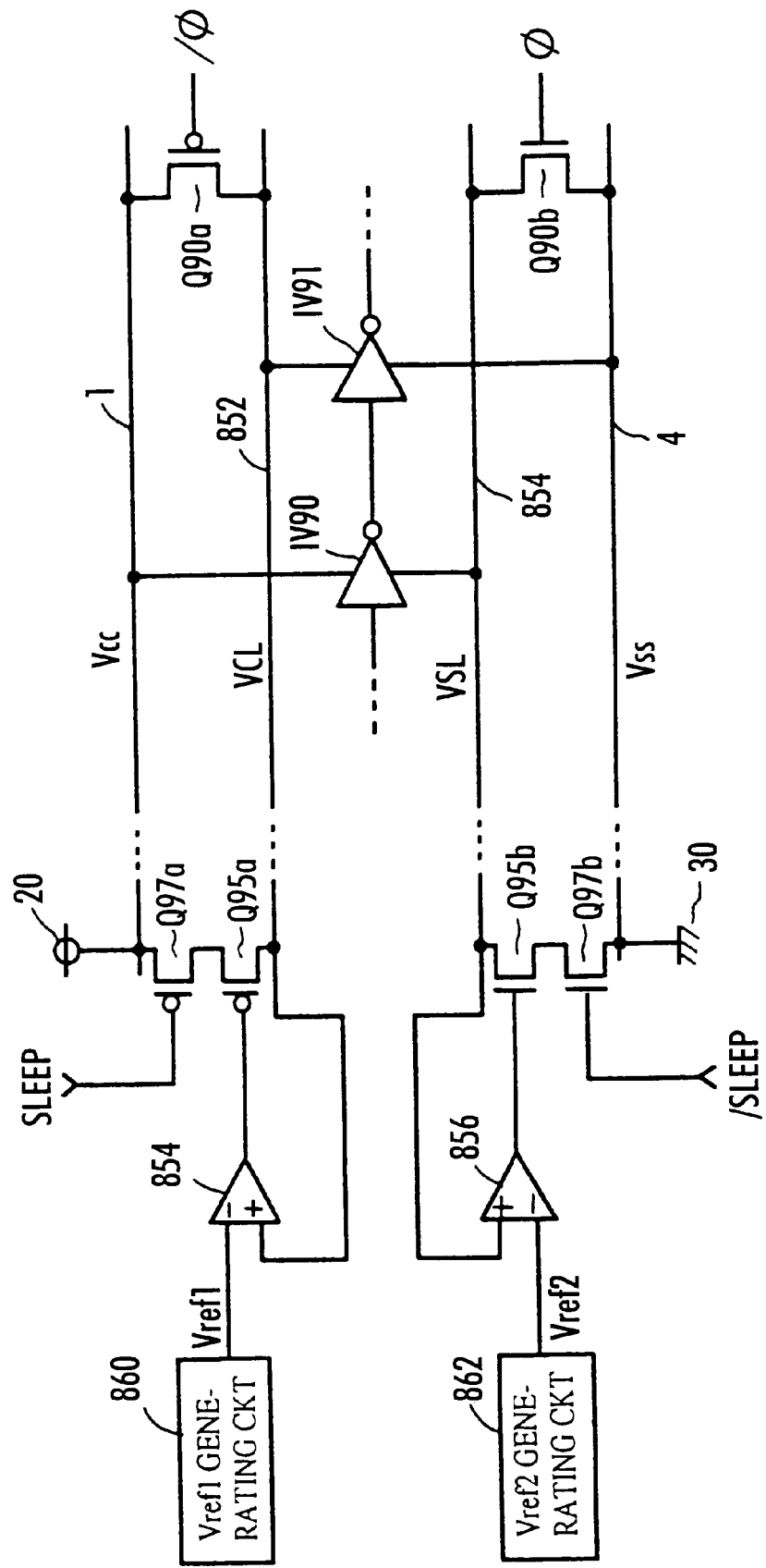
FIG. 49 shows a structure of a main portion of a semiconductor memory device in accordance with an eleventh embodiment of the present invention.

FIG. 49 shows a structure of a main portion of a semiconductor memory device in accordance with an eleventh embodiment of the present invention. In the structure shown in FIG. 49, between main power supply line 1 and variable impedance power supply line 852, p channel MOS transistors Q97a and Q95a are connected in series. To the gate of MOS transistor Q95a, an output signal from comparing circuit 954 is applied. To the gate of MOS transistor Q97a, data holding mode designating signal /Sleep is applied. Between main ground line 4 and variable impedance ground line 854, n channel MOS transistors Q95b and Q97b are connected in series. To the gate of MOS transistor Q95b, an output signal from comparing circuit 856 is applied. To the gate of MOS transistor Q97b, data holding mode designating signal /Sleep is applied.

In the structure shown in FIG. 49, MOS transistors Q97a and Q97b are provided in place of switch circuits SWa and SWb. Except this point, the structure is the same as that shown in FIG. 46, and corresponding portions are denoted by the corresponding reference numerals.

In the structure shown in FIG. 49, in the normal operation mode, signal Sleep is set to the level of the ground voltage Vss, and the signal /Sleep is set to the high level at the level of power supply voltage Vcc. Therefore, MOS transistors Q97a and Q97b are set to the conductive state of low resistance, MOS transistor Q95a has one conduction terminal (source) coupled to the main power supply line 1, and MOS transistor Q95b has one conduction terminal (source) coupled to the main ground line 4. Therefore, in the normal operation mode, similar operation as realized by the structure shown in FIG. 46 is carried out.

In the data holding mode, the signal Sleep is set to the high level which is at the level of the power supply voltage Vcc, and the signal /Sleep is set to the low level at the level of the ground voltage Vss. Therefore, at this state, MOS transistors Q97a and Q97b are set to the non-conductive state of high resistance, and MOS transistors Q95a and Q95b are isolated from the main power supply line 1 and main ground line 4, respectively. In the data holding mode, MOS transistors Q77a and Q95a are connected in series between main power supply line 1 and variable impedance power supply line 852. Therefore, combined resistance of these becomes larger than that of FIG. 46, and therefore leak current from main power supply line 1 to variable impedance power supply line 852 can further be suppressed. Similarly, since MOS transistors Q95b and Q97b are connected in series between main ground line and variable impedance ground line 854, combined resistance thereof becomes larger than that of FIG. 46, and thus leak current can further be reduced.

In the structure shown in FIG. 49, signals Sleep and /Sleep are described as having the amplitude between power supply voltage Vcc and the ground voltage Vss. However, the signal Sleep may have the amplitude between the levels of high voltage Vpp and the ground voltage Vss, while the signal /Sleep may have the amplitude between power supply voltage Vcc and the negative voltage Vbb. Such a structure in which the amplitude is set at the high voltage Vpp and negative voltage Vbb may be implemented by using level converting circuits 780*a* and 790*a* shown in FIGS. 40 and 41. By setting the signal Sleep to the high voltage Vpp in the data holding mode, MOS transistor Q97*a* is set to more strongly off state (with high resistance), and therefore main power supply line 1 can surely be electrically separated from variable impedance power supply line 852. Similarly, by setting the signal /Sleep to the negative voltage Vbb in the data holding mode, MOS transistor Q97*b* can be set to more strongly off state (with high resistance) and rendered nonconductive, whereby the current path between main ground line 4 and variable impedance ground line 854 can be surely shut off.

As described above, according to the structure of the eleventh embodiment of the present invention, two MOS transistors are provided in series between the main power supply line 1 or main ground line 4 which is the main power supply line and the variable impedance power supply line or variable impedance ground line which is the subpower supply line, one MOS transistor has its resistance value (or current drivability) adjusted in accordance with an output signal from the comparing circuit and the other MOS transistor is set on or off in accordance with the data holding mode designating signal Sleep and /Sleep. These MOS transistors are connected in series in the data holding mode, increasing the resistance value, whereby leak current (subthreshold current) can further be reduced. In addition, by setting the signals Sleep and /Sleep to a voltage (Vpp or Vbb) having larger absolute value than the voltage (Vcc or Vss) on the main power supply line in this structure, the other MOS transistor can be set to more strongly off state (with higher resistance) and hence current path between the main power supply line and the subpower supply line can be surely shut off, further reducing the leak current.

[Embodiment 12]

Figure 50:
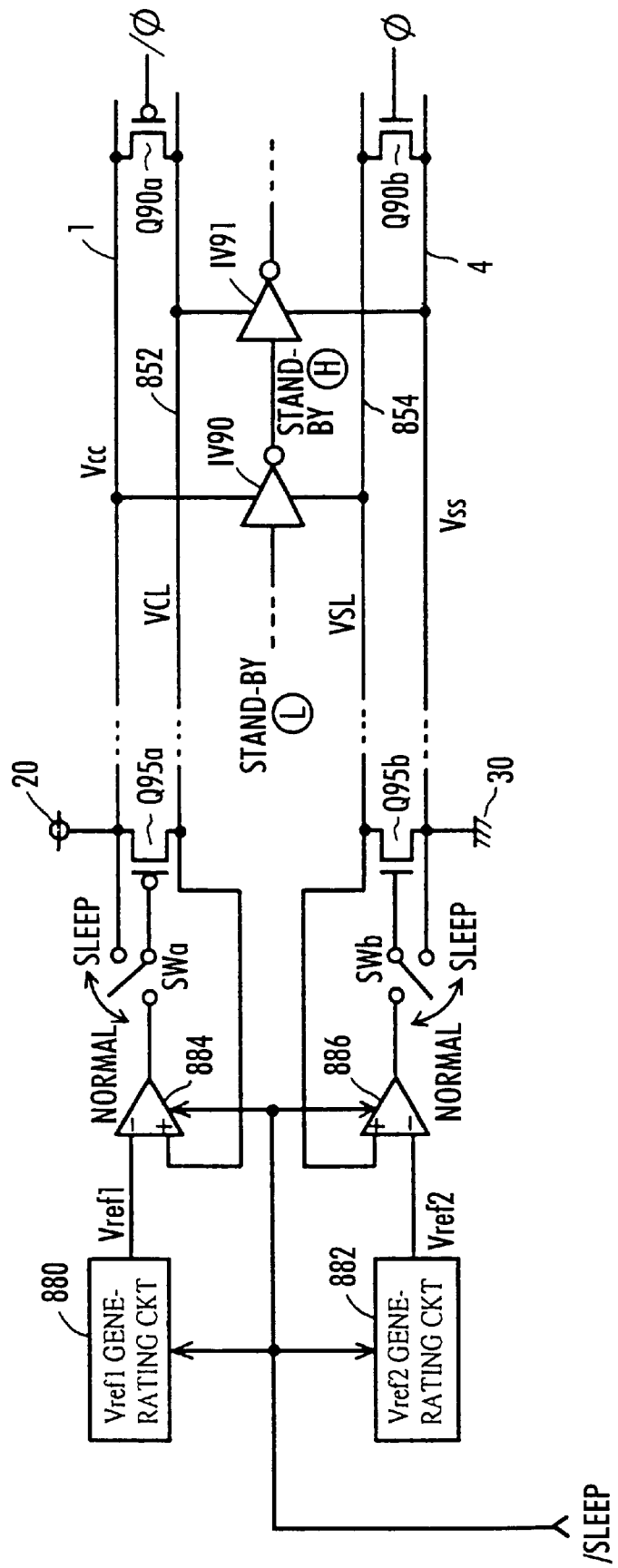
FIG. 50 shows a structure of a main portion of a semiconductor memory device in accordance with a twelfth embodiment of the present invention.

FIG. 50 shows a structure of a main portion of the semiconductor memory device in accordance with the twelfth embodiment of the present invention. In the structure shown in FIG. 50, the Vref1 generating circuit 880 for generating the reference voltage Vref1 for determining the voltage level of voltage Vcl on variable impedance power supply line 852 in the stand-by cycle and comparing circuit 884 comparing the reference voltage Vref1 with the voltage VCL on variable impedance power supply line 852 are inactivated in the data holding mode (sleep mode), and hence the operation of generating the reference voltage Vref1 and comparing operation are inhibited.

Similarly, the Vref2 generating circuit 882 generating the reference voltage Vref2 for determining the voltage level of voltage VSL of variable impedance ground line 854 in the stand-by cycle and comparing circuit 886 comparing the reference voltage Vref2 and the voltage VSL are inactivated in the data holding mode (sleep mode), thus respective operations are inhibited. Except these points, the structure is the same as that shown in FIG. 46, and therefore corresponding portions are denoted by the same reference characters and detailed description thereof is not repeated.

The operation in the normal operation mode is the same as that described with reference to FIGS. 46 and 47. More specifically, in the normal operation mode, data holding mode designating signal /Sleep is inactivated, and Vref1 generating circuit 880, Vref2 generating circuit 882 and comparing circuits 884 and 886 are activated. Switch circuits SWa and SWb transmit the output signals from corresponding comparing circuits 884 and 886 to the gates of corresponding MOS transistors Q95*a* and Q95*b*. Therefore, in the stand-by cycle in the normal operation, the voltage VCL on variable impedance power supply line 852 and the voltage VSL on variable impedance ground line 854 are held at the reference voltages Vref1 and Vref2, respectively. In the active cycle, MOS transistors Q90*a* and Q90*b* are turned on, and voltages VCL and VSL attain to the level of the power supply voltage Vcc and the ground voltage Vss.

In the data holding mode (sleep mode), switch circuit SWa couples the gate of MOS transistor Q95*a* to main power supply line 1, and switch circuit SWb couples the gate of MOS transistor Q95*b* to main ground line 4. At this state, similar to the structure of the tenth embodiment described with reference to FIG. 46, MOS transistors Q95*a* and Q95*b* are turned off, the current path is shut off, and current consumption is reduced.

In the twelfth embodiment, further, in the data holding mode, data holding mode designating signal /Sleep is activated, and operations of Vref1 generating circuit 880, Vref2 generating circuit 882 and comparing circuits 884 and 886 are inhibited. Current is not consumed in these circuits in the data holding mode (sleep mode), and thus current consumption is reduced.

Figure 51:
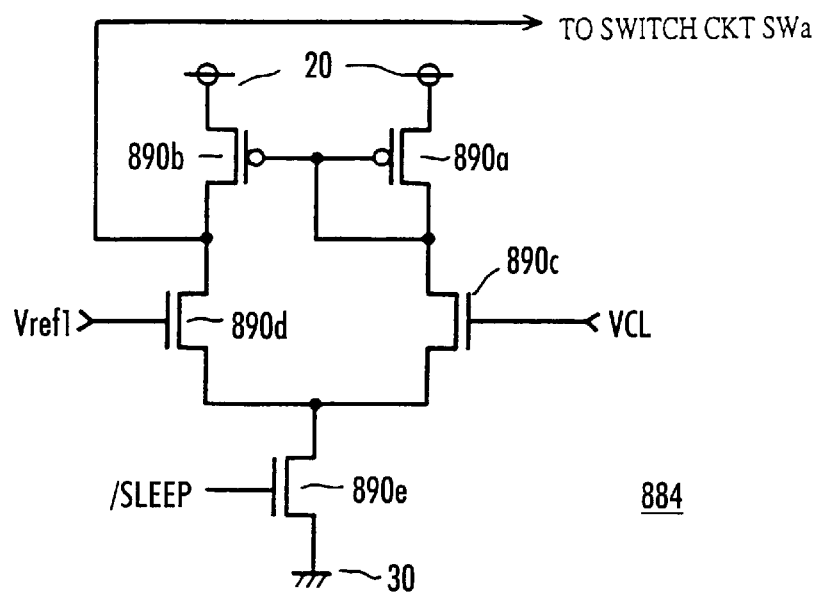
FIG. 51 shows an example of a structure of a comparing circuit comparing reference voltage Vref1 and the voltage VCL shown in FIG. 50.

FIG. 51 shows an example of the structure of comparing circuit 844 shown in FIG. 50. The comparing circuit 884 shown in FIG. 51 includes p channel MOS transistors 890*a* and 890*b* constituting a current mirror circuit, n channel MOS transistors 890*c* and 890*d* constituting a comparing stage between voltage VCL and reference voltage Vref1, and an n channel MOS transistor 890*e* for controlling activation/inactivation of comparing circuit 884.

More specifically, MOS transistor 890*a* has one conduction terminal (source) connected to a power supply terminal 20 and its gate and the other conduction terminal (drain) connected together. MOS transistor 890*b* has one conduction terminal connected to power supply terminal 20, its gate connected to the gate of MOS transistor 890*a*, and its other conduction terminal connected to the other conduction terminal (drain) of MOS transistor 890*b*. MOS transistor 890*c* has the other conduction terminal connected to the gate and the other conduction terminal of MOS transistor 890*a*, and receives at its gate, the voltage VCL. MOS transistor 890*d* receives at its gate the reference voltage Vref1. MOS transistors 890*c* and 890*d* have one conduction terminal (source) commonly connected and coupled to ground terminal 30 through MOS transistor 890*e*. MOS transistor 890*e* receives at its gate the data holding mode designating signal /Sleep.

In the normal operation mode, data holding mode designating signal /Sleep is at the inactive state of high level, and MOS transistor 890*e* is on. At this state, a current path from power supply terminal 20 to ground terminal 30 is provided, and voltage VCL is compared to Vref1. When voltage VCL is higher than reference voltage Vref1, conductance of MOS transistor 890*c* becomes larger than that of MOS transistor 890*d*, and thus amount of current flowing through MOS transistor 890*c* becomes larger than that flowing through MOS transistor 890*d*. The current flowing through MOS transistor 890*c* is applied from power supply terminal 20 through MOS transistor 890*a*. Mirror current of the current flowing through MOS transistor 890*a* flows through MOS transistor 890*b*, and applied to MOS transistor 890*d*. Consequently, the voltage level at the other conduction node (drain) of MOS transistor 890*d* rises, the voltage level of the signal applied to switch circuit SWa increases, conductance of MOS transistor Q95*a* (see FIG. 50) reduces, and thus the transistor turns off. When voltage VCL is lower than the reference voltage Vref1, the current flowing through MOS transistor 890a becomes larger than the current flowing through MOS transistor 890c, the amount of current discharged by MOS transistor 800d becomes larger than the current supplied from MOS transistor 890b, and in response, the voltage level of the signal applied from comparing circuit 884 to switch circuit SWa lowers. Consequently, gate potential of MOS transistor Q95a decreases, and the conductance of the transistor Q95a increases.

In the data holding mode (sleep mode), the signal /Sleep attains to the inactive state of low level, and MOS transistor 890e is turned off. Consequently, the current path from power supply terminal 20 to the ground terminal 30 is shut off, and comparing operation by comparing circuit 884 is inhibited. At this state, the voltage level of the signal provided from comparing circuit 884 is approximately at the level of the power supply voltage Vcc. In the data holding mode, since MOS transistor 890e is turned off and current path of comparing circuit 884 from power supply terminal 20 to the ground terminal 30 is shut off, current consumption in comparing circuit 884 is inhibited.

Figure 52:
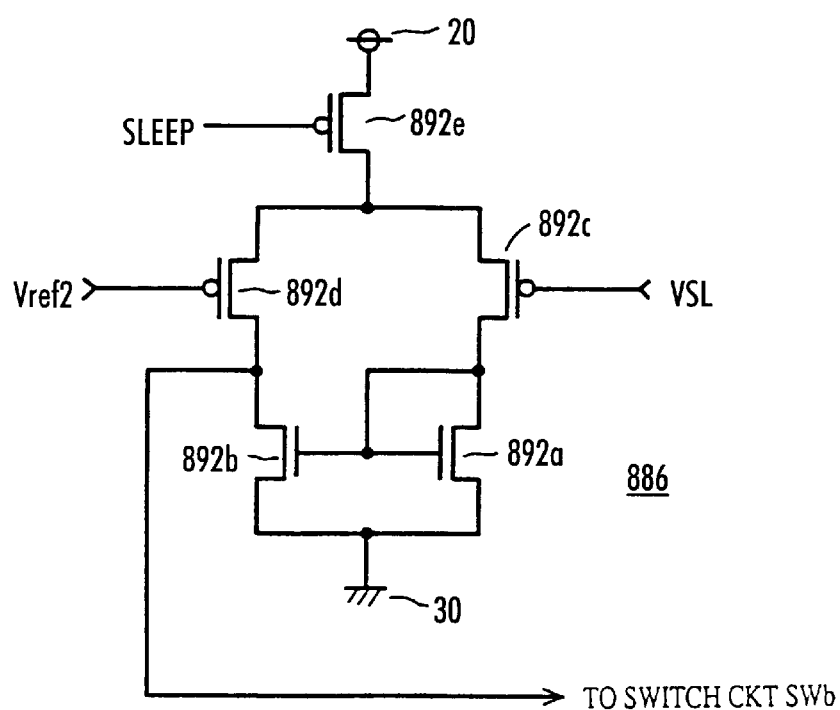
FIG. 52 shows an example of a structure of a circuit comparing a reference voltage Vref2 and the voltage VSL shown in FIG. 50.

FIG. 52 shows an example of a structure of comparing circuit 886 shown in FIG. 50. Referring to FIG. 52, comparing circuit 886 includes n channel MOS transistors 892a and 892b constituting a current mirror circuit, p channel MOS transistors 892c and 892d constituting a comparing stage between voltage VSL and Vref2, and a p channel MOS transistor 892e controlling activation/inactivation of comparing circuit 886. MOS transistor 892a has one conduction terminal (source) connected to the ground terminal 30, and its gate and drain connected commonly. MOS transistor 892b has its source connected to the ground terminal 30, its gate connected to the gate and drain of MOS transistor 892a, and outputs a signal indicative of the result of comparison from its drain. MOS transistor 892c receives at its gate the voltage VSL, and its drain connected to the gate and drain of MOS transistor 892a. MOS transistor 892d receives at its gate the reference voltage Vref2, and its drain connected to the drain of MOS transistor 892b. MOS transistors 892c and 892d have their sources commonly connected and coupled to power supply terminal 20 through MOS transistor 892e. MOS transistor 892e receives at its gate the data holding mode designating signal Sleep. The data holding mode designating signal Sleep is set to the active state of high level in the data holding mode.

In the normal operation mode, data holding mode designating signal Sleep is at the low level, MOS transistor 892e is on, and a current path from power supply terminal 20 to ground terminal 30 is formed. When the voltage VSL is higher than the reference voltage Vref2, the conductance of MOS transistor 892d becomes higher than that of MOS transistor 892c. Mirror current of the current flowing through MOS transistor 892c is formed by MOS transistors 892a and 892b, and the mirror current thus formed is supplied from MOS transistor 892d. At this time, since the current supplied from MOS transistor 892d is larger than the mirror current flowing through MOS transistor 892b, the voltage level of the signal applied to switch circuit SWb increases, and MOS transistor Q95b shown in FIG. 50 turns on or rendered more conductive. When the voltage VSL is lower than reference voltage Vref2, by contrast, conductance of MOS transistor 892c becomes larger than that of MOS transistor 892b, the current flowing through MOS transistor 892b becomes larger than the current supplied from MOS transistor 892d, and voltage level of the signal applied to switch circuit SWb decreases.

In the data holding mode (sleep mode), the signal Sleep attains to the active state of high level, MOS transistor 892e is turned off, and current path from power supply terminal 20 to ground terminal 30 is shut off. At this state, the voltage level of the signal applied from comparing circuit 886 to switch circuit SWb is approximately at the level of the voltage Vss applied to the ground terminal 30.

Figure 53:
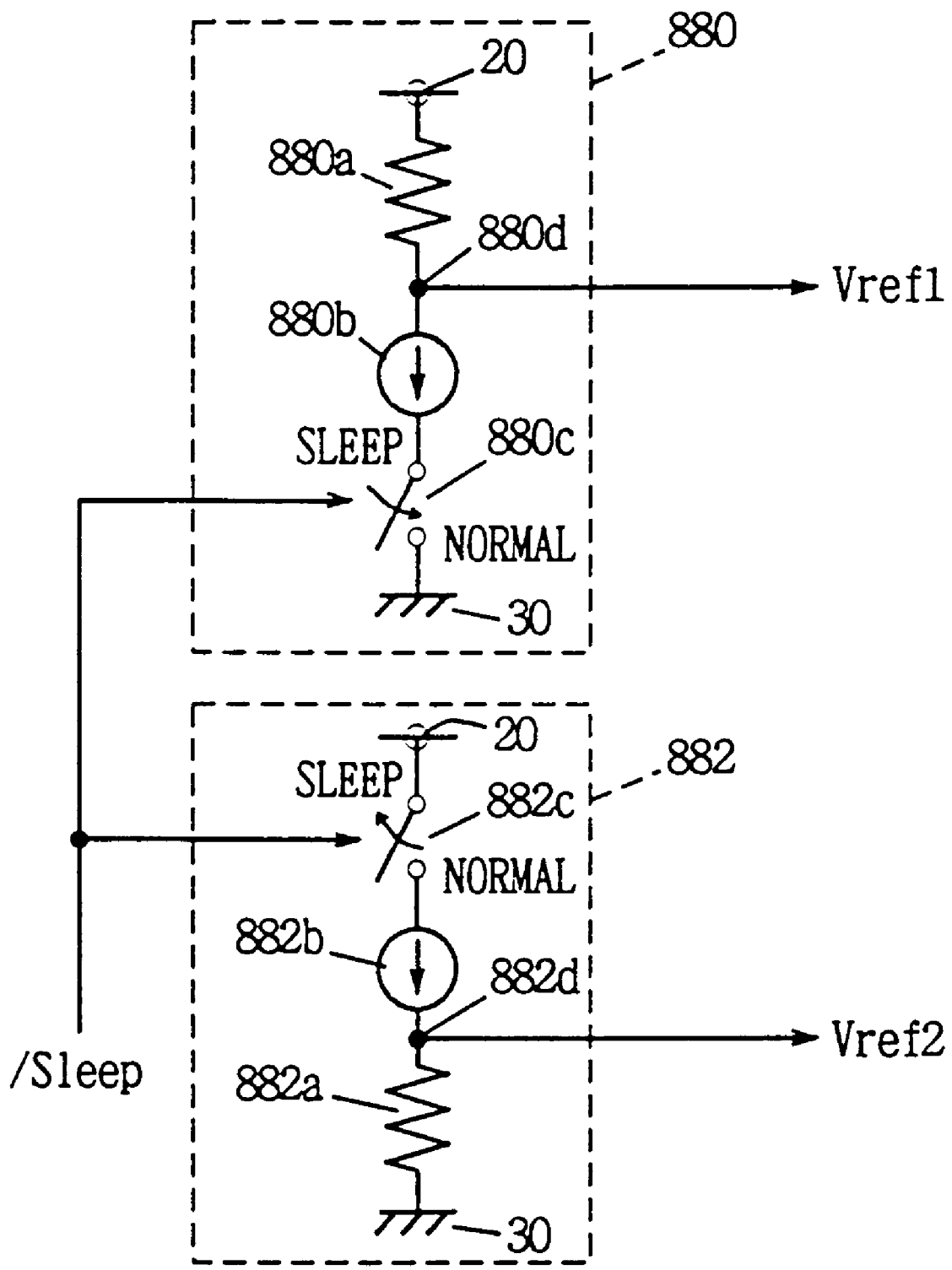
FIG. 53 schematically shows the structure of a reference voltage generating circuit shown in FIG. 50.

FIG. 53 schematically shows the structures of reference voltage generating circuits 880 and 882 of FIG. 50. Referring to FIG. 53, reference voltage generating circuit 880 includes a resistance 880a connected between power supply node 20 and node 880d, and a constant current source 880b and a switching element 880c connected in series between node 880b and ground node 30. Switching element 880c is shut off when data holding mode designating signal /Sleep is at the active state of low level, and rendered conductive when data holding mode designating signal /Sleep is at the inactive state of high level, forming a path of current flowing from power supply node 20 to ground node 30. Reference voltage Vref1 is output from node 880b.

Reference voltage generating circuit 882 includes a switching element 882c and a constant current source 882d connected in series between power supply node 20 and a node 882, and a resistance element 882a connected between node 882d and ground node 30. Switching element 882c is shut off when data holding mode designating signal /Sleep is active indicating the data holding mode, and rendered conductive when data holding mode designating signal /Sleep is inactive indicating normal operation mode (operation other than the data holding mode). Reference voltage Vref2 is output from node 882d. The operation will be briefly described.

When data holding mode designating signal /Sleep is inactive, switching elements 880c and 882c are both non-conductive. Therefore, in reference voltage generating circuit 880, current does not flow through resistance 880a and hence reference voltage Vref1 attains to the level of power supply voltage Vcc applied to power supply node 20. In reference voltage generating circuit 882 also, current does not flow through resistance 882a, and reference voltage Vref2 at node 882d attains to the level of ground voltage Vss at ground node 30.

When data holding mode designating signal /Sleep is inactive, switching elements 880c and 882c are rendered conductive. Therefore, in reference voltage generating circuit 880, current I (880) determined by constant current source 880b flows through resistance 880a, and reference voltage Vref1 attains to the voltage level of Vcc-I (880)·R (880a), where R (880a) represents resistance value of resistance element 880a. In reference voltage generating circuit 882, constant current I (882) determined by constant current source 882b flows through resistance element 882a. Therefore, reference voltage Vref2 from node 882d attains to I (882)·R (882a)+Vss, where R (882a) represents resistance value of resistance element 882a.

Figure 54:
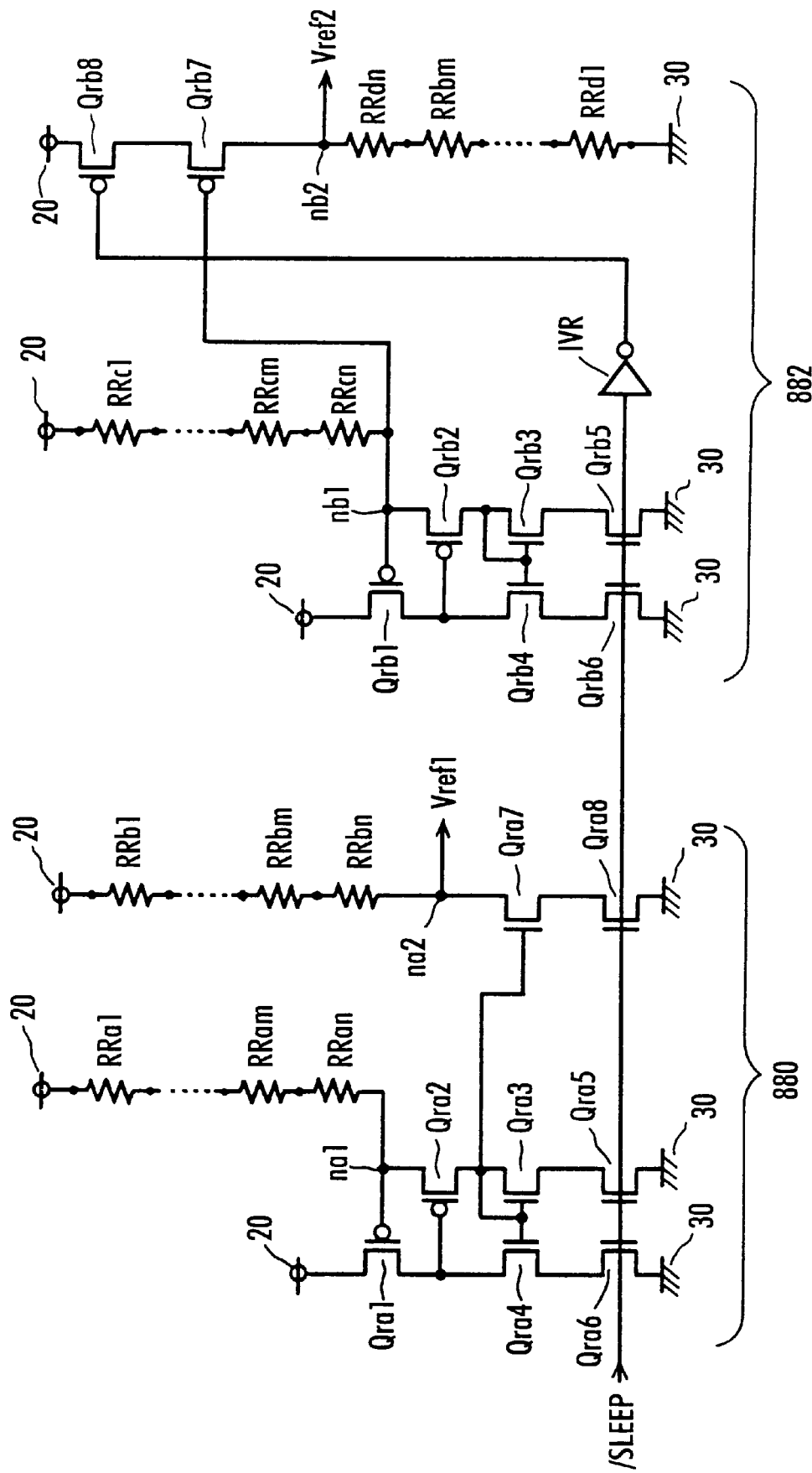
FIG. 54 shows an example of a detailed structure of the circuit generating reference voltages Vref1 and Vref2 shown in FIG. 53.

FIG. 54 shows details of the structures of the circuits 880 and 882 generating the reference voltages shown in FIG. 53.

Referring to FIG. 54, Vref generating circuit 880 includes a p channel MOS transistor Qra1 having its source connected to power supply terminal 20 and its gate connected to a node na1; a p channel MOS transistor Qra2 having its source connected to node na1 and its gate connected to the drain of MOS transistors Qra1; and n channel MOS transistor Qra3 having its drain and gate connected to the drain of MOS transistor Qra2 and its source coupled to ground terminal 30 through an MOS transistor Qra5; an n channel MOS transistor Qra4 having its drain connected to the gate of MOS transistor Qra2 and to the drain of MOS transistor Qra1 and its source coupled to the ground terminal 30 through an n channel MOS transistor Qra6; and resistances RRa1, . . . , RRam and RRan connected in series between power supply terminal 20 and node na1. Data holding mode designating signal /Sleep is applied to the gates of MOS transistors Qra5 and Qra6.

Vref1 generating circuit 880 further includes resistances RRb1, . . . , RRbm and RRbn connected in series between power supply terminal 20 and a node na2; and an n channel MOS transistor Qra7 having its drain connected to node na2, its gate connected to the gate and drain of MOS transistor Qra3 and its source connected to ground terminal 30 through an MOS transistor Qra8. To the gate of MOS transistor Qra8, data holding mode designating signal /Sleep is applied. Transistor Qra8 corresponds to switching element 880c of FIG. 53, resistances RRb1 to RRbn correspond to resistance element 880a of FIG. 53, and other components correspond to constant current source 880b. Prior to the description of the structure and operation of Vref2 generating circuit 882, the operation of Vref1 generating circuit 880 will be described. In the normal operation mode, data holding mode designating signal /Sleep is at the high level, MOS transistors Qra5, Qra6 and Qra8 are on, and in Vref1 generating circuit 880, current flows from power supply terminal 20 to ground terminal 30. Current drivability of MOS transistors Qra1 and Qra2 is set sufficiently larger than the current drivability of MOS transistors Qra3 and Qra4. The voltage level of node na1 is lower than that of power supply terminal 20, and current flows through MOS transistor Qra1. Similarly, current flows through MOS transistor Qra2. MOS transistors Qra3 and Qra4 constitute a current mirror circuit, and the mirror current of MOS transistor Qra2 flows from MOS transistor Qra1 through MOS transistor Qra4 to ground terminal 30. When the voltage level at node na1 is high, the current flowing through MOS transistor Qra1 decreases. Meanwhile, current flowing through MOS transistor Qra2 increases, as its source potential becomes higher. MOS transistors Qra3 and Qra4 constitute a current mirror circuit, and therefore when the current flowing through MOS transistor Qra2 increases, current flowing through MOS transistor Qra4 increases accordingly, and gate potential of MOS transistor Qra2 decreases. Therefore, current in MOS transistor Qra2 is further increased and the voltage level at node na1 decreases.

Meanwhile, when the voltage level at node na1 is low, the current flowing through MOS transistor Qra1 increases. Since its source potential is low, MOS transistor Qra2 supplies smaller amount of current, mirror current flowing through MOS transistor Qra4 decreases accordingly, gate potential of MOS transistor Qra2 increases, and the current flowing through MOS transistor Qra2 is further reduced. Thus the voltage level at node na1 increases.

By the above described operation, the voltage level at node na1 is set to a constant voltage level. Current drivability of MOS transistors Qra1 and Qra2 is set sufficiently larger than current drivability of MOS transistors Qra3 and Qra4. At this state, in the steady state, the source-gate voltage of MOS transistor Qra1 becomes equal to the absolute value of Vthp of the threshold voltage. The current flowing from node na1 to ground terminal 30 is supplied from power supply terminal 20 through the resistance body of resistances RRa1 to RRan. Since the voltage at node na1 is Vcc-Vthp, the current IA flowing from power supply terminal 20 through node na1 to the ground terminal 30 is represented by the following equation, where RA represents combined resistance of resistances RRa1 to RRAn:

$$IA=Vthp/RA$$

In the output stage, MOS transistor Qra7 constitutes, together with MOS transistor Qra3, a current mirror circuit.

Therefore, when current drivability of MOS transistor Qra3 is equal to that of Qra7, current IA flows through transistors Qra7 and Qra8. The current IA flows through the resistance body of resistances RRb1 to RRbn. Therefore, reference voltage Vref1 is given by the following equation, where RB represents combined resistance of resistances RRb1 to RRbn.

$$Vref1=Vcc-IA\cdot RB=Vcc-Vthp\cdot RB/RA$$

Therefore, the reference voltage Vref1 is at a voltage level lower than the power supply voltage Vcc by Vthp·RB/RA. As an example, a value of about 0.15 V is used as Vthp·RB/RA.

In the data holding mode, data holding mode designating signal /Sleep attains to the low level, MOS transistors Qra5, Qra6 and Qra8 are all turned off, and current path from power supply terminal 20 to ground terminal 30 is shut off. At this state, reference voltage Vref1 rises to the level of power supply voltage Vcc applied to power supply terminal 20, and reference voltage generating operation is inhibited. Since MOS transistors Qra5, Qra6, and Qra8 are turned off and the current path is shut off, current consumption in Vref1 generating circuit 880 can be inhibited.

Vref2 generating circuit 882 includes a p channel MOS transistor Qrb1 having its source connected to power supply terminal 20 and its gate connected to node na1; a p channel MOS transistor Qrb2 having its source connected to a node nb1 and its gate connected to the drain of MOS transistors Qrb1; an n channel MOS transistor Qrb3 having its gate and drain connected to the drain of MOS transistor Qrb2 and its source connected to ground terminal 30 through an MOS transistor Qrb5; and an n channel MOS transistor Qrb4 having its drain connected to the gate of MOS transistor Qrb2 and to the drain of MOS transistor Qrb1 and its source coupled to ground terminal 30 through MOS transistor Qrb6. To the gates of MOS transistors Qrb5 and Qrb6, data holding mode designating signal /Sleep is applied.

Vref2 generating circuit 882 further includes an inverter IVR for inverting data holding mode designating signal /Sleep; a p channel MOS transistor Qrb7 having its gate connected to node nb1, its drain connected to node nb2 and its source coupled to power supply terminal 20 through an MOS transistor Qrb8; resistances RRc1, RRcm and RRcn connected in series between power supply terminal 20 and node nb1; and resistances RRd1, . . . , RRdm and RRdn connected in series between ground terminal 30 and node nb2. As for the correspondence with the structure of FIG. 53, resistances RRd1 to RRdn correspond to resistance element 882a, transistor Qrb8 corresponds to switching element 882c, and other components correspond to constant current source 882b. Reference voltage Vref2 is output from node nb2. The structure of the portion including MOS transistors Qrb1 to Qrb6 and resistances RRc1 to RRcn is the same as that of the corresponding portion of Vref1 generating circuit 881. Therefore, the voltage at node nb1 is, in the normal operation mode, Vcc-Vthp. The voltage at node nb1 is applied to the gate of MOS transistor Qrb7. In the normal operation mode, the output signal from inverter IVR is at the low level, and MOS transistor Qrb8 is on. MOS transistor Qrb7 receives at its gate the voltage on node nb1, and supplies the current of the same magnitude as that in MOS transistors Qrb1 (provided that MOS transistors Qrb1 and Qrb7 are of the same size). Therefore, the current flowing through MOS transistor Qrb7 also becomes constant. The reference voltage Vref2 can be given by the following equation, where current flowing through MOS transistor Qrb7 is represented by ID and combined resistance of resistances RRd1 to RRdn is represented by RD.

$$Vref2 = Vss + ID \cdot RD = Vss + Vthp \cdot RD/RC$$

where RC represents combined resistance of resistances RRc1 to RRcn.

In the data holding mode, signal /Sleep attains to the low level, and output signal from inverter IVR attains to the high level. Therefore, MOS transistors Qrb5, Qrb6 and Qrb8 turn off, and current path from power supply terminal 20 to ground terminal 30 in Vref2 generating circuit 882 is shut off. At this state, reference voltage Vref2 attains to the level of the voltage Vss applied to ground terminal 30.

In the structure shown in FIGS. 51 to 54, power supply terminal 20 and ground terminal 30 may be replaced by main power supply line 1 and main ground line 4, respectively.

[Modification 1]

Figure 55:
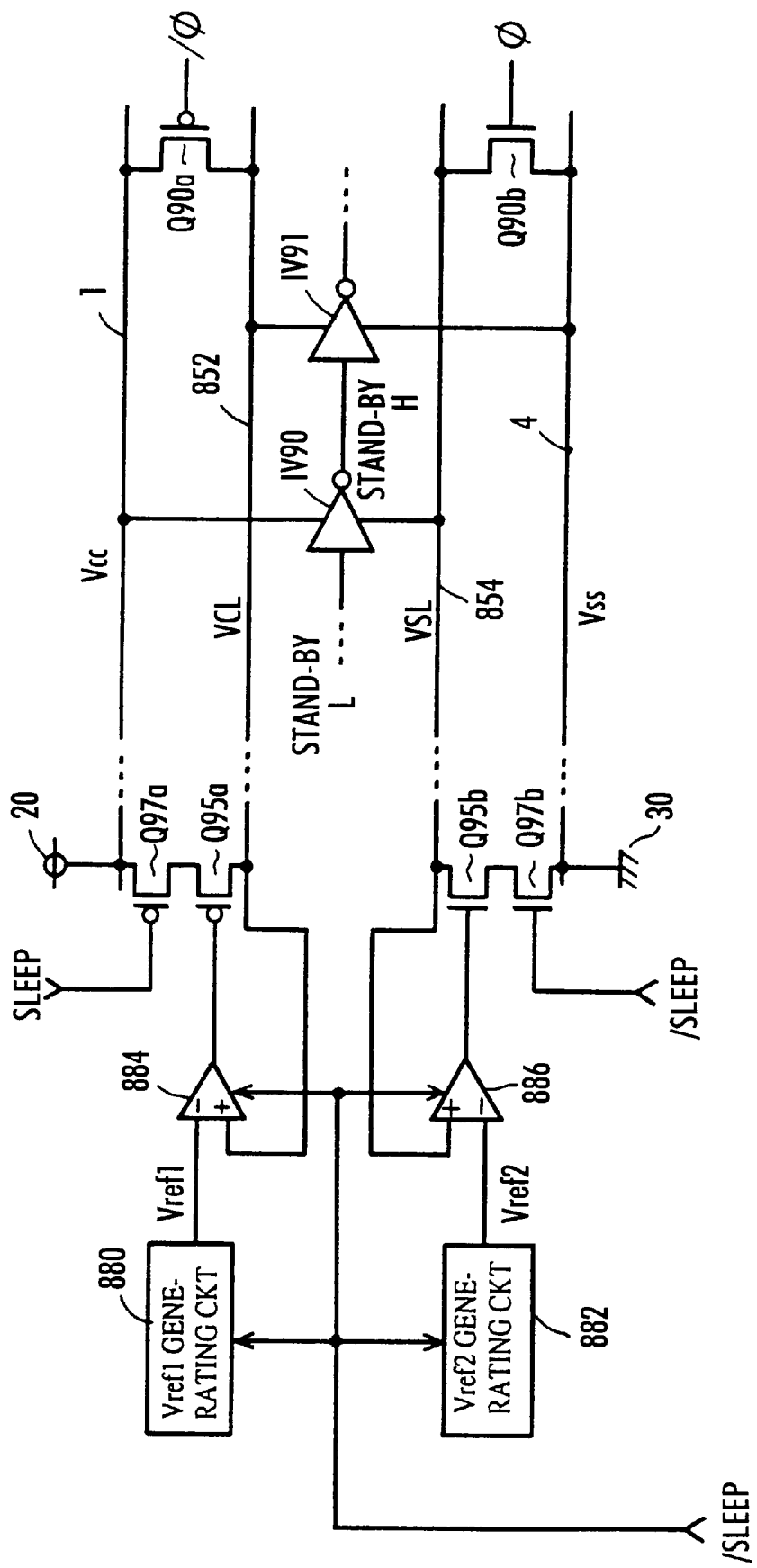
FIG. 55 shows a structure of a first modification of the twelfth embodiment of the present invention.

FIG. 55 shows a structure of a first modification of the twelfth embodiment of the present invention. In the structure shown in FIG. 55, p channel MOS transistors Q97a and 95a are connected in series between main power supply line 1 and variable impedance power supply line 852. Data holding mode designating signal Sleep is applied to the gate of MOS transistor Q97a. An output signal from comparing circuit 884 is applied to the gate of MOS transistor Q95a. The n channel MOS transistors Q97b and Q95b are connected in series between main ground line 4 and variable impedance ground line 854. Data holding mode designating signal /Sleep is applied to the gate of MOS transistor Q97b. To the gate of MOS transistor Q95b, an output signal from comparing circuit 886 is applied. Comparing circuit 884 compares reference voltage Vref1 output from Vref1 generating circuit 880 with the voltage VCL on variable impedance power supply line 852. Comparing circuit 886 compares reference voltage Vref2 output from Vref2 generating circuit 882 with the voltage VSL on variable impedance ground line 854. Circuits 880, 882, 884 and 886 have the same structures as those shown in FIGS. 50 to 54. These circuits are inactivated when data holding mode designating signals /Sleep is activated, and operations thereof are inhibited. In the structure shown in FIG. 55 also, since operations of circuits 880, 882, 884 and 886 are inhibited in the data holding mode, current consumption in the data holding mode can be reduced. The operation in the normal operation cycle is the same as that of the structure shown in FIG. 49, and therefore description thereof is not repeated.

[Modification 2]

Figure 56:
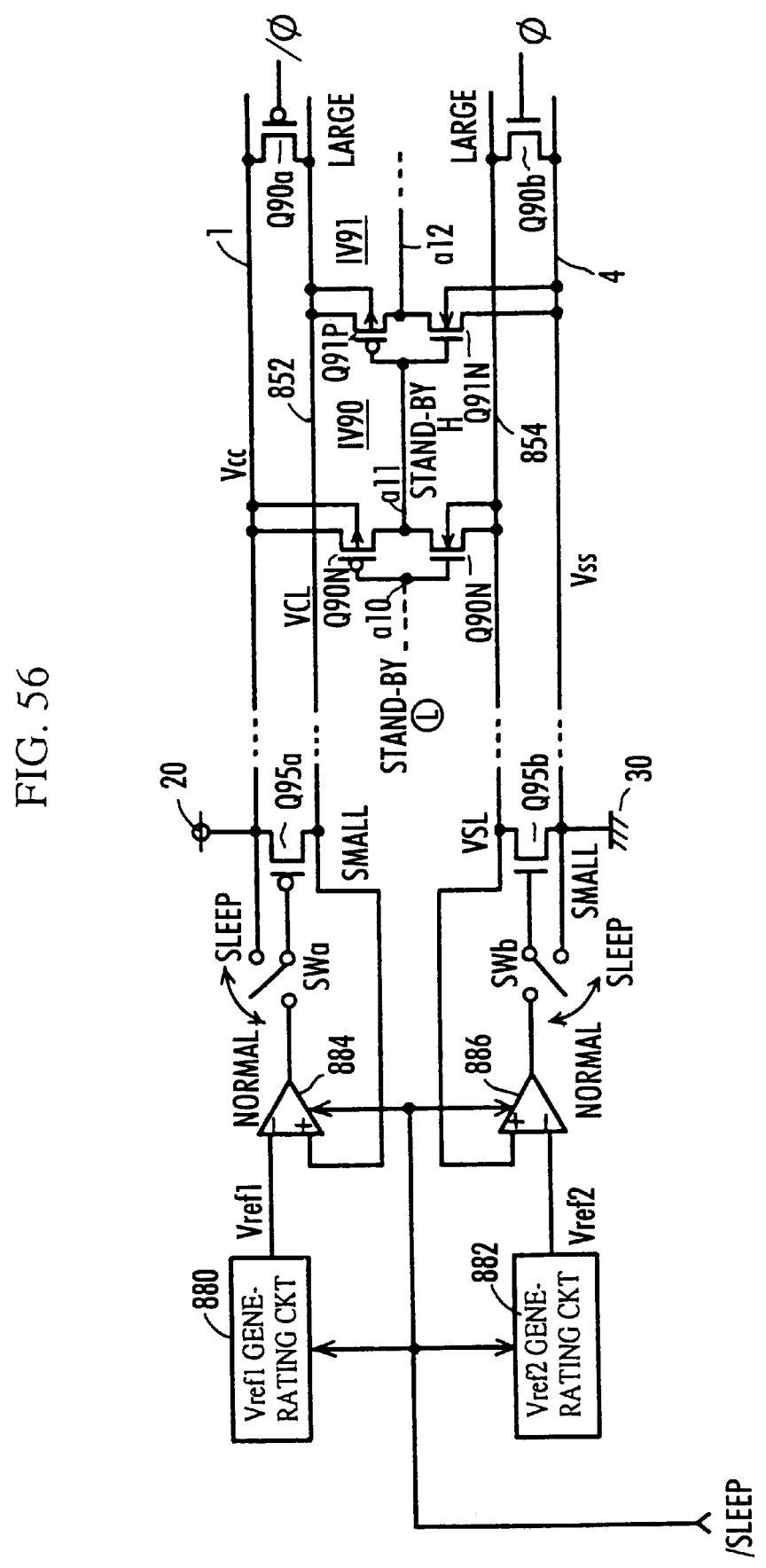

FIG. 56 shows a structure of a second modification of the twelfth embodiment of the present invention. In the structure shown in FIG. 56, inverters IV90 and IV91 shown in FIG. 50 are constituted by CMOS inverters.

Inverter IV90 includes a p channel MOS transistor Q90p having its gate connected to a node a10, its source connected to main power supply line 1, its drain connected to a node a11 and a substrate region (well region or semiconductor layer) connected to main power supply line 1; and an n channel MOS transistor Q90n having its gate connected to node a10, its drain connected to node a11, its source connected to variable impedance ground line 854 and substrate region connected to variable impedance ground line 854.

Inverter IV91 includes a p channel MOS transistor Q91p having its gate connected to node a11, its source connected to variable impedance power supply line 852, its drain connected to a node a12 and a substrate region connected to variable impedance power supply line 852; and an n channel MOS transistor Q91n having its gate connected to node a11, its drain connected to node a12, its source connected to main ground line 4 and a substrate region connected to main ground line 4. Current drivability of MOS transistor Q90a is set sufficiently larger than that of MOS transistor Q95a.

Similarly, current drivability of MOS transistor Q90b is made sufficiently larger than that of MOS transistor Q95b. Except these points, the structure of FIG. 56 is the same as that of FIG. 50.

In the structure of FIG. 56, MOS transistors Q90p, Q91p, Q90n and Q91n each have the source and substrate regions set at the same potential. Consequently, the influence of the backgate (substrate) bias effect of these transistors can be eliminated, and the desired constant threshold voltage is maintained both in the normal operation mode and in the data holding mode. Threshold voltage of MOS transistors Q90p and Q91p are set at −0.5 V, for example, and threshold voltage of MOS transistors Q90n and Q91n are held at 0.35 V, for example.

In either of the operation modes, the threshold voltages of the constant threshold voltage transistors can be maintained stably, and therefore desired operation characteristics and current consumption characteristics can be realized.

[Modification 3]

Figure 57:
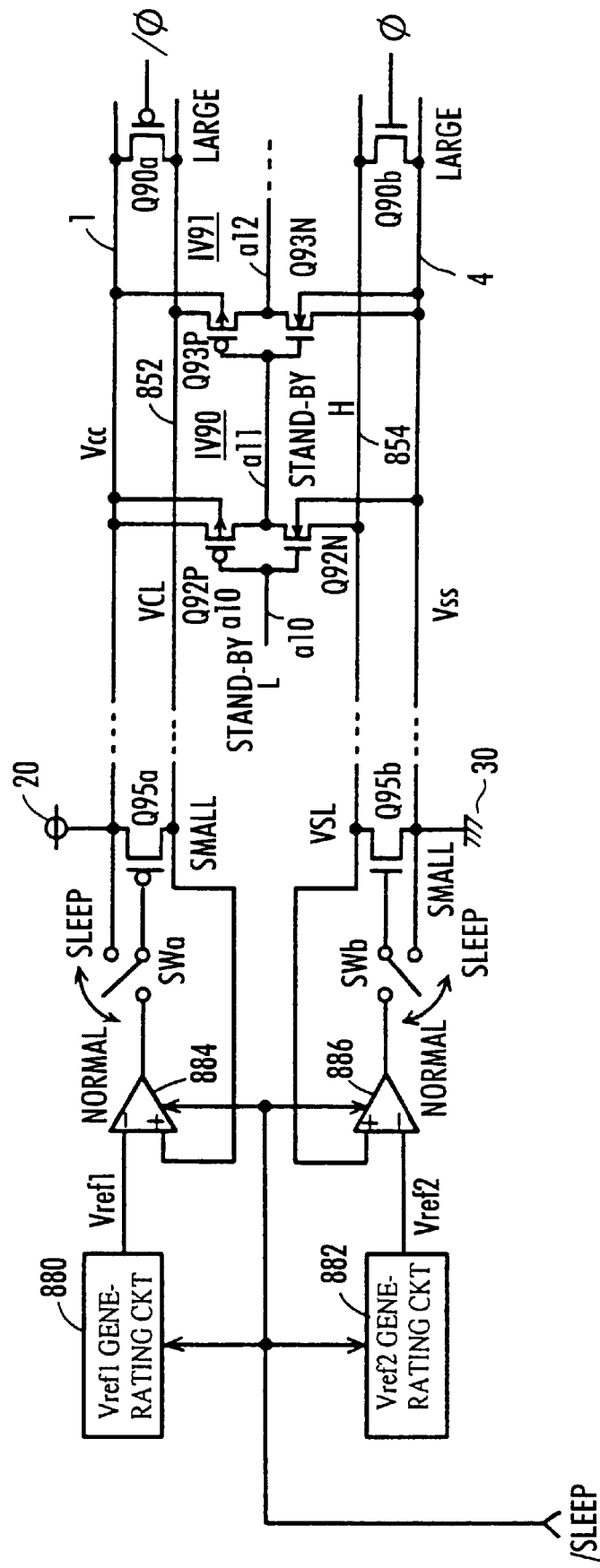
FIG. 57 shows a structure of a third modification of the twelfth embodiment of the present invention.

FIG. 57 shows a structure of a third modification of the twelfth embodiment of the present invention. The structure of FIG. 57 differs from that of FIG. 56 in that MOS transistors constituting inverters IV90 and IV91 have substrate regions connected in a different manner. In the structure shown in FIG. 57, substrate region of n channel MOS transistor Q92n included in inverter IV90 is connected to main ground line 4. The substrate region of p channel MOS transistor Q92p is connected to main power supply line 1 as in the case of FIG. 56. In inverter IV91, the substrate region of p channel MOS transistor Q93p is connected to main power supply line 1. The substrate region of n channel MOS transistor Q93n is connected to main ground line 4. The structure shown in FIG. 57 is electrically equivalent to the manner of connection of the inverters IV80 to IV82 shown in FIG. 45 above. As already described with reference to FIG. 52, there is a large junction capacitance in the substrate region. Therefore, by connecting the substrate regions of MOS transistors constituting inverters IV90 and IV91, which are the internal circuits, to main power supply line 1 or main ground line 4, parasitic capacitances of variable impedance power supply line 852 and variable impedance ground line 854 can be reduced. Therefore, at the transition from data holding mode to the normal operation mode, recovery of potentials of variable impedance power supply line 852 and variable impedance ground line 854 can be performed at high speed. Further, as MOS transistors Q92n and Q93p generating subthreshold currents have their substrate regions connected to main ground line 4 and main power supply line 1, respectively, backgate bias effect is generated in these transistors Q92n and Q93p, and thus these transistors Q92n and Q93p can be turned more deeply off. This can further reduce the subthreshold current. Therefore, current consumption in the data holding mode can be reduced.

In the structure shown in FIGS. 56 and 57, switch circuits SWa and SWb are connected to the gates of MOS transistors Q95a and Q95b, respectively. Alternatively, the structure of the inverter which is the internal circuit shown in FIGS. 56 and 57 and the power supply arrangement shown in FIG. 55 may be combined.

As described above, in accordance with the structure of the twelfth embodiment of the present invention, since circuits 880 and 882 generating reference voltages and comparing circuits 884 and 886 are inactivated in the data holding mode and operations of these circuits are inhibited, current is not consumed in these circuits, and thus current consumption in the data holding mode can further be reduced.

[Embodiment 13]

Figure 58:
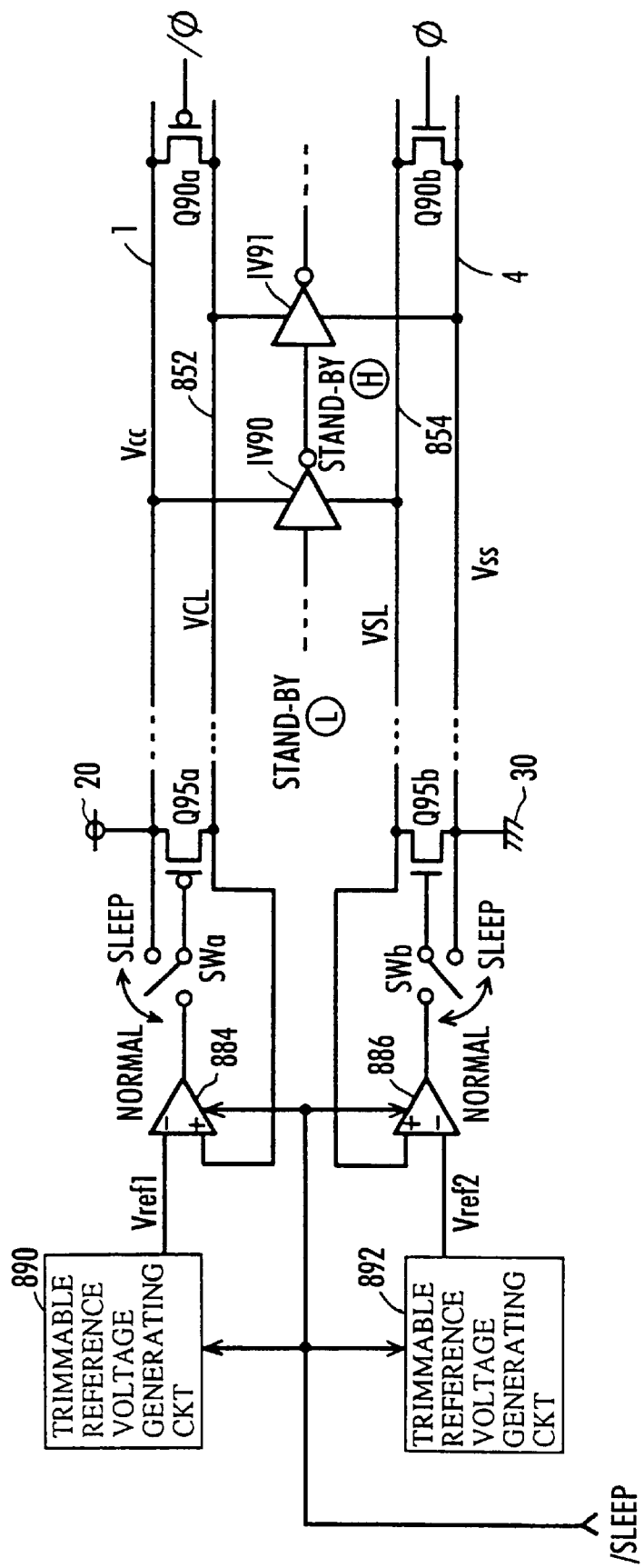
FIG. 58 shows a structure of a main portion of a semiconductor memory device in accordance with a thirteenth embodiment of the present invention.

FIG. 58 shows a structure of a main portion of a semiconductor memory device in accordance with a thirteenth embodiment of the present invention. In the structure of FIG. 58, voltage levels of reference voltages Vref1 and Vref2 determining the voltage VCL on variable impedance power supply line 852 and the voltage VSL on variable impedance ground line 854 in the stand-by cycle is adjustable after manufacturing of the semiconductor memory device. More specifically, a trimmable reference voltage generating circuit 890 generating reference voltage Vref1 and a trimmable reference voltage generating circuit 892 generating reference voltage Vref2 have structures allowing adjustment of voltage levels of reference voltages Vref1 and Vref2 generated respectively therefrom, after the completion of manufacturing steps of the semiconductor memory device. Detailed structures of trimmable reference voltage generating circuits 890 and 892 will be described later.

Referring to FIG. 58, as the voltage levels of reference voltages Vref1 and Vref2 can be adjusted after the completion of manufacturing steps, reference voltages Vref1 and Vref2 having the desired voltage levels can be accurately generated even when there are variations in various parameters in the manufacturing steps (for example, variations in resistance values, variations in threshold voltages of transistors, variations in gate length and gate width). Therefore, even when desired voltages levels of reference voltages Vref1 and Vref2 cannot be obtained at the end of manufacturing steps, the reference voltage levels can be adjusted, and therefore the number of semiconductor chips discarded as defective can be reduced, improving production yield of the chips.

Figure 59:
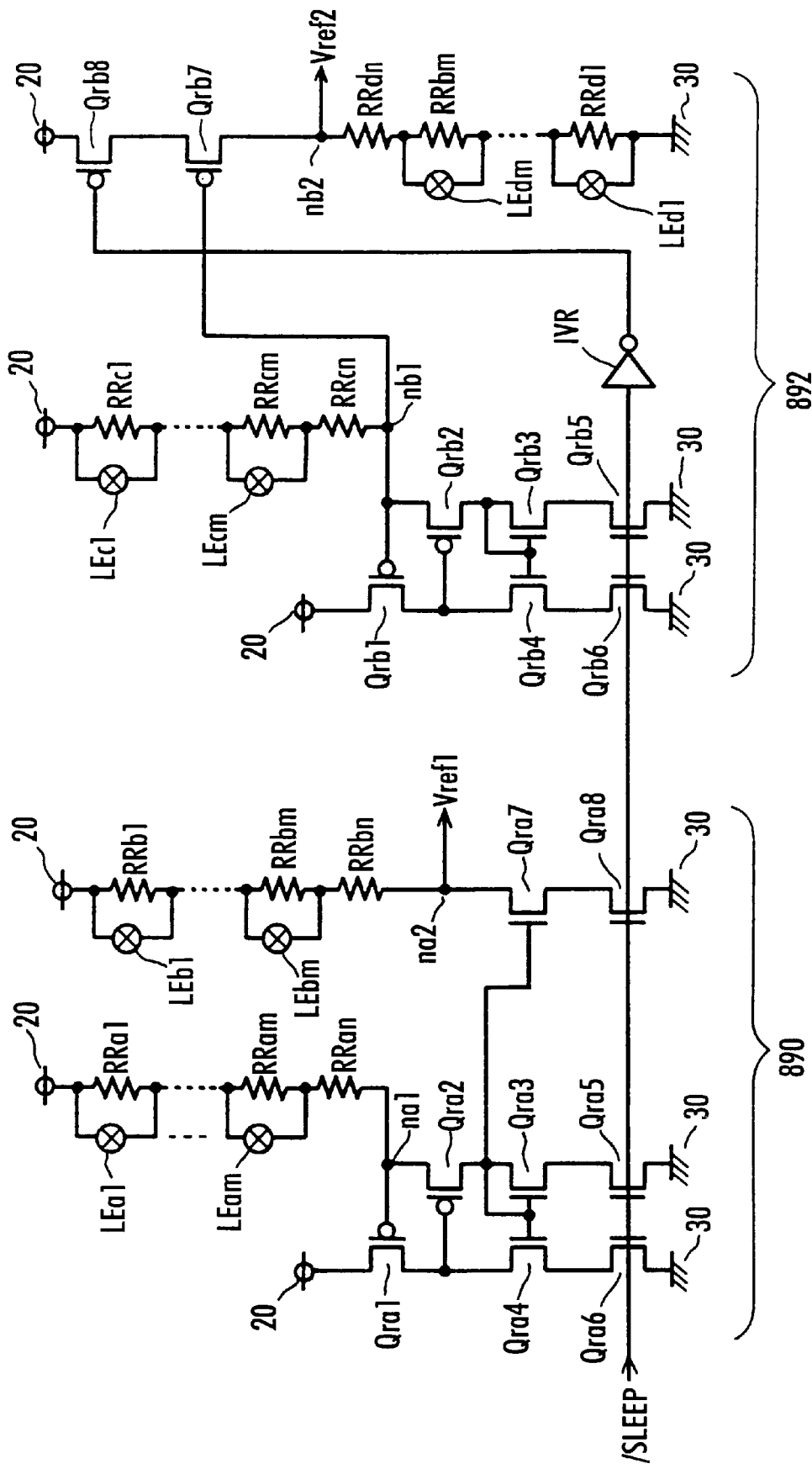
FIG. 59 shows a schematic structure of trimmable reference voltage generating circuit shown in FIG. 58.
Figure 60:
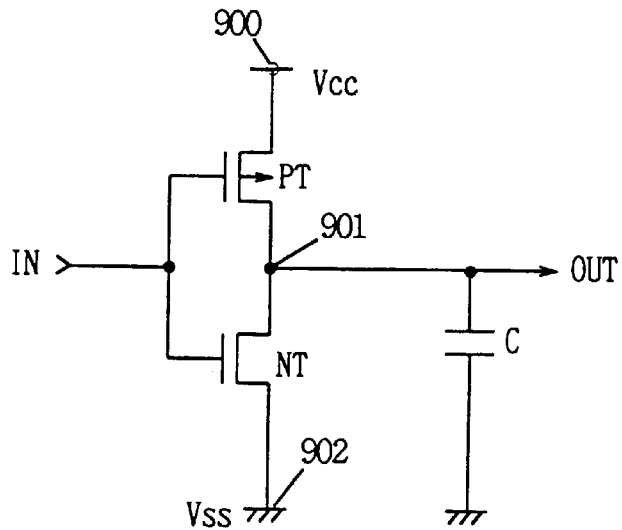
FIG. 60 shows a structure of a conventional CMOS inverter.

FIG. 59 shows an example of a specific structure of the trimmable reference voltage generating circuits 890 and 892 shown in FIG. 58. Referring to FIG. 59, trimmable reference voltage generating circuit 890 includes, in addition to the structure of Vref generating circuit 880 shown in FIG. 54, link elements LEa1 to LEam connected parallel to resistances RRa1 to RRam, and link elements LEb1 to LEbm connected parallel to resistances RRb1 to RRbm. Each of the link elements LEa1 to LEam and LEb1 to LEbm is formed by a fuse element which is a low resistance conductor and which can be blown off.

Trimmable reference voltage generating circuit 892 also includes, in addition to the structure of Vref2 generating circuit 882 shown in FIG. 54, link elements LEc1 to LEcm provided parallel to resistances RRc1 to RRcm, and link elements LEd1 to LEdm connected parallel to resistances RRd1 to RRdm, respectively. These link elements LEc1 to LEcm and LEd1 to LEdm are each formed of a fuse element which is a low resistance conductor and which can be blown off. In the remaining portions of trimmable reference voltage generating circuits 890 and 892, portions corresponding to the components of circuits 890 and 892 shown in FIG. 54 are denoted by the same reference characters.

Level adjustment of reference voltages Vref1 and Vref2 is carried out in the following manner. First, a plurality of patterns for reference voltage adjustment are prepared in advance. The plurality of patterns for voltage level adjustment includes, for example, (1) a pattern used when variation in resistance values of resistances RRa1 to RRd1 is small; (2) a pattern used when there is significant variation in the resistance values of the resistance bodies; and (3) a pattern used when there is significant variation in parameters such as β of the transistors. Here, the reference character β represents a constant which is proportional to the ratio of gate length to gate width of the MOS transistor, which is a factor indicative of current drivability of the MOS transistor. These patterns include voltage level of the reference voltage detected after the completion of manufacturing steps, and information indicative of the positions of the link elements to be blown off at that time.

At the completion of the manufacturing steps of a semiconductor memory device, at first manufacturing parameters and voltage levels of reference voltages Vref1 and Vref2 are inspected. Thereafter, various functions tests are performed on the semiconductor memory device (such as to examine data retention characteristic, to detect existence of defective memory cell, and so on). According to the result of function test, whether or not the semiconductor memory device can be repaired is determined. If it is determined that repairment is possible, a portion to be repaired is detected. Generally, when a defective memory cell is detected in the function test, the defective memory cell is repaired by replacing the defective memory cell with a redundant memory cell by blowing off a link element. At this stage, based on the result of function test, the position of the link element to be blown off is determined.

Thereafter, based on the information of voltage levels of reference voltages Vref1 and Vref2 as well as manufacturing parameters, a pattern for adjusting reference voltage is selected. Based on the selected pattern, the position of the link elements to be blown off in the trimmable reference voltage generating circuits 890 and 892 is calculated.

Thereafter, based on the result of calculation, link elements LEa1 to LEd1 is blown off in trimmable reference voltage generating circuits 890 and 892. The process of blowing off is carried out in the same step as the blowing off of the link element to be blown off detected based on the function test. Blowing off of the link element is carried out by using a laser beam, for example. Since level adjustment of reference voltages Vref1 and Vref2 output from trimmable reference voltage generating circuits 890 and 892 and blowing off of the link elements for repairing or replacement in the semiconductor memory device are carried out in the same process step, the voltage level of reference voltages Vref1 and Vref2 can be adjusted without necessitating an additional step, and thus increase in time for adjustment can be prevented.

In determining the voltage levels of reference voltages Vref1 and Vref2, the amount of current flowing from power supply terminal 20 to ground terminal 30 in the stand-by cycle may be utilized as determining factor for voltage level adjustment of reference voltages Vref1 and Vref2. Voltage level adjustment in trimmable reference voltage generating circuits 890 and 892 will be described.

Reference voltage Vref1 can be represented by the following equation, as already mentioned.

$$Vref1 = Vcc - Vthp \cdot RB/RA$$

When link elements LEa1 to LEam are all rendered conductive, resistances RRa1 to RRan are all short-circuited, and thus resistance value RA attains to the minimum value. As the link elements LEa1 to LEam are selectively blown off, the resistance value RA increases. Therefore, by selectively blowing off the link elements LEa1 to LEam, voltage level of reference voltage Vref1 increases.

Meanwhile, when link elements LEb1 to Lebm are all rendered conductive, resistance value RB between power supply terminal 20 and node na2 is determined by the resistance value given by resistance RRbn, and thus attains to the minimum value (as resistances RRb1 to RRbm are all short-circuited by link elements LEb1 to LEbm). By selectively blowing off the link elements LEb2 to LEbm, resistance value RB between power supply terminal 20 and node na2 is increased. At this time, from the above equation, voltage level of reference voltage Vref1 decreases. By selectively blowing off link elements LEa1 to LEam and LEb1 to LEbm, a reference voltage Vref1 having the desired voltage level can be generated.

Similar level adjustment is performed in trimmable reference voltage generating circuit 892. The reference voltage Vref2 is given by the following equation, as already mentioned.

$$Vref2 = Vthp \cdot RD/RC$$

,where ground voltage Vss applied to ground terminal 30 is assumed to 0 V. Further, it is assumed that the current value flowing through transistor Qrb1 is the same as the current value flowing through Qrb7.

By selectively blowing off link elements LEc1 to LEcm, resistance value RC increases and voltage level of reference voltage Vref2 decreases. Meanwhile, by selectively blowing off link elements LEd1 to LEdm, resistance value RD increases and voltage level of reference voltage Vref2 increases.

As described above, by selectively blowing off link elements LEa1 to LEd1, reference voltages Vref1 and Vref2 at the desired voltage levels can be generated.

Trimmable reference voltage generating circuits 890 and 892 shown in FIG. 59 may be replaced by Vref1 generating circuit 880 and Vref2 generating circuit 882 of the tenth to twelfth embodiments above. These trimmable reference voltage generating circuits 890 and 892 may be used as the reference voltage generating circuit shown in FIGS. 24, 25, 26, 34 and 37.

As described above, according to the thirteenth embodiment of the present invention, since voltage levels of reference voltages Vref1 and Vref2 determining the voltage levels of voltages VCL and VSL on variable impedance power supply line and variable impedance ground line in the stand-by cycle can be adjusted after the completion of manufacturing, reference voltages of the desired voltage levels can be generated even if there is variation in the manufacturing parameters. Therefore, semiconductor memory device not having satisfactory reference voltage level can be repaired, and thus production yield can be improved. Since level adjustment of the reference voltage is implemented by blowing off link elements connected parallel to resistors (a series connection of resistance elements), reference voltage of the desired voltage level can be readily obtained, and reference voltage level can be adjusted in the same step as other repairing process such as repairing of a defective memory cell. Therefore, level adjustment of the reference voltage can be carried out without necessitating an additional step of level adjustment.

Resistances RRa1 to RRd1 may be formed of a polysilicon-resistance body. Alternatively, an MOS transistor may be utilized as a resistance. Further, a structure may be used in the reference voltage generating circuit in which one series connection of resistances is provided by polycrystalline silicon-resistances and the other series connection of resistances may be provided by MOS transistors.

POST SUMMARY OF THE INVENTION

As described above, according to the present invention, since impedances of variable impedance power supply line and variable impedance ground line are changed in accordance with operation cycle, operation mode or operation period, subthreshold current can be surely suppressed, and thus semiconductor device of low power consumption in which stand-by current and active DC current can be reduced, is obtained. Further, a semiconductor device in which subthreshold current can surely be suppressed and which consumes low power can be implemented. Since the subthreshold current can be surely suppressed, a semiconductor device can be formed by using MOS transistors of which threshold value in terms of absolute value is small. Therefore, a semiconductor device which can operate at high speed even with low power supply voltage can be obtained, and by applying the power supply circuit to the semiconductor memory device, a semiconductor memory device having large storage capacity with low power consumption which operates at high speed with low voltage can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a logic gate outputting a signal which attains to a first logic level in a stand-by cycle and to a second logic level in an active cycle, said active cycle including a set period in which the logic level of said signal changes and a holding period in which said signal holds said second logic level, said semiconductor device comprising:

a first power supply line to which a voltage corresponding to said first logic level is supplied from a first power supply node, serving as one operating power supply line for said logic gate;

a first variable impedance circuit connected between said first power supply node and said first power supply line;

a second power supply line to which a voltage corresponding to said second logic level is supplied from a second power supply node, serving as another operating power supply line of said logic gate;

a second variable impedance circuit connected between said second power supply node and said second power supply line; and an impedance changing circuit for setting said first variable impedance circuit to a low impedance state and said second variable impedance circuit to a high impedance state in said stand-by cycle, setting the first and second variable impedance circuits both to the low impedance state in said set period, and setting said first variable impedance circuit to the high impedance state and said second variable impedance circuit to the low impedance state in said holding period.

2. The semiconductor device according to claim 1, further comprising:

a third power supply line to which a voltage is applied from said first power supply node;

a fourth power supply line to which a voltage is supplied from said second power supply node;

a third variable impedance circuit provided between said first power supply node and said third power supply line, set to the low impedance state in said holding period and to the high impedance state in said stand-by cycle and in said set period;

a fourth variable impedance circuit provided between said second power supply node and said fourth power supply line, set to the high impedance state in said stand-by cycle and said set period, and to the low impedance state in said holding period; and a second logic gate operating using the voltage on one of said first and second power supply nodes and the voltage on one of said third and fourth power supply lines as operating supply voltages, for performing a logical operation on an input signal applied in said holding period for outputting.

3. The semiconductor device according to claim 1, wherein the first and second variable impedance circuits each include means for setting a corresponding power supply line to an electrically floating state in the high impedance state in a predetermined mode of operation.

4. The semiconductor device according to claim 1, wherein the first and second variable impedance circuits each include an insulated gate type field effect transistor provided between a corresponding power supply line and a corresponding power supply node.

5. The semiconductor device according to claim 4, wherein said first and second variable impedance circuits each further include a comparator for comparing the voltage on said corresponding power supply line with a prescribed reference voltage level, rendering non-conductive said insulated gate type field effect transistor when the voltage on said corresponding power supply line is at a level intermediate between said prescribed reference voltage level and the voltage at the corresponding power supply node, and otherwise rendering conductive said insulated gate type field effect transistor.

6. The semiconductor device according to claim 4, wherein said first and second variable impedance circuits each further include a comparator for comparing a voltage on the corresponding power supply line with a reference voltage to control a conductance of the corresponding insulated gate field effect transistor according to the result of comparison.

7. A semiconductor device, comprising:

a first power supply node receiving a voltage corresponding to a first logic level;

a first power supply line;

a second power supply node receiving a voltage corresponding to a second logic level;

a second power supply line;

a logic gate operating using the voltage on said first power supply line and the voltage on said second power supply line as operating power supply voltages for performing a prescribed logic processing on an input signal, said logic gate having a stand-by cycle, a set period in which logic level of an output signal thereof changes to an established state, and a holding period in which said established state is held;

a first variable impedance circuit connected between said first power supply line and said first power supply node, set to a high impedance state in said stand-by cycle and said holding period, and to a low impedance state in said set period; and a second variable impedance circuit connected between said second power supply line and said second power supply node, set to a high impedance state in said stand-by cycle and said holding period, and to a low impedance state in said set period.

8. The semiconductor device according to claim 7, further comprising:

a third power supply line to which a voltage is supplied from said first power supply node;

a fourth power supply line to which a voltage is supplied from said second power supply node;

a third variable impedance circuit connected between said first power supply node and said third power supply line, set to the low impedance state in said holding period and to the high impedance state in said stand-by cycle and said set period;

a fourth variable impedance circuit provided between said second power supply node and said fourth power supply line, set to the high impedance state in said stand-by cycle and said set period, and to the low impedance state in said holding period; and a second logic gate operating using the voltage on one of said first and second power supply nodes and the voltage on one of said third and fourth power supply lines as operating power supply voltages, for performing a prescribed logical operation on an input signal applied in said holding period for outputting.

9. The semiconductor device according to claim 7, wherein the first and second variable impedance circuits each include means for setting an associated power supply line to an electrically floating state in the high impedance state in a predetermined mode of operation.

10. The semiconductor device according to claim 7, wherein the first and second variable impedance circuits each include an insulated gate type field effect transistor provided between a corresponding power supply line and a corresponding power supply node.

11. The semiconductor device according to claim 10, wherein said first and second variable impedance circuits each include a comparator comparing the voltage on said corresponding power supply line with a prescribed reference voltage level, for rendering non-conductive said insulated gate type field effect transistor when the voltage on said corresponding power supply line is at a level intermediate between said prescribed reference voltage level and the voltage on the corresponding power supply node, and otherwise rendering conductive said insulated gate type field effect transistor.

12. The semiconductor device according to claim 10, wherein said first and second variable impedance circuits each further include a comparator for comparing a voltage on the corresponding power supply line with a reference voltage for controlling a conductance of a corresponding insulated gate type field effect transistor according to the result of comparison.

13. The semiconductor device according to claim 1, further comprising:

a third power supply line to which a voltage is applied from said first power supply node;

a fourth power supply line to which a voltage is supplied from said second power supply node;

a third variable impedance circuit provided between said first power supply node and said third power supply line, set to the high impedance state in said stand-by cycle, and to the low impedance state in said active cycle;

a fourth variable impedance circuit provided between said second power supply node and said fourth power supply line, set to the low impedance state in said stand-by cycle and said set period, and to the high impedance state in said holding period; and a second logic gate operating using the voltage on said third power supply line and the voltage on said fourth power supply line as operating supply voltages, for performing a logical operation on an input signal applied in said set period for outputting a signal at said first logic level at said holding period.

14. The semiconductor device according to claim 1, further comprising:

a third power supply line to which a voltage is applied from said first power supply node;

a fourth power supply line to which a voltage is supplied from said second power supply node;

a third variable impedance circuit provided between said first power supply node and said third power supply line, set to the nigh impedance state in said stand-by cycle and to the low impedance state in said active cycle;

a fourth variable impedance circuit provided between said second power supply node and said fourth power supply line, set to the low impedance state in said stand-by cycle and said set period, and to the high impedance state in said holding period; and a second logic gate operating using the voltage on said third power supply line and the voltage on said fourth power supply line as operating supply voltage, for performing a logical operation on input signal to provide an output signal, said output signal being at the second logic level in said stand-by cycle and at the first logic in said holding period.

15. The semiconductor device according to claim 7, further comprising:

a third power supply line to which a voltage is supplied from said first power supply node;

a fourth power supply line to which a voltage is supplied from said second power supply node;

a third variable impedance circuit connected between said first power supply node and said third power supply line, set to the high impedance state in said holding period and to the low impedance state in said stand-by cycle and said set period;

a fourth variable impedance circuit provided between said second power supply node and said fourth power supply line, set to the high impedance state in said hold period, and to the low impedance state in said stand-by cycle and said set period; and a second logic gate operating using the voltage on a predetermined one of the first and third power supply lines and the voltage on a predetermined one of the second and fourth power supply lines as operating power supply voltages, for performing a prescribed logical operation on an input signal applied in said set period for outputting and holding in said holding period.

16. The semiconductor device according to claim 1, further comprising:

a third power supply line to which a voltage is supplied from said first power supply node;

a fourth power supply line to which a voltage is supplied from said second power supply node;

a third variable impedance circuit connected between said first power supply node and said third power supply line, set to the high impedance state in said stand-by cycle and to the low impedance state in said set period and said holding period;

a fourth variable impedance circuit provided between said second power supply node and said fourth power supply line, set to the low impedance state in said stand-by cycle and said set period, and to the high impedance state in said holding period; and a second logic gate operating using the voltage on a predetermined one of the first and third power supply lines and the voltage on a predetermined one of the second and fourth power supply lines as operating power supply voltages, for performing a prescribed logical operation on an input signal in said set period for outputting and holding in said holding period.

17. The semiconductor device according to claim 7, further comprising:

a third power supply line to which a voltage is supplied from said first power supply node;

a third variable impedance circuit connected between said first power supply node and said third power supply line, set to the high impedance state in said holding period and to the low impedance state in said stand-by cycle and said set period; and a second logic gate operating using the voltage on said second power supply line and the voltage on said third power supply line as operating power supply voltages, for performing a prescribed logical operation on an input signal applied in said set period for outputting and holding in sad holding period.

18. The semiconductor device according to claim 7, further comprising:

a third power supply line to which a voltage is supplied from said second power supply node;

a third variable impedance circuit provided between said second power supply node and said third power supply line, set to the low impedance state in said stand-by cycle and said set period, and to the high impedance state in said holding period; and a second logic gate operating using the voltage on said first power supply line and the voltage on said third power supply line as operating power supply voltages, for performing a prescribed logical operation on an input signal in said set period for outputting and holding in said holding period.

* * * * *

UNITED STATES PATENT AND TRADEMARK OFFICE
CERTIFICATE OF CORRECTION

PATENT NO. : 5,959,927
DATED : September 28, 1999
INVENTOR(S) : TADATO YAMAGATA, et al.

It is certified that error appears in the above-identified patent and that said Letter Patent is hereby corrected as shown below:

Claim 6, line 39, after "corresponding" insert --type--.

Claim 14, line 28, change "voltage to --voltages--.

Claim 15, line 48, change "hold" to --holding--.

Claim 17, line 41, change "sad" to --said--.

Signed and Sealed this

Twenty-second Day of August, 2000

Attest:

Q. TODD DICKINSON

Attesting Officer     Director of Patents and Trademarks